US012713897B2

(12) United States Patent
Liaw

(10) Patent No.: US 12,713,897 B2
(45) Date of Patent: Aug. 18, 2026

(54) SEMICONDUCTOR STRUCTURE HAVING BACK-SIDE CONTACT AND MANUFACTURING METHOD THEREOF

(71) Applicant: TAIWAN SEMICONDUCTOR MANUFACTURING COMPANY, LTD., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 647 days.

(21) Appl. No.: 18/157,607

(22) Filed: Jan. 20, 2023

(65) Prior Publication Data

US 2024/0250027 A1 Jul. 25, 2024

(51) Int. Cl.
*H10W 20/41* (2026.01)
*H10D 30/01* (2025.01)
(Continued)

(52) U.S. Cl.
CPC ........ *H10W 20/427* (2026.01); *H10D 30/014* (2025.01); *H10D 30/43* (2025.01); (Continued)

(58) Field of Classification Search
CPC ........... H01L 23/5286; H01L 21/28518; H01L 21/76897; H01L 23/485; H10D 30/014; (Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

TW 202201697 A 1/2022
TW 202211472 A 3/2022
TW 202242971 A 11/2022

OTHER PUBLICATIONS

Rubin, L., & Poate, J. (2003). lon implantation in silicon technology. Industrial Physicist, 9(3), 12-15. (Year: 2003).*
(Continued)

*Primary Examiner* — William B Partridge
*Assistant Examiner* — Ilker Ozden
(74) *Attorney, Agent, or Firm* — Cooper Legal Group, LLC

(57) ABSTRACT

A method includes forming semiconductor sheets on a front-side of a semiconductive layer on a front-side of a substrate; forming a gate strip surrounding each of the semiconductor sheets; forming dielectric layers on the semiconductive layer and at opposite sides of the gate strip; forming source/drain structures on the dielectric layers and on either side of each of the semiconductor sheets; performing a planarization process on a back-side of the substrate to expose the semiconductive layer; etching the semiconductive layer from a back-side of the semiconductive layer to form a first opening exposing a first one of the dielectric layers, while remains covering a second one of the dielectric layers; selectively removing the first one of the dielectric layers through the first opening to from a second opening exposing one of the source/drain structures; forming a contact having back-side and front-side portions in the first and second openings.

20 Claims, 92 Drawing Sheets

C6-C6'

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ..... *H10D 30/6729* (2025.01); *H10D 30/6735* (2025.01); *H10D 62/121* (2025.01); *H10D 64/0112* (2026.01); *H10D 64/017* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 84/85* (2025.01)

(58) Field of Classification Search

CPC ............... H10D 30/43; H10D 30/6729; H10D 30/6735; H10D 62/121; H10D 64/017; H10D 84/0167; H10D 84/017; H10D 84/0186; H10D 84/0188; H10D 84/038; H10D 84/85; H10D 30/6757; H10D 30/797; H10D 62/151; H10D 84/0149; H10D 84/83; H10D 64/0112; H10W 20/427; H10W 20/069; H10W 20/40

See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 * | 11/2016 | Jiang | H01L 21/31053 |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,613,953 | B2 | 4/2017 | Liaw | |
| 9,793,273 | B2 | 10/2017 | Liaw | |
| 9,805,985 | B2 | 10/2017 | Liaw | |
| 10,090,325 | B1 | 10/2018 | Liaw | |
| 10,312,332 | B2 | 6/2019 | Liaw | |
| 10,515,967 | B2 | 12/2019 | Liaw | |
| 2016/0268392 | A1 * | 9/2016 | Zhu | H10D 84/038 |
| 2019/0148245 | A1 * | 5/2019 | Baars | H10D 64/691 257/351 |
| 2020/0105761 | A1 * | 4/2020 | Liaw | H10D 84/0167 |
| 2020/0381426 | A1 * | 12/2020 | Xu | H10D 30/014 |
| 2021/0098306 | A1 * | 4/2021 | Smith | H01L 21/743 |
| 2021/0336063 | A1 * | 10/2021 | Liao | H01L 23/5286 |
| 2022/0069117 | A1 * | 3/2022 | Yu | H10D 64/017 |
| 2022/0115510 | A1 | 4/2022 | Yu et al. | |
| 2022/0199530 | A1 * | 6/2022 | Huang | H10D 62/121 |
| 2022/0302172 | A1 * | 9/2022 | Hong | H10D 30/43 |
| 2022/0302268 | A1 * | 9/2022 | Chiang | H10D 30/6735 |
| 2022/0328363 | A1 * | 10/2022 | Chou | H01L 22/12 |
| 2022/0367619 | A1 | 11/2022 | Yu et al. | |
| 2023/0093101 | A1 * | 3/2023 | Xie | H10D 64/01 257/690 |
| 2023/0170400 | A1 * | 6/2023 | Pal | H10D 64/01 438/151 |
| 2023/0197503 | A1 * | 6/2023 | Xie | H10W 10/014 257/288 |
| 2023/0260909 | A1 * | 8/2023 | Yeoh | H10D 30/6735 438/157 |
| 2024/0079446 | A1 * | 3/2024 | Xie | H10D 64/017 |

OTHER PUBLICATIONS

Current, M. I., Ion implantation of advanced silicon devices: Past, present and future, Materials Science in Semiconductor Processing, vol. 62, 2017, pp. 13-22, ISSN 1369-8001, https://doi.org/10.1016/j.mssp.2016.10.045 (Year: 2017).*

* cited by examiner

C8-C8'

C6-C6'

C8-C8'

110
F-M1-Vss
F-M1
F-M1
F-M1
240
240
F-M1
240
C2
C1
227
233
225
F-M1
210
250
220
F-M1
210
C1'
C2'
240
242
F-M1
F-M1-Vdd
10A
10B
10C
10D
x
y

C2-C2'

C6-C6'

C5-C5'

C1-C1'

C5-C5'

C6-C6'

C1-C1'

C1-C1'

C1-C1'

C6-C6'

C1-C1'

C1-C1'

C1-C1'

C1-C1'

C1-C1'

C1-C1'

C1-C1'

SEMICONDUCTOR STRUCTURE HAVING BACK-SIDE CONTACT AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
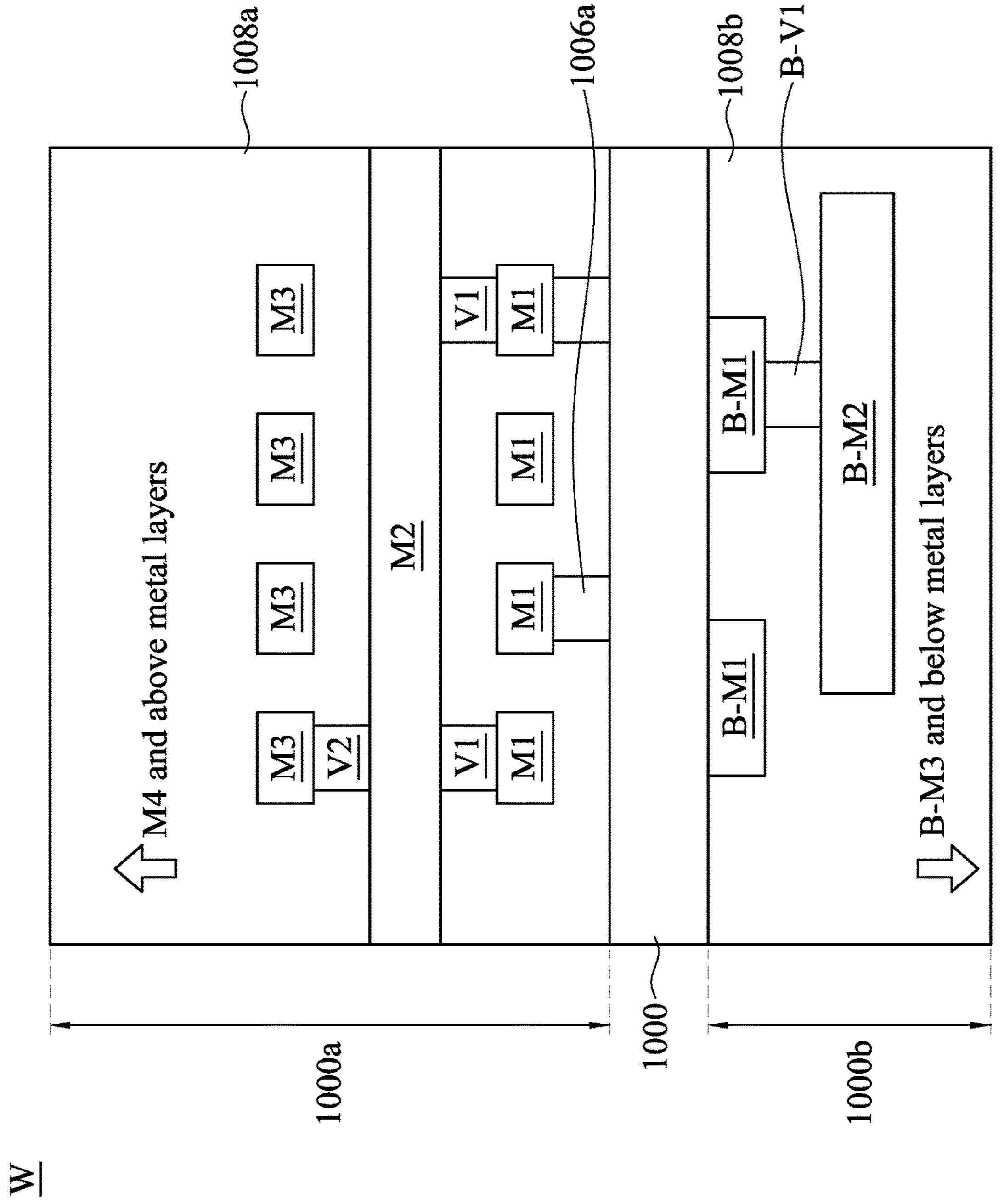
FIG. 1 is schematic view of a wafer including a front-side interconnect structure and a back-side interconnect structure on a device region thereof in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution, functional density (i.e., the number of interconnected devices per chip area) has generally increased while geometry size (i.e., the smallest component (or line) that can be created using a fabrication process) has decreased. However, the smaller and more dense the metal lines in the IC structure will result in worse resistant thereof, thereby wasting processing power and processing speed during the operation of the IC structure. For example, in a cell routing of the IC structure, Vdd and Vss power routing may occupy too many routing resources and therefore impact the cell scaling as well as the performance of the IC structure (e.g., RC delay or IR drop). Hence, a part of power lines and power conductive contacts are moved to wafer back-side, so as to reduce the routing loading and improve the circuit density in a same chip area. Nevertheless, the power conductive contact on the wafer back-side may not be aligned with the source/drain region when forming thereof, which in turn non-overlaps with the source/drain region and/or overlaps with the gate, such that an unwanted connection may occur and therefore impacts the performance of IC structure.

Therefore, the present disclosure in various embodiments provides a metal line routing method to improve the functional density and operation performance on the IC structure. Because the power conductive contact can be formed to inherit the location of the dielectric layer directly underlying the source/drain region, the back-side contact can self-align with the source/drain region to connect the source/drain region to the back-side power metal layers. Therefore, an isolation margin issue of the back-side power conductive contact to gate electrode can be solved, which in turn allows for scaling the contacted poly pitch (CPP). In addition, because the back-side power conductive contact can have a back-side portion having wider width than the front-side portion thereof (e.g., stepped sidewall structure) to connect the back-side power metal layers, an improved contact resistance between the source/drain region and the back-side power metal layers can be achieved.

Reference is made to FIG. 1. FIG. 1 is schematic view of a wafer including a front-side interconnect structure and a back-side interconnect structure on a device region thereof in accordance with some embodiments of the present disclosure. As shown in FIG. 1, a device region 1000 is provide in the wafer W and includes, such as gate, channel, and source/drain regions. A front-side interconnect structure 1000*a* is formed after the device region formation. Specifically, the front-side interconnect structure 1000*a* is formed to have a front-side gate via 1006*a*, and a front-side source/drain via 1004*a*. The front-side interconnect structure 1000*a* may further include, for example, two metallization layers, labeled as M1, M2, and M3, with two layer of metallization via or interconnect, labeled as V1 and V2. Other embodiments may contain more or fewer metallization layers and corresponding more or fewer number of vias. The metal line illustrated here just for an example, and the metal line may be otherwise oriented (rotated 90 degrees or at other orientations). The front-side interconnect structure 1000*a* includes a full metallization stack, including a portion of each of metallization layers M1, M2, and M3 connected by the interconnect V1 and V2, with the front-side gate via 1006*a*, and the front-side source/drain via 1004*a* connecting the stack to the source/drain region and the gate of the transistor in the device region 1000. Also included in the front-side interconnect structure 1000*a* shown in FIG. 1 is a front-side IMD (inter-metal dielectric) layer 1008*a*. The front-side IMD layer 1008*a* may provide electrical insulation as well as structural support for the various features in the front-side interconnect structure 1000*a*.

As shown in FIG. 1, a back-side interconnect structure 1000*b* is formed after device region formation. The back-side interconnect structure 1000*b* is formed to include, for example, two metallization layers, labeled as B-M1 and B-M2, with one layer of metallization via B-V1 connected between the metallization layers B-M1 and B-M2. Other embodiments may contain more or fewer metallization layers and corresponding more or fewer number of vias. The metal line illustrated here just for an example, and the metal line may be otherwise oriented (rotated 90 degrees or at other orientations). The back-side interconnect structure 1000*b* may include a full metallization stack including the metallization layer and the metallization layer B-M1 connecting the stack to the source/drain region of the transistor in the device region 1000. Also included in the back-side interconnect structure 1000*b* shown in FIG. 1 can be a back-side IMD layer 1008*b*. The back-side IMD layer 1008*b* may provide electrical insulation as well as structural support for the various features in the back-side interconnect structure 1000*b*.

Figure 2A:
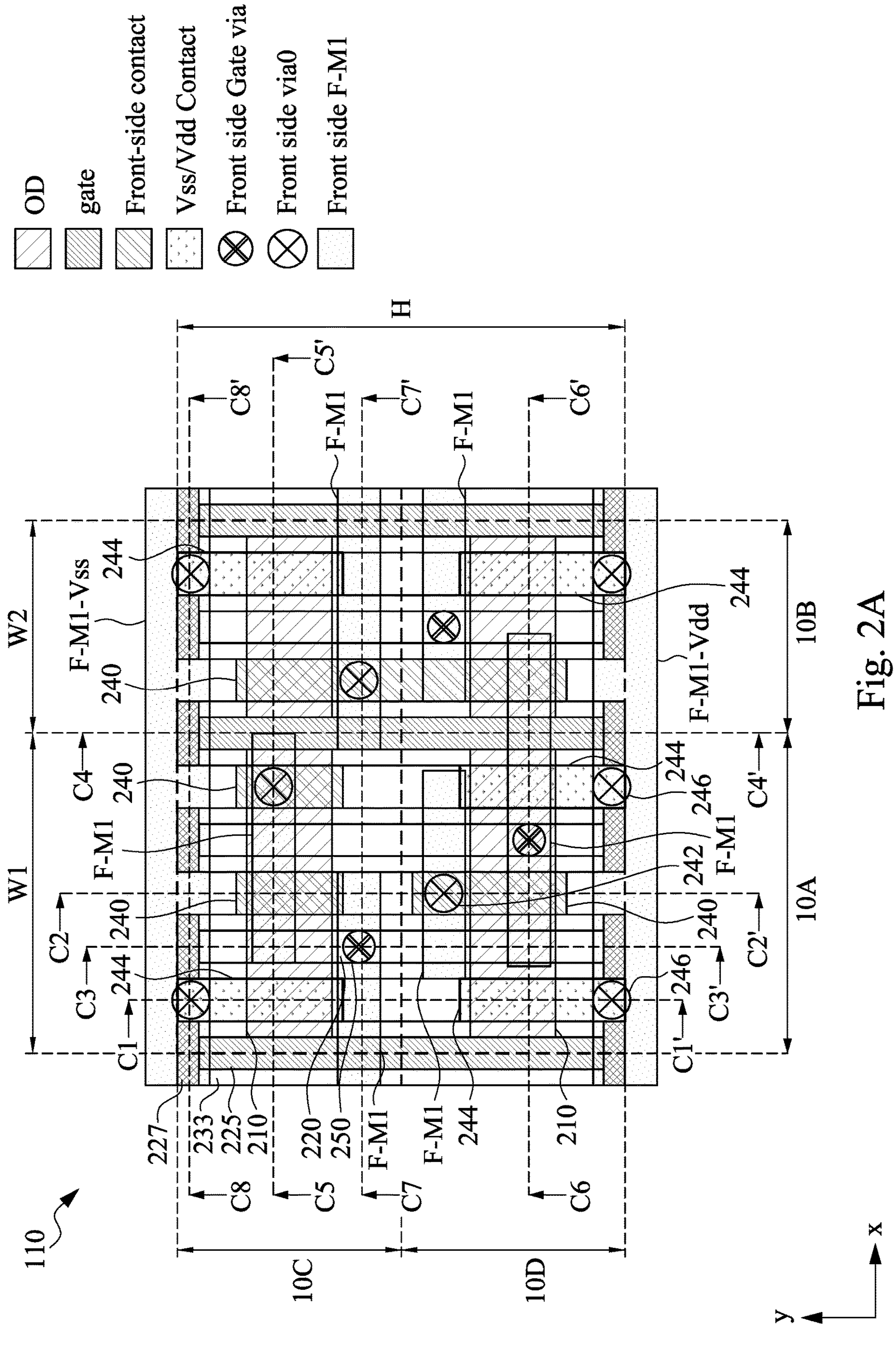
FIGS. 2A and 2B illustrate a layout diagram of a logic circuit on a front side and a back side of a semiconductor structure, respectively, according to some embodiments of the present disclosure.
Figure 2B:
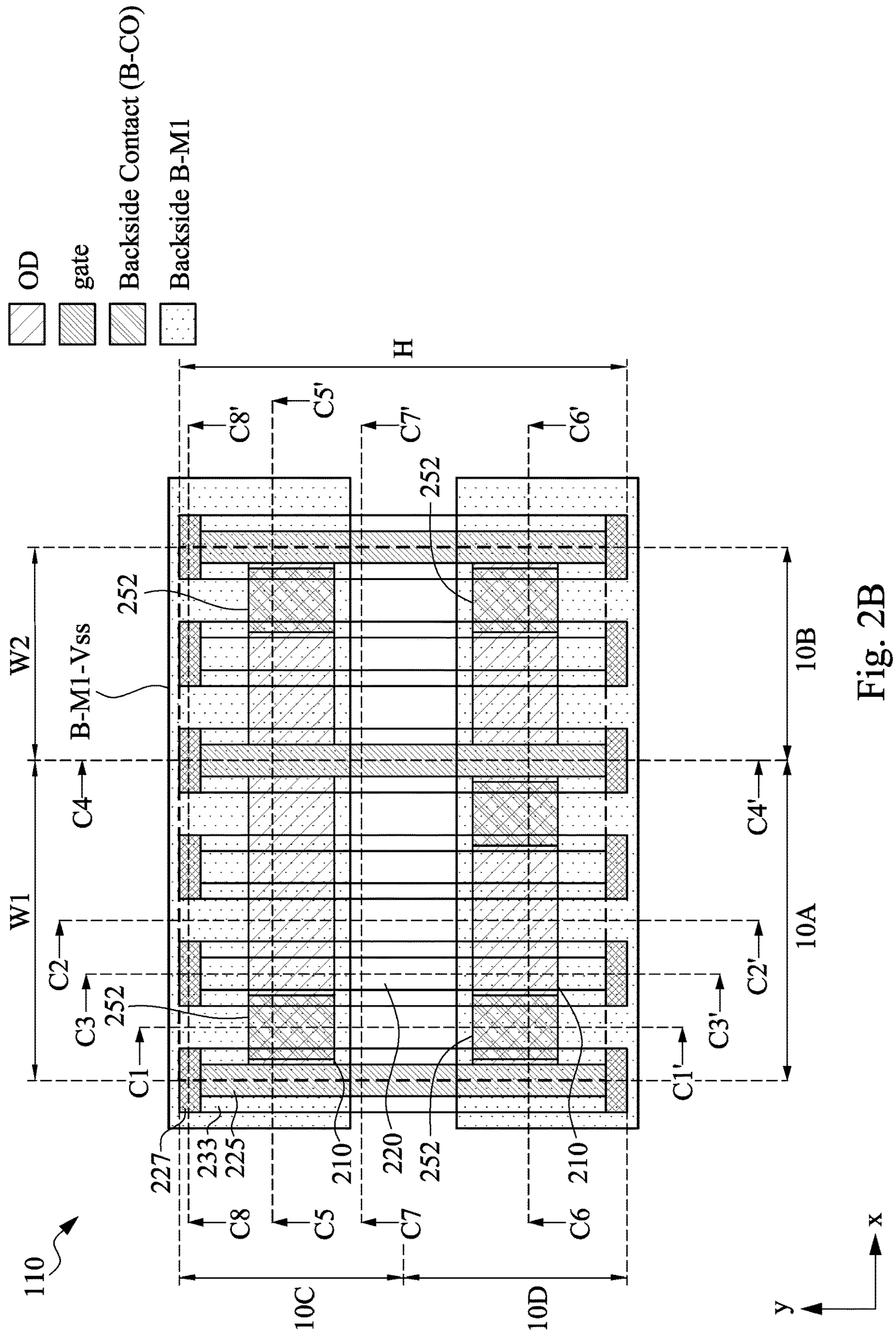

Reference is made to FIGS. 2A, 2B, 3A-3E, 3H, 3K, and 3L. FIGS. 2A and 2B illustrate a layout diagram of a logic circuit on a front side and a back side of a semiconductor structure, respectively, according to some embodiments of the present disclosure. FIGS. 3A-3E, 3H, 3K, and 3L illustrate cross-sectional views obtained from reference cross-sections C1-C1', C2-C2', C3-C3', C4-C4', C5-C5', C6-C6', C7-C7', and C8-C8' in FIGS. 2A and 2B.

As shown in FIGS. 2A and 2B, a first logic circuit region 10A and a second circuit region 10B are arranged in the same row in the cell. The outer boundary of each of the first logic circuit region 10A and the second circuit region 10B is illustrated using dashed lines. In some embodiments, the first logic circuit region 10A and the second circuit region 10B may have the same cell height H. In some embodiments, the cell width W1 of the first logic circuit region 10A may be wider than the cell width W2 of the second circuit region 10B. In FIGS. 2A and 2B, it should be noted that the configuration of the first logic circuit region 10A and the second circuit region 10B in the logic circuit 110 is used as an illustration, and not to limit the disclosure. In some embodiments, the row in the cell of the logic circuit 110 may include more logic cells or fewer logic cells than the layout shown in FIGS. 2A and 2B. In some embodiments, the cell of the logic circuit 110 may include more rows or fewer rows and more columns or fewer columns than the layout shown in FIGS. 2A and 2B. Each logic cell provides a circuit or portion thereof, exemplary functionality provided by the cells includes, but are not limited to NAND, NOR, AND, XOR, XNOR, SACN, inverter, Flip-Flop, latch, and/or other suitable logic or storage functions. For example, the first logic circuit region 10A may have a first one of the logic circuits including inverter, NAND, and NOR circuit schematics and Flip-Flop circuit schematics for NOR and NAND, and the second logic circuit region 10B may have a second one of the logic circuits including inverter, NAND, and NOR circuit schematics and Flip-Flop circuit schematics for NOR and NAND. By way of example but not limiting the present disclosure, the first logic circuit region 10A may have a NAND circuit, and the second circuit region 10B may have an inverter.

In some embodiments, the logic circuit 110 may include a plurality of transistors in a first conductivity type device region 10C and a second conductivity type device region 10D. In some embodiments, the transistors in the first conductivity type device region 10C may be NMOSFET transistors with silicon channel regions, and the transistors in the second conductivity type device region 10D may be PMOSFET transistors with silicon channel regions. In some embodiments, the transistors may be GAA FETs. The silicon channel regions of the NMOSFET and PMOSFET transistors are formed by semiconductor sheets 210. The semiconductor sheets 210 are stacked along the Z-direction (not shown) and are wrapped by the gate electrode, and the Z-direction is perpendicular to the plane formed by the X-direction and Y-direction. In some embodiments, the semiconductor sheets 210 has a length extending in the X-direction in a range from about 4 nm to about 12 nm, such as about 4, 5, 6, 7, 8, 9, 10, 11, or 12 nm. The semiconductor sheets 210 are on the front-side surface 248*f*/248*s* of the semiconductive layer 248*a*/248*b* (see FIGS. 3E and 3H).

As shown in FIGS. 2A and 2B, the logic circuit 110 includes dielectric-base gates 225 extending in the Y-direction. The logic circuit 110 further includes gate electrodes 220 extending in the Y-direction and being arranged between adjacent two of the dielectric-base gates 225. In other words, the gate electrodes 220 extend in parallel with each other, and the dielectric-base gates 225 extend in parallel with a lengthwise direction of the gate electrodes 220. The transistors are surrounded by the dielectric-base gates 225. In other words, the dielectric-base gates 225 are formed in the boundary of the first logic circuit region 10A and in the boundary of the second circuit region 10B. Moreover, one of the dielectric-base gates 225 between the first and second logic circuit regions 10A and 10B is shared by the first and second logic circuit regions 10A and 10B, i.e., the first logic circuit region 10A and the second circuit region 10B in the same row are isolated (or separated) from each other by said dielectric-base gate 225. The material of the dielectric-base gates 225 is different from that of the gate electrodes 220. In some embodiments, the dielectric-base gates 225 can be interchangeably referred to dummy gates, dummy gate pattern, dummy gate strip, isolation structures/dielectric gates serving as circuit boundaries. Also included in FIGS. 2A and 2B, spacers 233 are formed on sidewalls of the dielectric-base gates 225 and the gate electrodes 220. In some embodiments, the gate electrodes 220 has a length extending in the Y-direction in a range from about 4 nm to about 70 nm, such as about 4, 5, 10, 15, 20, 25, 30, 35, 40, 45, 50, 55, 60, 65, or 70 nm.

As shown in FIG. 2A illustrating the logic circuit 110 on the front side of the semiconductor structure/wafer, the gate electrodes 220 are connected to an overlying level (e.g., metal line F-M1) through gate vias 250. Source/drain regions 218*a*/218*b* (see FIGS. 3A, 3B, 3E, and 3H) are formed on opposite sides of the semiconductor sheets 210 wrapping around by the gate electrodes 220. The source/drain regions 218*a* (see FIGS. 3A, 3E, and 3H) which are of Vdd node and Vss node can be electrically coupled to overlying power supply voltage line F-M1-Vdd/F-M1-Vss through a power supply voltage contact 244 and a conductive via 246. In some embodiments, the source/drain region 218*a* can be interchangeably referred to as a power conductor connection, and the power supply voltage contact 244 can be interchangeably referred to as a Vss/Vdd contact. The source/drain regions 218*b* (see FIGS. 3B, 3E, and 3H) which are not of Vdd node and Vss node can be electrically coupled to overlying metal lines F-M1 through source/drain contacts 240 and source/drain vias 242.

In some embodiments, the power supply voltage line F-M1-Vdd can be interchangeably referred to as a Vdd line that is provided with positive a power supply voltage Vdd, and the power supply voltage line F-M1-Vss can be interchangeably referred to as a Vss line that is provided with power supply voltage Vss. In some embodiments, the cell can be powered through the positive power supply node Vdd that has a positive power supply voltage (also denoted as VDD). The cell can be also connected to power supply voltage Vss (also denoted as VSS), which may be an electrical ground. Throughout the description, the notations of metal lines may be followed by the metal line levels they are in, wherein the respective metal line level is placed in parenthesis. As shown in FIG. 2A, metal lines disposed at the M1 level on the front-side of the semiconductor structure may include the power supply voltage lines F-M1-Vdd and F-M1-Vss and the metal lines F-M1 laterally between the power supply voltage lines F-M1-Vdd and F-M1-Vss. The metal lines disposed at the M1 level on the front-side of the semiconductor structure may have lengthwise directions parallel to the X-direction (e.g., column direction). In some embodiments, the power supply voltage line F-M1-Vdd/F-

M1-Vss disposed at the M1 level can be interchangeably referred to a power supply voltage landing pad or a power supply voltage landing line. In some embodiments, the lines can be interchangeably referred to metal layers, conductive lines, conductive layers, or conductors.

In some embodiments, a dopant in the source/drain regions 218*a* and 218*b* (see FIGS. 3A, 3B, and 3E) of the first conductivity type device region 10C (see FIGS. 2A and 2B) has an opposite conductivity type to another dopant in the source/drain regions 218*a* and 218*b* (see FIGS. 3A, 3B, and 3H) of the second conductivity type device region 10D. For example, the source/drain regions 218*a* and 218*b* of the first conductivity type device region 10C may have an n-type dopant, and the source/drain regions 218*a* and 218*b* of the second conductivity type device region 10D may have a p-type dopant. In some embodiments, the source/drain regions 218*a* and 218*b* of the first conductivity type device region 10C may include SiP, SiC, SiPC, SiAs, Si, or a combination thereof. In some embodiments, the source/drain regions 218*a* and 218*b* of the first conductivity type device region 10C may have a phosphorus concentration within a range from about 2E19/cm$^3$ to about 3E21/cm$^3$. In some embodiments, the source/drain regions 218*a* and 218*b* of the second conductivity type device region 10D may include boron, $BF_2$, SiGe, or a combination thereof. In some embodiments, the source/drain regions 218*a* and 218*b* (see FIGS. 3A, 3B, and 3H) of the second conductivity type device region 10D (see FIGS. 2A and 2B) may have a boron concentration within a range from about 1E19/cm$^3$ to about 6E20/cm$^3$. In some embodiments, the source/drain regions 218*a* and 218*b* of the second conductivity type device region 10D may have a Ge atomic percentage within a range of about 36% to about 85%. In some embodiments, the source/drain regions 218*a* and 218*b* of the second conductivity type device region 10D may include a carbon-containing material.

As shown in FIG. 2B illustrating the logic circuit 110 on the back side of the semiconductor structure with a contact 252, the source/drain regions 218*a* (see FIGS. 3A, 3E, and 3H) which are of Vdd node and Vss node can be electrically coupled to the underlying power supply voltage line B-M1-Vdd/B-M1-Vss through the contact 252. On the other hand, dielectric layers 249 can be formed between the source/drain regions 218*b* and the semiconductive layer 248*a*/248*b*, such that the source/drain regions 218*b* (see FIGS. 3B, 3E, and 3H) which are not of Vdd node and Vss node can be isolated from the underlying semiconductive layers 248*a* and 248*b* and the underlying power supply voltage line B-M1-Vdd/B-M1-Vss. In some embodiments, the dielectric layer 249 can be interchangeably referred to a dielectric barrier layer or a leakage barrier.

Figure 3A:
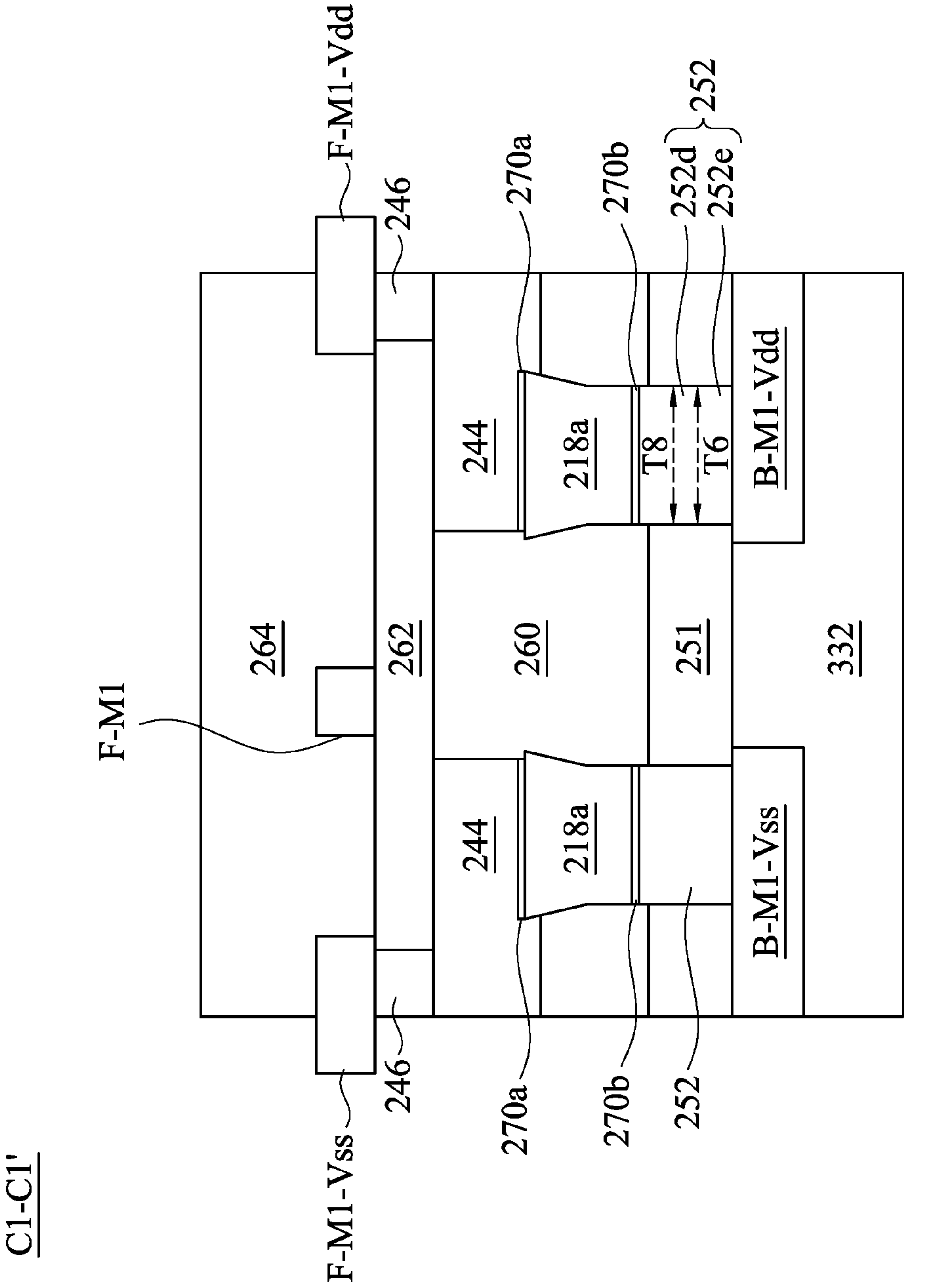
FIGS. 3A-3E, 3H, 3K, and 3L illustrate cross-sectional views obtained from reference cross-sections C1-C1', C2-C2', C3-C3', C4-C4', C5-C5', C6-C6', C7-C7', and C8-C8' in FIGS. 2A and 2B.
Figure 3B:
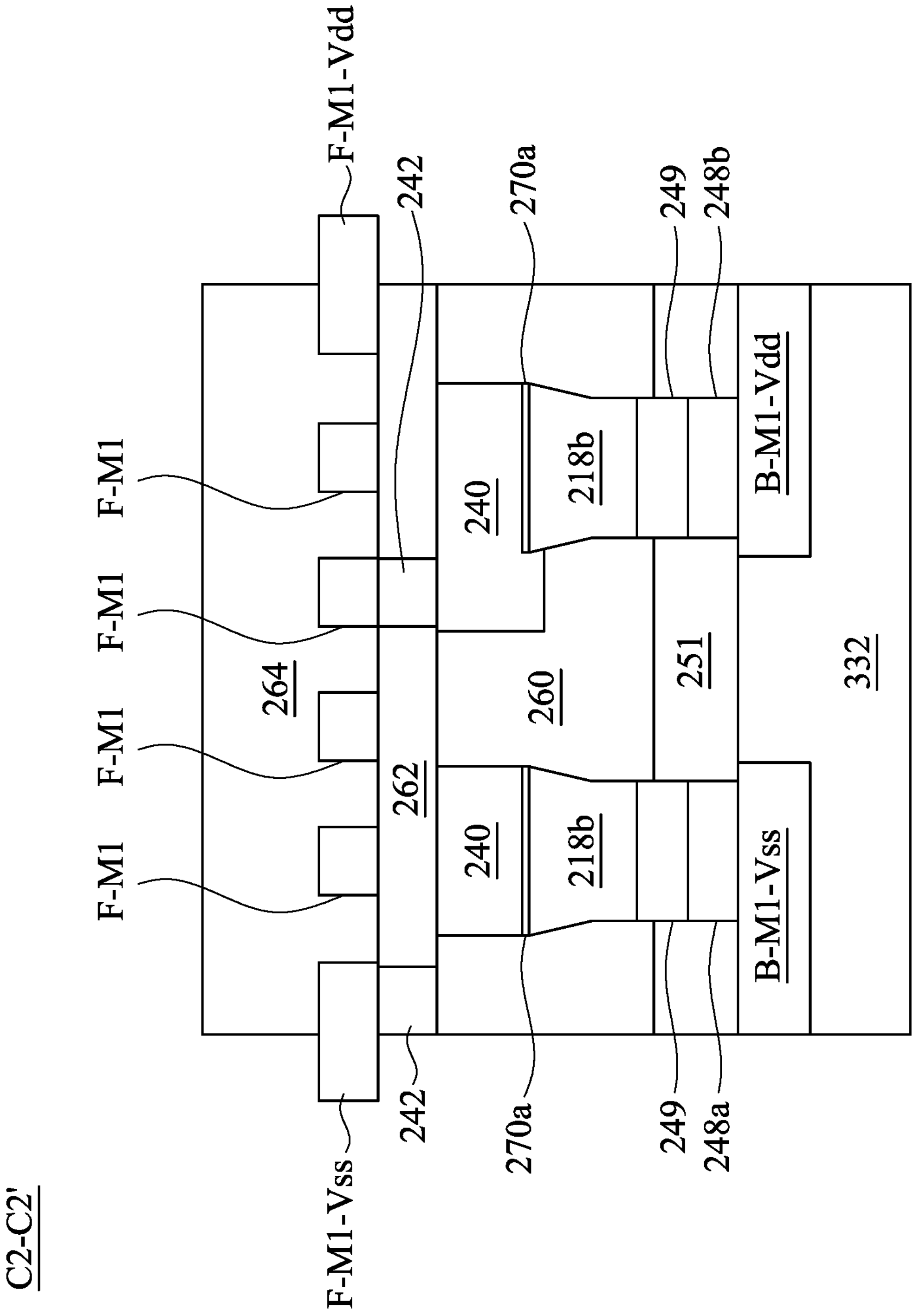
Figure 3C:
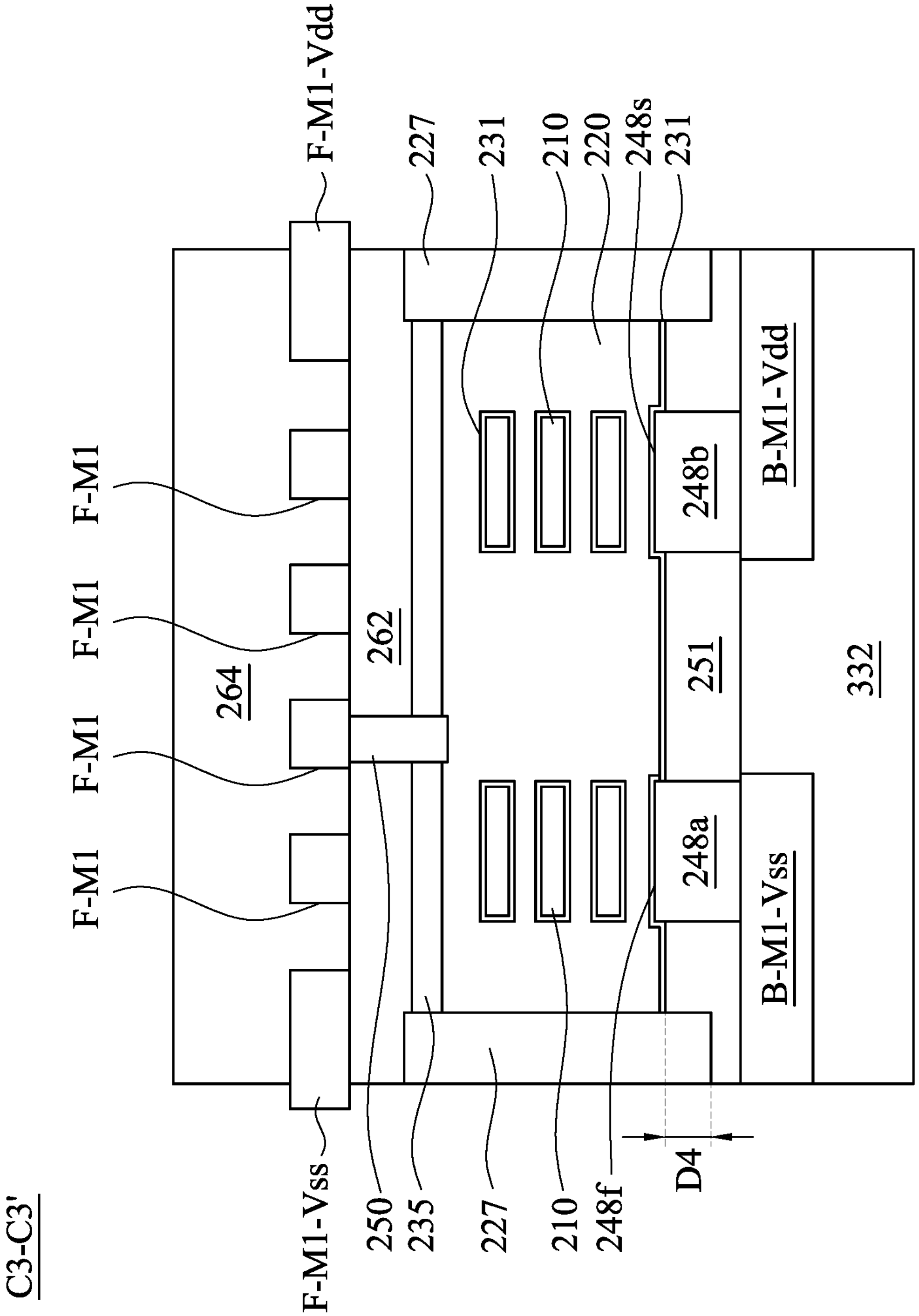
Figure 3D:
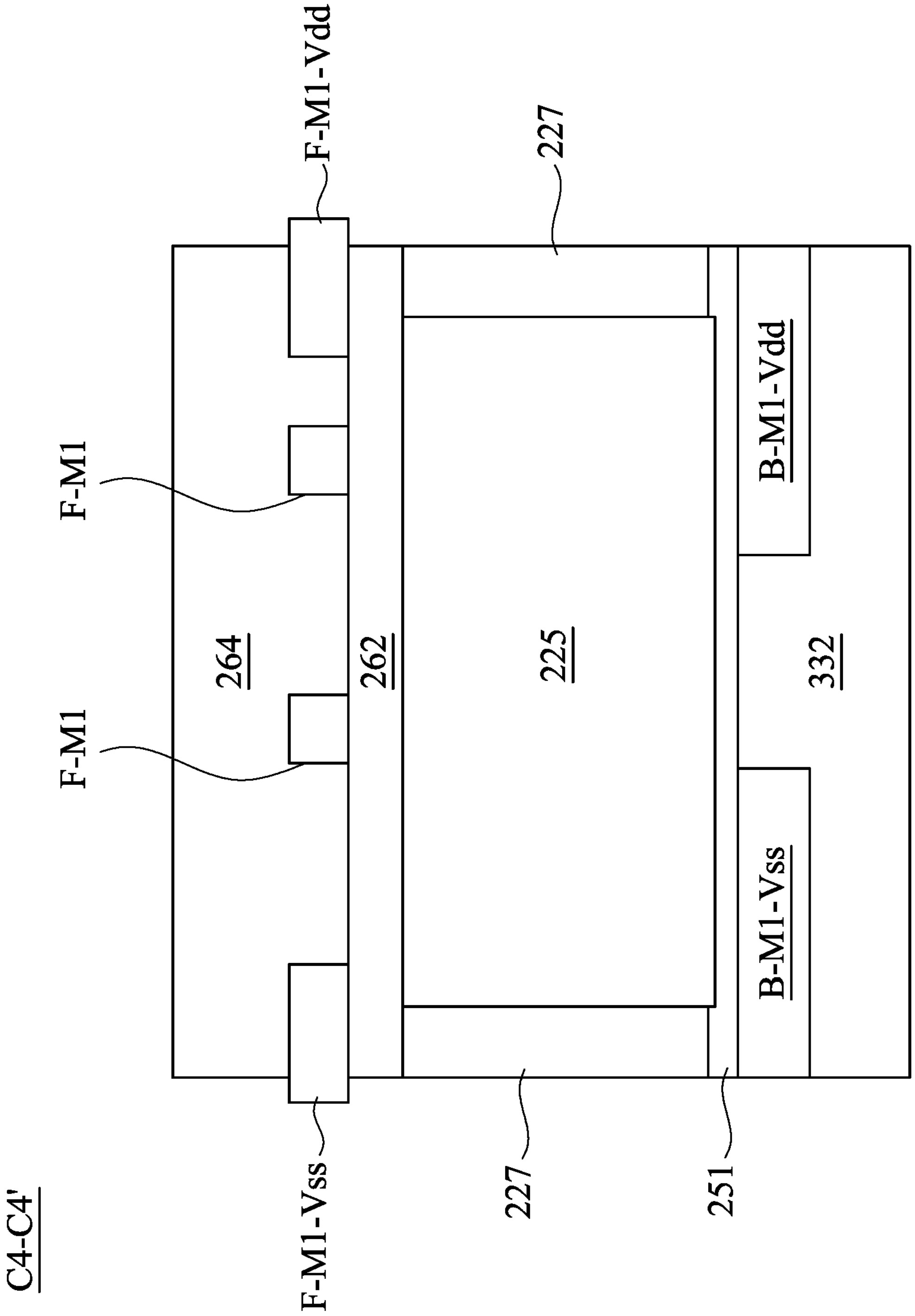
Figure 3E:
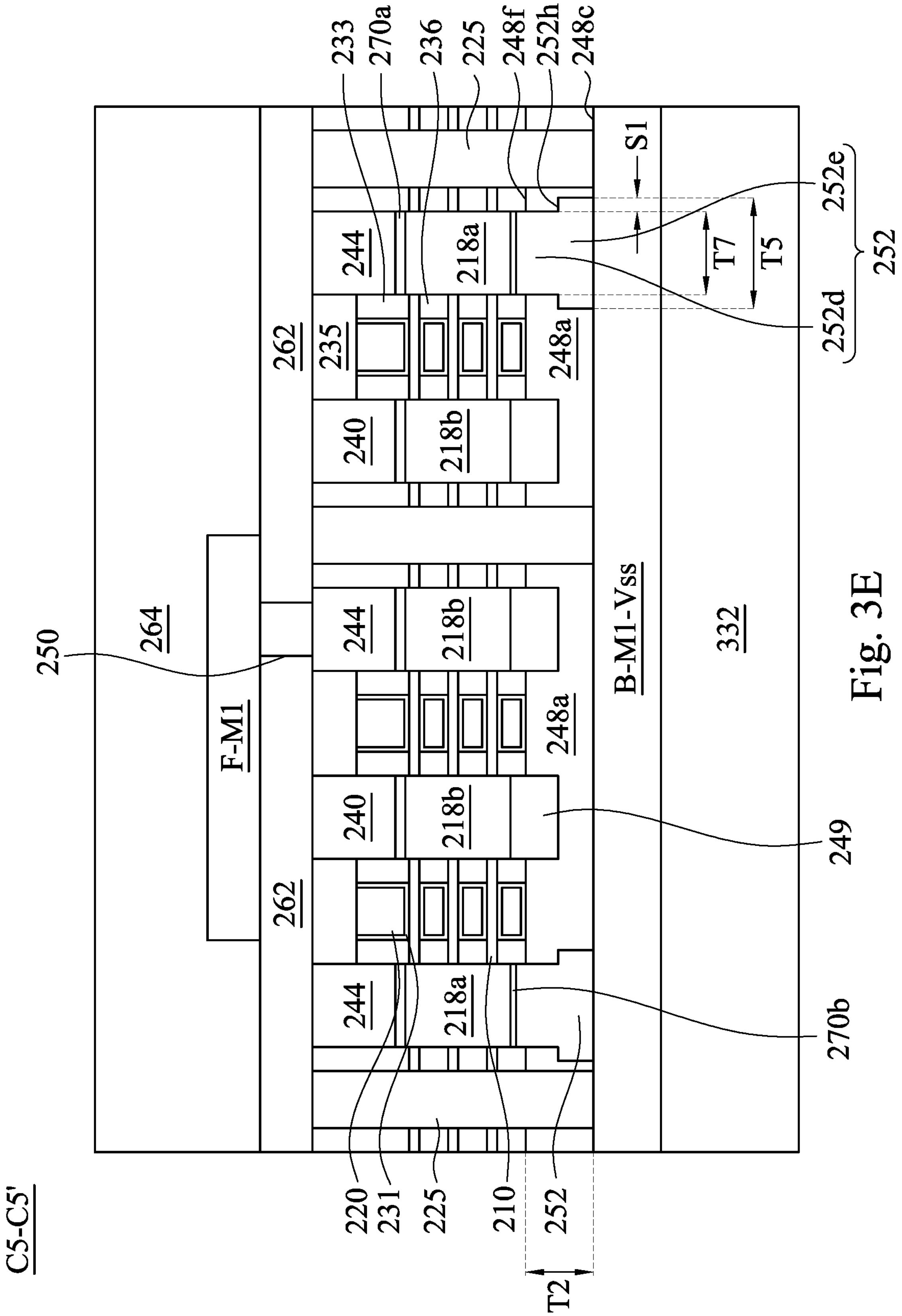
Figure 3F:
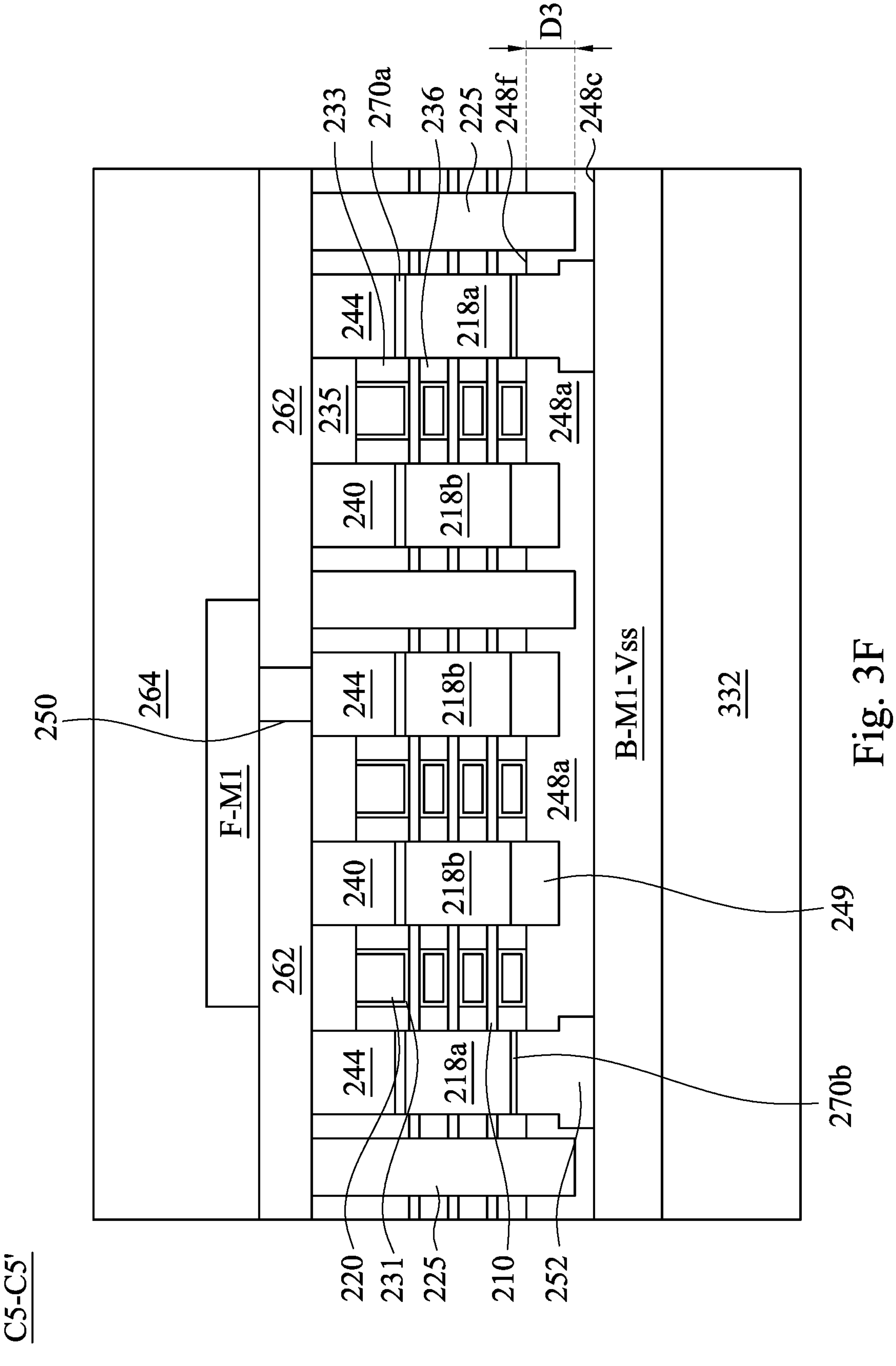
FIGS. 3F and 3I illustrate cross-sectional views of a semiconductor structure corresponding to FIGS. 3E and 3G, respectively, according to some embodiments of the present disclosure.
Figure 3G:
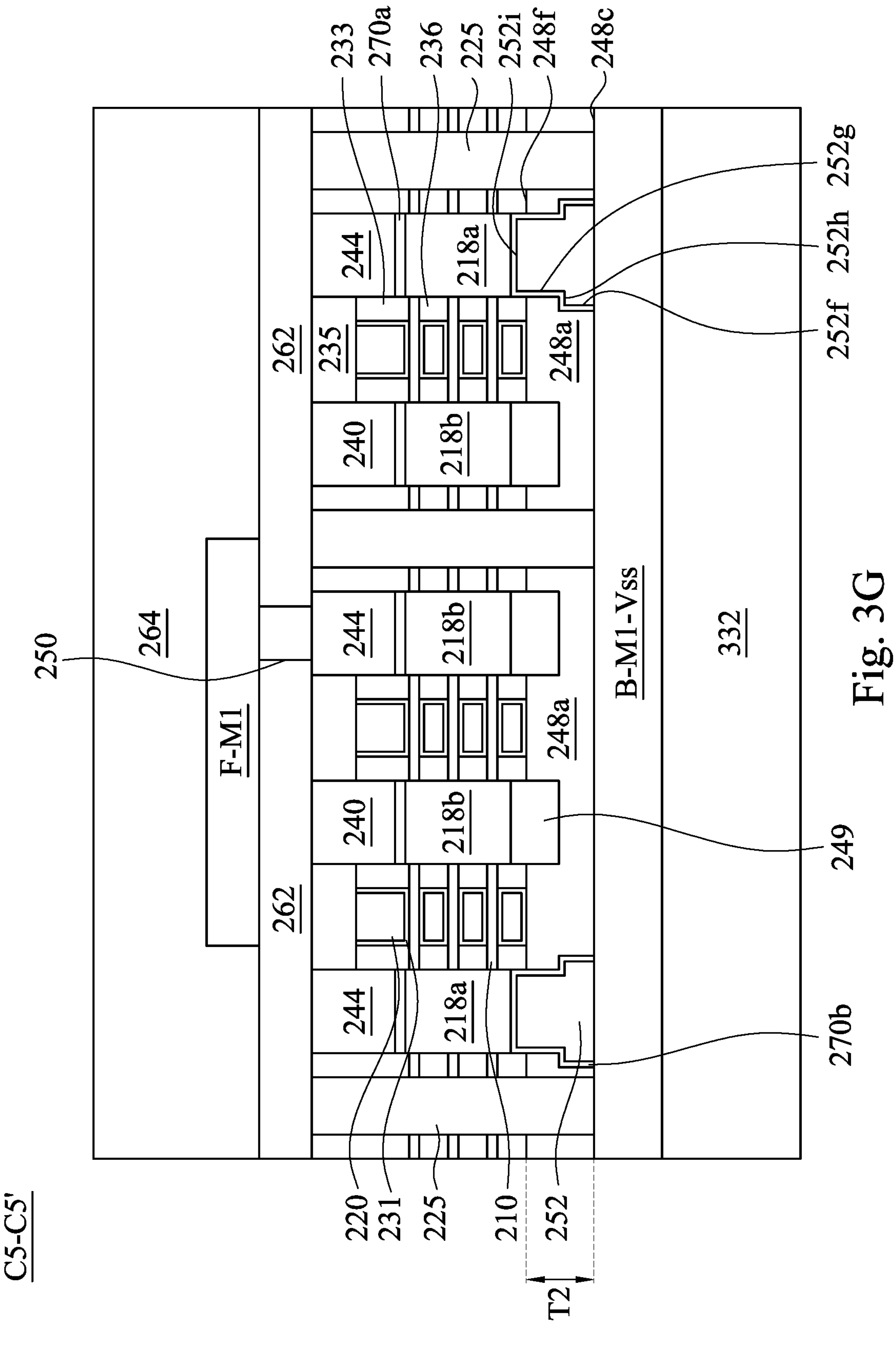
FIGS. 3G and 3J illustrate cross-sectional views of a semiconductor structure corresponding to FIGS. 3E and 3G, respectively, according to some embodiments of the present disclosure.
Figure 3H:
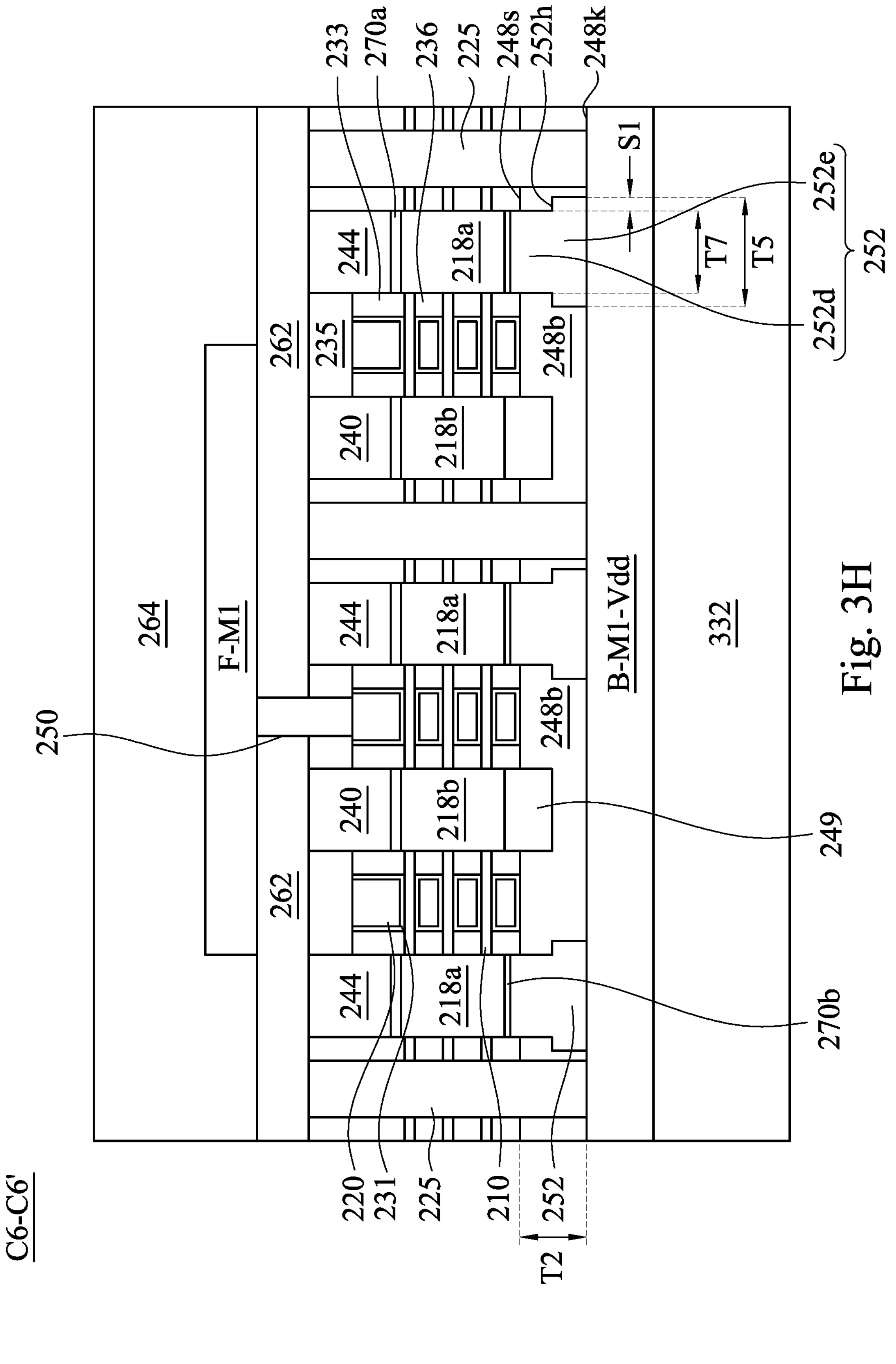

As shown in FIGS. 3E and 3H, the semiconductive layers 248*a* and 248*b* are formed to underlie the semiconductor sheet 210 and extending along a lengthwise direction of the semiconductor sheet 210. Specifically, the semiconductive layer 248*a*/248*b* is formed as a fin-like structure underlying the semiconductor sheet 210. In some embodiment, the semiconductive layer 248*a*/248*b* may be a pure semiconductor layer without dopant. In some embodiment, the semiconductive layer 248*a*/248*b* may be doped with a dopant having a same conductivity type as the source/drain region 218*a* formed subsequently overlying thereof, and the dopant can be either n-type or p-type doping species. In some embodiment, the semiconductive layer 248*a*/248*b* may be doped with a dopant having a different conductivity type than the source/drain region 218*a* formed subsequently overlying thereof, and the dopant can be either n-type or p-type doping species. In some embodiments, the semiconductive layer 248*a*/248*b* overlaps the semiconductor sheet 210 and extends beyond opposite two edge of the semiconductor sheet 210. In some embodiments, the semiconductive layer 248*a*/248*b* extends from one of the dielectric-base gates 225 across the gate electrodes 220 to another one of the dielectric-base gates 225. In some embodiments, the dielectric-base gate 225 penetrates the semiconductive layer 248*a*/248*b* and is in contact with the underlying power supply voltage line B-M1-Vdd/B-M1-Vss. The back-side power supply voltage line B-M1-Vdd/B-M1-Vss are on the back-side 248*c*/248*k* of the semiconductive layer 248*a*/248*b*. In some embodiments, a back-side silicide layer (not shown) is form on a back-side surface of the semiconductive layer 248*a*/248*b*, and the power supply voltage line B-M1-Vdd/B-M1-Vss electrically contacts the semiconductive layer 248*a*/248*b* through the back-side silicide layer. In some embodiments, the semiconductive layer b may have a thickness T2 in a range from about 5 nm to about 100 nm, such as about 5, 10, 20, 30, 40, 50, 60, 70, 80, 90, or 100 nm. In some embodiments, the semiconductive layer 248*a*/248*b* can be interchangeably referred to as a bottom silicon region, a doped silicon layer, a semiconductor strip, a fin, fin structure, or a fin pattern. In FIGS. 3B and 3C, the STI structure 251 is formed to laterally surround the semiconductive layer 248*a*/248*b*. In some embodiments, the STI structure 251 is located between NMOSFET and PMOSFET. In some embodiments, the top surface of the STI structure 251 is coplanar (within process variations) with a front-side surface 248*f*/248*s* of the semiconductive layer 248*a*/248*b*. In some embodiments, the top surface of the STI structure 251 is above or below the front-side surface 248*f*/248*s* of the semiconductive layer 248*a*/248*b*. In some embodiments, the STI structure 251 may separate the features of adjacent devices.

As shown in FIGS. 3E and 3H, the dielectric layers 249 are formed to electrically isolate the Vdd node and Vss node from the underlying semiconductive layers 248*a* and 248*b* and the underlying power supply voltage line B-M1-Vdd/B-M1-Vss. Firstly, a dielectric material (see FIGS. 12A-12C) is selective formed on all of the bottoms 94*b* of the source/drain recess 94 where source/drain regions 218*a* and 218*b* will be subsequently formed thereon. In particular, a selective deposition process may include a deposition step to deposit the dielectric material over the semiconductor sheets 210 and a sputter step to remove the dielectric material deposited on sidewalls of the source/drain recesses 94 and an upper surface above the semiconductor sheets 210, so as to leave the deposited dielectric material on the semiconductive layer 248*a*/248*b*. Subsequently, the source/drain region 218*a*/218*b* (see FIGS. 13A-13C) is formed on the semiconductor sheet 210 and vertically self-aligns with the dielectric layers 249 in the source/drain recess 94. Subsequently, a substrate underlying the semiconductive layers 248*a* and 248*b* of the semiconductor structure may be removed in one or more removing processes from the back-side of the semiconductor structure to expose the STI structure 251 (see FIG. 21A) and the semiconductive layers 248*a*, 248*b* (see FIGS. 21A-21C), in which the STI structure 251 and/or the semiconductive layer 248*a*/248*b* can act as an etch stop layer.

Figure 22A:
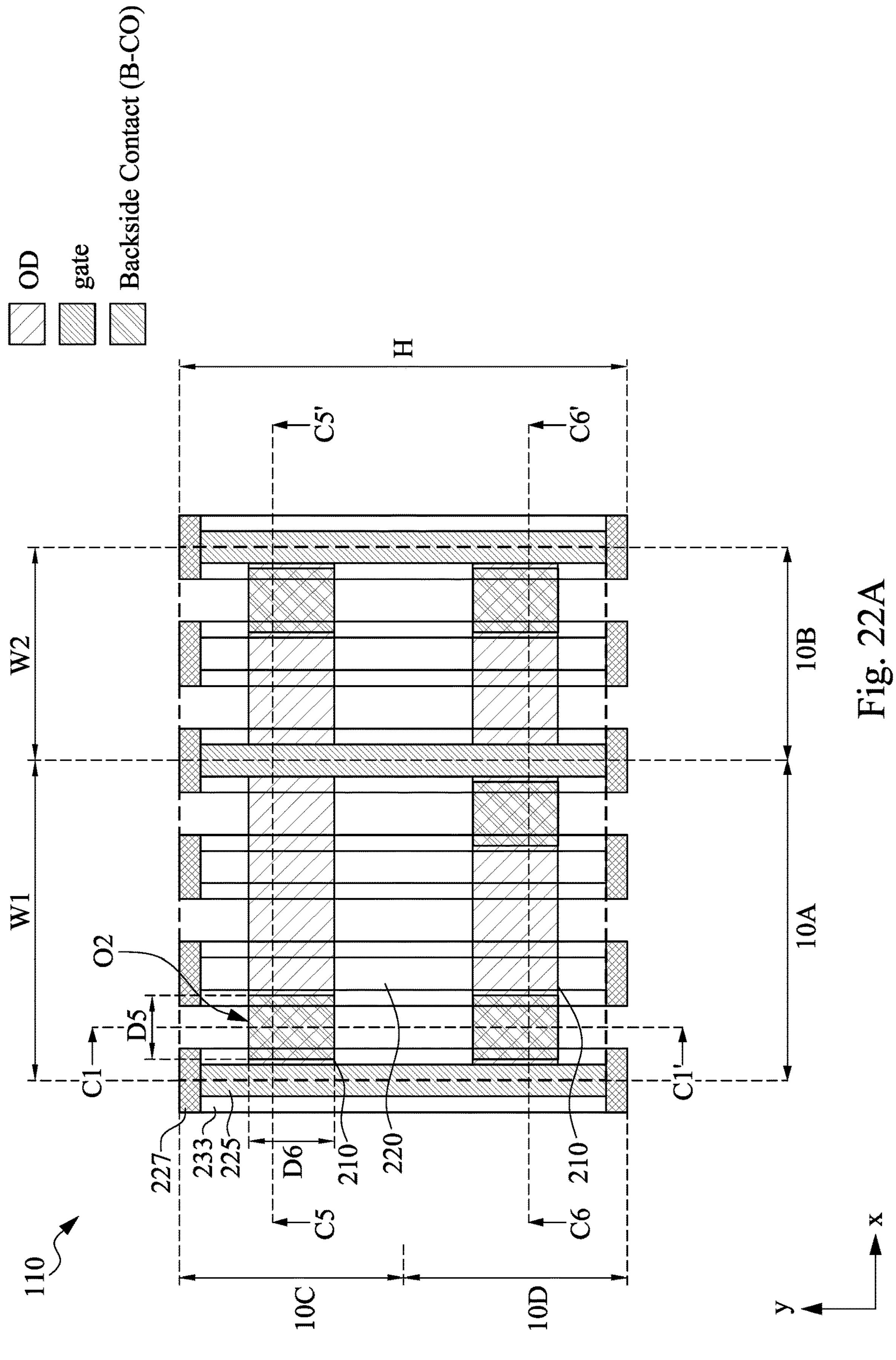
Figure 22B:
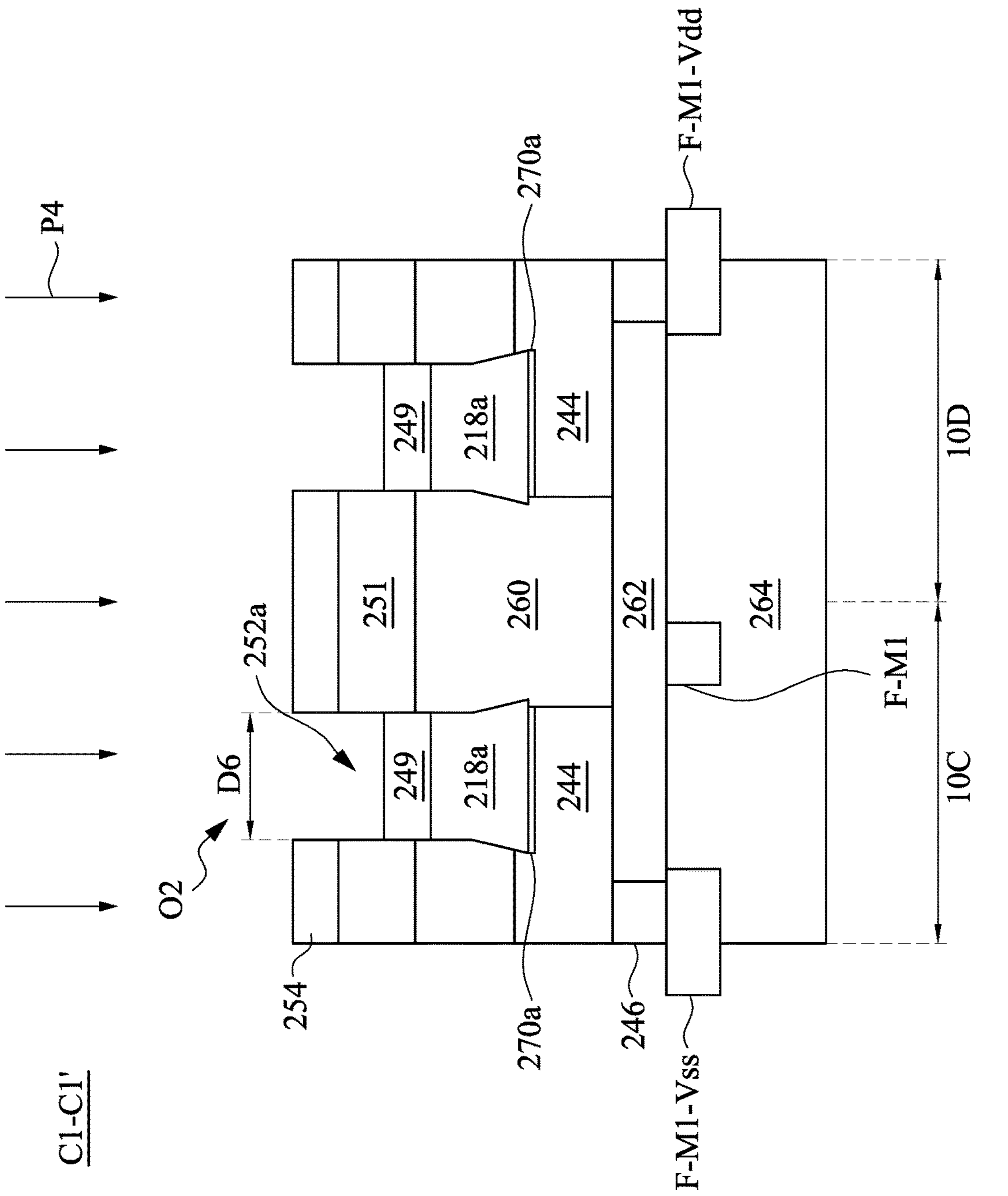
Figure 22C:
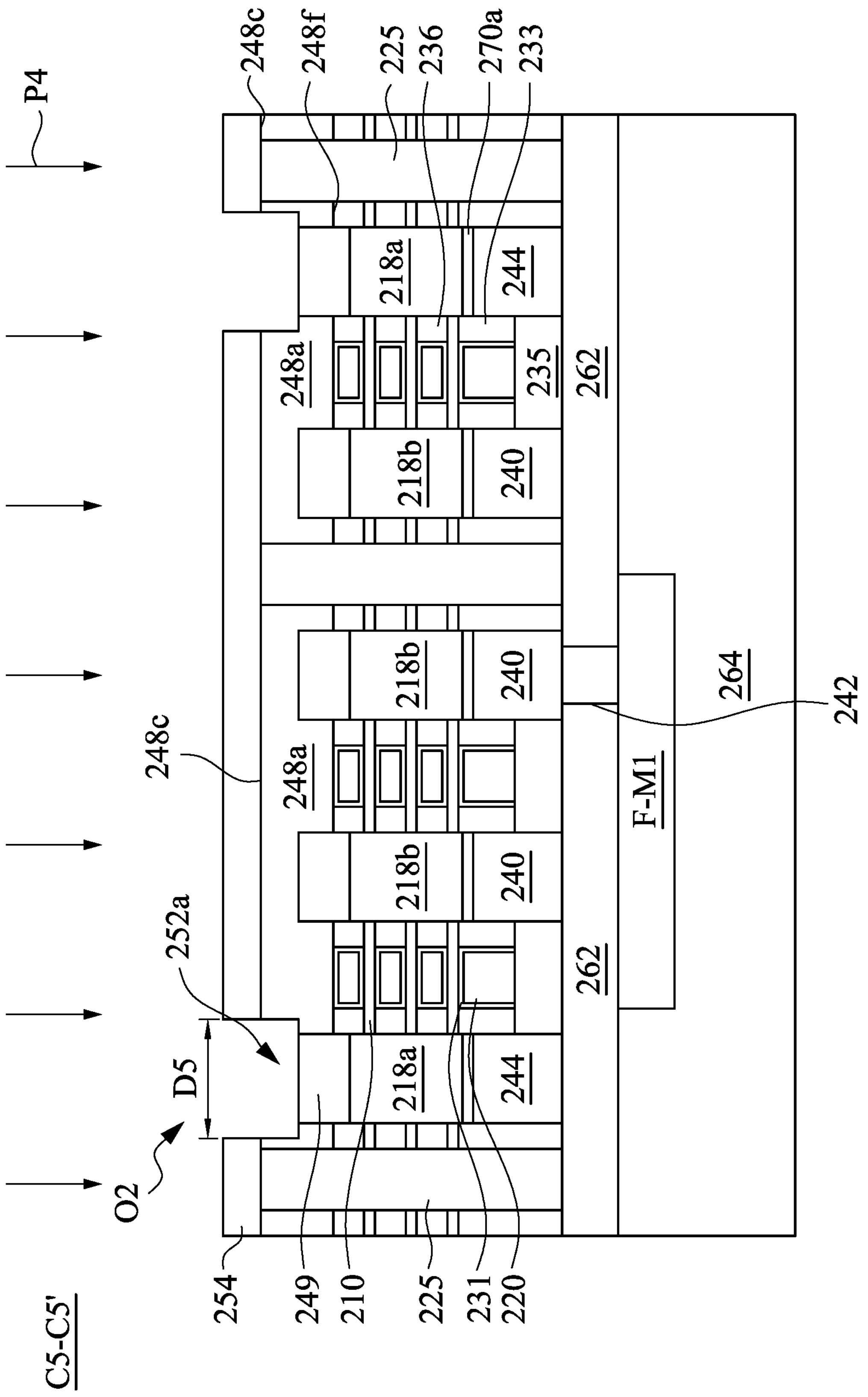
Figure 22D:
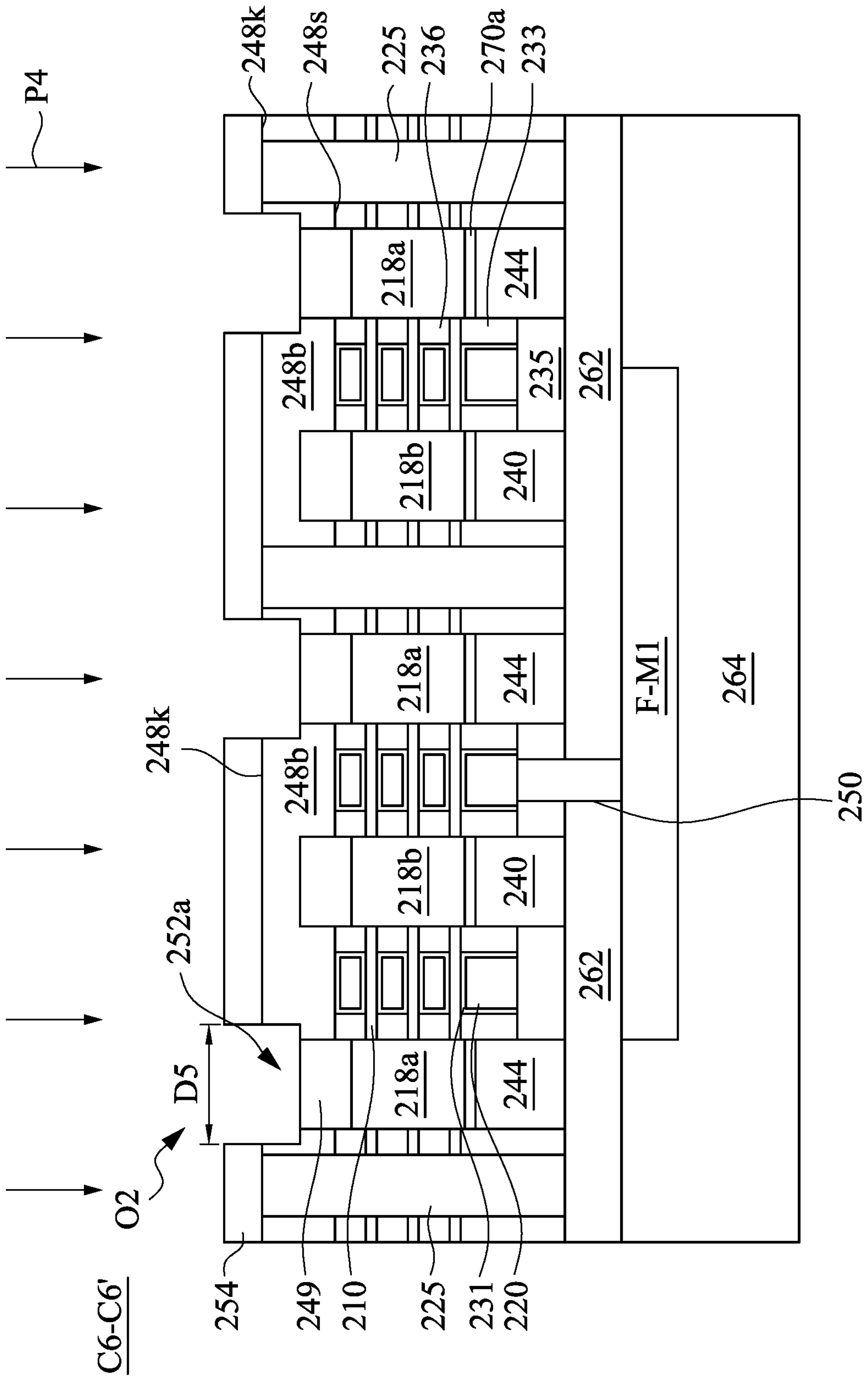

Subsequently, the dielectric layers 249 included in Vdd node and Vss node are removed from the back-side of the semiconductor structure to expose the source/drain regions 218*a*. Firstly, a mask layer 254 (see FIGS. 22B-22D) may be formed over the back-side 248*c*/248*k* of the semiconductive layer 248*a*/248*b*. The mask layer 254 is patterned to have openings O2 (see FIGS. 22B-22D) overlapping the source/drain regions 218a. In some embodiment, the opening O2 (see FIG. 22A) on the mask layer 254 may have a dimension D5 in parallel with a lengthwise direction of the semiconductor sheet 210, and a dimension D6 in parallel with a lengthwise direction of the gate electrode 220 from the top view. As shown in FIGS. 22C and 22D, the dimension D5 of the opening O2 may be greater than a width of the source/drain regions 218a in the lengthwise direction of the semiconductor sheet 210, such that the opening O2 can overlap the gate spacer 233 and/or the gate electrode 220 from the top view. As shown in FIG. 22B, the dimension D6 of the opening O2 may be the same as a width of the semiconductor sheet 210.

Figure 23A:
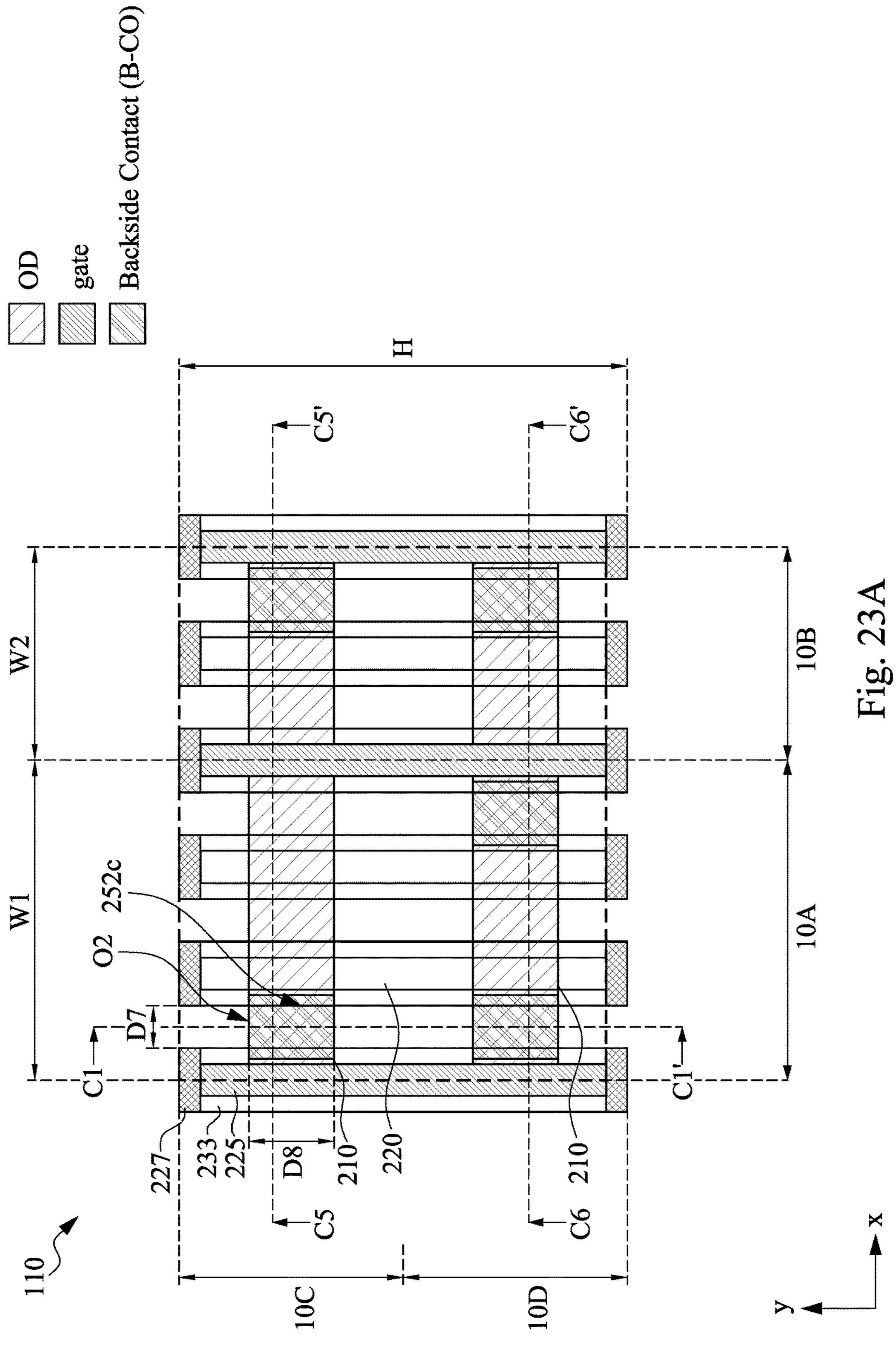
Figure 23B:
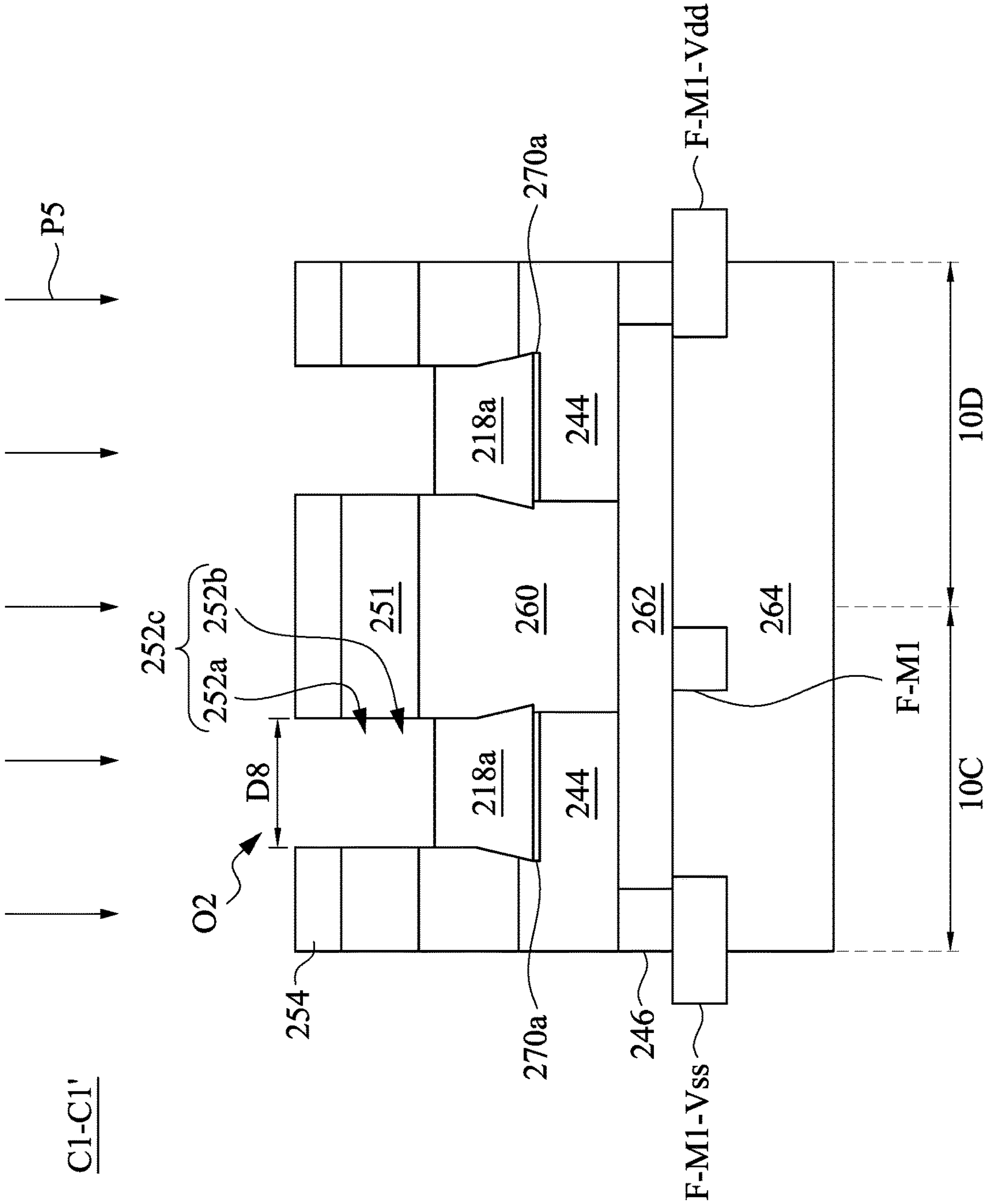
Figure 23C:
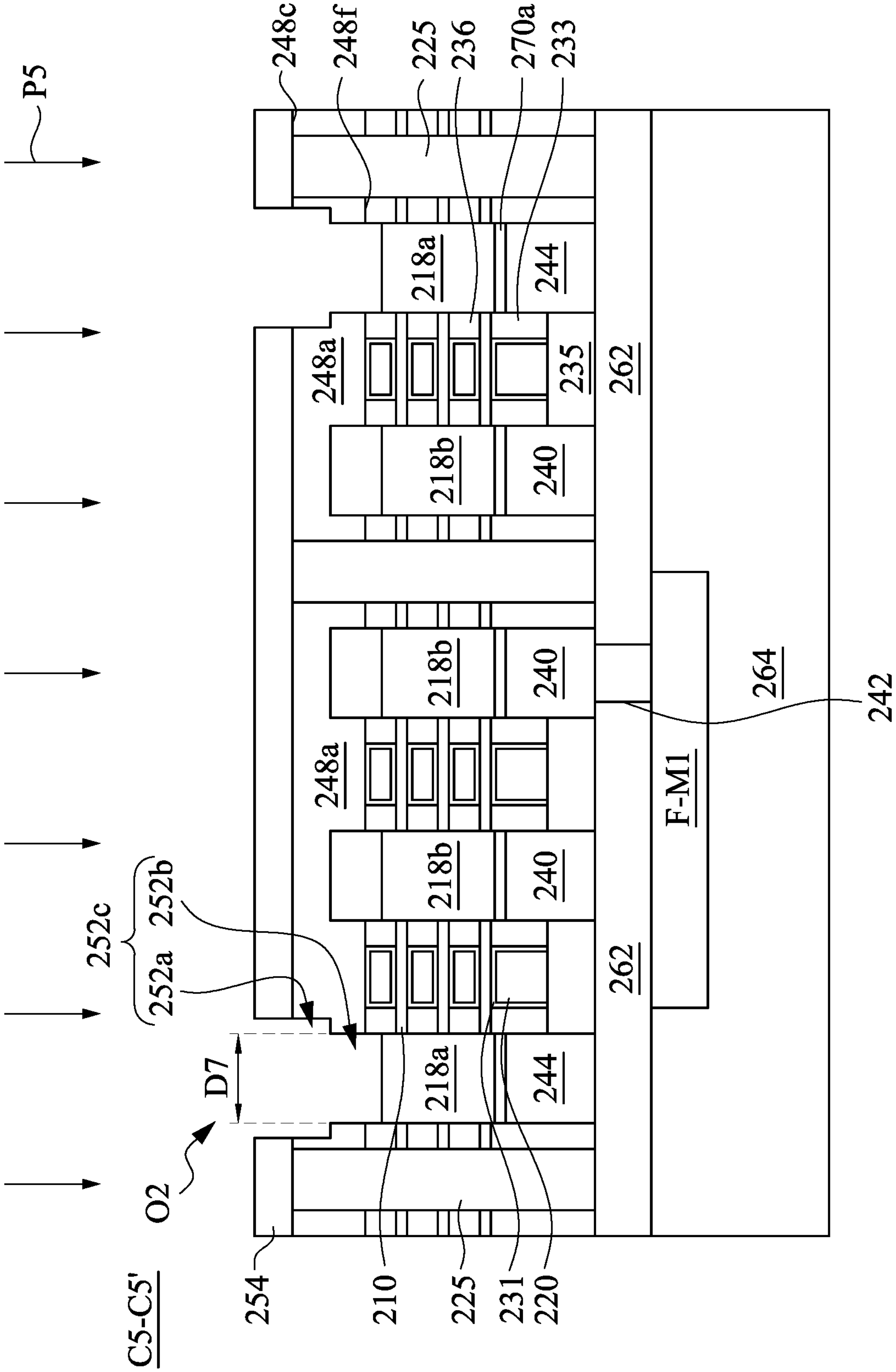
Figure 23D:
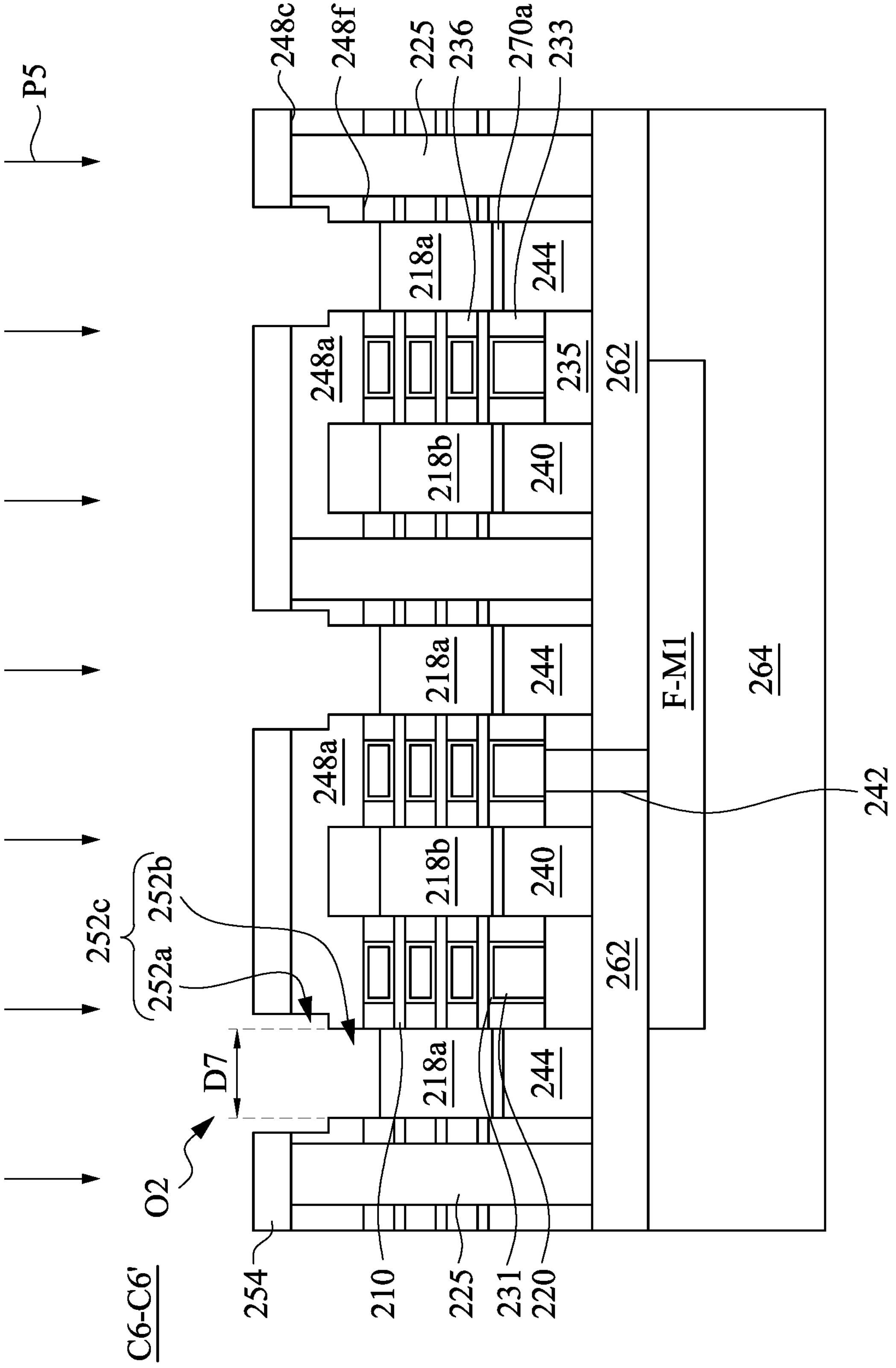

Subsequently, a first etching process P4 (see FIGS. 22B-22D) can be performed through the openings O2 to remove portions of the semiconductive layer 248a/248b to form a back-side subsidiary contact opening 252a in the semiconductive layer 248a/248b, in which the dielectric layer 249 can act as an etch stop layer. In some embodiments, the etching process P4 may be an anisotropic dry etch process, such as a dry etch process (e.g., RIE, a NBE, or the like). In some embodiments, the back-side subsidiary contact opening 252a can have a top view profile inheriting the opening O2. Subsequently, a second etching process P5 (see FIGS. 23B-23D) can be performed through the openings O2 to remove the dielectric layers 249, in which the source/drain regions 218a can act as an etch stop layer, such that a front-side subsidiary contact opening 252b can be formed to inherit the shape of the dielectric layers 249 and self-align with the source/drain regions 218a. In some embodiments, the back-side subsidiary contact opening 252a and the front-side subsidiary contact opening 252b can be collectively referred to as a back-side contact opening 252c.

The front-side subsidiary contact opening 252b (see FIG. 23A) may have a dimension D7 in parallel with the lengthwise direction of the semiconductor sheet 210, and a dimension D8 in parallel with the lengthwise direction of the gate electrode 220 from the top view. The dimension D7 of the front-side subsidiary contact opening 252b may be the same as the width of the source/drain regions 218a in the lengthwise direction of the semiconductor sheet 210, such that the front-side subsidiary contact opening 252b non-overlaps with the gate spacer 233 and/or the gate electrode 220 from the top view. The dimension D8 of the front-side subsidiary contact opening 252b may be the same as a width of the semiconductor sheet 210. The dimension D5 (see FIG. 22A) of the back-side subsidiary contact opening 252a is greater than the dimension D7 (see FIG. 23A) of the front-side subsidiary contact opening 252b. By way of example and not limitation, a ratio of dimension D5 of the back-side subsidiary contact opening 252a to the dimension D7 of the front-side subsidiary contact opening 252b can be greater than about 1.2. In some embodiments, the ratio of dimension D5 of the back-side subsidiary contact opening 252a to the dimension D7 of the front-side subsidiary contact opening 252b can be in a range from about 1.2 to about 3, such as about 1.2, 1.3, 1.4, 1.5, 1.6, 1.7, 1.8, 1.9, 2.0, 2.1, 2.2, 2.3, 2.4, 2.5, 2.6, 2.7, 2.8, 2.9 or 3. In some embodiments, the dimension D6 (see FIG. 22A) of the back-side subsidiary contact opening 252a is substantially the same as the dimension D8 (see FIG. 23A) of the front-side subsidiary contact opening 252b.

In some embodiments, the etching process P5 (see FIGS. 23B-23D) may be an anisotropic dry etch process, such as a dry etch process (e.g., RIE, a NBE, or the like) and may employ a different etchant than that used in the etching process P4 (see FIGS. 22B-22D). In some embodiments, the dielectric layers 249 may be made of a material that has a high etching selectivity relative to the source/drain regions 218a, STI structure 251, and the gate spacer 233. For example, the etching selectivity, which is the ratio of the etching rate of the dielectric layer 249 to the source/drain region 218a, STI structure 251, and/or the gate spacer 233, is greater than about 10 when the dielectric layers 249 are etched. By way of example and not limitation, the dielectric layer 249 may be made of an oxide-containing material (e.g., $SiO_2$), a nitrogen-containing material (e.g., SiON, SiN, $Si_3N_4$), a carbon-containing material (e.g., SiOC, SIOCN), the like, or combinations thereof. In some embodiments, the dielectric layer 249 may be made of a material having a dielectric constant greater than about 7.9 (e.g., high dielectric constant (high-k) material). For example, the dielectric layer 249 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. After the formation of back-side contact opening 252a, the mask layer 254 can be removed with a wet clean process, an ashing process, or the like.

Subsequently, the contact 252 (see FIGS. 3A, 3E and 3H) is formed in the contact opening 252c, and the source/drain region 218a can be electrically connected to the back-side metal line (e.g., power supply voltage lines B-M1-Vss, B-M1-Vdd) through the contact 252 acting a power conductor path. Because the front-side subsidiary contact opening 252b of the contact opening 252c (see FIGS. 23B-23D) can be formed to inherit the shape of the dielectric layer 249 (see FIGS. 22B-22D) directly underlying the source/drain regions 218a, the contact 252 (see FIGS. 24A-24C) formed in the contact opening 252c can self-align with the source/drain regions 218a and on the back-side 218k of the source/drain region 218a. Therefore, the contact 252 can be interchangeably referred to as a self-aligned connection structure, and the intermediate stages in the formation of the semiconductor structure shown in FIGS. 12A-13C and 22A-24C can be referred to as a self-aligned contact process. Specifically, the contact 252 has a front-side portion 252d (see FIGS. 24A-24C) formed in the front-side subsidiary contact opening 252b and a back-side portion 252e (see FIGS. 24A-24C) formed in the back-side contact opening 252a.

As shown in FIGS. 3A, 3E, and 3H, the contact 252 can penetrate through the STI structure 251 when viewed in the cross section as shown in FIG. 3A and penetrate through the semiconductive layer 248a/248b when viewed in the cross section as shown in FIG. 3E or FIG. 3H. In addition, the contact 252 can be a stepped sidewall structure (e.g., two step shape) having a back-side sidewall 252f, a front-side sidewall 252g laterally set back from the back-side sidewall 252f, and a horizontal surface 252h connecting the back-side sidewall 252f to the front-side sidewall 252g. The back-side portion 252e of the contact 252 may have a dimension T5 (see FIGS. 3E and 3H) in parallel with a lengthwise direction of the semiconductor sheet 210, and a dimension T6 (see FIG. 3A) in parallel with a lengthwise direction of the gate electrode 220 from the top view. The dimension T5 of the back-side portion 252e of the contact 252 may be greater than a width of the source/drain regions 218a in the lengthwise direction of the semiconductor sheet 210, such that the back-side portion 252e of the contact 252 can overlap the gate spacer 233 and/or the gate electrode 220 from the top view. The dimension T6 of the back-side portion 252e of the contact 252 may be the same as a width of the semiconductor sheet 210. The front-side portion 252*d* of the contact 252 (see FIGS. 3E and 3H) may have a dimension T7 in parallel with the lengthwise direction of the semiconductor sheet 210, and a dimension T8 in parallel with the lengthwise direction of the gate electrode 220. The dimension T7 of the front-side subsidiary contact opening 252*b* may be the same as the width of the source/drain regions 218*a* in the lengthwise direction of the semiconductor sheet 210, such that the front-side portion 252*d* of the contact 252 non-overlaps with the gate spacer 233 and/or the gate electrode 220. The dimension T8 of the front-side subsidiary contact opening 252*b* may be the same as a width of the semiconductor sheet 210.

An interface between the back-side portion 252*e* and the front-side portion 252*d* of the contact 252 has an extension jog (e.g., horizontal surface 252*h*), such that the back-side portion 252*e* and the front-side portion 252*d* of the contact 252 have different lateral dimensions. In some embodiments, the back-side portion 252*e* of the contact 252 is wider than the front-side portion 252*d* of the contact 252 in the lengthwise direction of the semiconductor sheet 210. In other words, the front-side portion 252*d* of the contact 252 is narrower than the back-side portion 252*e* of the contact 252 in the lengthwise direction of the semiconductor sheet 210. Specifically, the dimension T5 of the back-side portion 252*e* of the contact 252 is greater than the dimension T7 of the front-side portion 252*d* of the contact 252. By way of example and not limitation, a ratio of dimension T5 of the back-side portion 252*e* of the contact 252 to the dimension T7 of the front-side portion 252*d* of the contact 252 can be greater than about 1.3. By way of example and not limitation, the dimension T5 of the back-side portion 252*e* of the contact 252 may be in a range from about 13 nm to about 50 nm, such as about 13, 15, 20, 25, 30, 35, 40, 45, or 50 nm. The dimension T7 of the front-side portion 252*d* of the contact 252 may be in a range from about 9 nm to about 20 nm, such as about 9, 10, 11, 12, 13, 14, 15, 16, 17, 18, 19, or 20 nm. In some embodiments, the dimension T6 of the back-side portion 252*e* of the contact 252 is substantially the same as the dimension T8 of the front-side portion 252*d* of the contact 252. In some embodiments, the front-side portion 252*d* of the contact 252 can have a front-side surface 252*i* in a position higher than the front-side surface 251*f* of the STI structure 251 (see FIG. 3A) and the front-side surface 248*f*/248*s* of the semiconductive layer 248*a*/248*b* (see FIGS. 3E and 3H). In some embodiments, the horizontal surface 252*h* of the contact 252 may have a length S1 (see FIGS. 23C and 23D) greater than about 2 nm. By way of example and not limitation, the length S1 (e.g., length) of the horizontal surface 252*h* of the contact 252 can be in a range from about 2 nm to about 10 nm, such as about 2, 3, 4, 5, 6, 7, 8, 9, or 10 nm.

In the course of IC evolution, functional density (i.e., the number of interconnected devices per chip area) has generally increased while geometry size (i.e., the smallest component (or line) that can be created using a fabrication process) has decreased. However, the smaller and more dense the metal lines in the IC structure will result in worse resistant thereof, thereby wasting processing power and processing speed during the operation of the IC structure. For example, in a cell routing of the IC structure, Vdd and Vss power routing may occupy too many routing resources and therefore impact the cell scaling as well as the performance of the IC structure (e.g., RC delay or IR drop). Hence, a part of power lines and power conductive contacts are moved to wafer back-side, so as to reduce the routing loading and improve the circuit density in a same chip area. Nevertheless, the power conductive contact on the wafer back-side may not be aligned with the source/drain region when forming thereof, which in turn non-overlaps with the source/drain region and/or overlaps with the gate, such that an unwanted connection may occur and therefore impacts the performance of IC structure. In some embodiments, the power conductive contact can be interchangeably referred to the back-side contact 252.

Therefore, the present disclosure in various embodiments provides a metal line routing method to improve the functional density and operation performance on the IC structure. Because the back-side contact 252 (i.e., power conductive contact) can be formed to inherit the location of the dielectric layer 249 directly underlying the source/drain region 218*a*, the back-side contact 252 can self-align with the source/drain region 218*a* to connect the source/drain region 218*a* to the back-side power metal layers (e.g., power supply voltage line Vdd/Vss). Therefore, an isolation margin issue of the back-side contact 252 to gate electrode 220 can be solved, which in turn allows for scaling the contacted poly pitch (CPP). In addition, because the back-side contact 252 can have a back-side portion 252*e* having wider width D5 than the front-side portion thereof (e.g., stepped sidewall structure) to connect the back-side power metal layers, an improved contact resistance between the source/drain region 218*a* and the back-side power metal layers can be achieved. Furthermore, the power conductor path including the source/drain region 218*a* and the semiconductive layer 248*a*/248*b* doped with a same dopant as the source/drain region 218*a* can save an extra strap area (i.e., an area for connecting back-side metal to front-side metal) and hence additional connection process and cost, and thus a functional density of the IC structure can be improved. Moreover, the power mesh (e.g., power supply voltage line B-M1-Vdd/B-M1-Vss) in the wafer back-side can be located at a lower level metal layer (e.g., back-side M1 level), and thus the IC structure can have a more robustness power mesh in the cell region.

In some embodiments, a front-side silicide layer 270*a* can be formed between the source/drain contacts 240 and the source/drain regions 218*b* and/or between the power supply voltage contacts 244 and the source/drain regions 218*a* for Rc reduction. In some embodiments, a back-side silicide layer 270*b* can be formed between the back-side contact 252 and the source/drain regions 218*a* for Rc reduction. In some embodiments, a metal silicidation process can be performed on the source/drain region 218*a*/218*b* to form the silicide layer 270*a*/270*b*. The metal silicidation process is to make a reaction between metal and silicon (or polycrystalline silicon). In some embodiments, a metal layer is formed on the source/drain region 218*a*/218*b*. Subsequently, regarding the metal silicidation process, a first rapid thermal annealing (RTA) process may be performed in, for example, Ar, He, N2 or other inert atmosphere at a first temperature, such as lower than 200~300° C., to convert the deposited metal layer into metal silicide. This is followed by an etching process to remove the unreacted metal layer from. The etching process may include a wet etch, a dry etch, and/or a combination thereof. As an example, the etchant of the wet etching may include a mixed solution of $H_2SO_4$, $H_2O_2$, $H_2O$, and/or other suitable wet etching solutions, and/or combinations thereof. Then, a second annealing or RTA step at a second temperature higher than the first temperature, such as 400~500° C., thereby forming a silicide layer 270*a*/270*b* with low resistance. In some embodiments, the silicide layer 270*a*/270*b* may include titanium silicide (TiSi), $TiSi_2$, nickel silicide (NiSi), PtSi, MoSi, $MOSi_2$, cobalt silicide (CoSi), $CoSi_2$, Ni—Pt, or combinations thereof.

Throughout the description, the notations of metal lines may be followed by the metal line levels they are in, wherein the respective metal line level is placed in parenthesis. As shown in FIG. 2B, metal lines disposed at the M1 level on the back-side of the semiconductor structure may include the power supply voltage lines B-M1-Vdd, and B-M1-Vss. The metal lines disposed at the M1 level on the back-side of the semiconductor structure may have lengthwise directions parallel to the X-direction (e.g., column direction) and perpendicular to a lengthwise direction of the gate electrode layer 220. In some embodiments, the power supply voltage line B-M1-Vss/B-M1-Vdd disposed at the M1 level on the back-side of the semiconductor structure can be interchangeably referred to a power supply voltage landing pad or a power supply voltage landing line. In some embodiments, the lines can be interchangeably referred to metal layers, conductive lines, conductive layers, or conductors. The back-side power supply voltage line B-M1-Vdd/B-M1-Vss is electrically connected to the front-side power supply voltage line F-M1-Vdd/F-M1-Vss through the back-side contact 252, the source/drain region 218*a* (see FIGS. 3A, 3E, and 3H), the front-side power supply voltage contact 244, and the front-side conductive via 246. In some embodiments, the back-side power supply voltage line B-M1-Vdd/B-M1-Vss and the back-side contact 252 can be either single damascene scheme or dual damascene scheme. In some embodiments, the back-side power supply voltage line B-M1-Vdd/B-M1-Vss may be made of a same material as the back-side contact 252. In some embodiments, the back-side power supply voltage line B-M1-Vdd/B-M1-Vss may be made of a different material than the back-side contact 252. In some embodiments, materials of the power supply voltage lines F-M1, F-M1-Vdd, F-M1-Vss, B-M1-Vdd, B-M1-Vss, the conductive vias 242, 246, and/or the contacts 240, 244 of the semiconductor structure may be made of Cu, Co, Ru, Pt, Al, W, Ti, TaN, TiN, Molybdenum (Mo), Ruthenium (Ru), Iridium (Ir), rhodium (Rh), or any combinations thereof. In some embodiments, the back-side power supply voltage line B-M1-Vdd/B-M1-Vss has a length in a range from about 200 nm to about 200 μm.

In some embodiments, the semiconductor structure can further includes conductive lines (e.g. power supply voltage line VDD/VSS) at the M2 level on the back-side of the semiconductor structure and extending along a direction perpendicular to the lengthwise direction of the back-side power supply voltage line B-M1-Vdd/B-M1-Vss. The power supply voltage line (e.g., Vdd) at the M2 level on the back-side of the semiconductor structure can be electrically connected to the back-side power supply voltage line B-M1-Vdd, and the power supply voltage line (e.g., Vss) at the M2 level on the back-side of the semiconductor structure can be electrically connected to the back-side power supply voltage line B-M1-Vss.

In some embodiments, PMOSFET including $P^+$ doped (e.g., boron) source/drain region 218*a* is upon a p-type semiconductive layer 248*b*, and NMOSFET including $N^+$ doped (e.g., phosphorus) source/drain region 218*a* is upon an n-type semiconductive layer 248*a*. This is described in greater detail with reference to FIG. 3E, the semiconductive layers 248*a* in the first conductivity type device region 10C have a same conductivity type as the source/drain regions 218*a* in the first conductivity type device region 10C. By way of example but not limiting the present disclosure, if the source/drain region 218*a* in the first conductivity type device region 10C is formed with an n-type dopant, the semiconductive layer 248*a* is dopant with the n-type dopant. In some embodiments, the semiconductive layer 248*a* in the first conductivity type device region 10C may include SiP, SiC, SiPC, SiAs, Si, or a combination thereof. In some embodiments, the semiconductive layer 248*a* in the first conductivity type device region 10C may have a phosphorus concentration within a range from about $5\times10^{16}$ atoms/$cm^3$ to about $1\times10^{19}$ atoms/$cm^3$. With reference to FIG. 3H, the semiconductive layers 248*b* in the second conductivity type device region 10D have a same conductivity type as the source/drain regions 218*a* in the second conductivity type device region 10D. By way of example but not limiting the present disclosure, if the source/drain region 218*a* in the second conductivity type device region 10D is formed with a p-type dopant, the semiconductive layer 248*b* is dopant with the p-type dopant. In some embodiments, the semiconductive layer 248*b* in the second conductivity type device region 10D may include boron, $BF_2$, or a combination thereof. In some embodiments, the semiconductive layer 248*b* in the second conductivity type device region 10D may have a boron concentration within a range from about $5\times10^{16}$ atoms/$cm^3$ to about $1\times10^{19}$ atoms/$cm^3$.

In some embodiments, PMOSFET including $P^+$ doped (e.g., boron) source/drain region 218*a* is upon an n-type semiconductive layer 248*b*, and NMOSFET including $N^+$ doped (e.g., phosphorus) source/drain region 218*a* is upon an p-type semiconductive layer 248*a*. This is described in greater detail with reference to FIG. 3E, the semiconductive layers 248*a* in the first conductivity type device region 10C have an opposite conductivity type to the source/drain regions 218*a* in the first conductivity type device region 10C. By way of example but not limiting the present disclosure, if the source/drain region 218*a* in the first conductivity type device region 10C is formed with an n-type dopant, the semiconductive layer 248*a* is dopant with the p-type dopant. In some embodiments, the semiconductive layer 248*a* in the first conductivity type device region 10C may include boron, $BF_2$, or a combination thereof. In some embodiments, the semiconductive layer 248*a* in the first conductivity type device region 10C may have a boron concentration within a range from about $5\times10^{16}$ atoms/$cm^3$ to about $1\times10^{19}$ atoms/$cm^3$. With reference to FIG. 3H, the semiconductive layers 248*b* in the second conductivity type device region 10D have an opposite conductivity type to the source/drain regions 218*a* in the second conductivity type device region 10D. By way of example but not limiting the present disclosure, if the source/drain region 218*a* in the second conductivity type device region 10D is formed with a p-type dopant, the semiconductive layer 248*b* is dopant with the n-type dopant. In some embodiments, the semiconductive layer 248*b* in the second conductivity type device region 10D may include SiP, SiC, SiPC, SiAs, Si, or a combination thereof. In some embodiments, the semiconductive layer 248*b* in the second conductivity type device region 10D may have a phosphorus concentration within a range from about $5\times10^{16}$ atoms/$cm^3$ to about $1\times10^{19}$ atoms/$cm^3$.

In FIGS. 2A, 2B, 3C, 3D, and 3L, dielectric regions 227 are formed on opposite ends of the gate electrode layers 220. In some embodiments, each dielectric region 227 is a gate-cut structure for the gate structure, and the gate-cut structure is formed by a cut metal gate (CMG) process. In some embodiments, the dielectric region 227 may be made of dielectric material, such as $SiO_2$, $Si_3N_4$, SiON, SiOC, SiOCN base dielectric material, or combinations thereof. In some embodiments, the dielectric region 227 may be made of an oxide, a nitride-based material, such as $Si_3N_4$, SiON, or a carbon-based material, such as SiC, SiOC, SiOCN, or combinations thereof. In some embodiments, the dielectric region 227 may be made of a material having a dielectric constant greater than about 9 (e.g., high dielectric constant (high-k) material). For example, the dielectric region 227 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof.

In FIGS. 2A, 2B, 3E, 3H, and 3K, gate spacers 233 are formed on the sidewalls of the gate electrode layers 220. In some embodiments, the gate spacer 233 may be made of silicon nitride or silicon oxynitride, although any suitable material, such as low-dielectric constant (low-k) materials having a k-value less than about 3.5, may be utilized. In FIGS. 3E and 3H, inner spacers 236 can act as isolation features and may be formed between the source/drain regions 218*a* and 218*b* and the gate electrode layers 220. In some embodiments, the inner spacers 236 can be interchangeably referred to lower gate spacers. In some embodiments, the inner spacers 236 may have a lateral dimension in a range from about 4 nm to about 12 nm. In some embodiments, the inner spacers 236 may be made of silicon nitride or silicon oxynitride, although any suitable material, such as low-dielectric constant (low-k) materials having a k-value less than about 3.5, may be utilized. In some embodiments, the inner spacers 236 may be air gaps. In some embodiments, the inner spacer 236 may have a higher K (dielectric constant) value than the gate spacer 233. In FIGS. 3C, 3E, 3H, and 3K, hard mask layers 235 are formed over the gate electrode layers 220. In some embodiments, the hard mask layer 235 can be interchangeably referred to a gate top dielectric. In some embodiments, the hard mask layer 235 is made of a different material than the dielectric region 227. In some embodiments, the hard mask layer 235 may be made of dielectric material, such as $SiO_2$, $Si_3N_4$, SiON, SiOC, SiOCN base dielectric material, or combinations thereof.

In FIGS. 3A, 3B, 3K, and 3L, an inter-layer dielectric (ILD) layer 260 is formed between the gate electrode layers 220 and over the source/drain regions 218*a* and 218*b*. An ILD layer 262 is formed over the hard mask layers 235 and the ILD layer 260 and laterally surrounds the gate vias 250 and the source/drain vias 242. An inter-metal dielectric (IMD) layer 264 is formed over the ILD layer 262 and can provide electrical insulation as well as structural support for the various features therein, such as the metal line F-M1, the power supply voltage lines F-M1-Vdd, F-M1-Vss. In some embodiments, the ILD layer 260, the ILD layer 262, and/or the IMD layer 264 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

In FIGS. 3A-3E, 3H, 3K, and 3L, an IMD layer 332 are deposited over the NMOSFET and PMOSFET. The power supply voltage lines B-M1-Vdd, B-M1-Vss are formed in the IMD layer 332. The IMD layer 332 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, the like, or combinations thereof, which may be formed by a chemical vapor deposition (CVD) process, such as high density plasma CVD (HDP-CVD), flowable chemical vapor deposition (FCVD), the like, or a combination thereof.

Figure 3I:
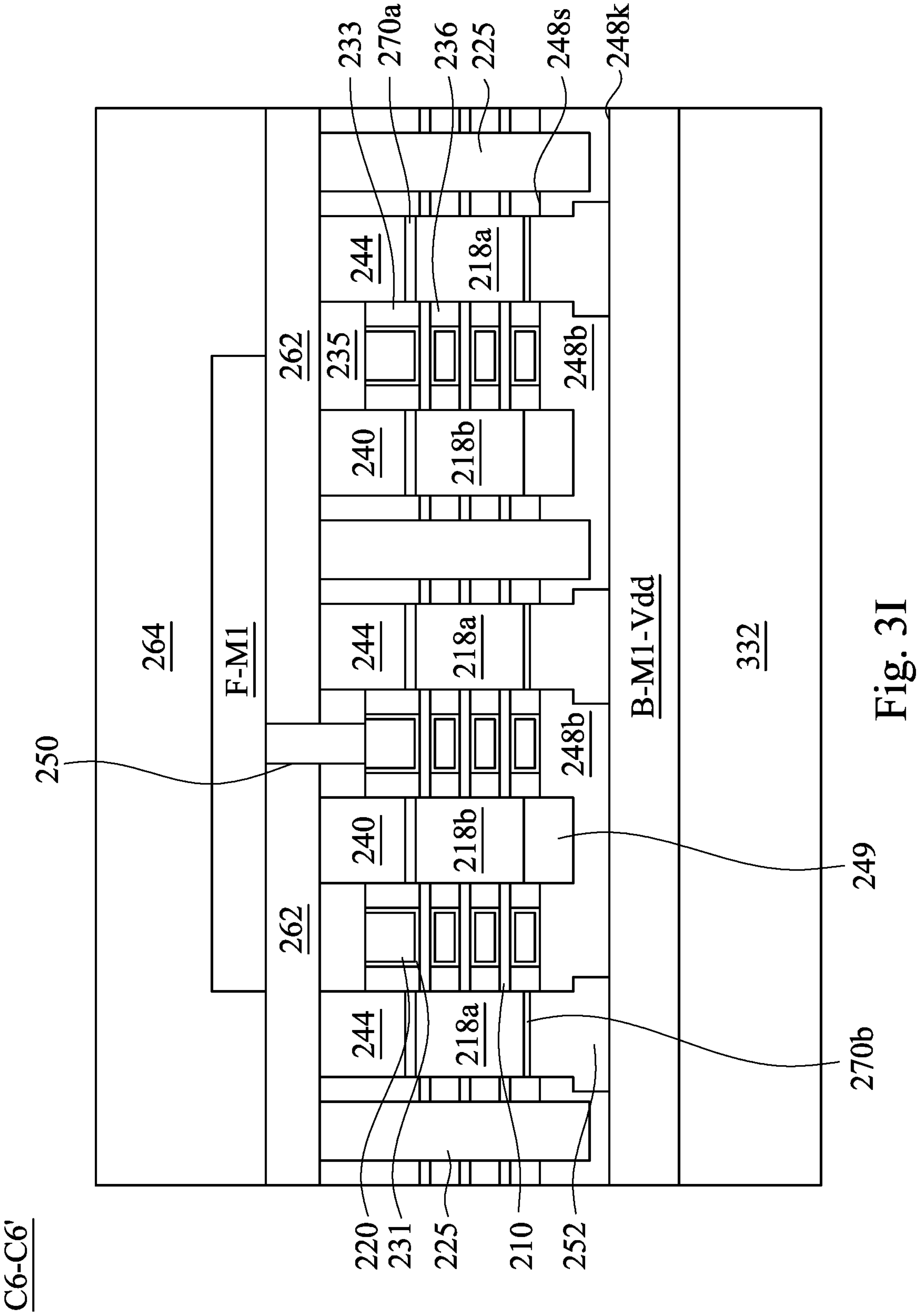

Reference is made to FIGS. 3F and 3I. FIGS. 3F and 3I illustrate cross-sectional views of a semiconductor structure corresponding to FIGS. 3E and 3G, respectively, according to some embodiments of the present disclosure, in which the semiconductive layers 248*a* and 248*b* are partially broken by the dielectric-base gates 225. While FIGS. 3F and 3I show an embodiment of the semiconductor structure with a different metal line routing method than the semiconductor structure in FIGS. 2A, 2B, 3A-3E, 3H, 3K, and 3L. In addition, the present disclosure may repeat reference numerals and/or letters in the various examples. This repetition is for the purpose of simplicity and clarity and does not in itself dictate a relationship between the various embodiments and/or configurations discussed. It is noted that, the difference between the present embodiment and the embodiment in FIGS. 2A, 2B, 3A-3E, 3H, 3K, and 3L is in that the semiconductive layer 248*a*/248*b* is partially broken by the dielectric-base gates 225, not fully broken by the dielectric-base gates 225. The dielectric-base gates 225 can have a vertical dimension D3 in the semiconductive layer 248*a*/248*b* about 2 nm to about 10 nm, such as about 2, 3, 4, 5, 6, 7, 8, 9, or 10 nm. The semiconductive layer 248*a*/248*b* laterally extends across the gate electrodes 220 and the dielectric-base gates 225. A back-side of the dielectric-base gate 225 is inlaid in the semiconductive layer 248*a*/248*b*. A first portion of the semiconductive layer 248*a*/248*b* underlying the dielectric-base gate 225 has a thicker thickness than a thickness of a second portion of the semiconductive layer 248*a*/248*b* underlying the dielectric layer 249.

Figure 3J:
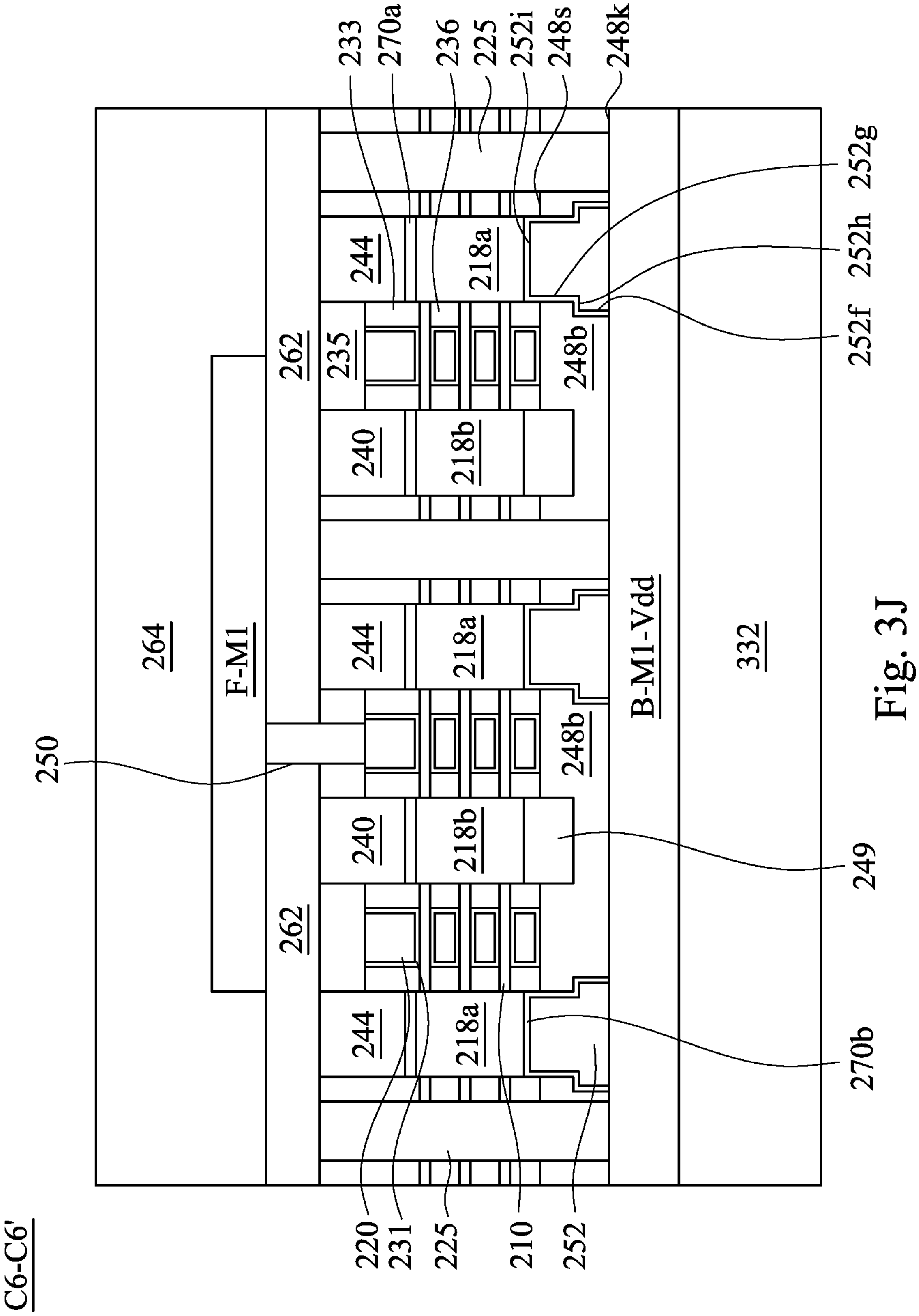
Figure 3K:
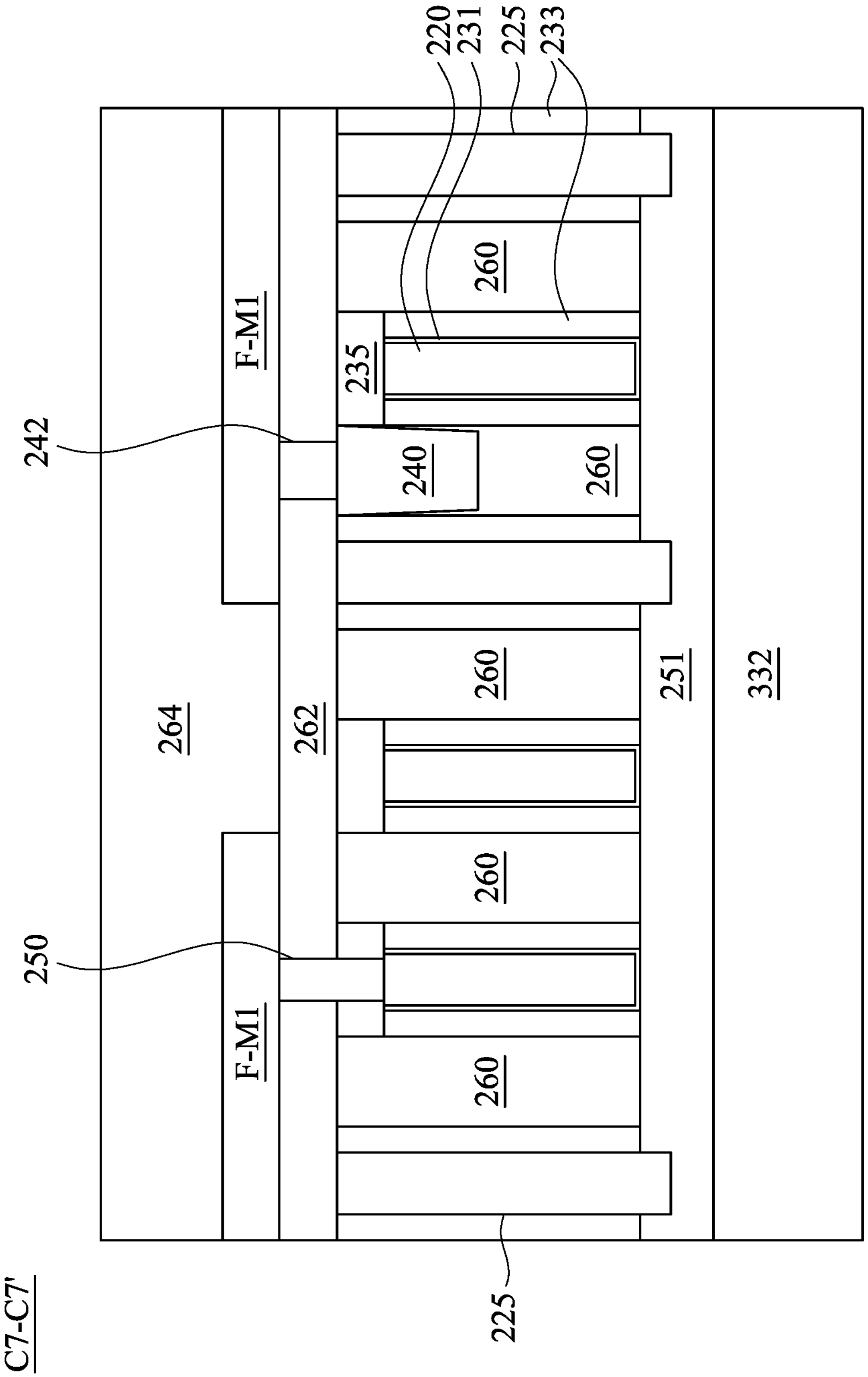
Figure 3L:
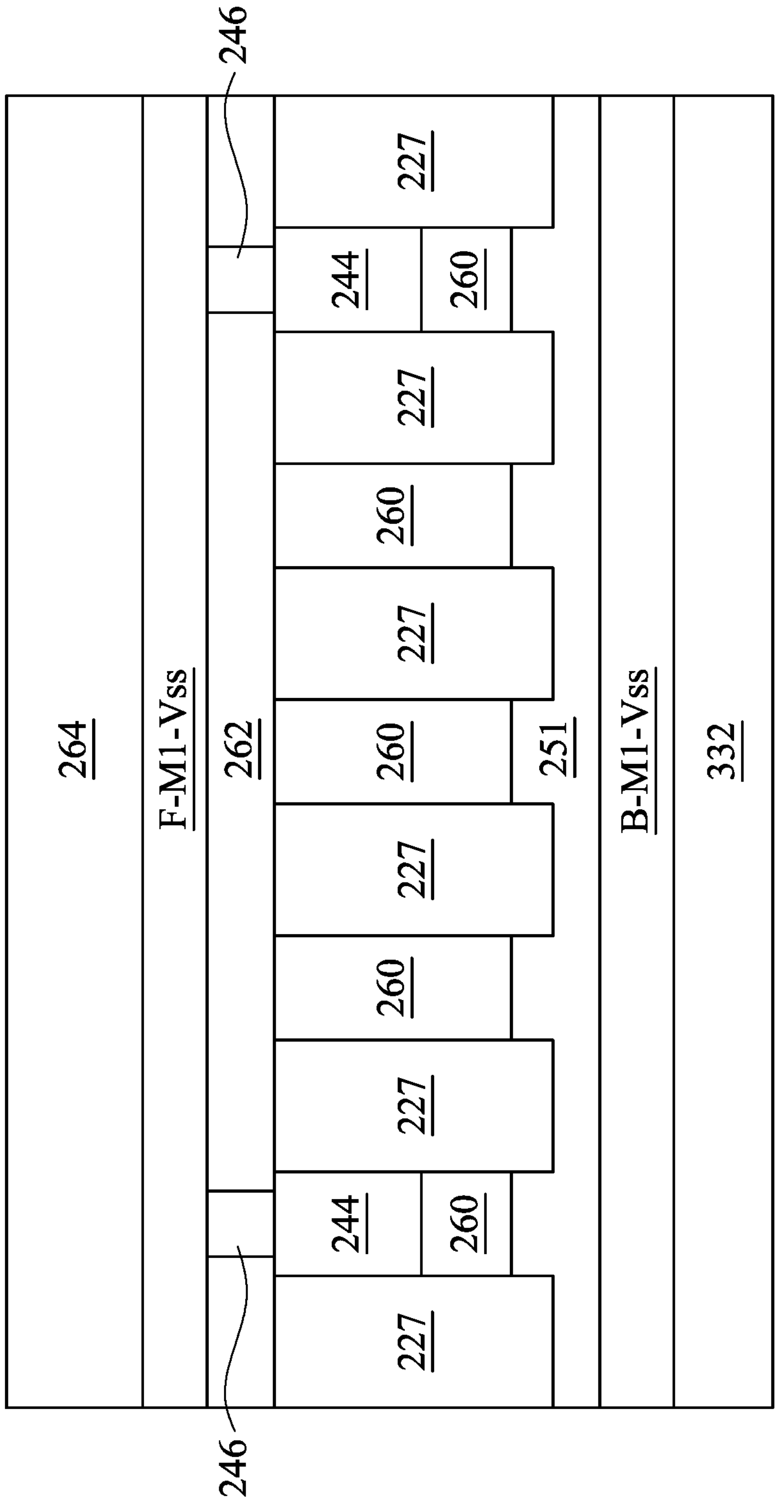

Reference is made to FIGS. 3G and 3J. FIGS. 3G and 3J illustrate cross-sectional views of a semiconductor structure corresponding to FIGS. 3E and 3G, respectively, according to some embodiments of the present disclosure, in which the back-side silicide layer 270*b* is formed between the back-side contact 252 and the source/drain regions 218*a* and further formed to line a sidewall of the back-side contact 252. In addition, the present disclosure may repeat reference numerals and/or letters in the various examples. This repetition is for the purpose of simplicity and clarity and does not in itself dictate a relationship between the various embodiments and/or configurations discussed. It is noted that, the difference between the present embodiment and the embodiment in FIGS. 2A, 2B, 3A-3E, 3H, 3K, and 3L is in that the back-side silicide layer 270*b* is further formed on the sidewall of the back-side contact 252. Specifically, the back-side silicide layer 270*b* is formed on the back-side sidewall 252*f*, the front-side sidewall 252*g*, the horizontal surface 252*h*, and a front-side surface 252*i* of the contact 252. In some embodiments, the back-side silicide layer 270*b* may be further formed on the back-side 248*c*/248*k* of the semiconductive layer 248*a*/248*b*. In some embodiments, a metal silicidation process can be performed on the back-side of the semiconductor structure to form the back-side silicide layer 270*b* at least on a sidewall the back-side contact opening 252*c* prior to forming the contact 252. The metal silicidation process is to make a reaction between metal and silicon (or polycrystalline silicon). In some embodiments, a metal layer can formed at least on the source/drain region 218*a* and the sidewall of the back-side contact opening 252*c* (see FIGS. 23B-23D). Subsequently, regarding the metal silicidation process, a first rapid thermal annealing (RTA) process may be performed in, for example, Ar, He, $N_2$ or other inert atmosphere at a first temperature, such as lower than 200~300° C., to convert the deposited metal layer into metal silicide. This is followed by an etching process to remove the unreacted metal layer from. The etching process may include a wet etch, a dry etch, and/or a combination thereof. As an example, the etchant of the wet etching may include a mixed solution of $H_2SO_4$, $H_2O_2$, $H_2O$, and/or other suitable wet etching solutions, and/or combinations thereof. Then, a second annealing or RTA step at a second temperature higher than the first temperature, such as 400~500° C., thereby forming the back-side silicide layer 270*b* with low resistance. In some embodiments, the back-side silicide layer 270*b* may include titanium silicide (TiSi), nickel silicide (NiSi), cobalt silicide (CoSi), Ni—Pt, or combinations thereof.

Reference is made to FIGS. 4A, 4C, 4E-4G, 4J, 4M, and 4N. FIGS. 4A, 4C, 4E-4G, 4J, 4M, and 4N illustrate cross-sectional views of a semiconductor structure corresponding to FIGS. 3A-3E, 3G, 3I, and 3J, respectively, according to some embodiments of the present disclosure. While FIGS. 4A, 4C, 4E-4G, 4J, 4M, and 4N show an embodiment of the semiconductor structure with a different metal line routing method than the semiconductor structure in FIGS. 2A, 2B, 3A-3E, 3H, 3K, and 3L. In addition, the present disclosure may repeat reference numerals and/or letters in the various examples. This repetition is for the purpose of simplicity and clarity and does not in itself dictate a relationship between the various embodiments and/or configurations discussed. It is noted that, the difference between the present embodiment and the embodiment in FIGS. 2A, 2B, 3A-3E, 3H, 3K, and 3L is in that a back-side dielectric layer 331 is formed between the STI structure 251 and the back-side power supply voltage lines B-M1-Vdd/B-M1-Vss. The back-side contact 252 further penetrates through the back-side dielectric layer 331 to the power supply voltage line B-M1-Vss/B-M1-Vdd. In some embodiments, the back-side dielectric layer 331 can have a thickness T9 (see FIG. 4A) in a range from about 3 nm to about 100 nm, such as about 3, 4, 5, 6, 7, 8, 9, 10, 20, 30, 40, 50, 60, 70, 80, 90, or 100 nm. In some embodiments, the back-side dielectric layer 331 may be made of dielectric material, such as $SiO_2$, $Si_3N_4$, SiON, SiOC, SiOCN base dielectric material, or combinations thereof. In some embodiments, the back-side dielectric layer 331 may be made of an oxide, a nitride-based material, such as $Si_3N_4$, SiON, or a carbon-based material, such as SiC, SiOC, SiOCN, or combinations thereof. In some embodiments, the back-side dielectric layer 331 may be made of a material having a dielectric constant greater than about 9 (e.g., high dielectric constant (high-k) material). For example, the back-side dielectric layer 331 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof.

Reference is made to FIGS. 4B, 4D, 4H, and 4K. FIGS. 4B, 4D, 4H, and 4K illustrate cross-sectional views of a semiconductor structure corresponding to FIGS. 4A, 4C, 4G, and 4J, respectively, according to some embodiments of the present disclosure, in which a dielectric layer is formed to line the sidewall of the back-side contact 252. In addition, the present disclosure may repeat reference numerals and/or letters in the various examples. This repetition is for the purpose of simplicity and clarity and does not in itself dictate a relationship between the various embodiments and/or configurations discussed. It is noted that, the difference between the present embodiment and the embodiment in FIGS. 4A, 4C, 4E-4G, 4J, 4M, and 4N is in that the dielectric layer 335 is further formed on the sidewall of the back-side contact 252. Specifically, the dielectric layer 335 is formed on the back-side sidewall 252*f* (see FIGS. 4H and 4K), the front-side sidewall 252*g* (see FIGS. 4H and 4K), and the horizontal surface 252*h* (see FIGS. 4H and 4K) of the contact 252. In some embodiments, the dielectric layer 335 may be further formed on the back-side 248*c*/248*k* of the semiconductive layer 248*a*/248*b*. In some embodiments, the dielectric layer 335 may be made of a same material as the back-side dielectric layer 331. In some embodiments, the dielectric layer 335 may be made of a different material than the back-side dielectric layer 331. In some embodiments, the back-side dielectric layer 331 may be made of dielectric material, such as $SiO_2$, $Si_3N_4$, SiON, SiOC, SiOCN base dielectric material, or combinations thereof. In some embodiments, the back-side dielectric layer 331 may be made of an oxide, a nitride-based material, such as $Si_3N_4$, SiON, or a carbon-based material, such as SiC, SiOC, SiOCN, or combinations thereof. In some embodiments, the back-side dielectric layer 331 may be made of a material having a dielectric constant greater than about 9 (e.g., high dielectric constant (high-k) material). For example, the back-side dielectric layer 331 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof.

Figure 4A:
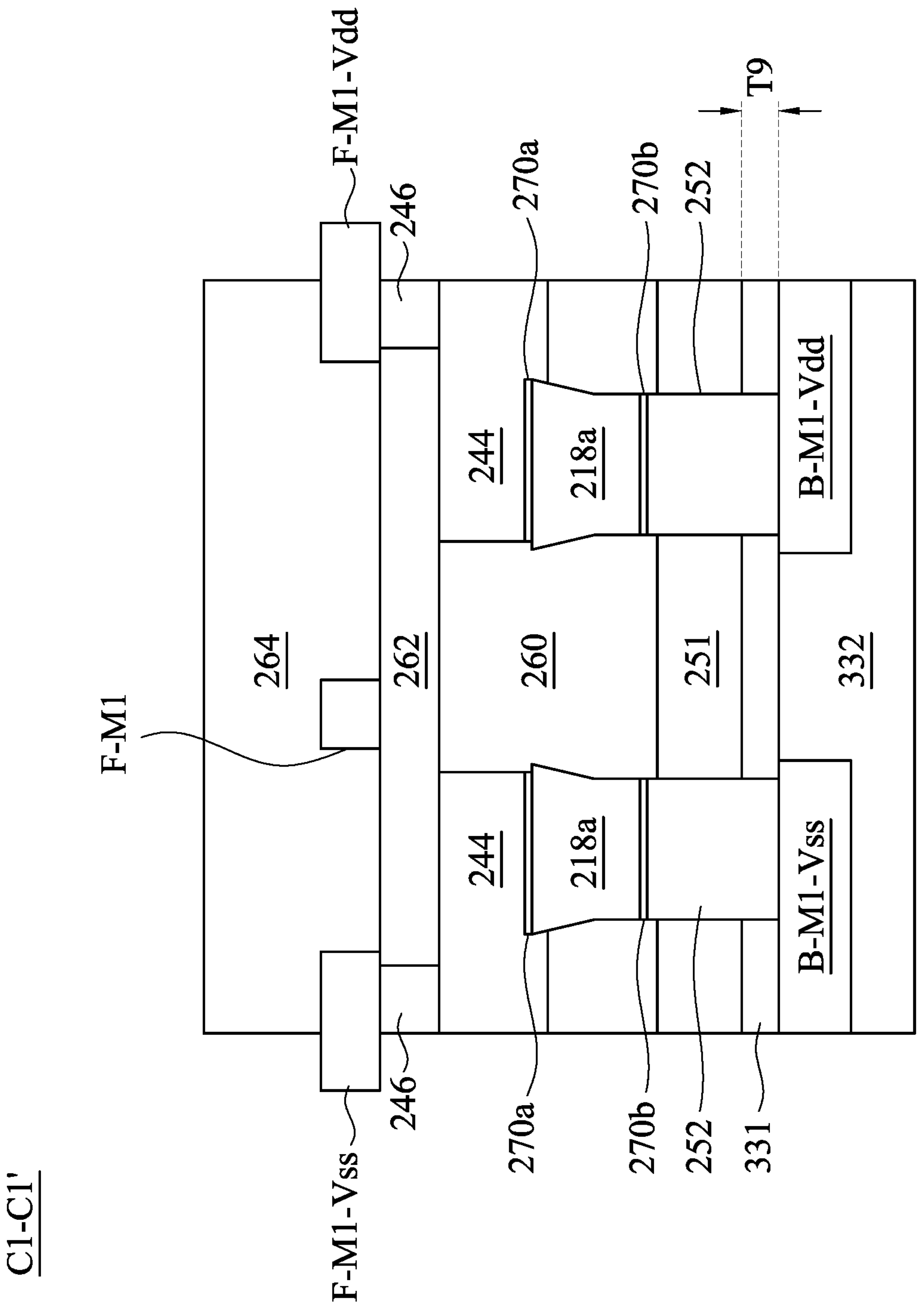
FIGS. 4A, 4C, 4E-4G, 4J, 4M, and 4N illustrate cross-sectional views of a semiconductor structure corresponding to FIGS. 3A-3E, 3G, 3I, and 3J, respectively, according to some embodiments of the present disclosure.
Figure 4B:
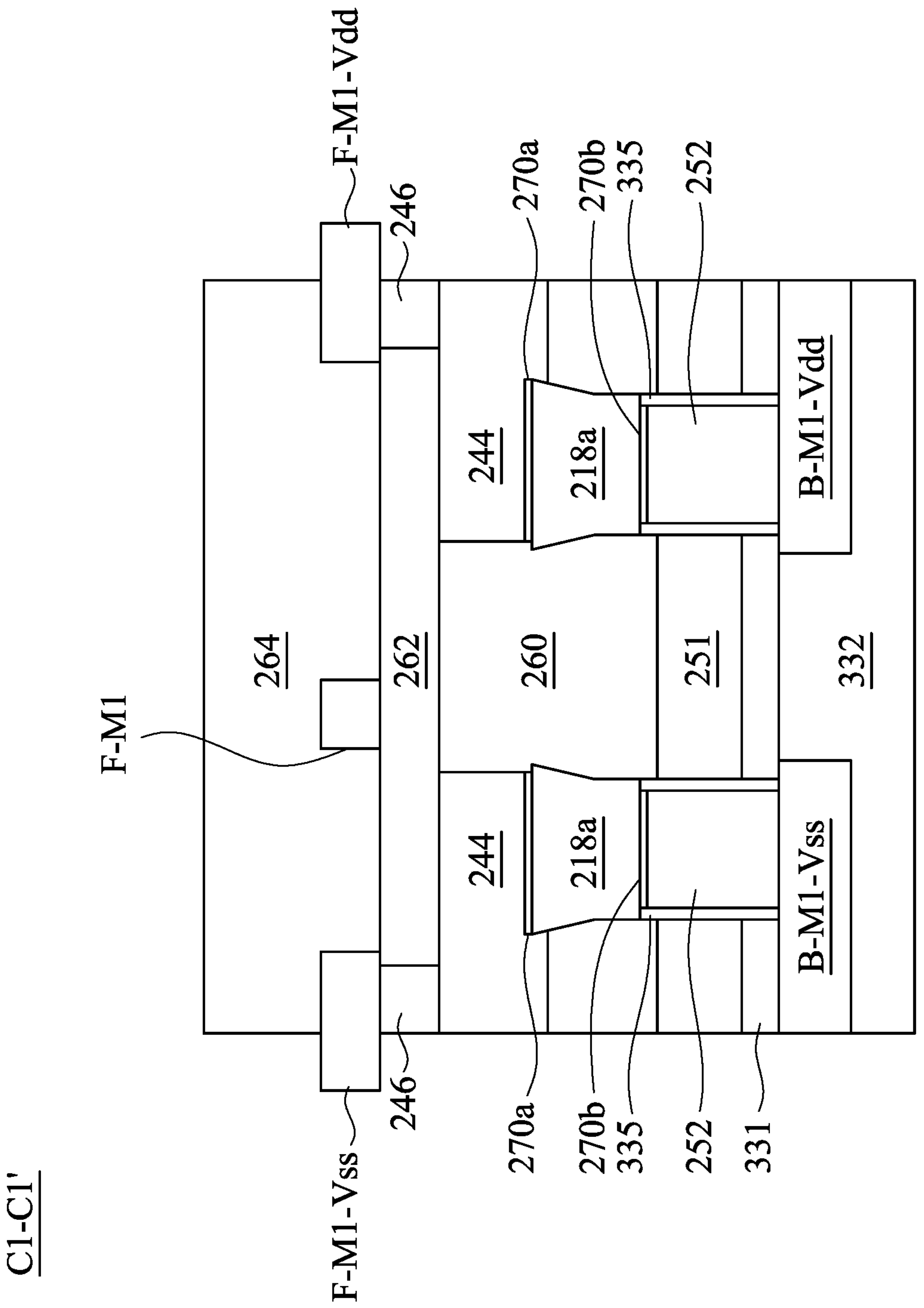
FIGS. 4B, 4D, 4H, and 4K illustrate cross-sectional views of a semiconductor structure corresponding to FIGS. 4A, 4C, 4G, and 4J, respectively, according to some embodiments of the present disclosure.
Figure 4C:
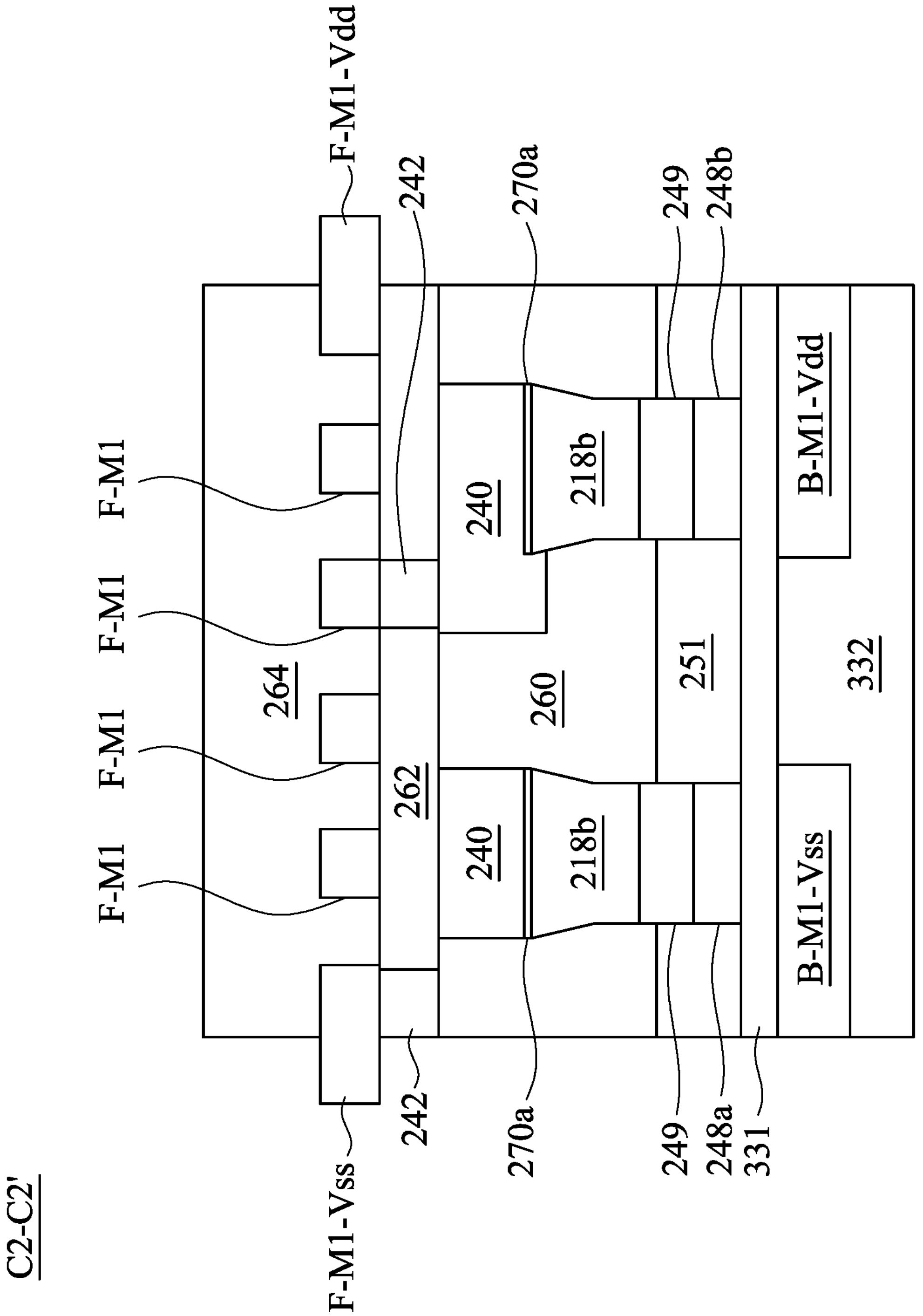
Figure 4D:
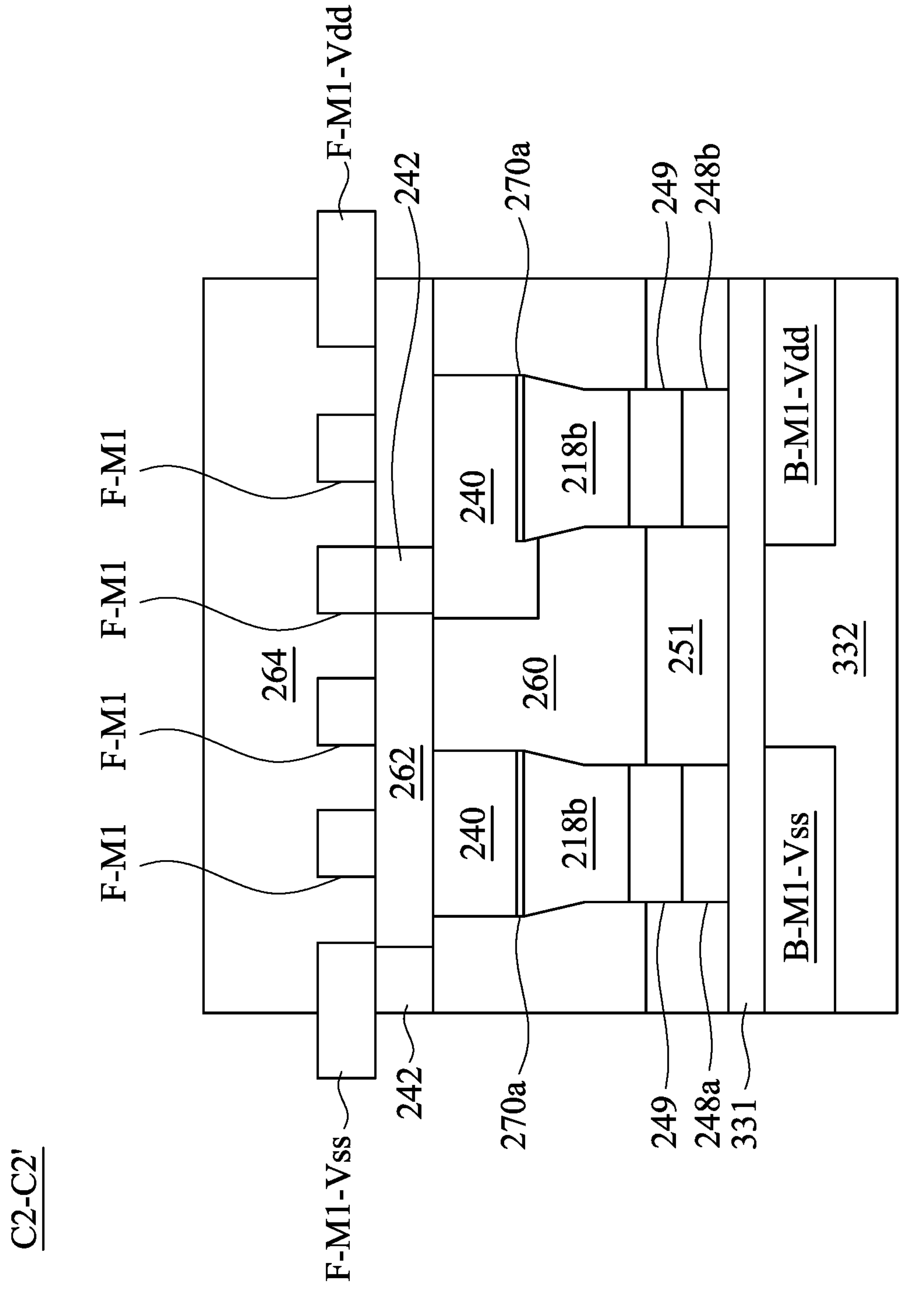
Figure 4E:
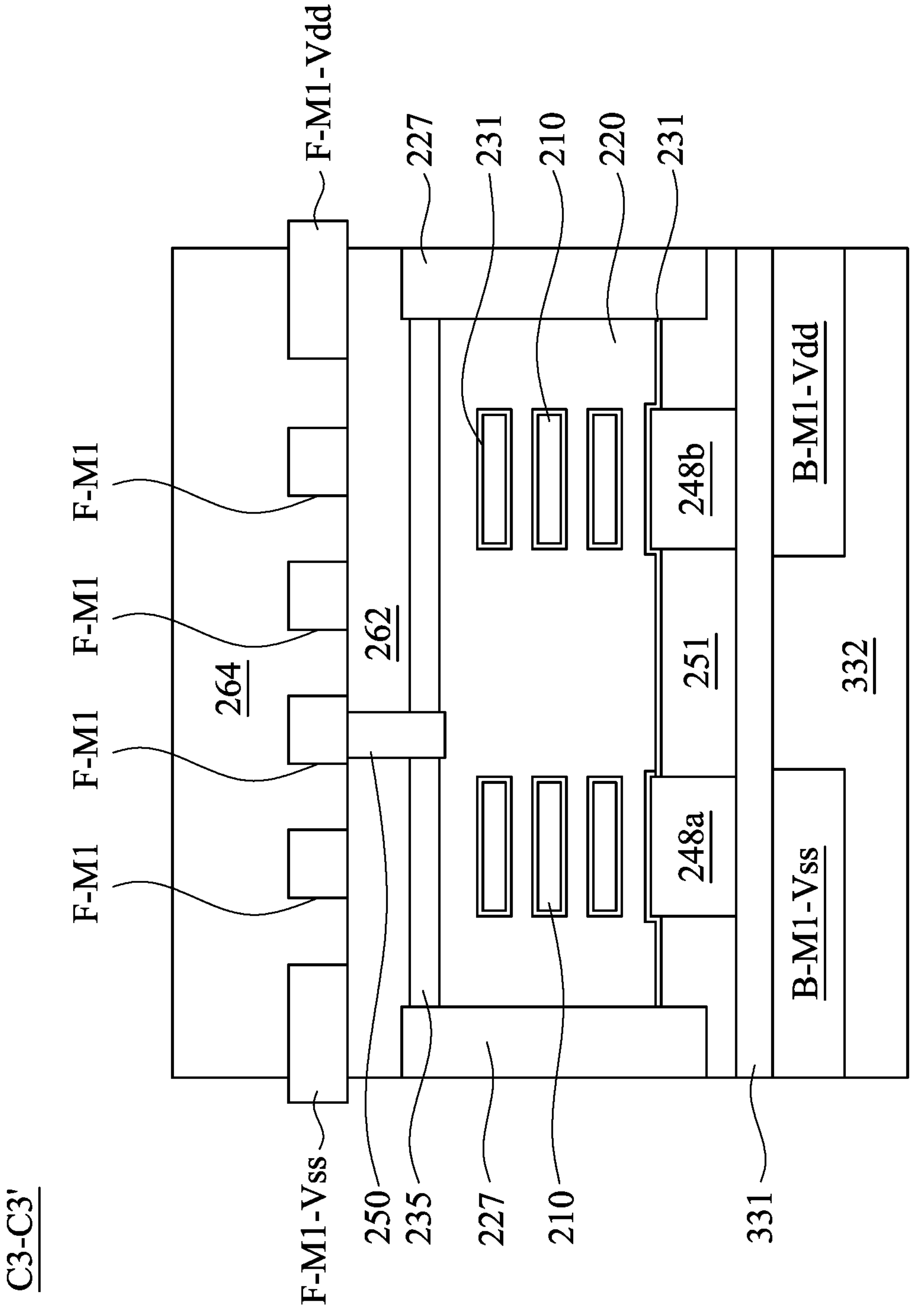
Figure 4F:
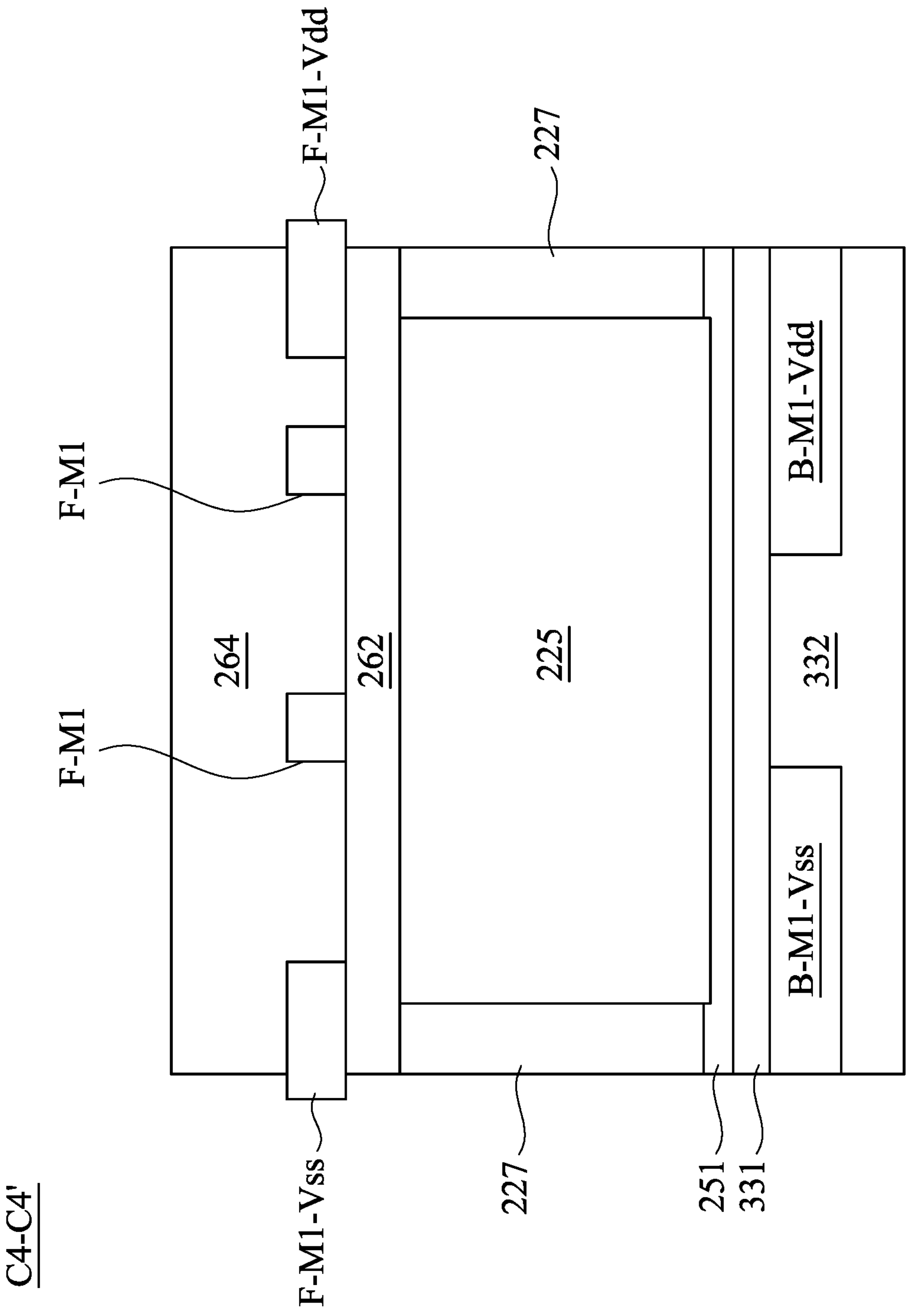
Figure 4G:
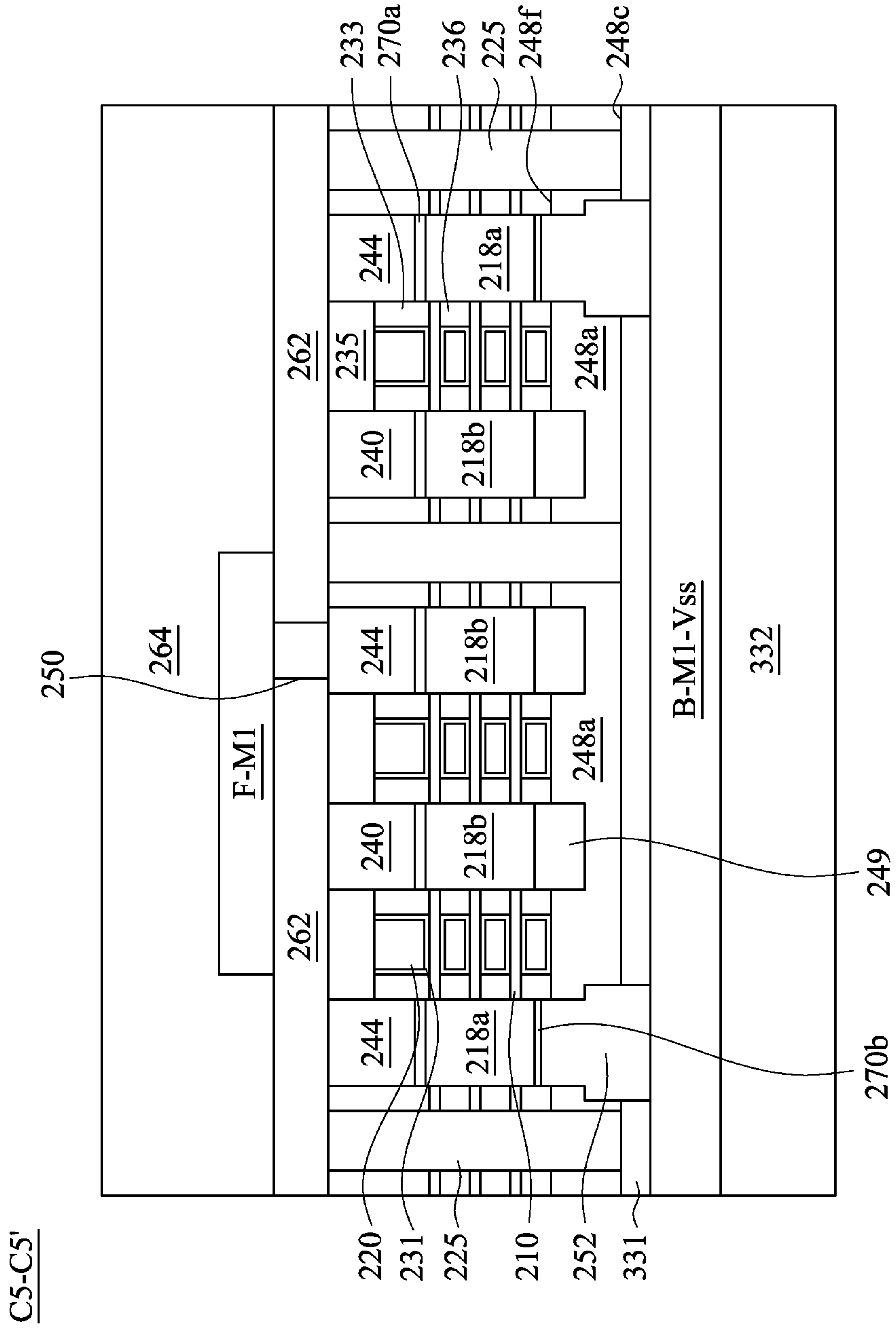
Figure 4H:
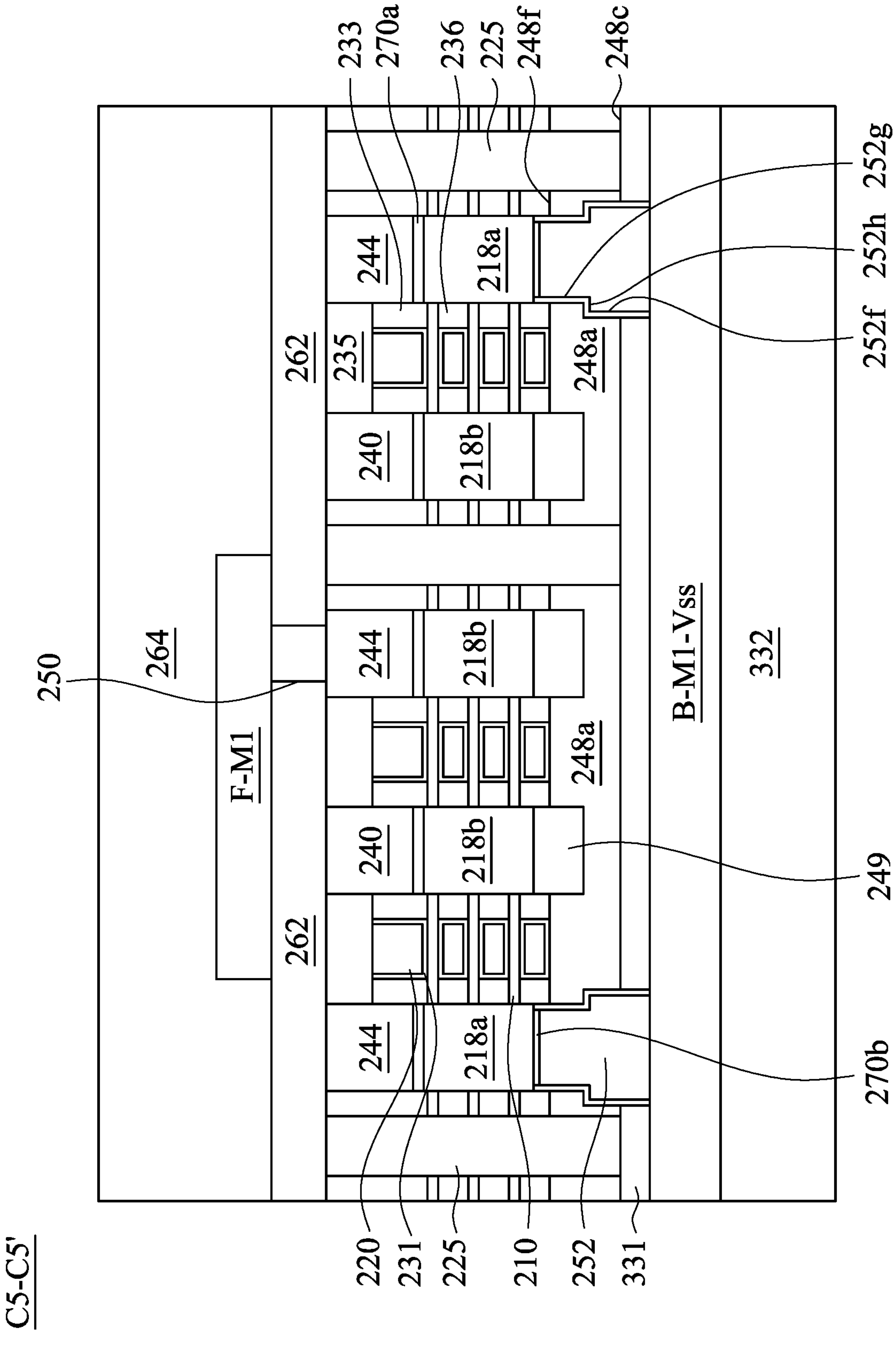
Figure 4I:
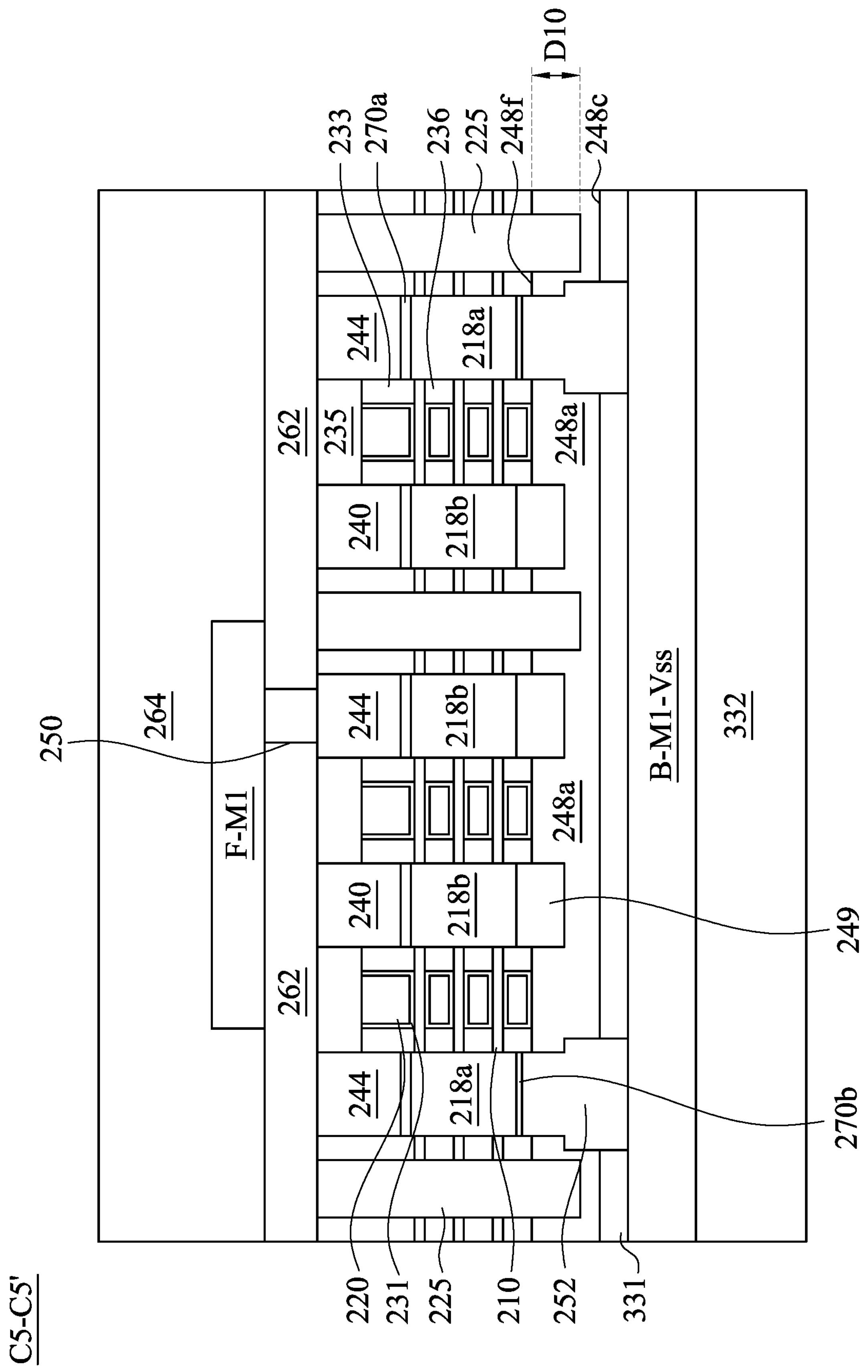
FIGS. 4I and 4L illustrate cross-sectional views of a semiconductor structure corresponding to FIGS. 4G and 4J, respectively, according to some embodiments of the present disclosure.
Figure 4J:
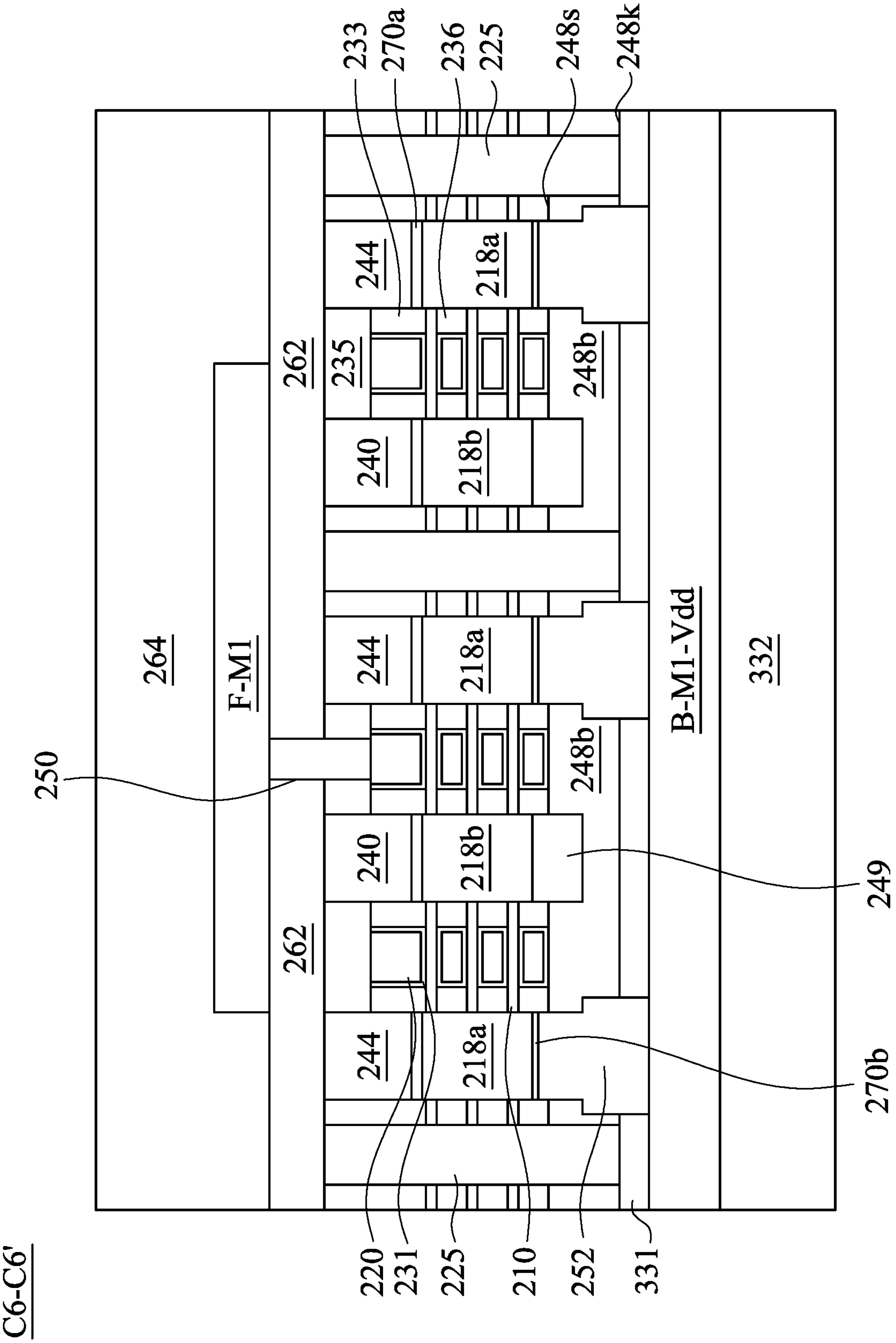
Figure 4K:
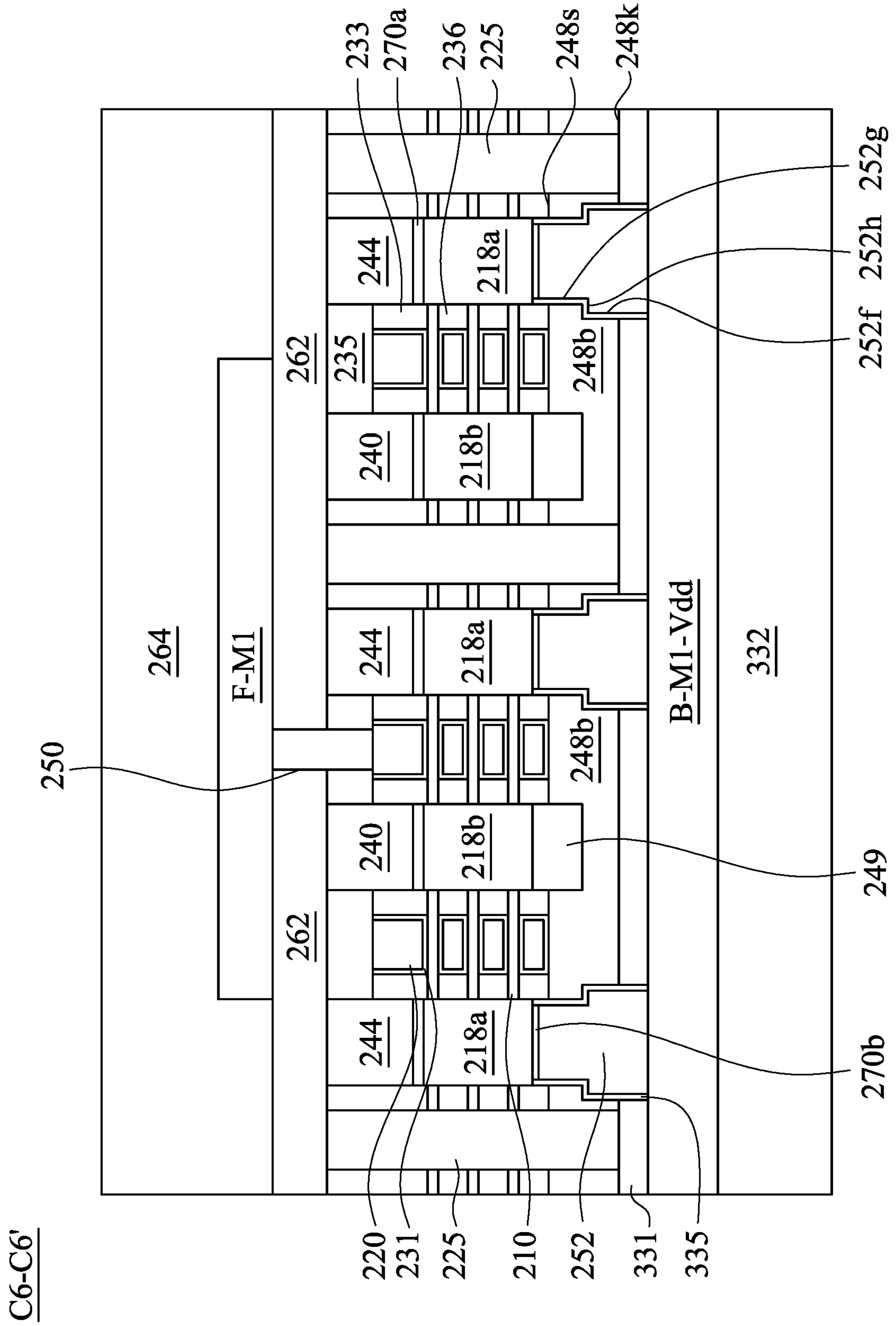
Figure 4L:
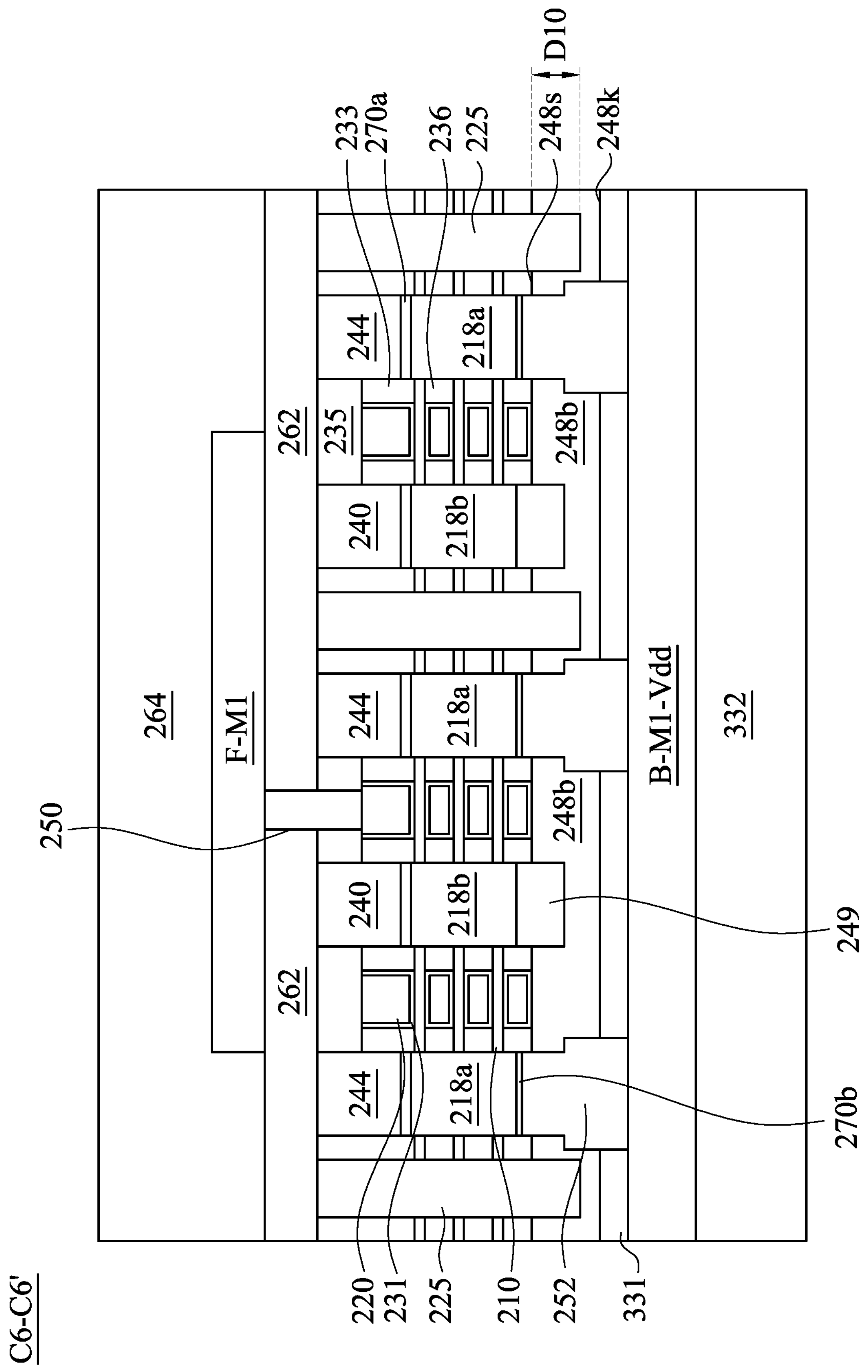
Figure 4M:
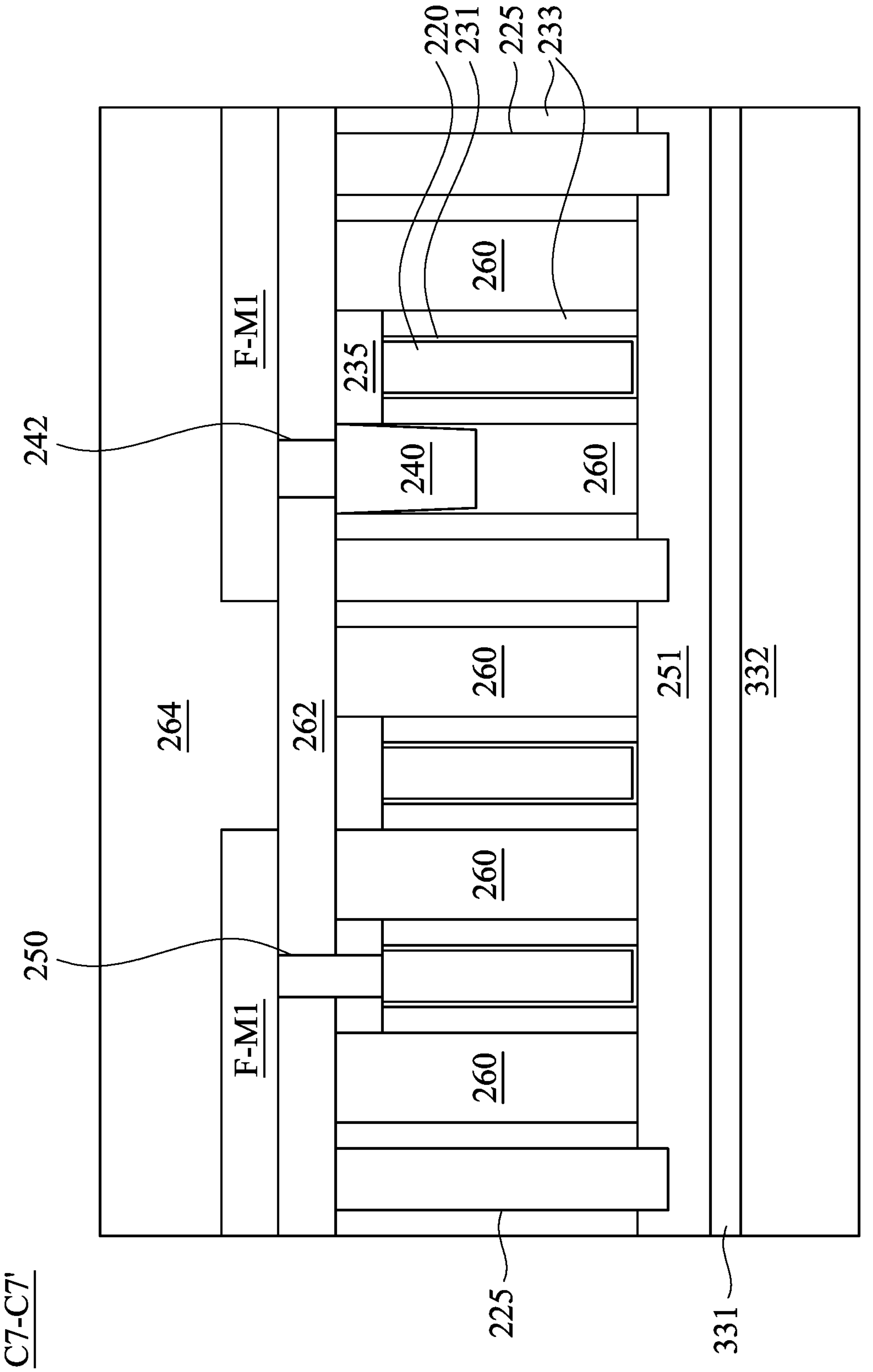
Figure 4N:
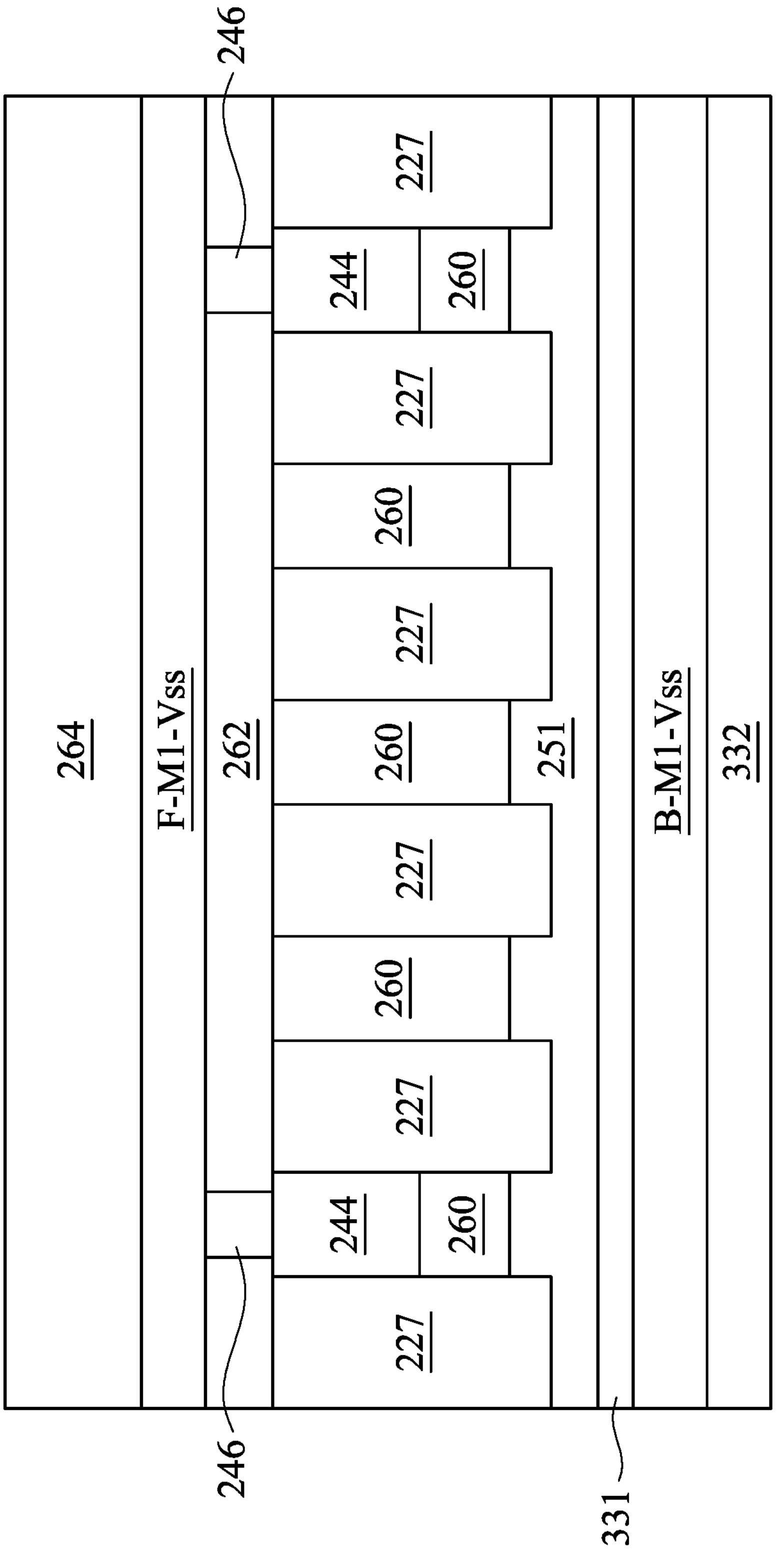

Reference is made to FIGS. 4I and 4L. FIGS. 4I and 4L illustrate cross-sectional views of a semiconductor structure corresponding to FIGS. 4G and 4J, respectively, according to some embodiments of the present disclosure, in which the semiconductive layers 248*a* and 248*b* are partially broken by the dielectric-base gates 225. While FIGS. 4I and 4L show an embodiment of the semiconductor structure with a different metal line routing method than the semiconductor structure in FIGS. 4A, 4C, 4E-4G, 4J, 4M, and 4N. In addition, the present disclosure may repeat reference numerals and/or letters in the various examples. This repetition is for the purpose of simplicity and clarity and does not in itself dictate a relationship between the various embodiments and/or configurations discussed. It is noted that, the difference between the present embodiment and the embodiment in FIGS. 4A, 4C, 4E-4G, 4J, 4M, and 4N is in that the semiconductive layer 248*a*/248*b* is partially broken by the dielectric-base gates 225, not fully broken by the dielectric-base gates 225. The dielectric-base gates 225 can have a vertical dimension D10 in the semiconductive layer 248*a*/248*b* about 2 nm to about 10 nm, such as about 2, 3, 4, 5, 6, 7, 8, 9, or 10 nm. The semiconductive layer 248*a*/248*b* laterally extends across the gate electrodes 220 and the dielectric-base gates 225. A back-side of the dielectric-base gate 225 is inlaid in the semiconductive layer 248*a*/248*b*. A first portion of the semiconductive layer 248*a*/248*b* underlying the dielectric-base gate 225 has a thicker thickness than a thickness of a second portion of the semiconductive layer 248*a*/248*b* underlying the dielectric layer 249.

Figure 5A:
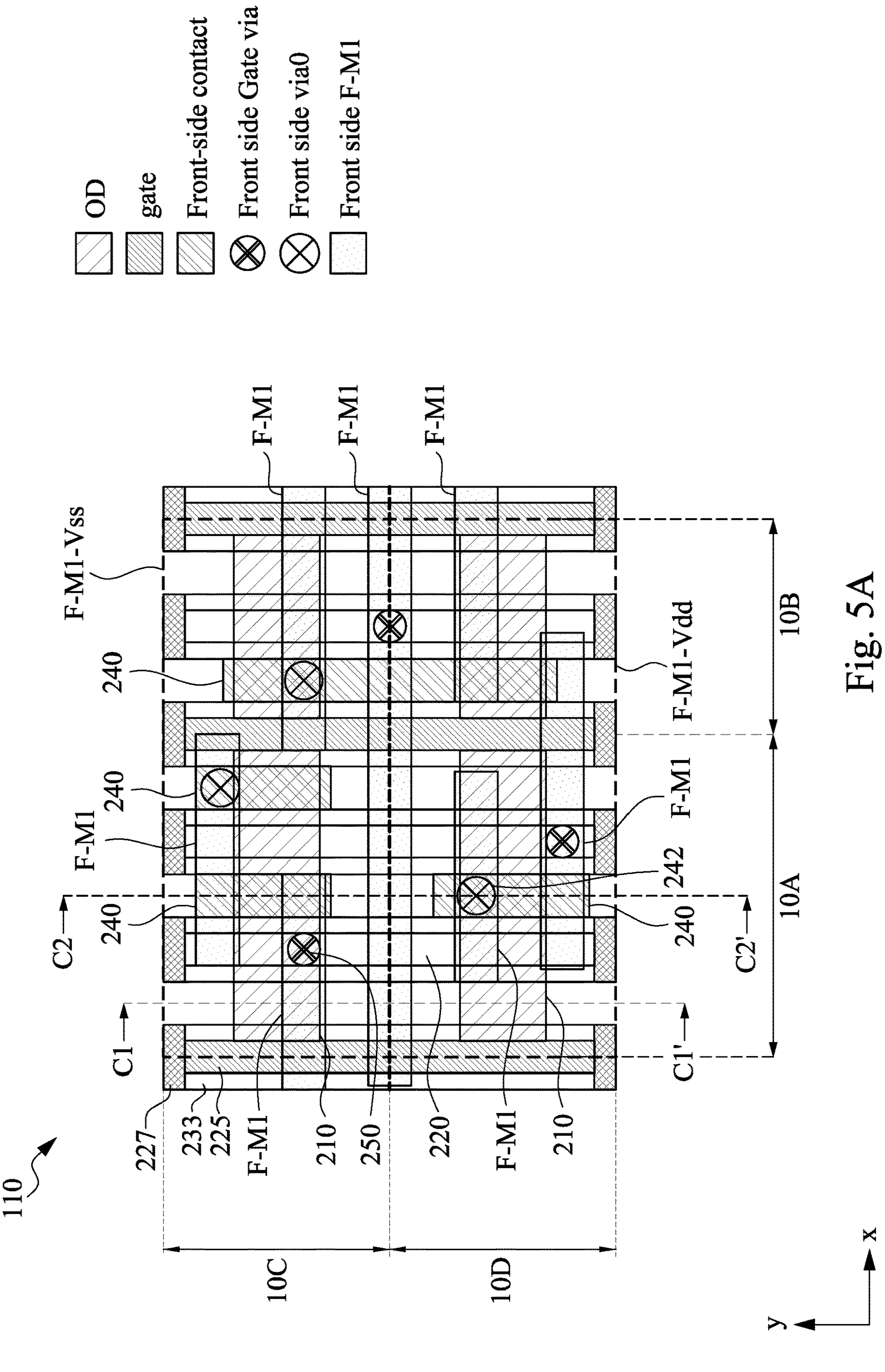
FIGS. 5A and 5B illustrate a layout diagram of a logic circuit on a front side and a back side of a semiconductor structure, respectively, according to some embodiments of the present disclosure.
Figure 5B:
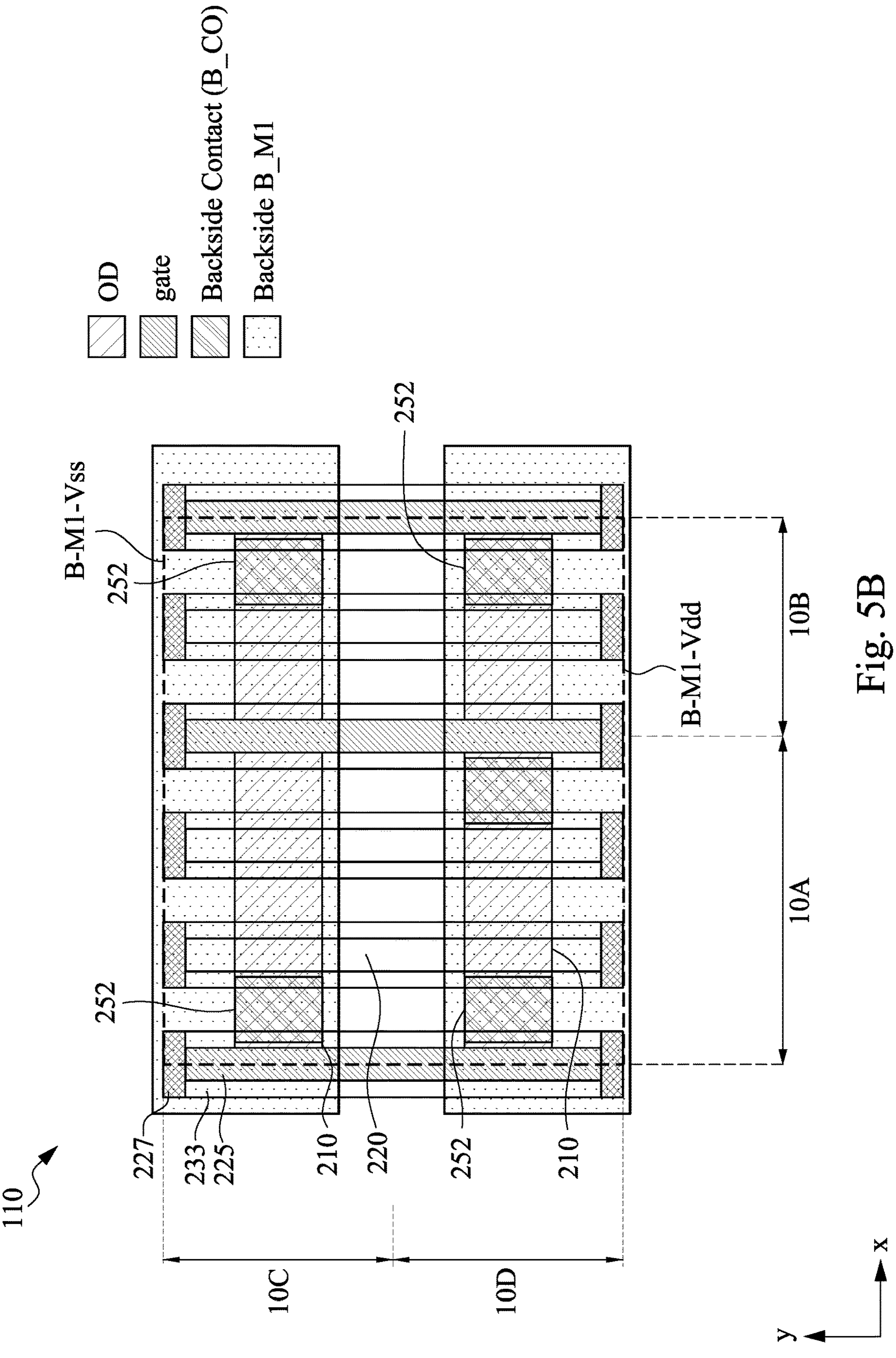
Figure 6A:
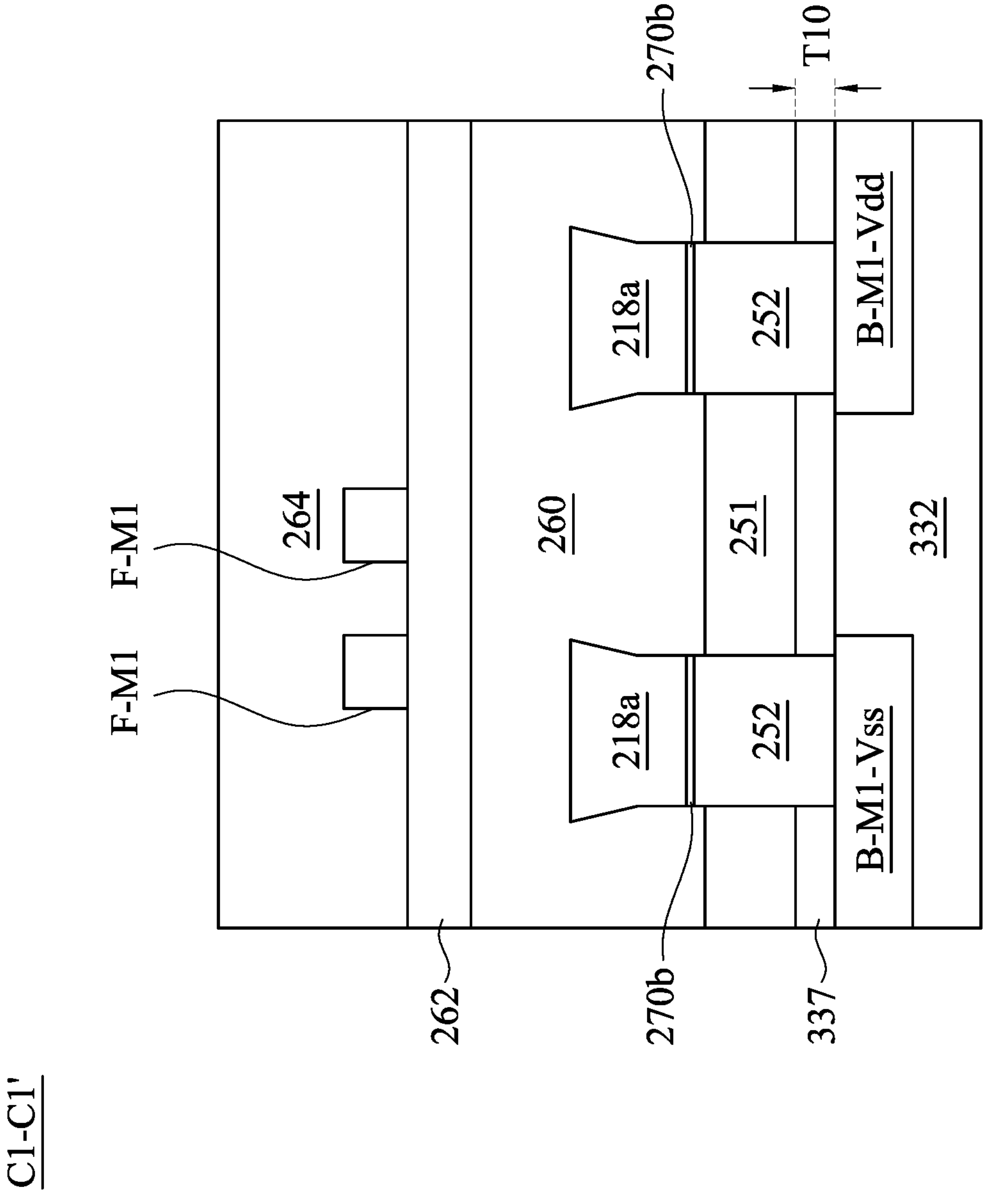
FIGS. 6A and 6B illustrate cross-sectional views obtained from reference cross-sections C1-C1' and C2-C2', respectively, in FIGS. 5A and 5B.
Figure 6B:
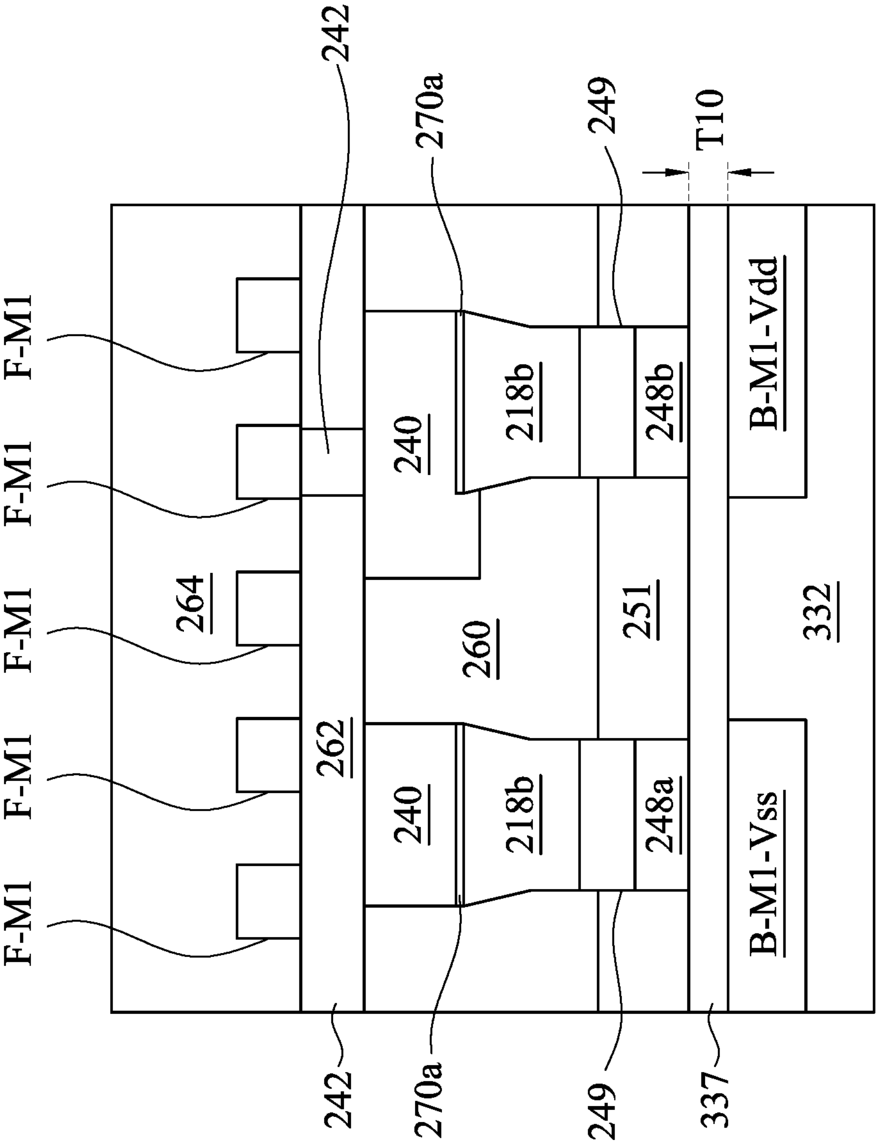

Reference is made to FIGS. 5A, 5B, 6A, and 6B. FIGS. 5A and 5B illustrate a layout diagram of a logic circuit on a front side and a back side of a semiconductor structure, respectively, according to some embodiments of the present disclosure. FIGS. 6A and 6B illustrate cross-sectional views obtained from reference cross-sections C1-C1' and C2-C2', respectively, in FIGS. 5A and 5B. While FIGS. 5A, 5B, 6A, and 6B show an embodiment of the semiconductor structure with a different metal line routing method than the semiconductor structure in FIGS. 2A, 2B, 3A-3E, 3H, 3K, and 3L. In addition, the present disclosure may repeat reference numerals and/or letters in the various examples. This repetition is for the purpose of simplicity and clarity and does not in itself dictate a relationship between the various embodiments and/or configurations discussed. It is noted that, the difference between the present embodiment and the embodiment in FIGS. 2A, 2B, 3A-3E, 3H, 3K, and 3L is in that the wafer front-side is free of power supply voltage lines F-M1-Vdd, F-M1-Vss at the M1 level and the conductive via 246 and the source/drain contacts 240 associated with the power supply voltage lines F-M1-Vdd, F-M1-Vss and the conductive via 246 at the M1 level. In addition, the back-side dielectric layer 337 is formed between the STI structure 251 and the back-side power supply voltage lines B-M1-Vdd/B-M1-Vss. The back-side contact 252 further penetrates through the back-side dielectric layer 337 to the power supply voltage line B-M1-Vss/B-M1-Vdd. In some embodiments, the back-side dielectric layer 337 can have a thickness T10 in a range from about 3 nm to about 100 nm, such as about 3, 4, 5, 6, 7, 8, 9, 10, 20, 30, 40, 50, 60, 70, 80, 90, or 100 nm. In some embodiments, the back-side dielectric layer 331 may be made of dielectric material, such as $SiO_2$, $Si_3N_4$, SiON, SiOC, SiOCN base dielectric material, or combinations thereof. In some embodiments, the back-side dielectric layer 337 may be made of an oxide, a nitride-based material, such as $Si_3N_4$, SiON, or a carbon-based material, such as SiC, SiOC, SiOCN, or combinations thereof. In some embodiments, the back-side dielectric layer 337 may be made of a material having a dielectric constant greater than about 9 (e.g., high dielectric constant (high-k) material). For example, the back-side dielectric layer 337 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof.

In some embodiments, the layouts as shown in FIGS. 2A, 2B, 5A, and 5B are represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Reference is made to FIGS. 7A-25C. FIGS. 7A-25C illustrate cross-sectional views of intermediate stages in the formation of a semiconductor structure in accordance with some embodiments. FIGS. 7A, 8A, 9A, 10A, 11A, 12A, 13A, 14A, 15A, 16A, 17A, 18A, 19A, 20A, 21A, 22A, 23A, 24A, and 25A illustrate cross-sectional views obtained from the reference cross-section C1-C1' in FIGS. 2A and 2B of intermediate stages in the formation of a semiconductor structure in accordance with some embodiments. FIGS. 7B, 8B, 9B, 10B, 11B, 12B, 13B, 14B, 15B, 16B, 17B, 18B, 19B, 20B, 21B, 22B, 23B, 24B, and 25B illustrate cross-sectional views obtained from the reference cross-section C5-C5' in FIGS. 2A and 2B of intermediate stages in the formation of a semiconductor structure in accordance with some embodiments. FIGS. 7C, 8C, 9C, 10C, 11C, 12C, 13C, 14C, 15C, 16C, 17C, 18C, 19C, 20C, 21C, 22C, 23C, 24C, and 25C illustrate cross-sectional views obtained from the reference cross-section C6-C6' in FIGS. 2A and 2B of intermediate stages in the formation of a semiconductor structure in accordance with some embodiments.

Figure 7A:
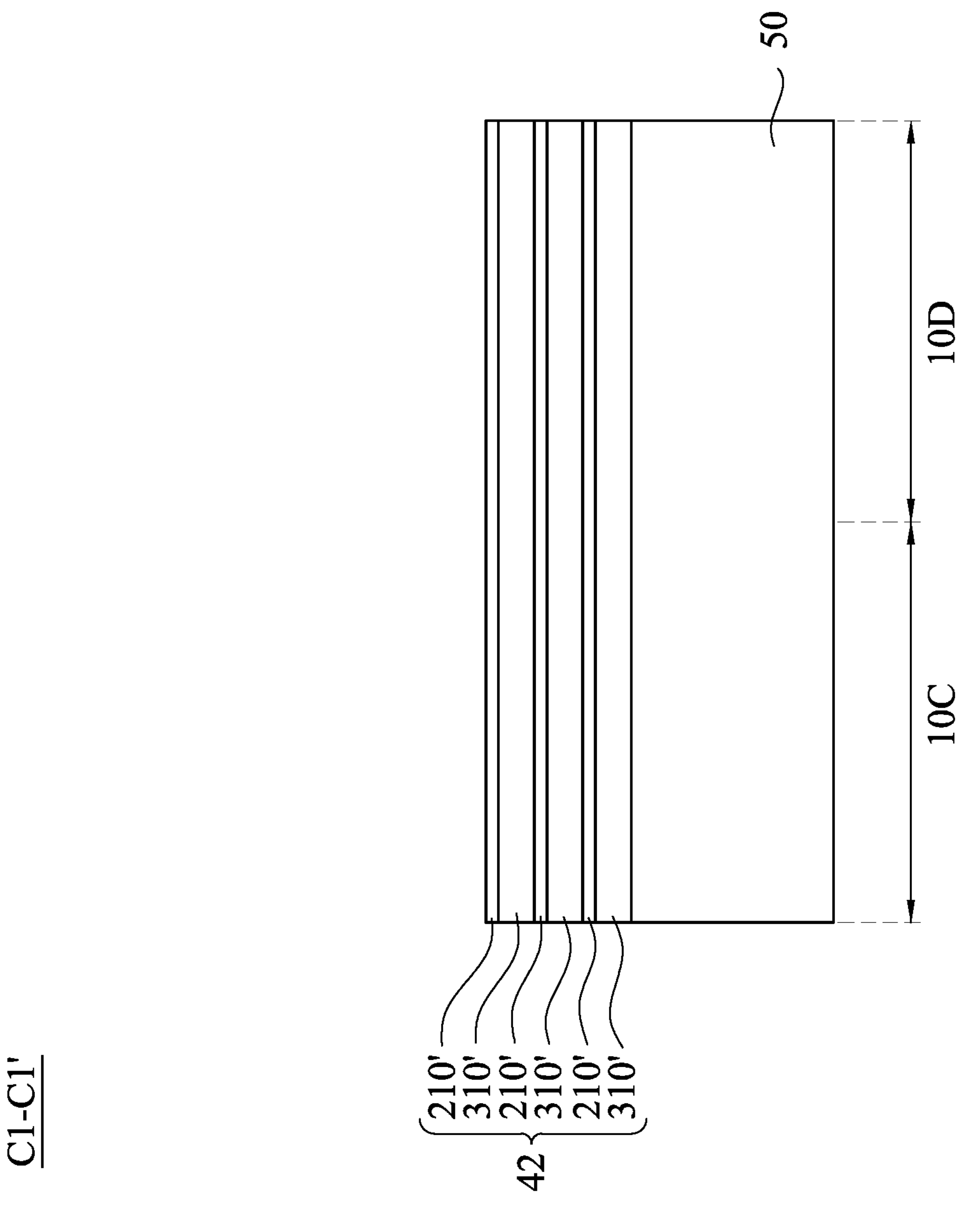
FIGS. 7A-25C illustrate cross-sectional views of intermediate stages in the formation of a semiconductor structure in accordance with some embodiments.
Figure 7B:
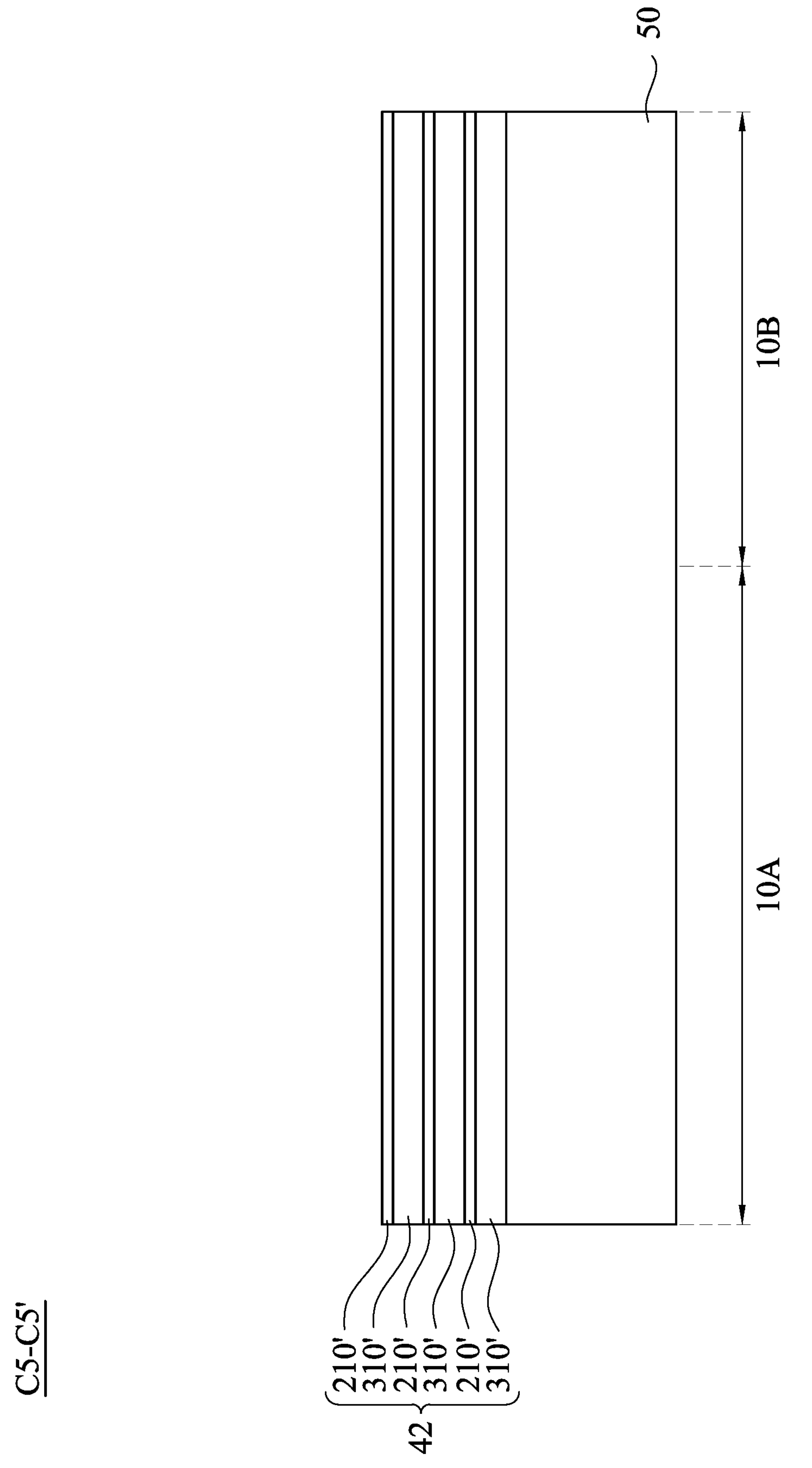
Figure 7C:
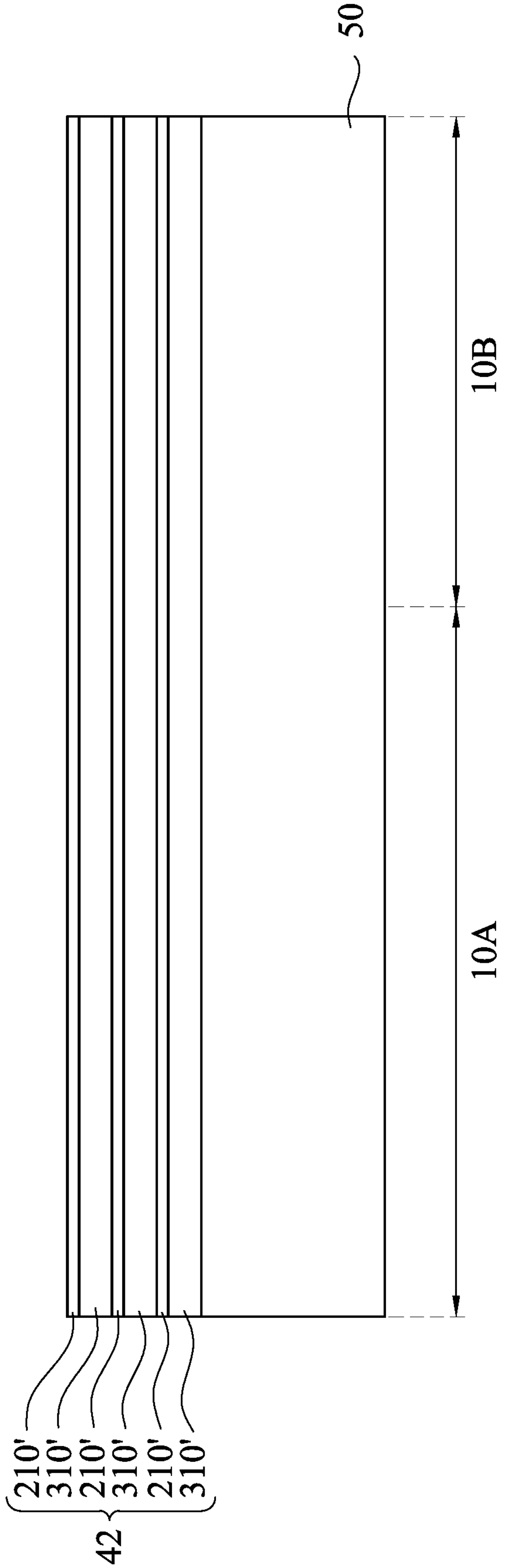

Reference is made to FIGS. 7A, 7B, and 7C. A substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

Specifically, the substrate 50 may have a first conductivity type device region 10C and a second conductivity type device region 10D. The first conductivity type device region 10C can be for forming n-type devices, such as NMOS transistors, e.g., n-type nano-FETs, and the second conductivity type device region 10D can be for forming p-type devices, such as PMOS transistors, e.g., p-type nano-FETs. The first conductivity type device region 10C may be physically separated from the second conductivity type device region 10D (not separately illustrated), and any number of device features (e.g., other active devices, doped regions, isolation structures, etc.) may be disposed between the first conductivity type device region 10C and the second conductivity type device region 10D. Although one first conductivity type device region 10C and one second conductivity type device region 10D are illustrated, any number of first and second conductivity type device regions 10C and 10D may be provided. In some embodiment, the first and second conductivity type device regions 10C and 10D of the substrate 50 may be a pure semiconductor layer without dopant. In some embodiment, the first conductivity type device region 10C and/or the second conductivity type device region 10D may be doped with a dopant having a same conductivity type as the source/drain region 218*a* (see FIGS. 13A-13C) formed subsequently overlying thereof, and the dopant can be either n-type or p-type doping species. In some embodiment, the first conductivity type device region 10C and/or the second conductivity type device region 10D may be doped with a dopant having a different conductivity type than the source/drain region 218*a* (see FIGS. 13A-13C) formed subsequently overlying thereof, and the dopant can be either n-type or p-type doping species.

Subsequently, a multi-layer stack 42 is formed on the front-side 50*f* of the substrate 50. The multi-layer stack 42 includes alternating first semiconductor layers 310' and second semiconductor layers 210'. The first semiconductor layers 310' formed of a first semiconductor material, and the second semiconductor layers 210' are formed of a second semiconductor material. The semiconductor materials may each be selected from the candidate semiconductor materials of the substrate 50. In some embodiments, the multi-layer stack 42 includes three layers of each of the first semiconductor layers 310' and the second semiconductor layers 210'. It should be appreciated that the multi-layer stack 42 may include any number (e.g. about 2 to 6) of the first semiconductor layers 310' and the second semiconductor layers 210'. In some embodiments, and as will be subsequently described in greater detail, the first semiconductor layers 310' will be removed and the second semiconductor layers 210' will patterned to form channel regions for the nano-FETs. The first semiconductor layers 310' are sacrificial layers (or dummy layers), which will be removed in subsequent processing to expose the top surfaces and the bottom surfaces of the second semiconductor layers 210'. The first semiconductor material of the first semiconductor layers 310' is a material that has a high etching selectivity from the etching of the second semiconductor layers 210', such as silicon germanium. The second semiconductor material of the second semiconductor layers 210' is a material suitable for both n-type and p-type devices, such as silicon.

In some embodiments, the first semiconductor material of the first semiconductor layers 310' may be made of a material, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 210' may be made of a material, such as silicon, silicon carbide, a III-V compound semiconductor, a II-VI compound semiconductor, or the like. The first semiconductor material and the second semiconductor material may have a high etching selectivity from the etching of one another. Each of the layers of the multi-layer stack 42 may be grown by a process such as vapor phase epitaxy (VPE) or molecular beam epitaxy (MBE), deposited by a process such as chemical vapor deposition (CVD) or atomic layer deposition (ALD), or the like. In some embodiments, the multi-layer stack 42 may have a thickness in a range from about 70 to 120 nm, such as about 70, 80, 90, 100, 110, or 120 nm. In some embodiments, each of the layers may have a small thickness, such as a thickness in a range of about 5 nm to about 40 nm. In some embodiments, some layers (e.g., the second semiconductor layers 210') are formed to be thinner than other layers (e.g., the first semiconductor layers 310'). For example, in embodiments in which the first semiconductor layers 310' are sacrificial layers (or dummy layers) and the second semiconductor layers 210' are patterned to form channel regions for the nano-FETs.

Figure 8A:
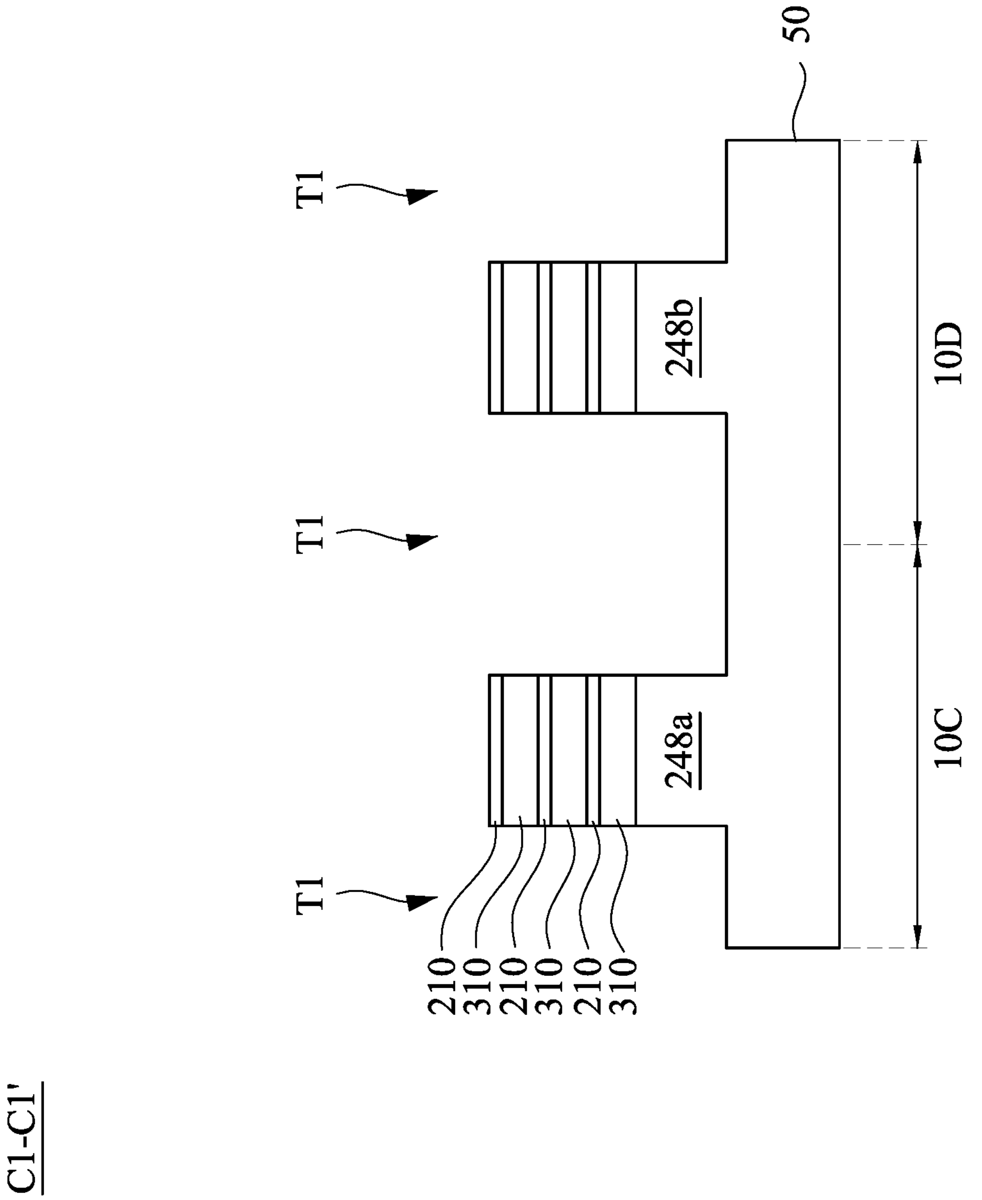
Figure 8B:
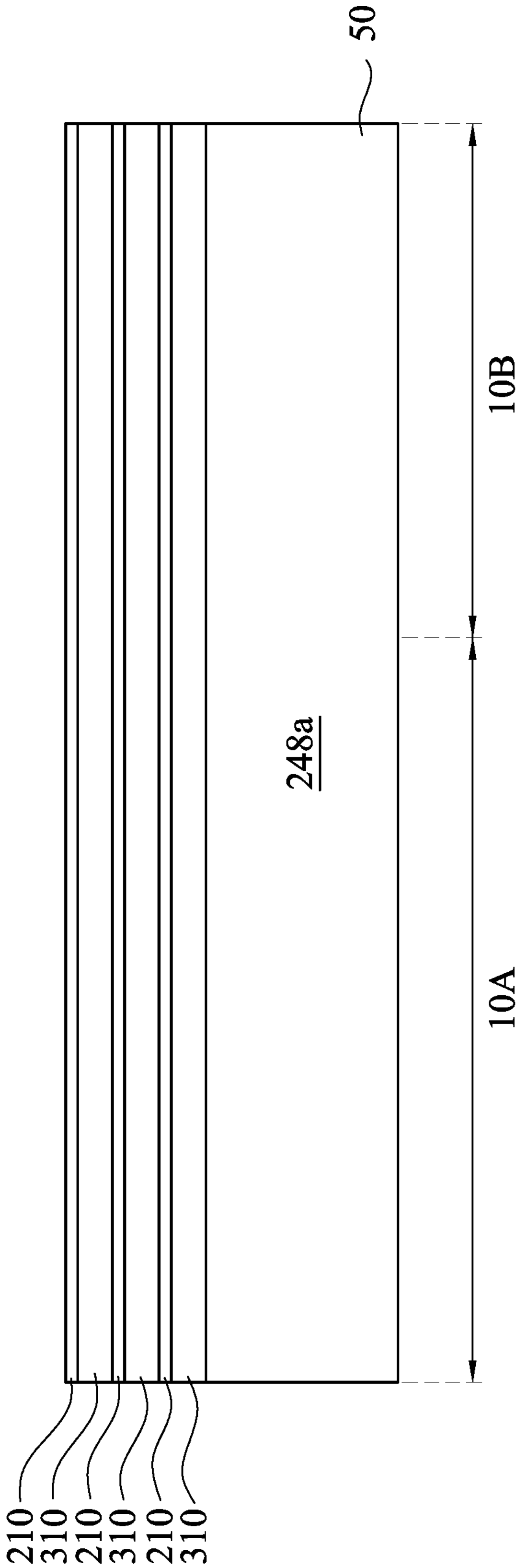
Figure 8C:
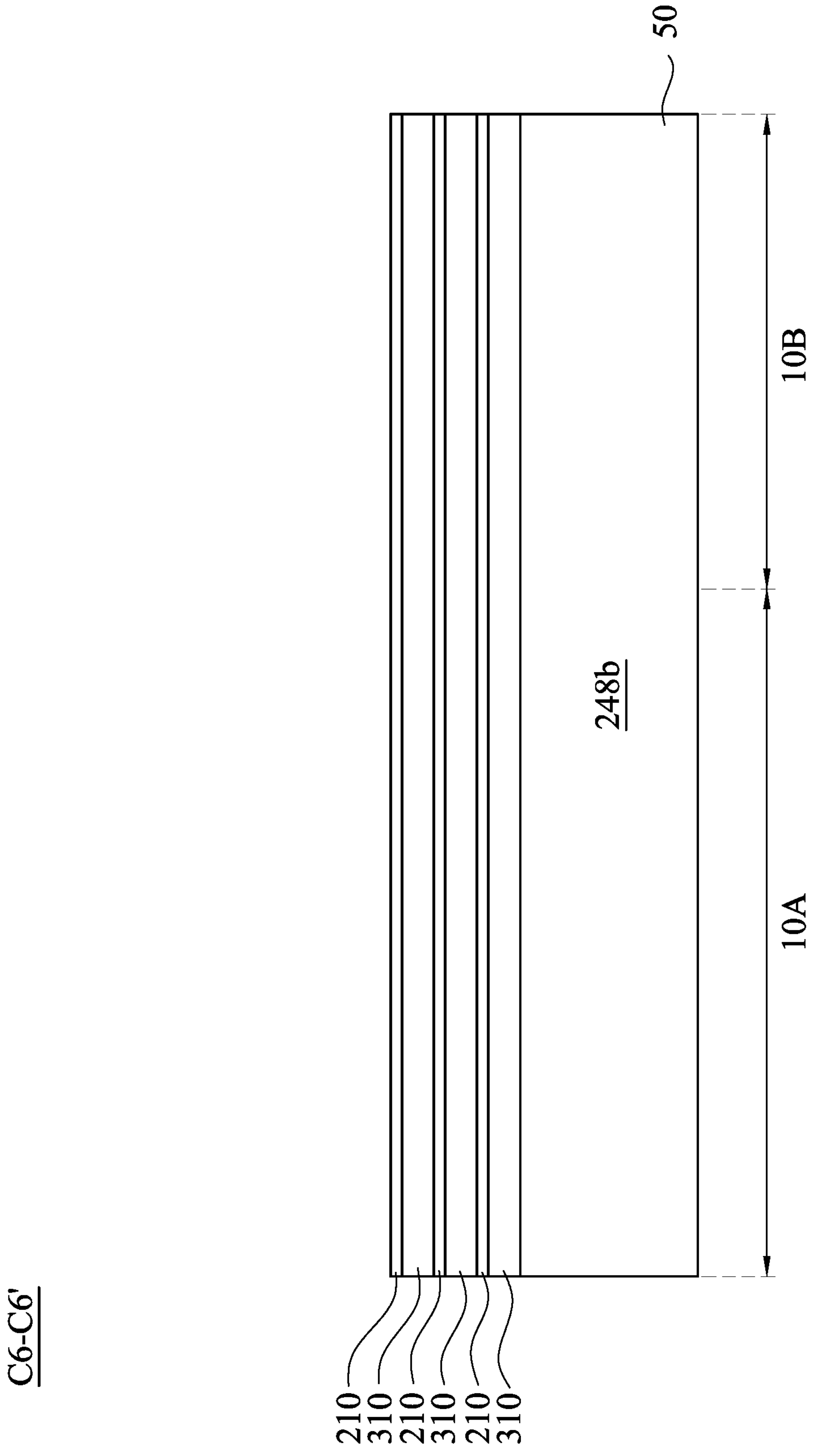

Reference is made to FIGS. 8A, 8B, and 8C. Trenches T1 are patterned in the substrate 50 and the multi-layer stack 42 to form a semiconductive layer 248*a* in the first conductivity type device region 10C and a semiconductive layer 248*b* in the second conductivity type device region 10D, and first and second semiconductor sheets 210 and 310 over the semiconductive layers 248*a* and 248*b*. The semiconductive layers 248*a* and 248*b* are semiconductor strips patterned in the substrate 50. The semiconductive layer 248*a*/248*b* is formed as a fin-like structure underlying the semiconductor sheets 210 and 310. The first semiconductor sheets 310 and the second semiconductor sheets 210 include the remaining portions of the first semiconductor layers 310' and the second semiconductor layers 210', respectively. The trenches T1 may be patterned by any acceptable etch process, such as a reactive ion etch (RIE), neutral beam etch (NBE), the like, or a combination thereof. The etching may be anisotropic. The semiconductive layers 248*a* and 248*b* and the first and second semiconductor sheets 310, 210 may be patterned by any suitable method. For example, the semiconductive layers 248*a* and 248*b* and the first and second semiconductor sheets 310, 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the semiconductive layers 248*a* and 248*b* and the first and second semiconductor sheets 310, 210. In some embodiments, the mask (or other layer) may remain on the first and second semiconductor sheets 310, 210. The semiconductive layers 248*a* and 248*b* and the first and second semiconductor sheets 310, 210 may each have widths in a range of about 8 nm to about 40 nm. In some embodiments, the semiconductive layers 248*a* and 248*b* and the first and second semiconductor sheets 310, 210 have substantially equal widths.

Figure 9A:
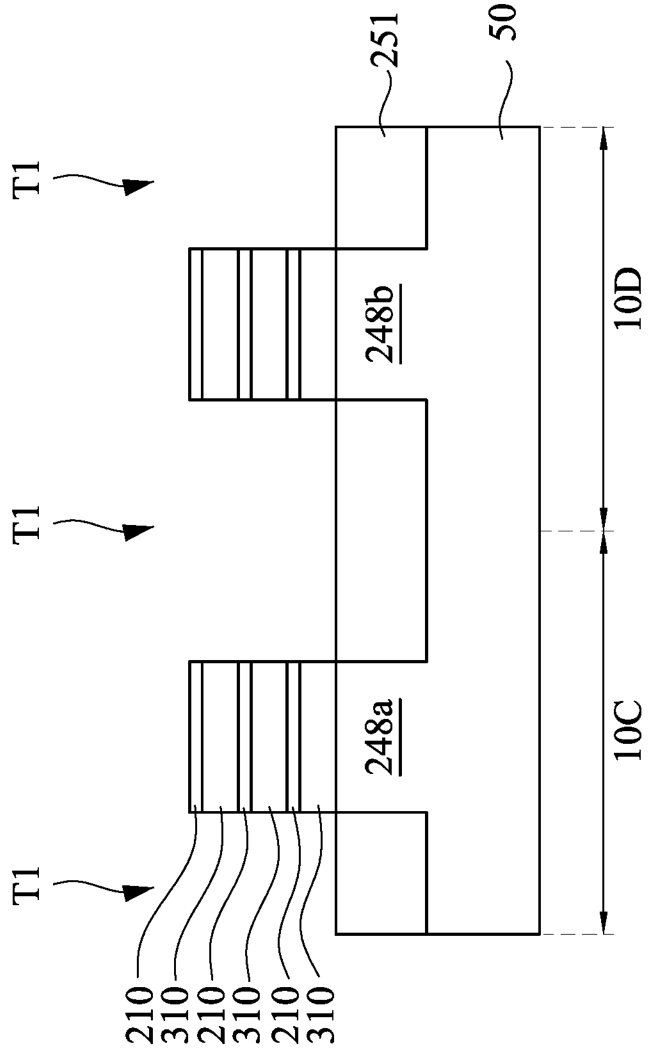
Figure 9B:
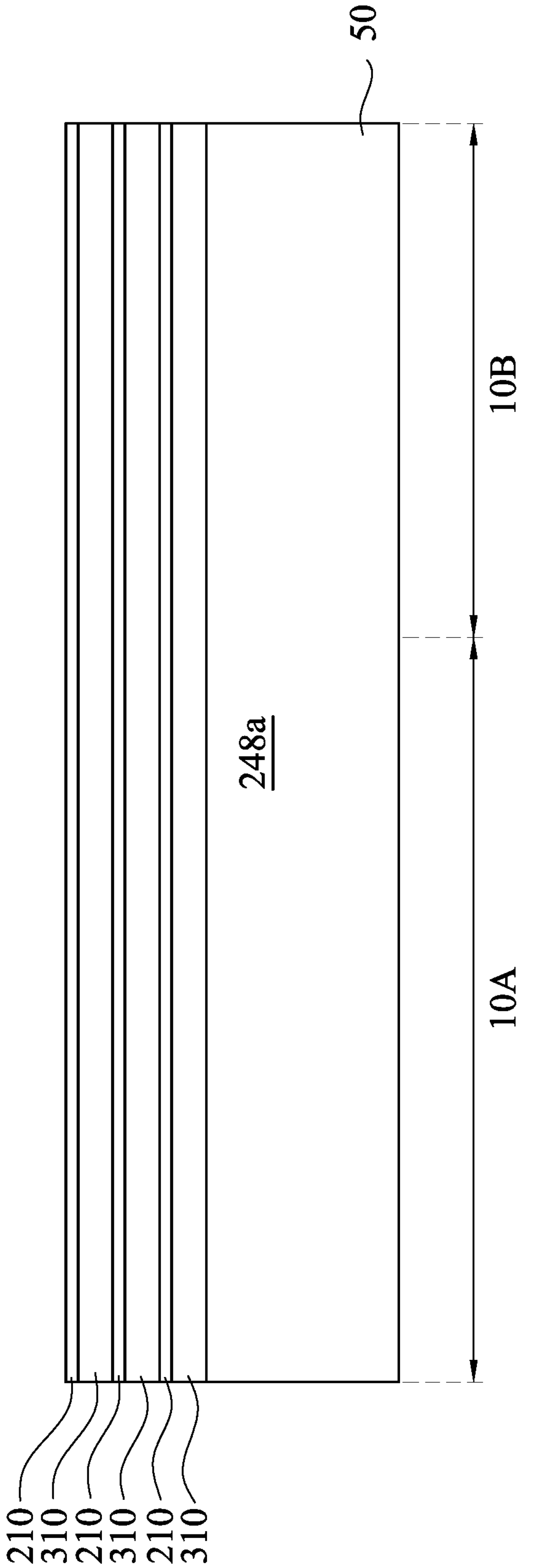
Figure 9C:
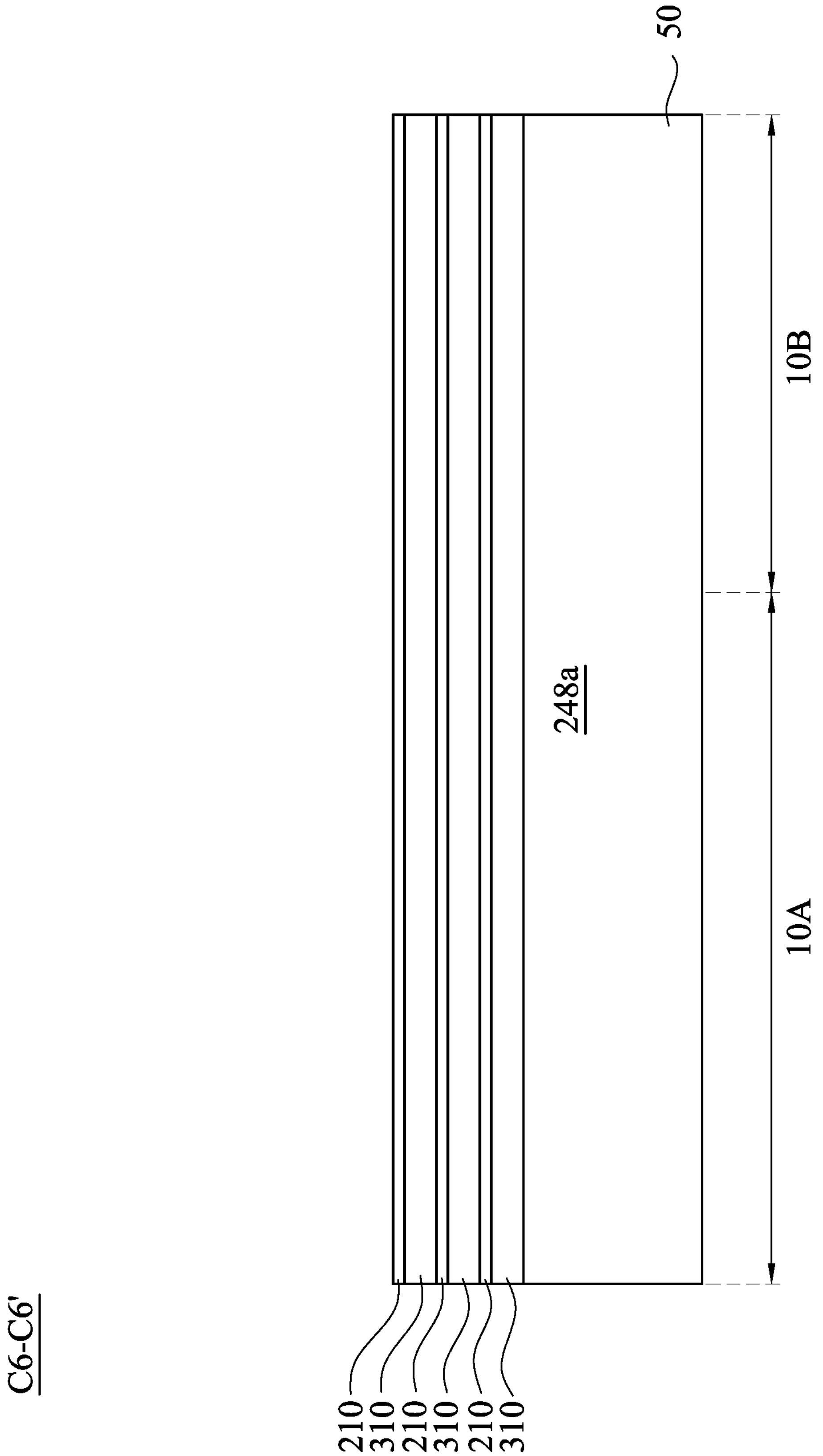

Reference is made to FIGS. 9A, 9B, and 9C. STI structures 251 are formed over the substrate 50 and between the semiconductive layers 248*a* and 248*b*. The STI structures 251 are disposed around at least a portion of the semiconductive layers 248*a* and 248*b* such that at least a portion of the first and second semiconductor sheets 310, 210 protrude from between adjacent STI structures 251. In some embodiments, the top surfaces of the STI structures 251 are coplanar (within process variations) with the top surfaces of the semiconductive layers 248*a* and 248*b*. In some embodiments, the top surfaces of the STI structures 251 are above or below the top surfaces of the semiconductive layers 248*a* and 248*b*. The STI structures 251 separate the features of adjacent devices.

The STI structures 251 may be formed by any suitable method. For example, an insulation material can be formed over the substrate 50 and the first and second semiconductor sheets 310, 210, and between adjacent semiconductive layers 248*a* and 248*b*. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the first and second semiconductor sheets 310, 210. Although the STI structures 251 are each illustrated as a single layer, some embodiments may utilize multiple layers. For example, in some embodiments a liner (not separately illustrated) may first be formed along surfaces of the substrate 50, the semiconductive layers 248*a* and 248*b*, and the first and second semiconductor sheets 310, 210. Thereafter, a fill material, such as those previously described may be formed over the liner.

A removal process is then applied to the insulation material to remove excess insulation material over the first and second semiconductor sheets 310, 210. In some embodiments, a planarization process such as a chemical mechanical polish (CMP), an etch-back process, combinations thereof, or the like may be utilized. In embodiments in which a mask remains on the first and second semiconductor sheets 310, 210, the planarization process may expose the mask or remove the mask. After the planarization process, the top surfaces of the insulation material and the mask (if present)

or the first and second semiconductor sheets 310, 210 are coplanar (within process variations). Accordingly, the top surfaces of the mask (if present) or the first and second semiconductor sheets 310, 210 are exposed through the insulation material. In some embodiments, no mask remains on the first and second semiconductor sheets 310, 210. The insulation material is then recessed to form the STI structures 251. The insulation material is recessed, such as in a range from about 30 nm to about 80 nm, such that at least a portion of the first and second semiconductor sheets 310, 210 protrude from between adjacent portions of the insulation material. Further, the top surfaces of the STI structures 251 may have a flat surface as illustrated, a convex surface, a concave surface (such as dishing), or a combination thereof. The top surfaces of the STI structures 251 may be formed flat, convex, and/or concave by an appropriate etch. The insulation material may be recessed using any acceptable etching process, such as one that is selective to the material of the insulation material (e.g., selectively etches the insulation material of the STI structures 251 at a faster rate than the materials of the semiconductive layers 248*a* and 248*b* and the first and second semiconductor sheets 310, 210). For example, an oxide removal may be performed using dilute hydrofluoric (dHF) acid.

The process previously described is just one example of how the semiconductive layers 248*a* and 248*b* and the first and second semiconductor sheets 310, 210 may be formed. In some embodiments, the semiconductive layers 248*a* and 248*b* and/or the first and second semiconductor sheets 310, 210 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductive layers 248*a* and 248*b* and/or the first and second semiconductor sheets 310, 210. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Figure 10A:
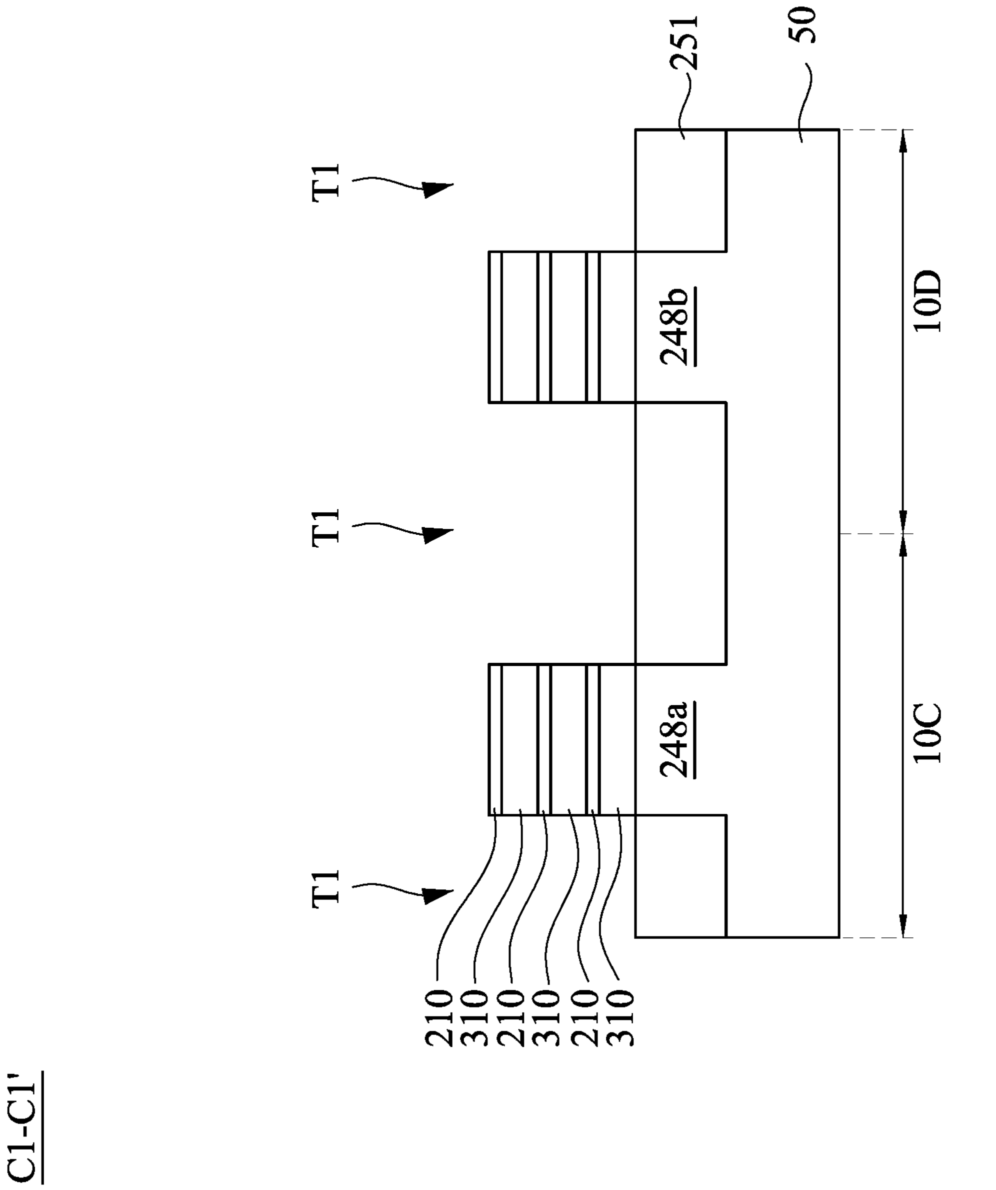
Figure 10B:
Figure 10C:
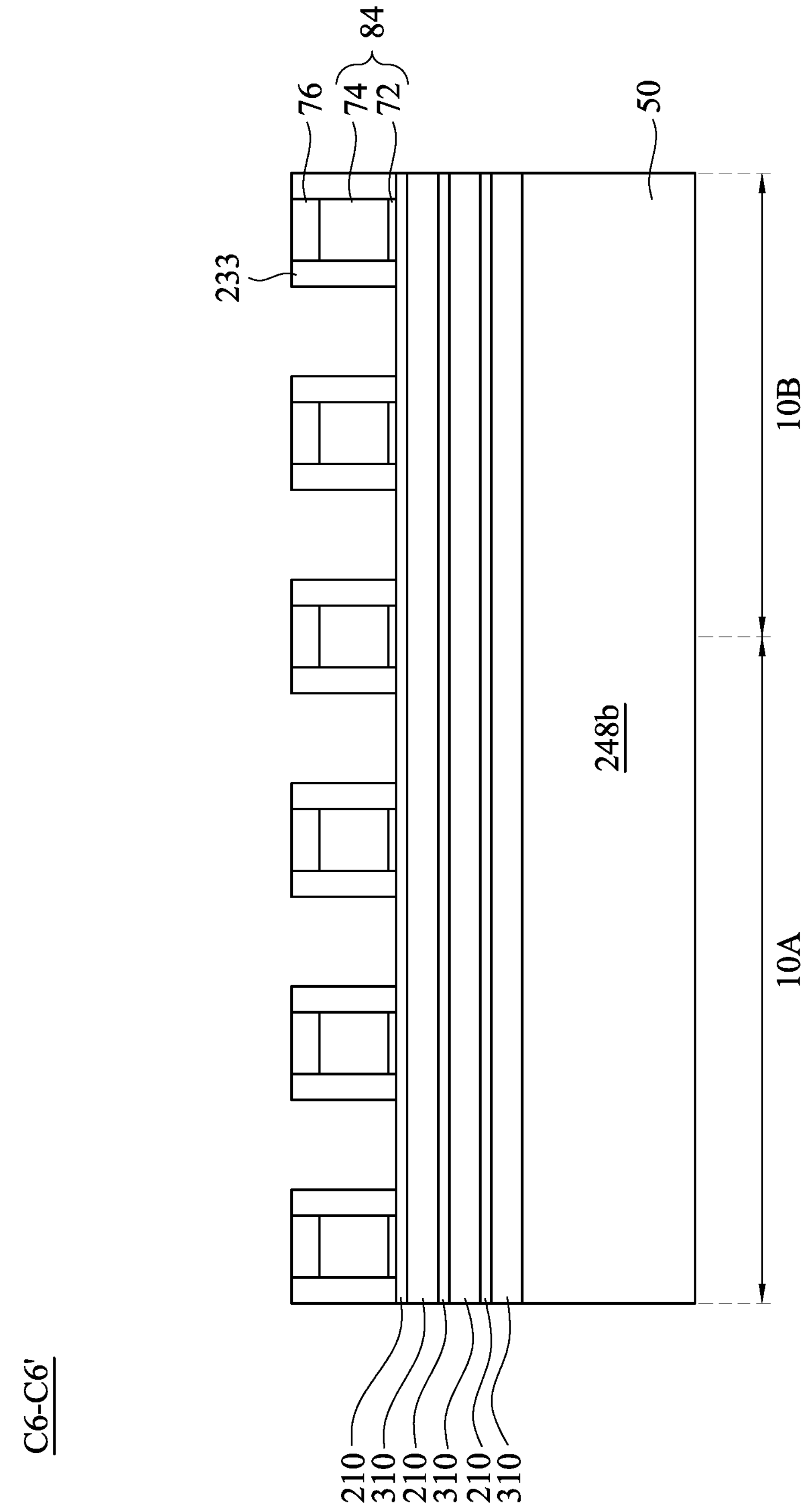

Reference is made to FIGS. 10A, 10B, and 10C. A dummy dielectric layer, a dummy gate layer, and a mask layer are sequentially formed on the semiconductive layers 248*a* and 248*b* and the first and second semiconductor sheets 310, 210. The dummy dielectric layer is formed on the semiconductive layers 248*a* and 248*b* and the first and second semiconductor sheets 310, 210. The dummy dielectric layer may be formed of a dielectric material such as silicon oxide, silicon nitride, a combination thereof, or the like, which may be deposited or thermally grown according to acceptable techniques. Subsequently, a dummy gate layer is formed over the dummy dielectric layer. Subsequently, a mask layer is formed over the dummy gate layer. The dummy gate layer may be deposited over the dummy dielectric layer and then planarized, such as by a CMP. The mask layer may be deposited over the dummy gate layer. The dummy gate layer may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer may be formed of material(s) that have a high etching selectivity from the etching of insulation materials, e.g., the STI structures 251 and/or the dummy dielectric layer. The mask layer may be formed of a dielectric material such as silicon nitride, silicon oxynitride, or the like. In some embodiments, the dummy dielectric layer covers the semiconductive layers 248*a* and 248*b*, the first and second semiconductor sheets 310, 210, and the STI structures 251, such that the dummy dielectric layer extends over the STI structures 251 and between the dummy gate layer and the STI structures 251. In another embodiment, the dummy dielectric layer covers only the semiconductive layers 248*a* and 248*b* and the first and second semiconductor sheets 310, 210.

The mask layer is patterned using acceptable photolithography and etching techniques to form masks 76. The pattern of the masks 76 is then transferred to the dummy gate layer by any acceptable etching technique to form dummy gates 74. The pattern of the masks 76 may optionally be further transferred to the dummy dielectric layer by any acceptable etching technique to form dummy dielectrics 72. The dummy gate 74 and the dummy dielectric 72 may be collectively referred to as a dummy gate structure 84. The dummy gate structures 84 cover portions of the first and second semiconductor sheets 310, 210 that will be exposed in subsequent processing to form channel regions. Specifically, the dummy gate structures 84 extend along the portions of the second semiconductor sheets 210 that will be patterned to form channel regions. The pattern of the masks 76 may be used to physically separate adjacent dummy gate structures 84. The dummy gate structures 84 may also have lengthwise directions substantially perpendicular (within process variations) to the lengthwise directions of the semiconductive layers 248*a* and 248*b*. The masks 76 can optionally be removed after patterning, such as by any acceptable etching technique.

Gate spacers 233 are formed over the first and second semiconductor sheets 310, 210, on exposed sidewalls of the masks 76, the dummy gates 74, and the dummy dielectrics 72. In some embodiments, the gate spacers 233 can be interchangeably referred to top spacers or upper gate spacers. In some embodiments, the gate spacers 233 may have a lateral dimension in a range from about 4 nm to about 12 nm. In some embodiments, the gate spacer 233 may include multiple dielectric material and selected from a group consist of $SiO_2$, $Si_3N_4$, carbon doped oxide, nitrogen doped oxide, porous oxide, air gap, or combinations thereof. The gate spacers 233 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gate structures 84 (thus forming the gate spacers 233).

Figure 11A:
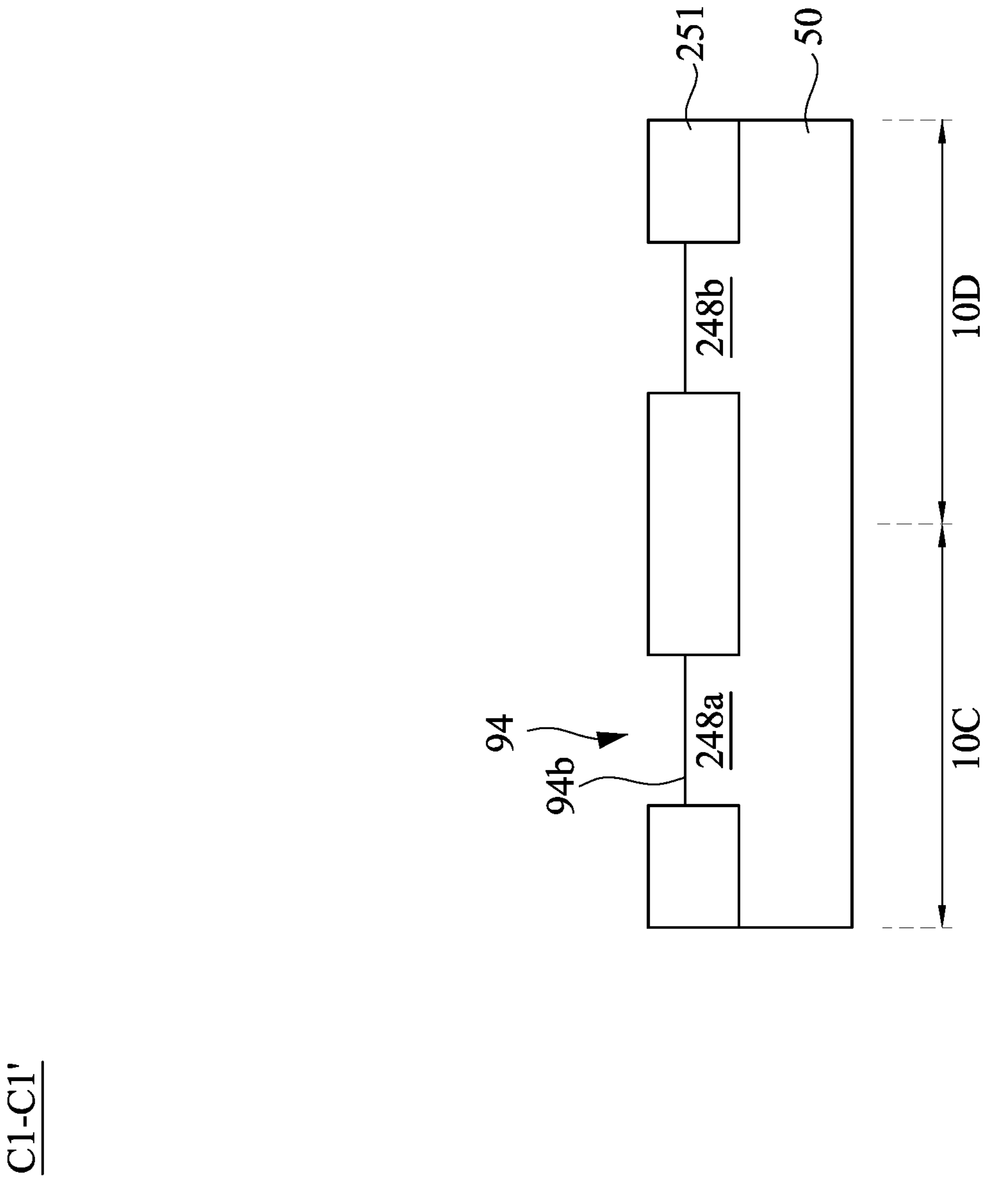
Figure 11B:
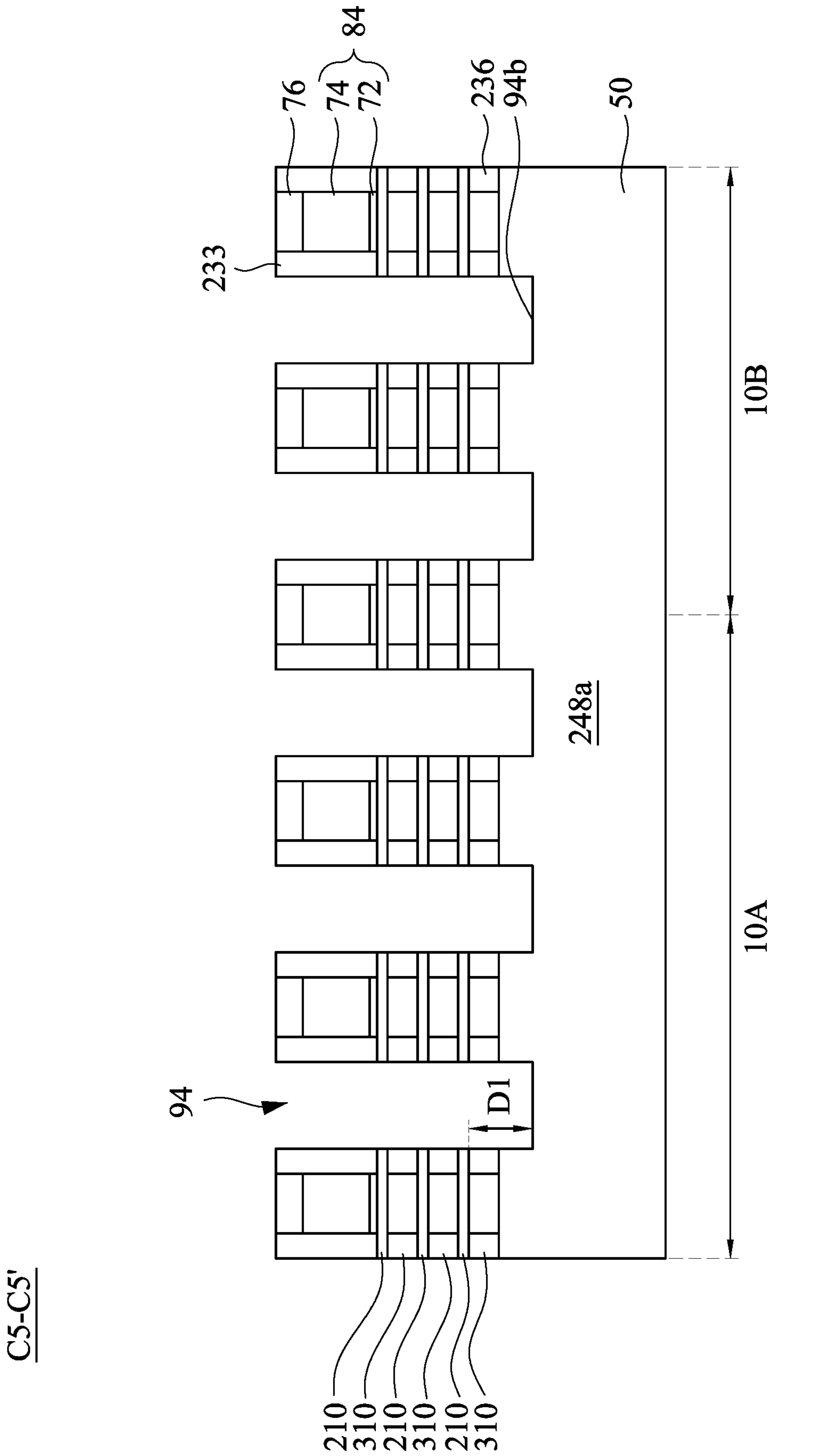
Figure 11C:
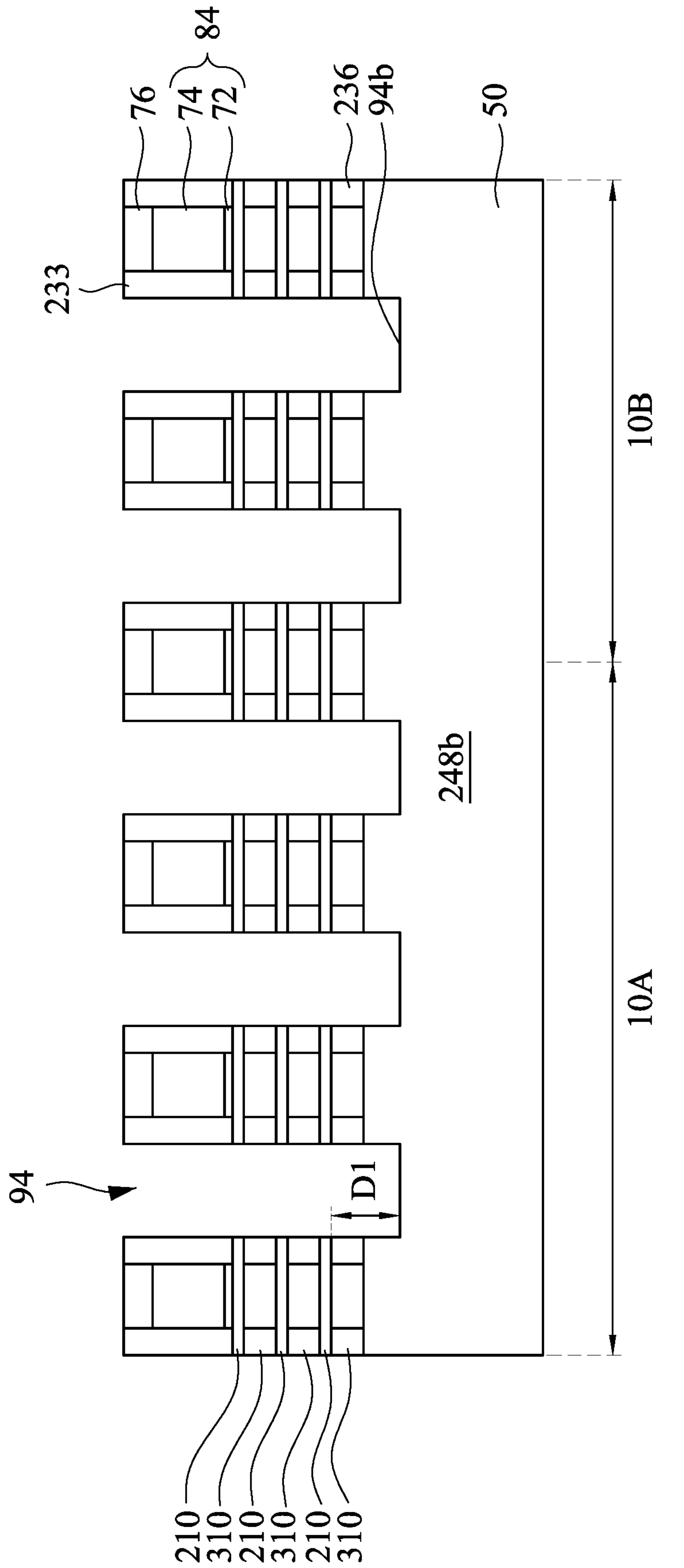

Reference is made to FIGS. 11A, 11B, and 11C. Source/drain recesses 94 are formed in the first and second semiconductor sheets 310, 210. In some embodiments, the source/drain recesses 94 extend through the first and second semiconductor sheets 310, 210 and into the semiconductive layers 248*a* and 248*b*. In some embodiments, the semiconductive layers 248*a* and 248*b* may be etched such that bottom surfaces of the source/drain recesses 94 are disposed below the top surfaces of the STI structures 251. The source/drain recesses 94 may be formed by etching the first and second semiconductor sheets 310, 210 using an anisotropic etching process, such as a RIE, a NBE, or the like. The gate spacers 233 and the dummy gate structures 84 collectively mask portions of the semiconductive layers 248*a* and 248*b* and/or the first and second semiconductor sheets 310, 210 during the etching processes used to form the source/drain recesses 94. A single etch process may be used to etch each of the first and second semiconductor sheets 310, 210, or multiple etch processes may be used to etch the first and second semiconductor sheets 310, 210. Timed etch processes may be used to stop the etching of the source/drain recesses 94 after the source/drain recesses 94 reach a desired depth. In some embodiments, the source/drain recess 94 has a bottom 94*b* that is in a position lower than a bottommost one of the second semiconductor sheets 210 about a vertical dimension D1. By way of example but not limitation, the vertical dimension D1 can be in a range from about 5 nm to about 60 nm, such as about 5, 10, 15, 20, 25, 30, 35, 40, 45, 50, 55, or 60 nm.

Subsequently, inner spacers 236 are formed on sidewalls of the remaining portions of the first semiconductor sheets 310, e.g., those sidewalls exposed by the source/drain recesses 94. As will be subsequently described in greater detail, source/drain regions will be subsequently formed in the source/drain recesses 94, and the first semiconductor sheets 310 will be subsequently replaced with corresponding gate structures. The inner spacers 236 act as isolation features between the subsequently formed source/drain regions and the subsequently formed gate structures. Further, the inner spacers 236 may be used to substantially prevent damage to the subsequently formed source/drain regions by subsequent etching processes, such as etching processes used to subsequently remove the first semiconductor sheets 310. In some embodiments, the inner spacers 236 can be interchangeably referred to lower gate spacers. In some embodiments, the inner spacers 236 may have a lateral dimension in a range from about 4 nm to about 12 nm.

As an example to form the inner spacers 236, the source/drain recesses 94 can be laterally expanded. Specifically, portions of the sidewalls of the first semiconductor sheets 310 exposed by the source/drain recesses 94 may be recessed. Although sidewalls of the first semiconductor sheets 310 are illustrated as being straight, the sidewalls may be concave or convex. The sidewalls may be recessed by any acceptable etching process, such as one that is selective to the material of the first semiconductor sheets 310 (e.g., selectively etches the material of the first semiconductor sheets 310 at a faster rate than the material of the second semiconductor sheets 210). The etching may be isotropic. For example, when the second semiconductor sheets 210 are formed of silicon and the first semiconductor sheets 310 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first semiconductor sheets 310. The inner spacers 236 can then be formed by conformally forming an insulating material and subsequently etching the insulating material. The insulating material may be silicon nitride or silicon oxynitride, although any suitable material, such as low-dielectric constant (low-k) materials having a k-value less than about 3.5, may be utilized. In some embodiments, the inner spacer 236 may have a higher K (dielectric constant) value than the gate spacer 233. In some embodiments, the material of inner spacer is selected from a group including $SiO_2$, $Si_3N_4$, SiON, SiOC, SiOCN base dielectric material, air gap, or combinations thereof. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 236 are illustrated as being flush with respect to the sidewalls of the gate spacers 233, the outer sidewalls of the inner spacers 236 may extend beyond or be recessed from the sidewalls of the gate spacers 233. In other words, the inner spacers 236 may partially fill, completely fill, or overfill the sidewall recesses. Moreover, although the sidewalls of the inner spacers 236 are illustrated as being straight, the sidewalls of the inner spacers 236 may be concave or convex.

Figure 12A:
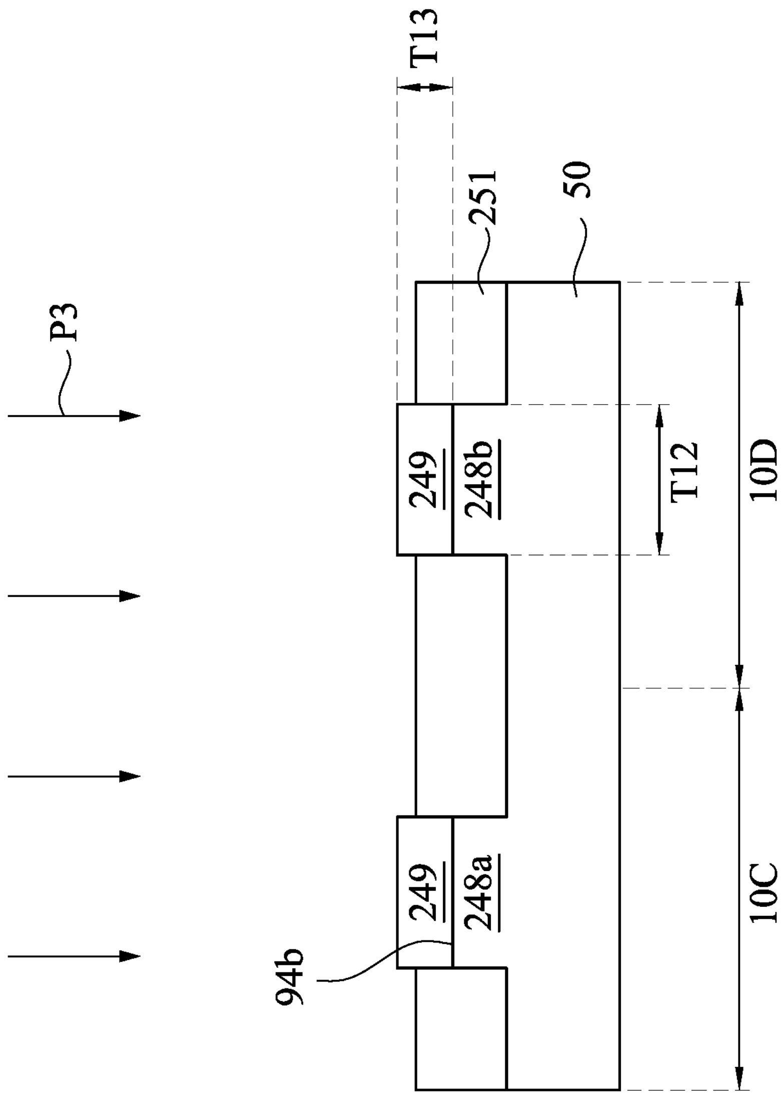
Figure 12B:
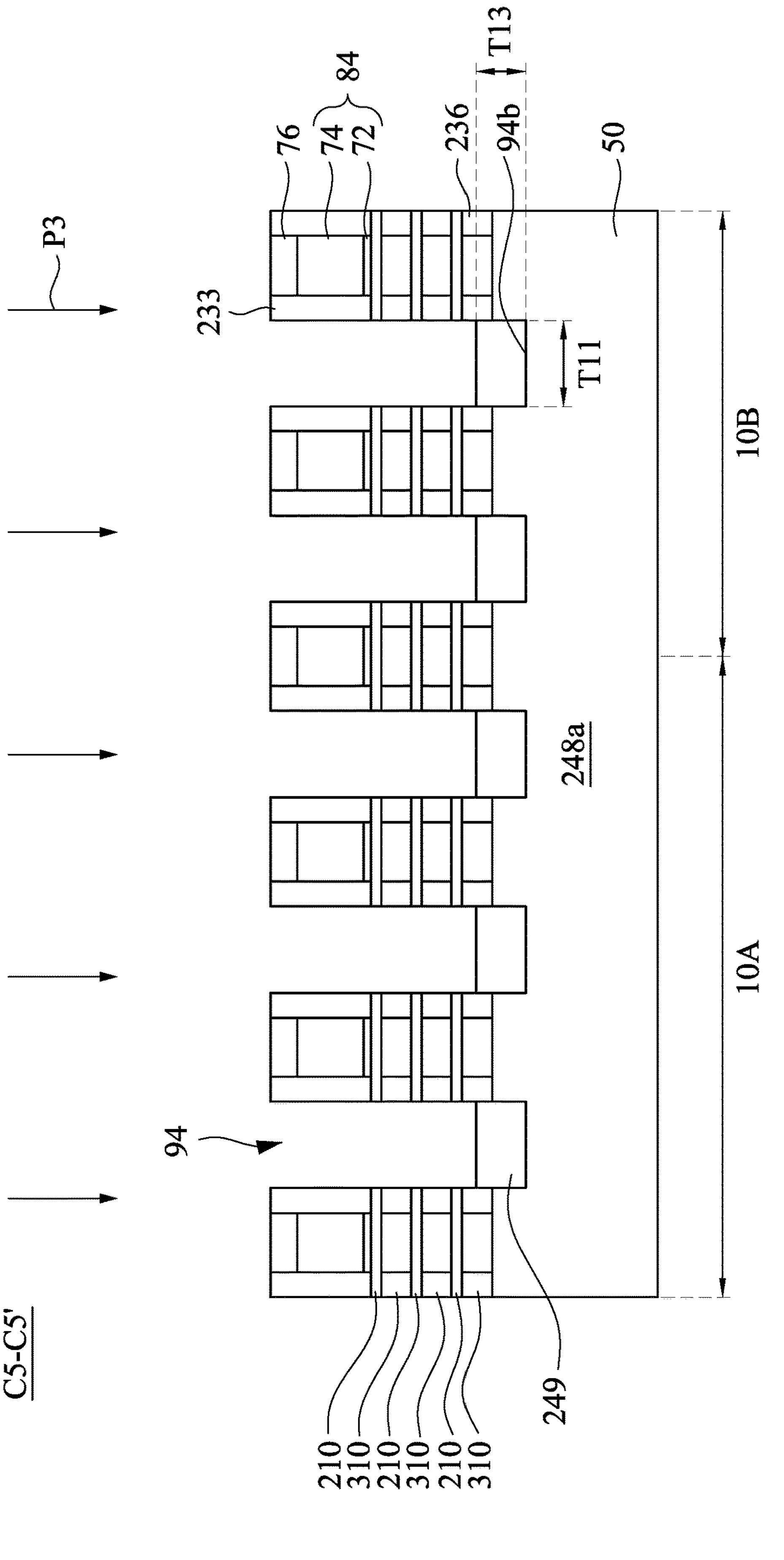
Figure 12C:
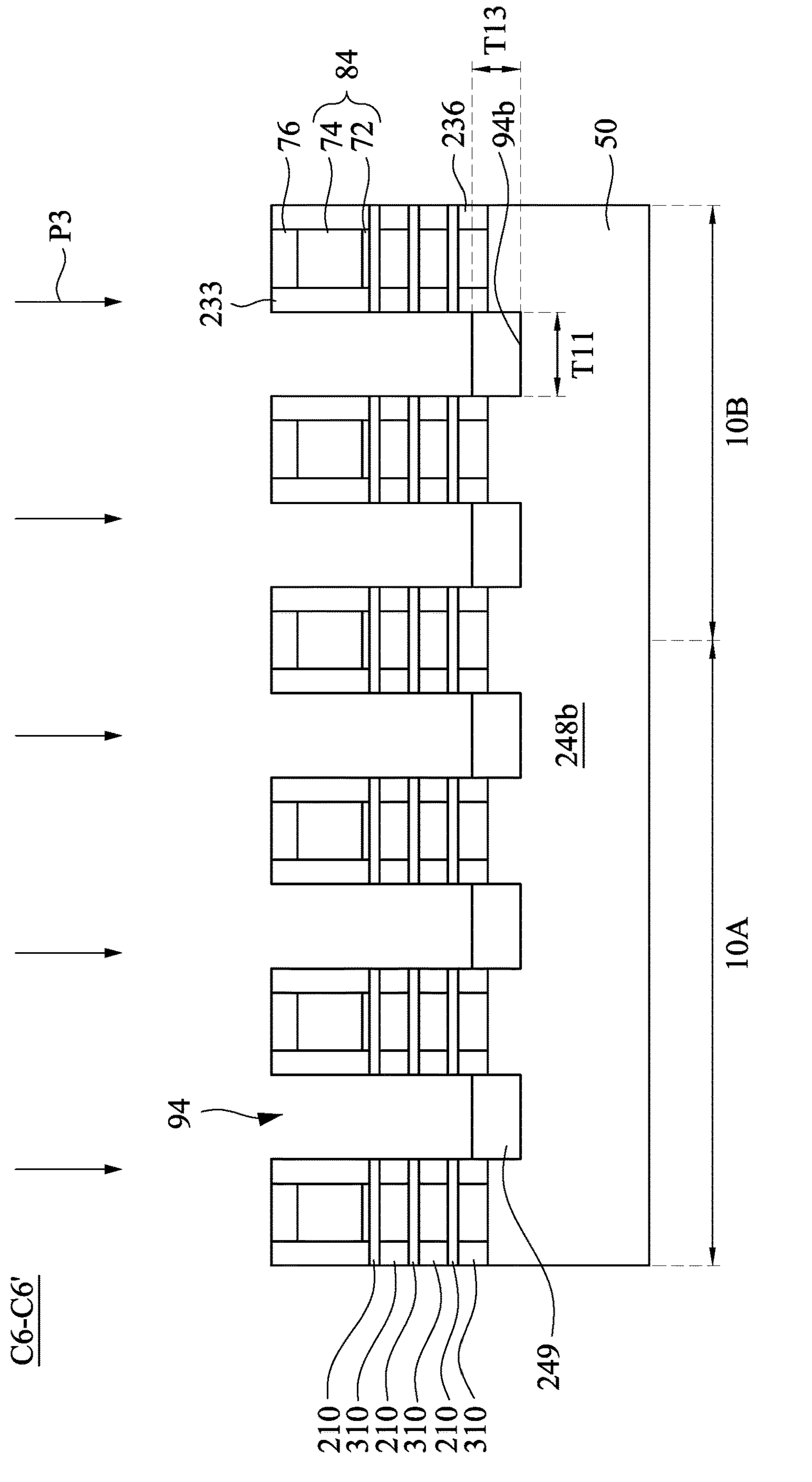

Reference is made to FIGS. 12A, 12B, and 12C. Dielectric layers 249 are formed on bottoms 94*b* of the source/drain recesses 94 where source/drain regions 218*a* and 218*b* (see FIGS. 13A-13C) will be subsequently formed thereon. In particular, a selective deposition process P3 may include a deposition step to deposit the dielectric material over the substrate 50 and a sputter step to remove the dielectric material deposited on sidewalls of the recesses 94 and an upper surface above the substrate 50, so as to leave the deposited dielectric material on a lower surface above the substrate 50. In some embodiments, the selective deposition process P3 may be performed by an inductively coupled plasma (ICP) tool or a capacitively coupled plasma (CCP) tool. In some embodiments, the deposition gas used in the selective deposition process P3 may include, for example, a silicon source gas, such as silicon tetrachloride gas, $SiCl_4$, and an oxygen source gas, such as molecular oxygen gas, O2, in plasma state to form a silicon oxide layer over the substrate 50. In some embodiments, the deposition gas used in the selective deposition process P3 may include, for example, a fluorocarbon ($C_xF_y$) source gas, such as $C_4F_6$ and/or $C_4F_8$, and an oxygen source gas, such as molecular oxygen gas, $O_2$, in plasma state to form a $C_xF_y$ layer over the substrate 105. In some embodiments, the deposition gas used in the selective deposition process P3 may include a mixture of $BCl_3$ and $N_2$ to deposit boron or boron nitride; a mixture of $BCl_3$, $CH_4$ and $H_2$ to deposit boron carbide. In some embodiments, sputter etching caused by plasmas in the selective deposition process P3 may provide a higher sputter etch rate at the dielectric material on the sidewalls of the recesses 94 and the upper surface above the substrate 50 than on the lower surface above the substrate 50, such that the net effect of the deposition and sputter etching in the selective deposition process P3 leads to the dielectric material remaining on the bottom 94*b* of the recess 94 and absent on the sidewalls of the recesses 94 and the upper surface above the substrate 50. In some embodiments, the deposition and sputter etching in the selective deposition process P3 may be performed in-situ or ex-situ.

In some embodiments, the dielectric layer 249 can be made of a different material than the inner spacer 236. In some embodiments, the dielectric layer 249 can be made of a same material as the inner spacer 236. In some embodiments, the dielectric layer 249 can be formed during a same process as forming the inner spacer 236, in which the material to form the inner spacer 236 can be remained at the bottom 94*b* of the recess 94 to act as the dielectric layer 249. In some embodiments, the dielectric layer 249 is made of an oxide-containing material (e.g., $SiO_2$), a nitrogen-containing material (e.g., SiON, SiN, $Si_3N_4$), a carbon-containing material (e.g., SiOC, SIOCN), the like, or combinations thereof. In some embodiments, the dielectric layer 249 may be made of a material having a dielectric constant greater than about 7.9 (e.g., high dielectric constant (high-k) material). For example, the dielectric layer 249 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof.

In some embodiments, the dielectric layer 249 may have a lateral dimension T11 (see FIGS. 12B and 12C) in parallel with the lengthwise direction of the semiconductor sheet 210, and a lateral dimension T12 (see FIG. 12A) in parallel with the lengthwise direction of the gate electrode 220, and a vertical dimension T13 (see FIGS. 12A-12C) perpendicular to the lateral dimensions T11 and T12. By way of example and not limitation, the lateral dimension T11 of the dielectric layer 249 may be in a range from about 13 to about 40 nm, such as about 13, 15, 20, 25, 30, 35, or 40 nm, the vertical dimension T13 of the dielectric layer 249 may be in a range from about 5 to about 50 nm, such as about 5, 10, 15, 20, 25, 30, 35, 40, 45, or 50 nm. In some embodiments, the vertical dimension of the dielectric layer 249 in the first logic circuit region 10A can be greater than the vertical dimension of the dielectric layer 249 in the second logic circuit region 10B. In some embodiments, the vertical dimension of the dielectric layer 249 in the first logic circuit region 10A can be less than the vertical dimension of the dielectric layer 249 in the second logic circuit region 10B. In some embodiments, the vertical dimension of the dielectric layer 249 in the first logic circuit region 10A can substantially the same as the vertical dimension of the dielectric layer 249 in the second logic circuit region 10B.

Figure 13A:
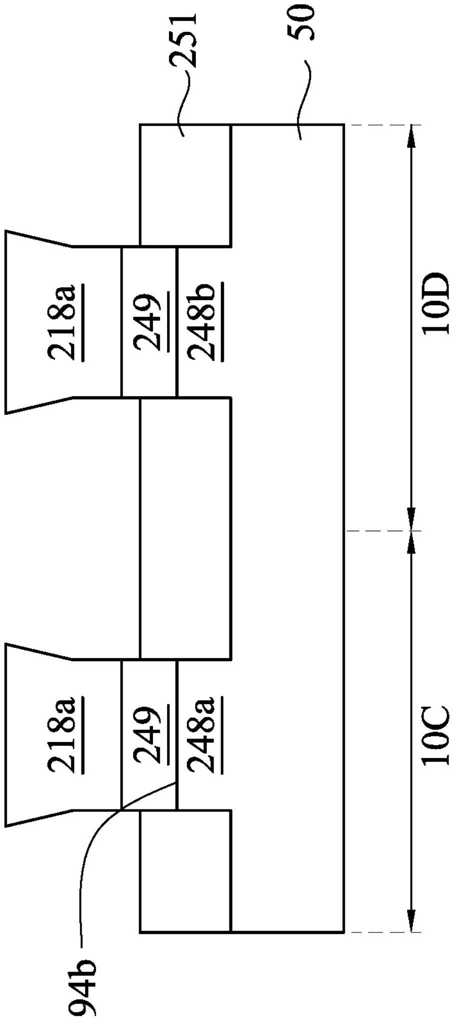
Figure 13B:
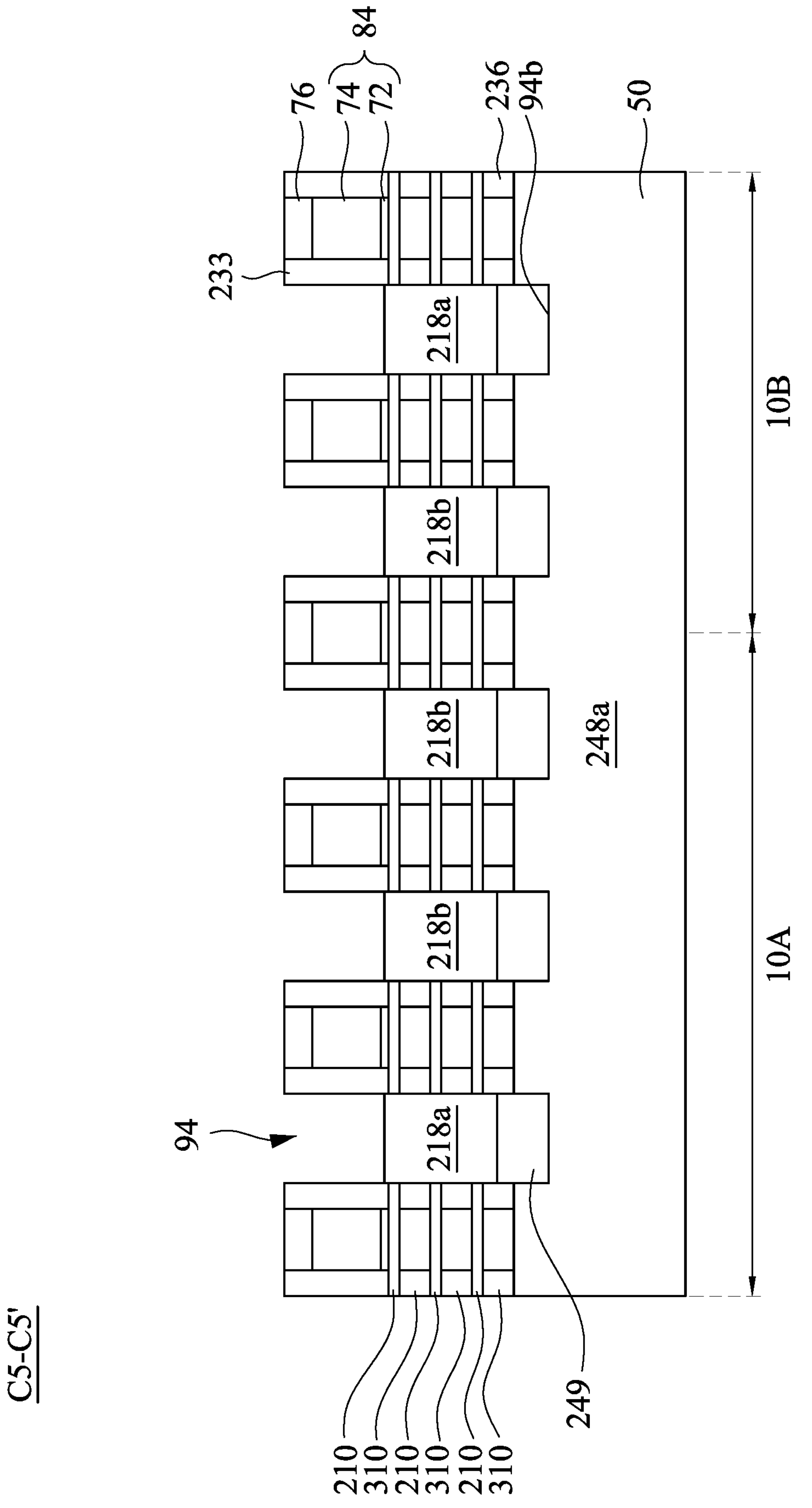
Figure 13C:
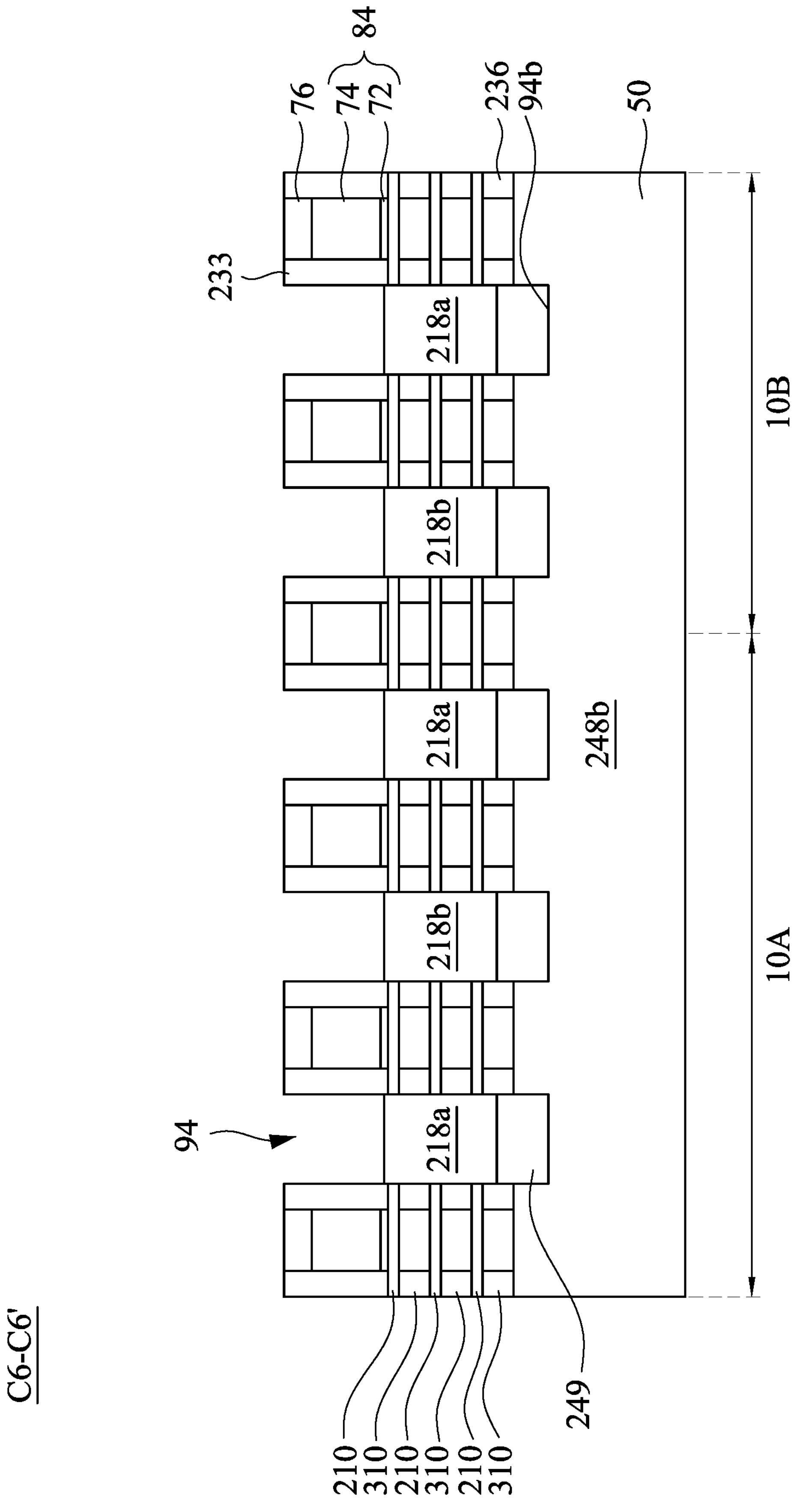

Reference is made to FIGS. 13A, 13B, and 13C. Epitaxial source/drain regions 218*a* and 218*b* are formed in the source/drain recesses 94, such that each dummy gate 84 (and corresponding channel regions) is disposed between respective adjacent pairs of the epitaxial source/drain regions 218*a* and 218*b*. In some embodiments, the gate spacers 233 and the inner spacers 236 are used to separate the epitaxial source/drain regions 218*a* and 218*b* from, respectively, the dummy gate structures 84 and the first semiconductor sheets 310 by an appropriate lateral distance so that the epitaxial source/drain regions 218*a* and 218*b* do not short out with subsequently formed gates of the resulting nano-FETs. A material of the epitaxial source/drain regions 218*a* and 218*b* may be selected to exert stress in the respective channel regions, thereby improving performance of the semiconductor structure.

The epitaxial source/drain regions 218*a* and 218*b* in the first conductivity type device region 10C may be formed by masking the second conductivity type device region 10D. Then, the epitaxial source/drain regions 218*a* and 218*b* in the first conductivity type device region 10C is epitaxially grown in the source/drain recesses 94 in the first conductivity type device regions 10C. The epitaxial source/drain regions 218*a* and 218*b* in the first conductivity type device region 10C may include any acceptable material appropriate for n-type devices. For example, the epitaxial source/drain regions 218*a* and 218*b* in the first conductivity type device region 10C may include materials exerting a tensile strain on the channel regions, such as silicon, silicon carbide, phosphorous doped silicon carbide, silicon phosphide, or the like. The epitaxial source/drain regions 218*a* and 218*b* in the first conductivity type device region 10C may be referred to as "n-type source/drain region." The epitaxial source/drain regions 218*a* and 218*b* in the first conductivity type device region 10C may have surfaces raised from respective surfaces of the semiconductive layers 248*a* and 248*b* and the first and second semiconductor sheets 310, 210, and may have facets. In some embodiments, the source/drain regions 218*a* and 218*b* of the first conductivity type device region 10C may have a phosphorus concentration within a range from about 2E19/cm$^3$ to about 3E21/cm$^3$.

The epitaxial source/drain regions 218*a* and 218*b* in the second conductivity type device region 10D may be formed by masking the first conductivity type device region 10C. Then, the epitaxial source/drain regions 218*a* and 218*b* in the second conductivity type device region 10D can be epitaxially grown in the source/drain recesses 94 in the second conductivity type device region 10D. The epitaxial source/drain regions 218*a* and 218*b* in the second conductivity type device region 10D may include any acceptable material appropriate for p-type devices. For example, the epitaxial source/drain regions 218*a* and 218*b* in the second conductivity type device region 10D may include materials exerting a compressive strain on the channel regions, such as silicon germanium, boron doped silicon germanium, germanium, germanium tin, or the like. The epitaxial source/drain regions 218*a* and 218*b* in the second conductivity type device region 10D may be referred to as "p-type source/drain region." The epitaxial source/drain regions 218*a* and 218*b* in the second conductivity type device region 10D may have surfaces raised from respective surfaces of the semiconductive layers 248*a* and 248*b* and the first and second semiconductor sheets 310, 210, and may have facets. In some embodiments, the source/drain regions 218*a* and 218*b* of the second conductivity type device region 10D may have a boron concentration within a range from about 1E19/cm$^3$ to about 6E20/cm$^3$. In some embodiments, the source/drain regions 218*a* and 218*b* of the second conductivity type device region 10D may have a Ge atomic percentage within a range of about 36% to about 85%.

Figure 14A:
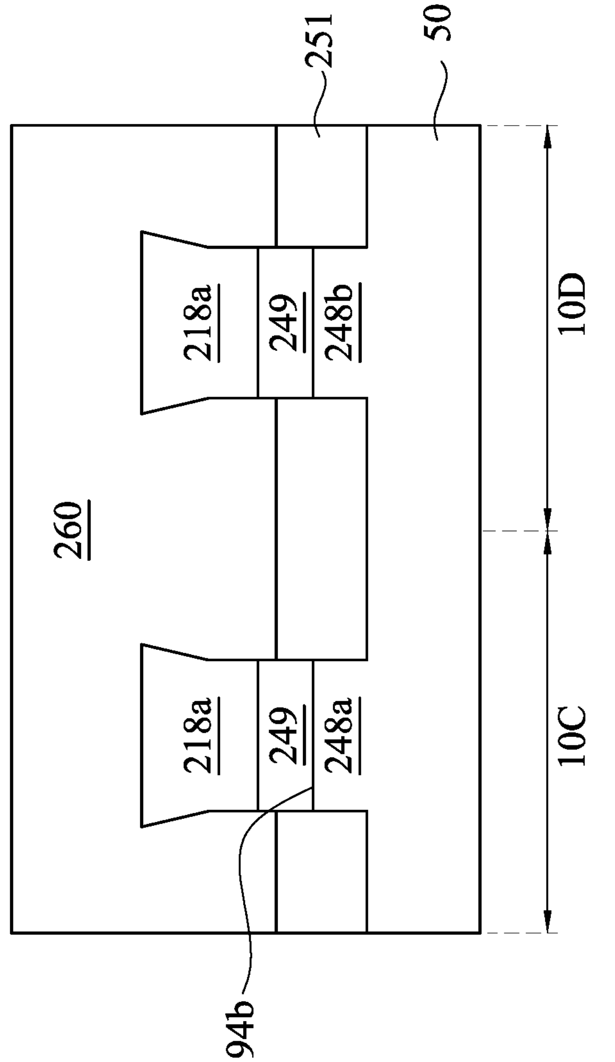
Figure 14B:
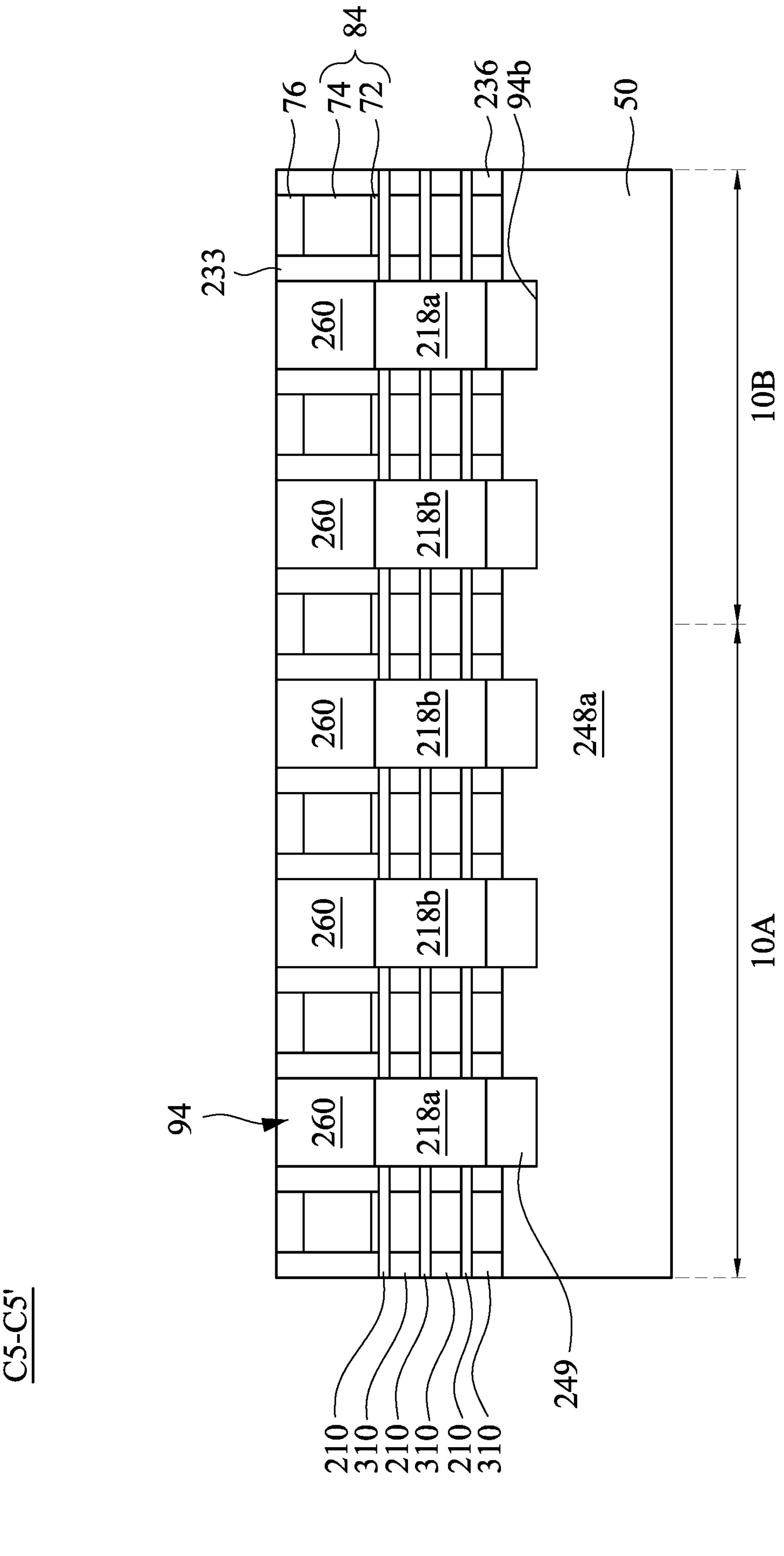
Figure 14C:
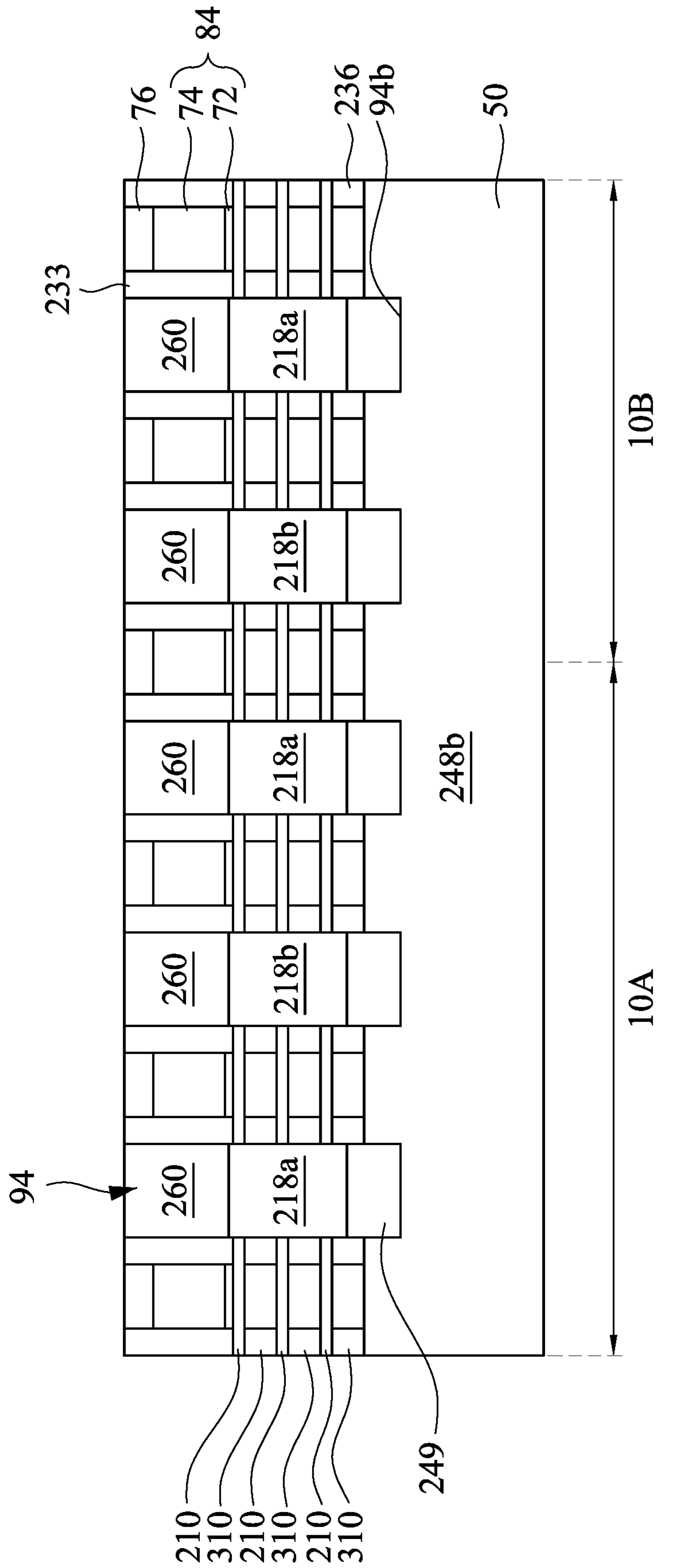

Reference is made to FIGS. 14A, 14B, and 14C. An inter-layer dielectric (ILD) layer 260 is deposited over the epitaxial source/drain regions 218*a* and 218*b*, the gate spacers 233, the dummy gate structures 84. The ILD layer 260 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) is formed between the ILD layer 260 and the epitaxial source/drain regions 218*a* and 218*b*, the gate spacers 233, and the dummy gate structures 844. The CESL may be formed of a dielectric material, such as silicon nitride, silicon oxide, silicon oxynitride, or the like, having a high etching selectivity from the etching of the ILD 260. The CESL may be formed by an any suitable method, such as CVD, ALD, or the like.

Subsequently, a removal process is performed to level the top surfaces of the ILD layer 260 with the top surfaces of the dummy gate structures 84. In some embodiments, a planarization process such as a chemical mechanical polish (CMP), an etch-back process, combinations thereof, or the like may be utilized. The planarization process may also remove the masks 76 on the dummy gate structures 84, and portions of the gate spacers 233 along sidewalls of the masks 76. After the planarization process, the top surfaces of the gate spacers 233, the ILD layer 260, the CESL, and the dummy gate structures 84 are coplanar (within process variations). Accordingly, the top surfaces of the dummy gate structures 84 are exposed through the ILD layer 260. In some embodiments, the masks 76 remain, and the planarization process levels the top surfaces of the ILD layer 260 with the top surfaces of the masks 76.

Figure 15A:
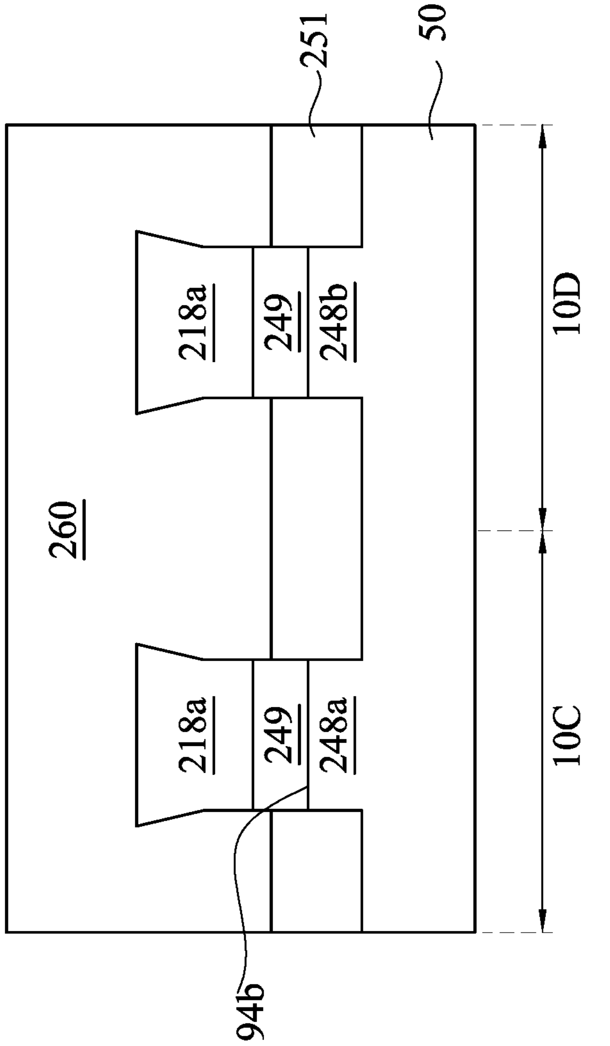
Figure 15B:
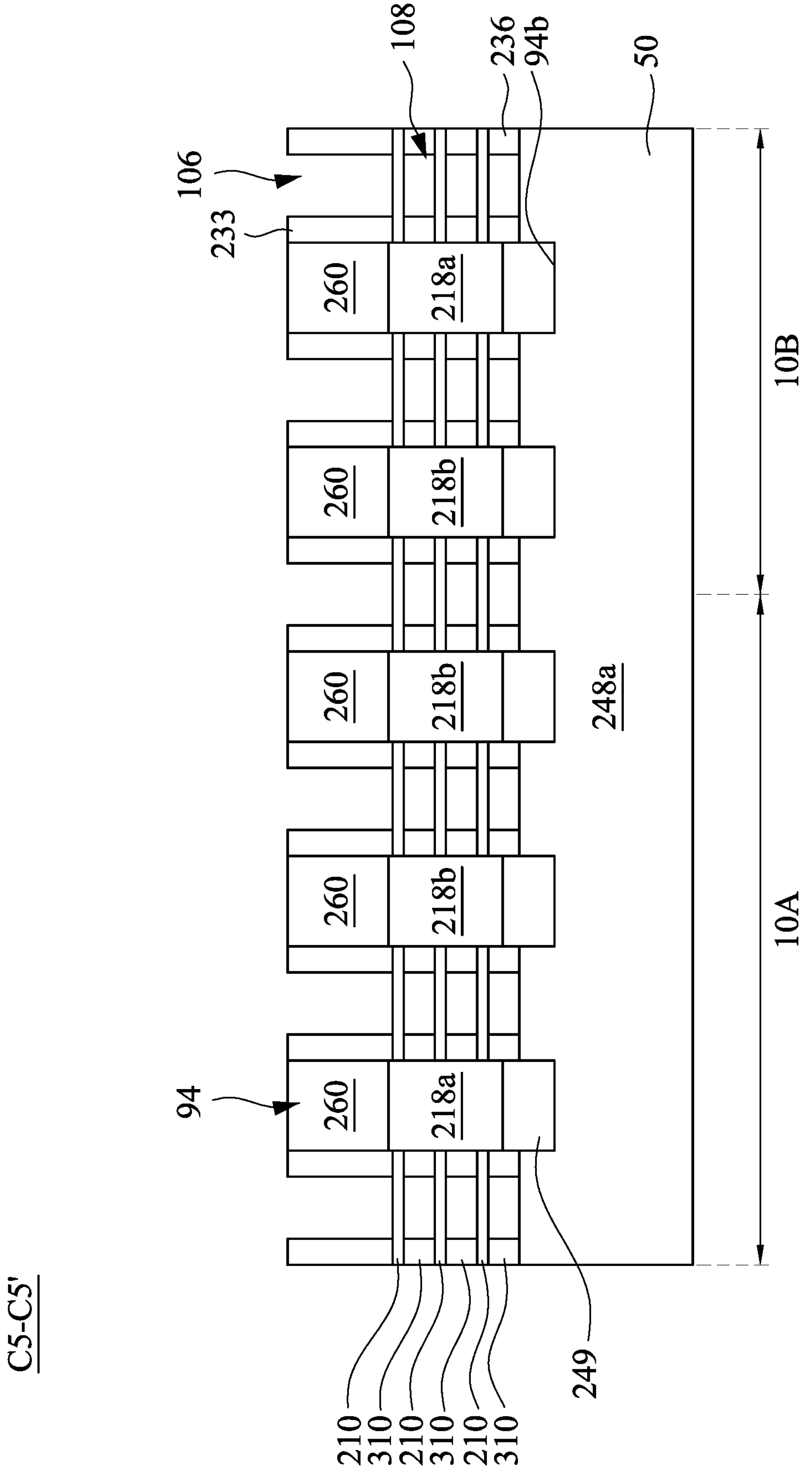
Figure 15C:
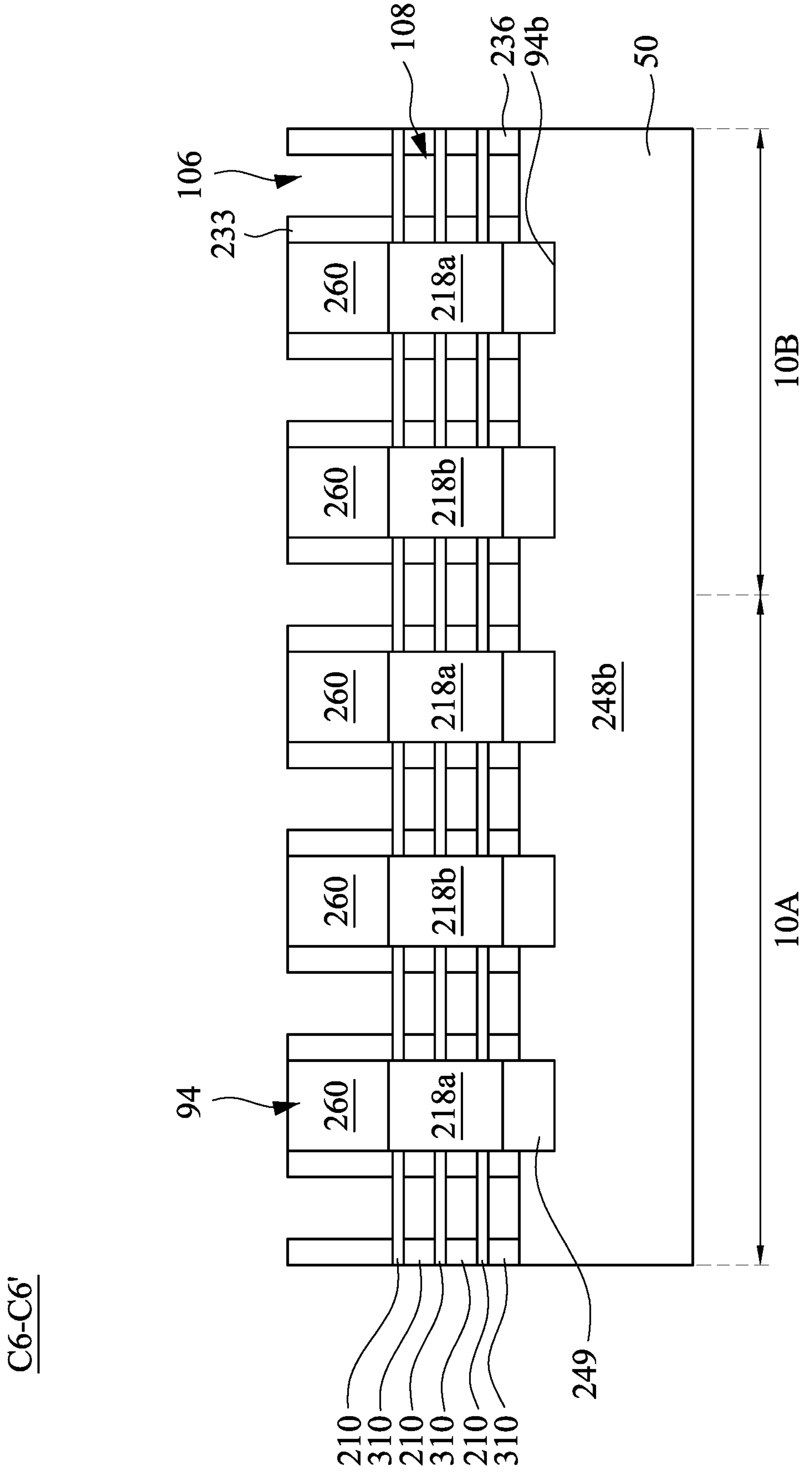

Reference is made to FIGS. 15A, 15B, and 15C. The dummy gate structures 84 are removed in an etching process, so that recesses 106 are formed. Portions of the dummy dielectrics 72 in the recesses 106 are also removed. In some embodiments, the dummy gate structures 84 are removed by an anisotropic dry etch process. For example, the etching process may include a dry etch process using reaction gas(es) that selectively etch the dummy gate structures 84 at a faster rate than the ILD layer 260 or the gate spacers 233. During the removal, the dummy dielectrics 72 may be used as etch stop layers when the dummy gate structures 84 are etched. The dummy dielectrics 72 are then removed. Each recess 106 exposes and/or overlies portions of the channel regions. Portions of the second semiconductor sheets 210 which act as the channel regions are disposed between adjacent pairs of the epitaxial source/drain regions 218*a* and 218*b*.

The remaining portions of the first semiconductor sheets 310 are then removed to expand the recesses 106, such that openings 108 are formed in regions between the second semiconductor sheets 210. The remaining portions of the first semiconductor sheets 310 can be removed by any acceptable etching process that selectively etches the material of the first semiconductor sheets 310 at a faster rate than the material of the second semiconductor sheets 210. The etching may be isotropic. For example, when the first semiconductor sheets 310 are formed of silicon germanium and the second semiconductor sheets 210 are formed of silicon, the etching process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second semiconductor sheets 210. In some embodiments, the removing of the remaining portions of the first semiconductor sheets 310 can be interchangeably referred to as a channel releasing process. The second semiconductor sheets 210 can be interchangeably referred to as a vertically stacked multiple channels (sheets) and may have a vertically sheet pitch within a range of from about 10 nm to about 30 nm, such as about 10, 12, 14, 16, 18, 20, 22, 23, 24, 26, 28, or 30 nm. In some embodiments, the second semiconductor sheets 210 may have a thickness within a range from about 4 nm to about 10 nm, such as about 4, 5, 6, 7, 8, 9, or 10 nm. In some embodiments, the vertically sheet pitch of the between adjacent two of the second semiconductor sheets 210 may be within a range from about 6 to about 20 nm, such as about 6, 7, 8, 9, 10, 11, 12, 13, 14, 15, 16, 17, 18, 19, or 20 nm.

Figure 16A:
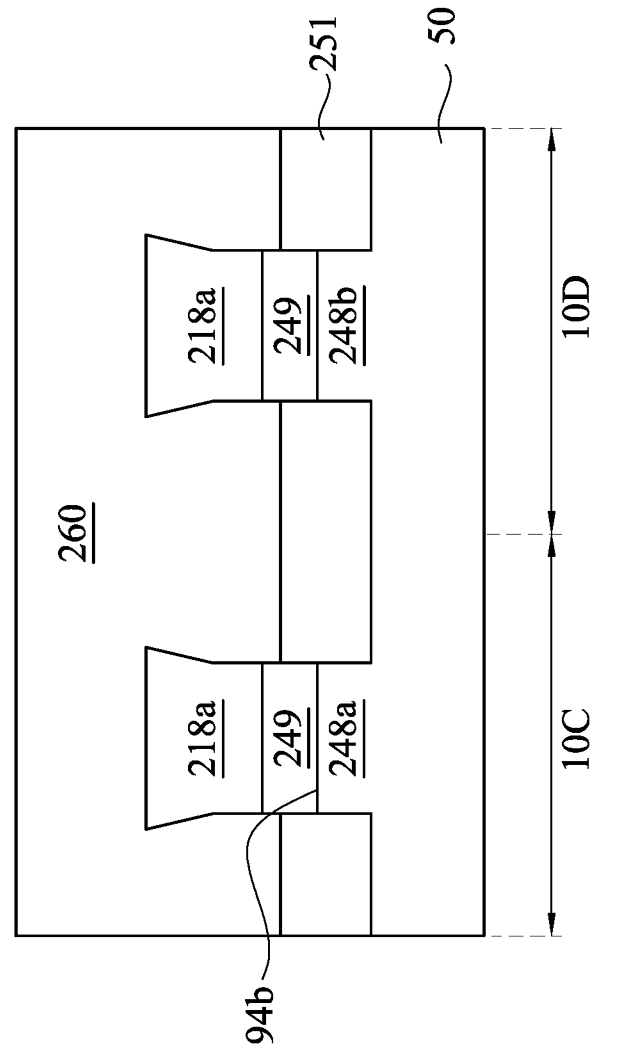
Figure 16B:
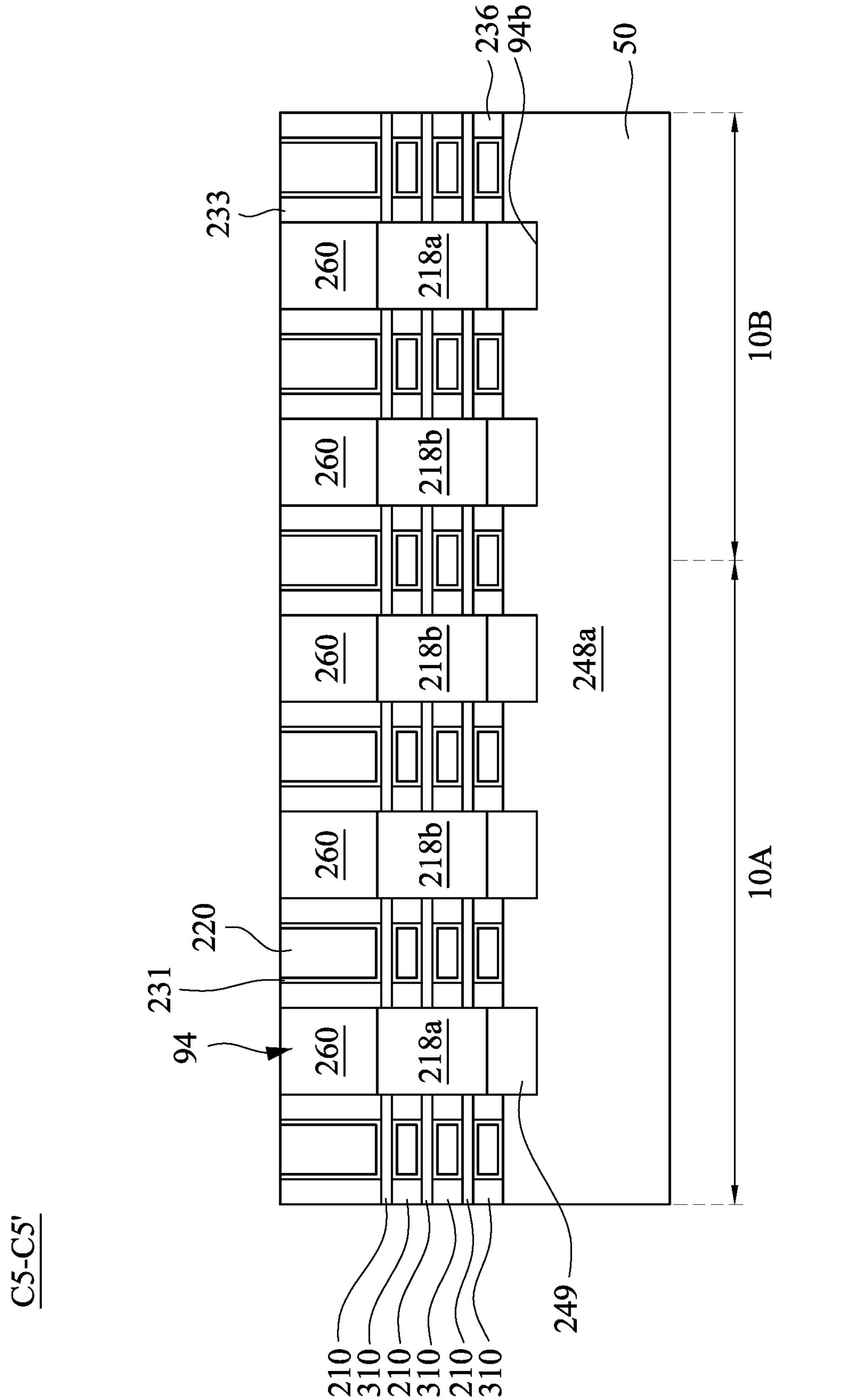
Figure 16C:
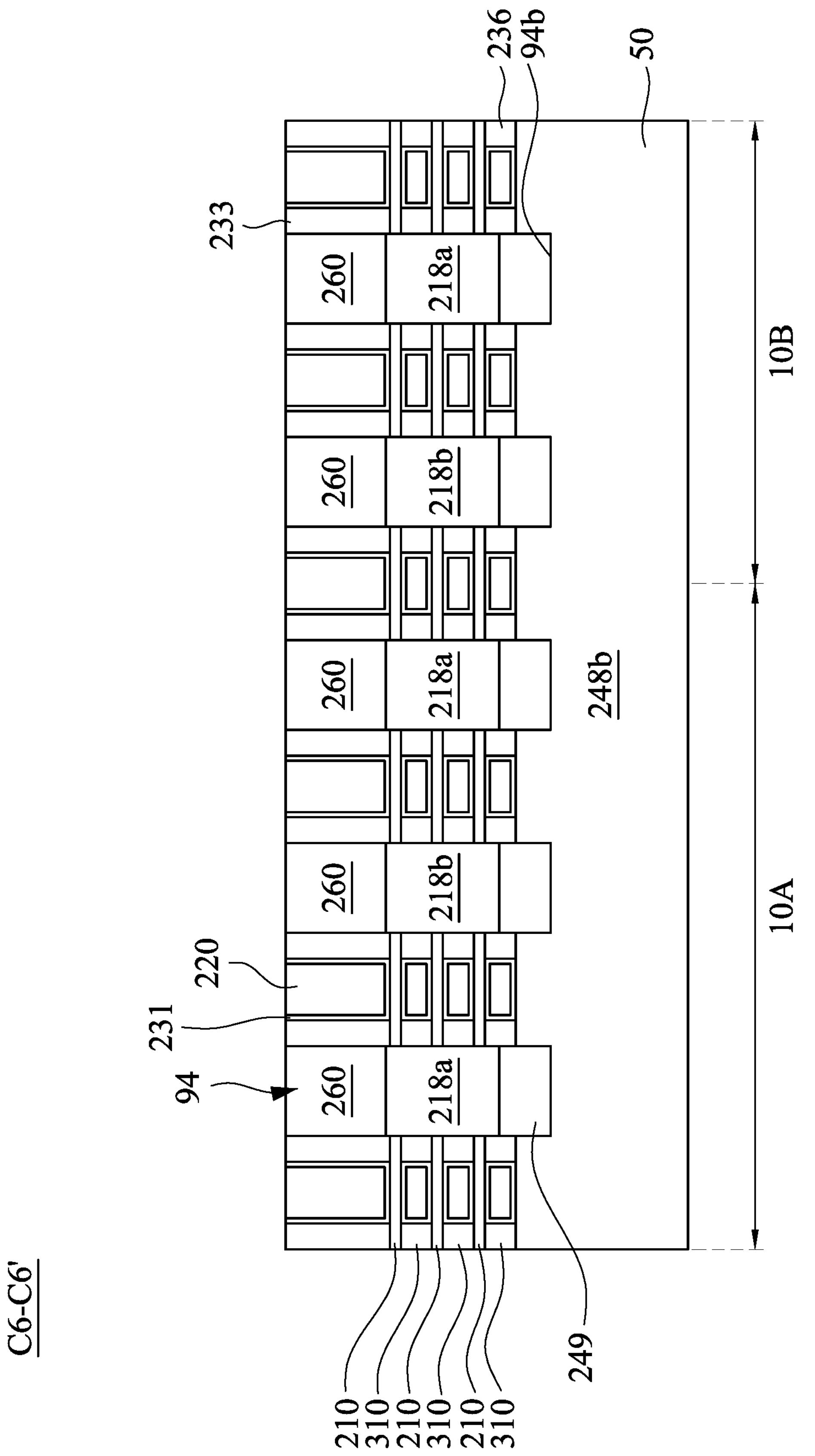

Reference is made to FIGS. 16A, 16B, and 16C. Gate structures are formed to wrap around the second semiconductor sheets 210. A gate dielectric layer 231 is formed in the recesses 106. Gate electrode layers 220 are formed on the gate dielectric layer 231. The gate dielectric layer 231 and the gate electrode layers 220 are layers for replacement gates, and each wrap around all (e.g., four) sides of the second semiconductor sheet 210. In some embodiments, the gate structure can be interchangeably referred to as a gate strip or a gate pattern.

The gate dielectric layer 231 is disposed on the sidewalls and/or the top surfaces of the semiconductive layers 248*a* and 248*b*; on the top surfaces, the sidewalls, and the bottom surfaces of the second semiconductor sheets 210; and on the sidewalls of the gate spacers 233. The gate dielectric layer 231 may include an oxide such as silicon oxide or a metal oxide, a silicate such as a metal silicate, combinations thereof, multi-layers thereof, or the like. The gate dielectric layer 231 may include a dielectric material having a k-value greater than about 7.0, such as a metal oxide or a silicate of hafnium, aluminum, zirconium, lanthanum, manganese, barium, titanium, lead, and combinations thereof. Although a single-layered gate dielectric layer 231 is illustrated in FIGS. 15B and 15C, as will be subsequently described in greater detail, the gate dielectric layer 231 may include any number of interfacial layers and any number of main layers.

The gate electrode layers 220 may include a metal-containing material such as titanium nitride, titanium oxide, tungsten, cobalt, ruthenium, aluminum, combinations thereof, multi-layers thereof, or the like. Although a single-layered gate electrode layers 220 is illustrated in FIGS. 15B and 15C, as will be subsequently described in greater detail, the gate electrode layer 220 may include any number of work function tuning layers, any number of barrier layers, any number of glue layers, and a fill material. In some embodiments, the gate electrode layers 220 may be made of a material selected from a group including TiN, TaN, TiAl, TiAlN, TaAl, TaAlN, TaAlC, TaCN, WNC, Co, Ni, Pt, W, or combinations thereof.

The formation of the gate dielectric layers 231 in the first conductivity type device region 10C and the second conductivity type device region 10D may form simultaneously such that the gate dielectric layers 231 in each region are formed of the same materials, and the formation of the gate electrode layers 220 may form simultaneously such that the gate electrode layers 220 in each region are formed of the same materials. In some embodiments, the gate dielectric layers 231 in each region may be formed by distinct processes, such that the gate dielectric layers 231 may be different materials and/or have a different number of layers, and/or the gate electrode layers 220 in each region may be formed by distinct processes, such that the gate electrode layers 220 may be different materials and/or have a different number of layers. Various masking steps may be used to mask and expose appropriate regions when using distinct processes. In the following description, at least portions of the gate electrode layers 220 in the first conductivity type device region 10C and the gate electrode layers 220 in the second conductivity type device region 10D are formed separately.

Subsequently, a removal process is performed to remove the excess portions of the materials of the gate dielectric layer 231 and the gate electrode layers 220, which excess portions are over the top surfaces of the ILD layer 260 and the gate spacers 233, thereby forming gate dielectric layer 231 and gate electrode layers 220. In some embodiments, a planarization process such as a chemical mechanical polish (CMP), an etch-back process, combinations thereof, or the like may be utilized. The gate dielectric layer 231, when planarized, has portions left in the recesses 106 (thus forming the gate dielectric layer 231). The gate electrode layers 220, when planarized, have portions left in the recesses 106 (thus forming the gate electrode layers 220). The top surfaces of the gate spacers 233; the CESL (not shown); the ILD layer 260; the gate dielectric layer 231, and the gate electrodes are coplanar (within process variations). The gate dielectric layer 231 and the gate electrode layers 220 form replacement gates of the resulting nano-FETs. Each respective pair of a gate dielectric layer 231 and a gate electrode layer 220 may be collectively referred to as a gate structure, a gate pattern, a gate strip, or a functional gate structure. The gate structures each extend along top surfaces, sidewalls, and bottom surfaces of a channel region of the second semiconductor sheet 210. In some embodiments, the gate electrode layers 220 each have a gate length in a range from about 6 nm to about 20 nm.

Figure 17A:
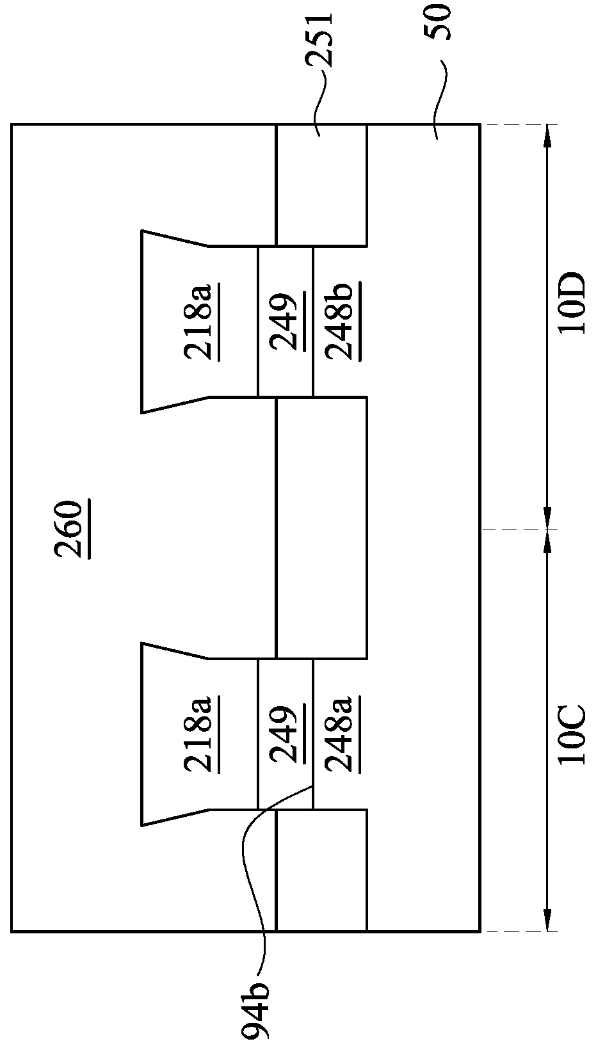
Figure 17B:
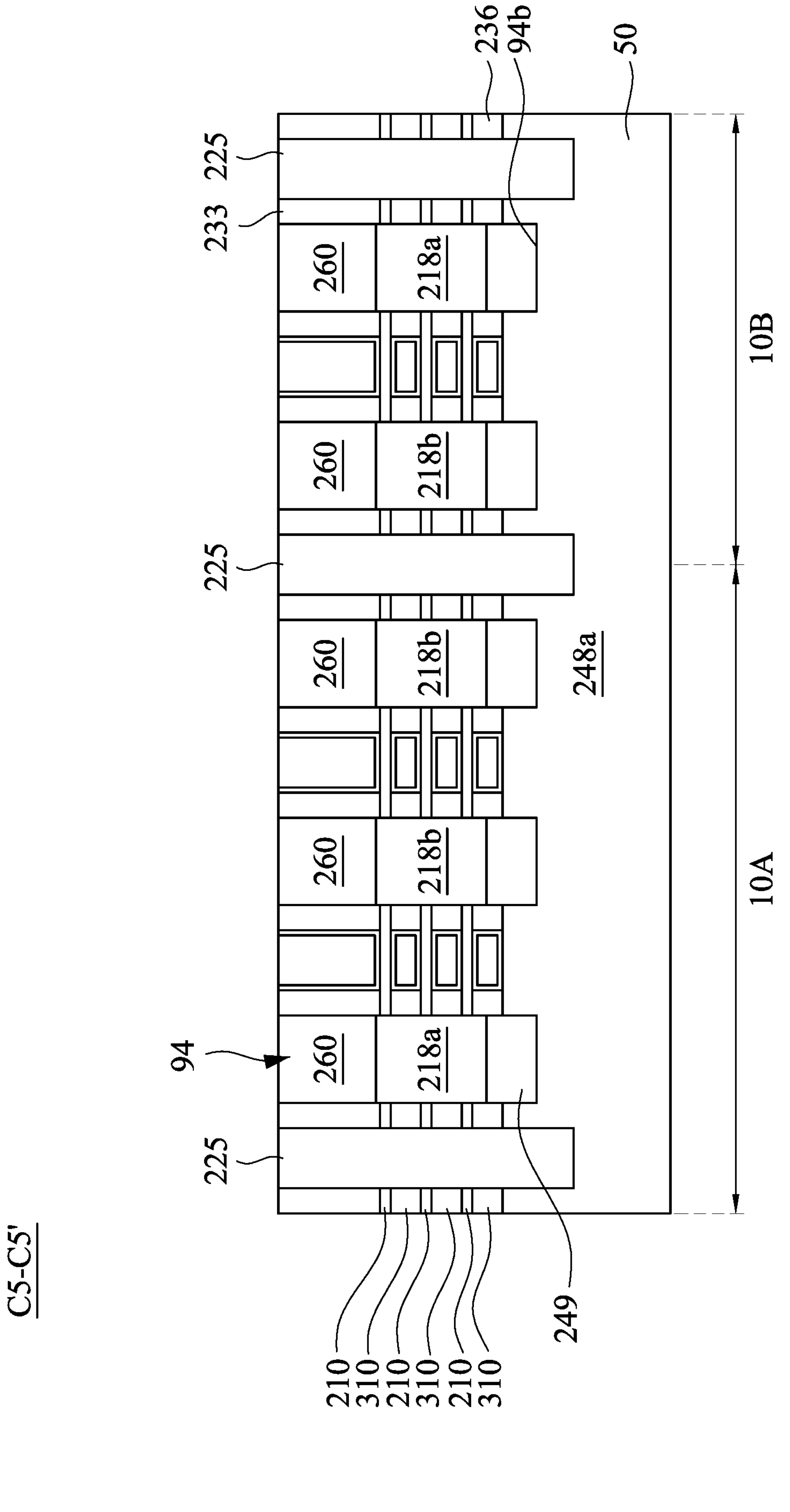
Figure 17C:
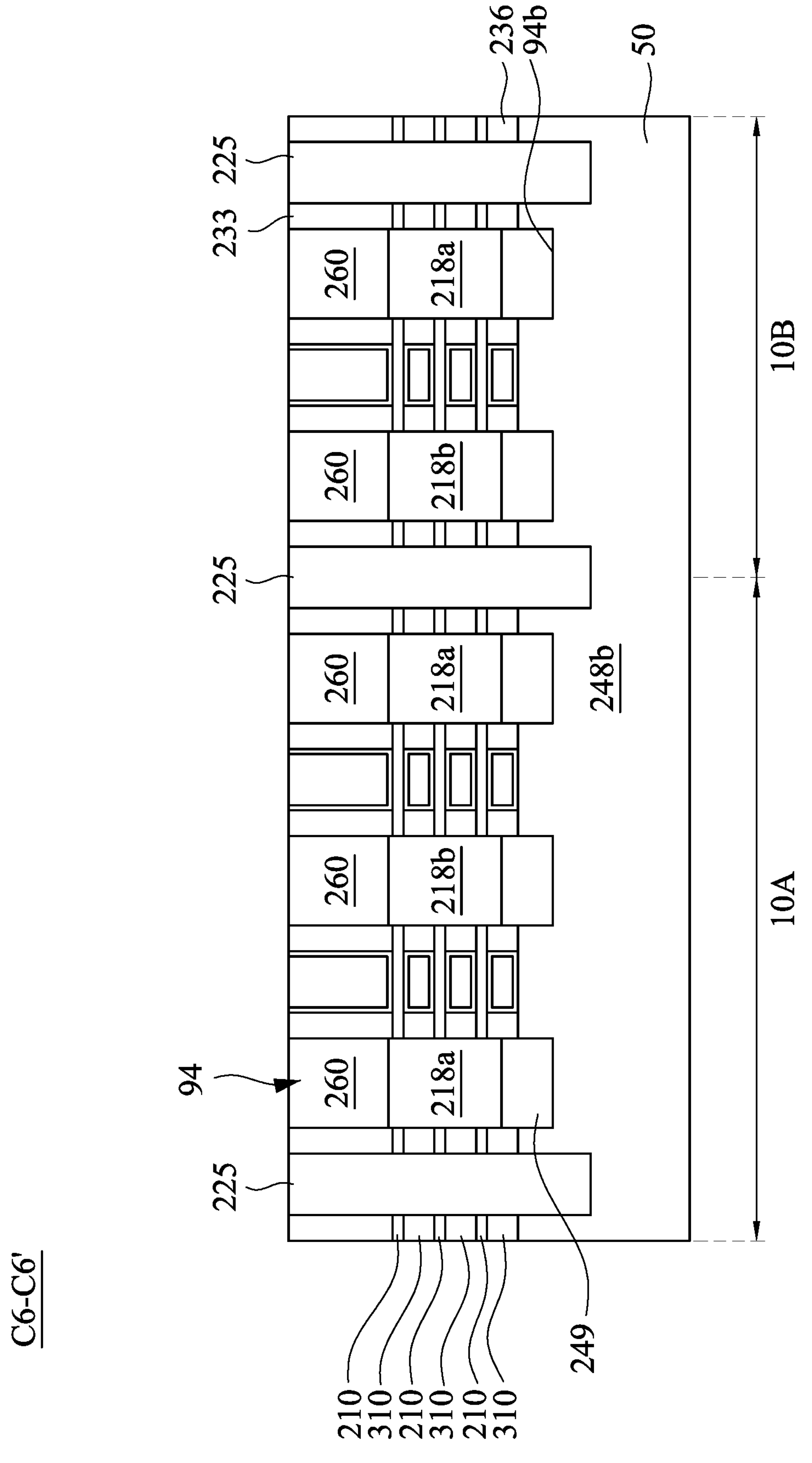

Reference is made to FIGS. 17A, 17B, and 17C. The gate electrode layers 220 and the gate dielectric layer 231 on the boundary of the first and second logic circuit regions 10A and 10B are removed to form isolation regions separating the source/drain regions of neighboring semiconductor devices from each other and separate different semiconductor devices. The isolation region may be formed by using an etching process. In the etching process, the gate electrode layers 220 and the gate dielectric layer 231 on the boundary of the first and second logic circuit regions 10A and 10B are etched anisotropically, until the underlying semiconductive layers 248*a* and 248*b* are exposed. The semiconductive layers 248*a* and 248*b* are then etched, and the etching continues down into the underlying semiconductive layer 248*a*/248*b* and deeper than the recess 94. In some embodiments, the etching may be stopped on the STI structures 251. Subsequently, a dielectric material is filled in the isolation region (i.e., spaces originally occupied by the gate electrode layers 220 and the gate dielectric layer 231 warping the gate electrode layers 220) to form dielectric-base gates 225. As shown in FIGS. 2A and 2B, the dielectric-base gates 225 extend in the Y-direction and being dummy gates. The gate electrodes 220 are arranged between the dielectric-base gates 225. The material of the dielectric-base gates 225 is different from that of the gate electrodes 220. In some embodiments, the dielectric-base gates 225 can be made of silicon oxide ($SiO_x$), silicon nitride ($Si_xNy$), silicon oxynitride (SiON), dielectric material(s), other suitable material, or a combination thereof. In some embodiments, the dielectric-base gates 225 can be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 18A:
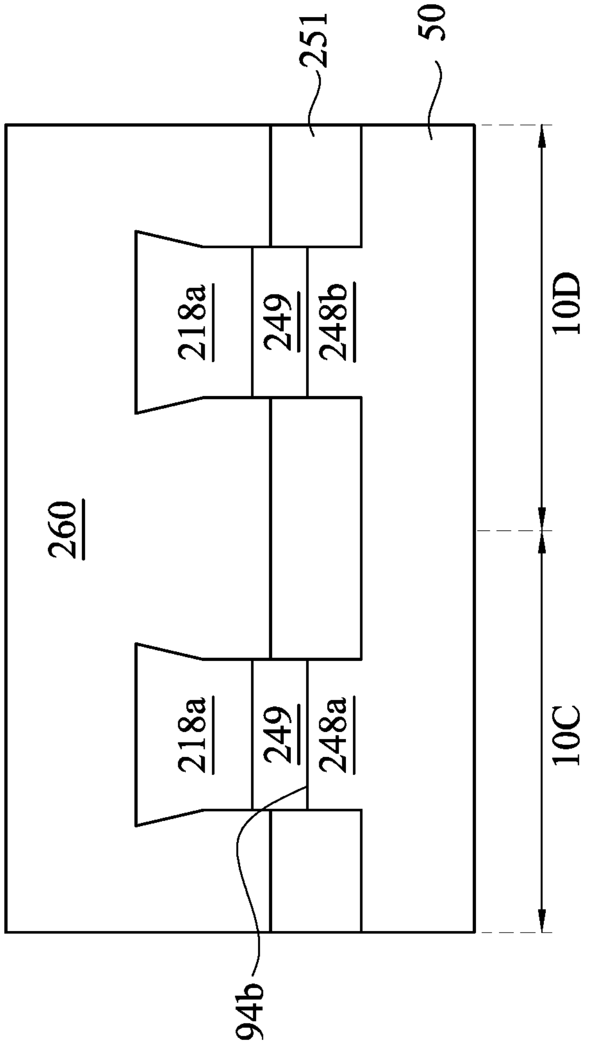
Figure 18B:
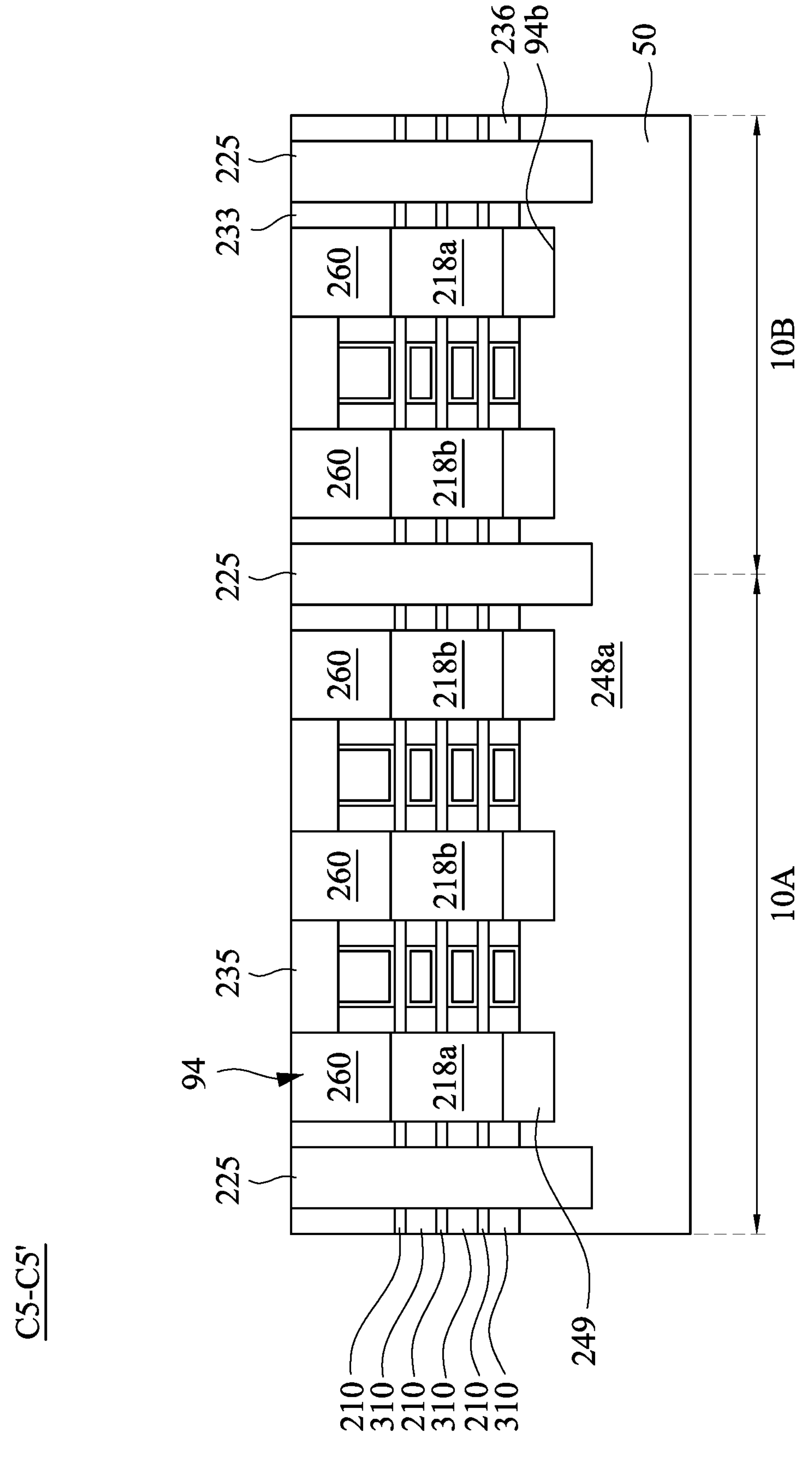
Figure 18C:
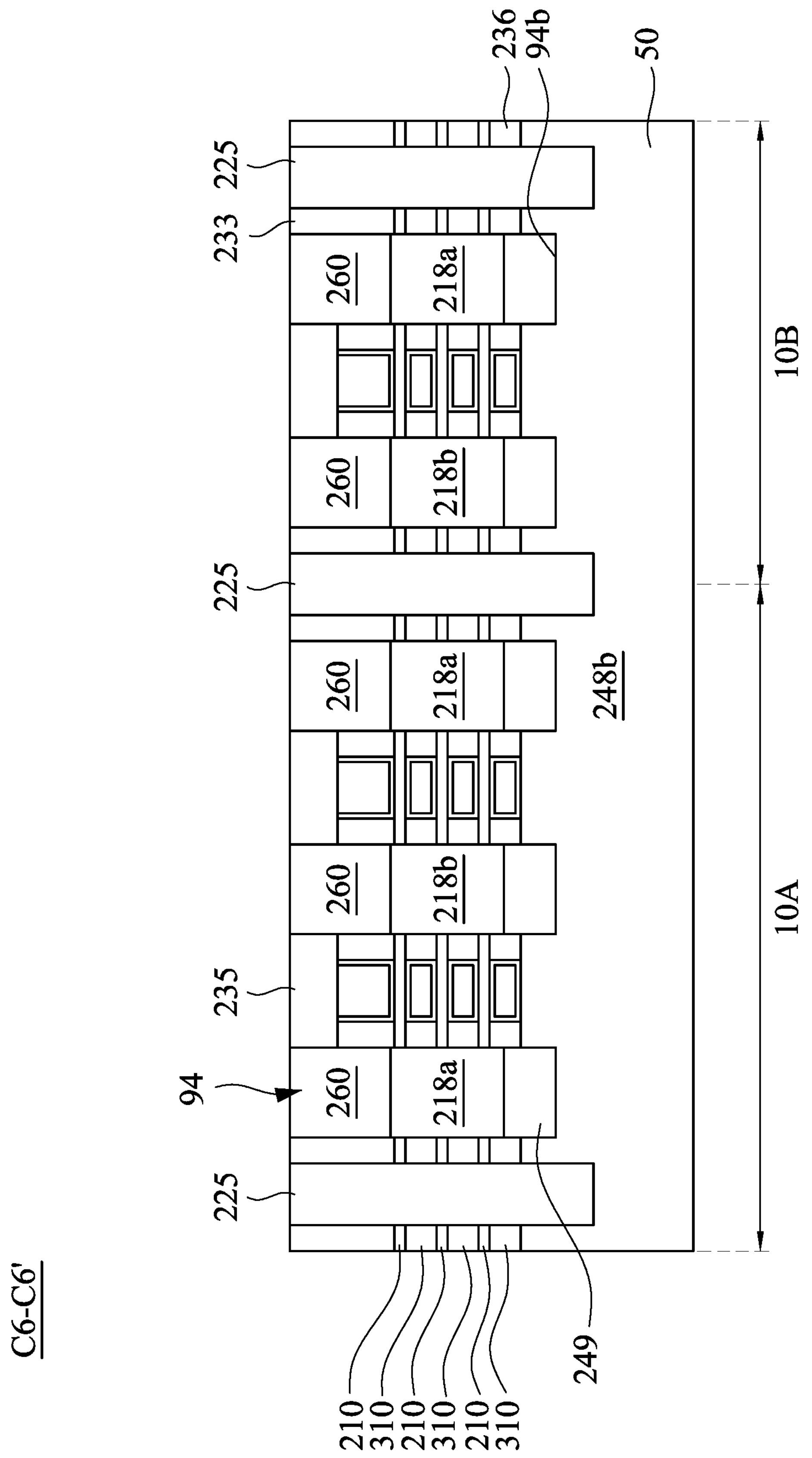

Reference is made to FIGS. 18A, 18B, and 18C. An etch back process is performed on the gate electrode layers 220 and the gate dielectric layer 231 to scale down the gate electrode layers 220 and the gate dielectric layer 231. The etch back process may include a bias plasma etching step. The bias plasma etching step may be performed to remove portions of the gate electrode layers 220 and the gate dielectric layer 231. Portions of the gate trenches may reappear with shallower depth. Top surfaces of the gate electrode layers 220 and the gate dielectric layer 231 may be no longer level with the ILD layer 260. Sidewalls of the gate spacers 233 are then exposed from the gate electrode layers 220 and the gate dielectric layer 231. In some embodiments, the bias plasma etching step may use a gas mixture of $Cl_2$, $O_2$, $BCl_3$, and Ar with a bias in a range from about 25V to about 1200V.

Subsequently, a hard mask layer 235 is formed over the gate electrode layers 220 and the gate dielectric layer 231 using, for example, a deposition process to deposit a dielectric material over the substrate 50, followed by a CMP process to remove excess dielectric material above the spacers 233 and the ILD layer 260. In some embodiments, source/drain contacts 240 and power supply voltage contacts 244 (see FIGS. 19A and 19C) formed subsequently are formed by a self-aligned contact process using the hard mask layer 235 as a contact etch protection layer. In some embodiments, the hard mask layer 235 may have a thickness in a range from about 2 nm to about 60 nm. In some embodiments, the hard mask layer 235 may be made of a nitride-based material, such as $Si_3N_4$, SiON, or a carbon-based material, such as SiC, SiOC, SiOCN, or combinations thereof. In some embodiments, the hard mask layer 235 may include $SiO_x$, SiBN, SiCBN, other suitable dielectric materials, or combinations thereof. In some embodiments, the hard mask layer 235 may include a metal oxide, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The hard mask layer 235 has different etch selectivity than the spacers 233 and/or the ILD layer 260, so as to selective etch back the hard mask layer 235. By way of example, if the hard mask layer 235 is made of silicon nitride, the spacers 233 and/or the ILD layer 260 may be made of a dielectric material different from silicon nitride. If the hard mask layer 235 is made of silicon carbide (SiC), the spacers 233 and/or the ILD layer 260 may be made of a dielectric material different from silicon carbide. Therefore, the hard mask layer 235 can be used to define self-aligned gate contact region and thus referred to as a self-aligned contact (SAC) structure or a SAC layer. In some embodiments, the hard mask layer 235 may have a thickness in a range from about 2 nm to about 60 nm, such as about 2, 5, 10, 15, 20, 25, 30, 35, 40, 45, 50, 55, or 60 nm. In some embodiments, the hard mask layer 235 can be interchangeably referred to a gate-top dielectric layer.

In some embodiments, the dielectric regions 227 (see FIGS. 3C, 3D, and 3L) are formed on opposite ends of the gate electrode layers 220 after the forming of the hard mask layer 235. In some embodiments, each dielectric region 227 is a gate-cut structure for the gate structure, and the gate-cut structure is formed by a cut metal gate (CMG) process. In some embodiments, the dielectric region 227 can be interchangeably referred to a gate end dielectric. Specifically, the opposite ends the gate electrode layers 220 are removed to form gate trenches. The ends of the gate electrode layers 220 may be removed by dry etching, wet etching, or a combination of dry and wet etching. For example, a wet etching process may include exposure to a hydroxide containing solution (e.g., ammonium hydroxide), deionized water, and/or other suitable etchant solutions. Subsequently, a dielectric material is deposited into the gate trenches, followed by a planarization process to remove excess portions of the dielectric material. The remaining dielectric material forms the dielectric regions 227. By way of example but not limiting the present disclosure, the dielectric region 227 can have a vertical dimension D4 (see FIG. 3C) in the STI structure 251 about 5 nm to about 60 nm, such as about 6, 10, 15, 20, 25, 30, 35, 40, 45, 50, 55, or 60 nm.

In some embodiments, the deposition of the dielectric material of the dielectric regions 227 is performed using a conformal deposition process such as ALD, which may be PEALD, thermal ALD, or the like. The dielectric material may be formed of or comprise $SiO_2$, SiOC, SiOCN, or the like, or combinations thereof. In some embodiments, the dielectric region 227 may be made of a nitride-based material, such as $Si_3N_4$, or a carbon-based material, such as SiOCN, or combinations thereof. In some embodiments, the dielectric region 227 may be made of a material having a dielectric constant greater than about 9 (e.g., high dielectric constant (high-k) material). For example, the dielectric region 227 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The dielectric regions 227 may be formed of a homogenous material, or may have a composite structure including more than one layer. The dielectric regions 227 may include dielectric liners, which may be formed of, for example, silicon oxide. In some embodiments, the dielectric material of the dielectric regions 227 comprises SiN, and the deposition is performed using process gases including dichlorosilane and ammonia. Hydrogen ($H_2$) may or may not be added.

Figure 19A:
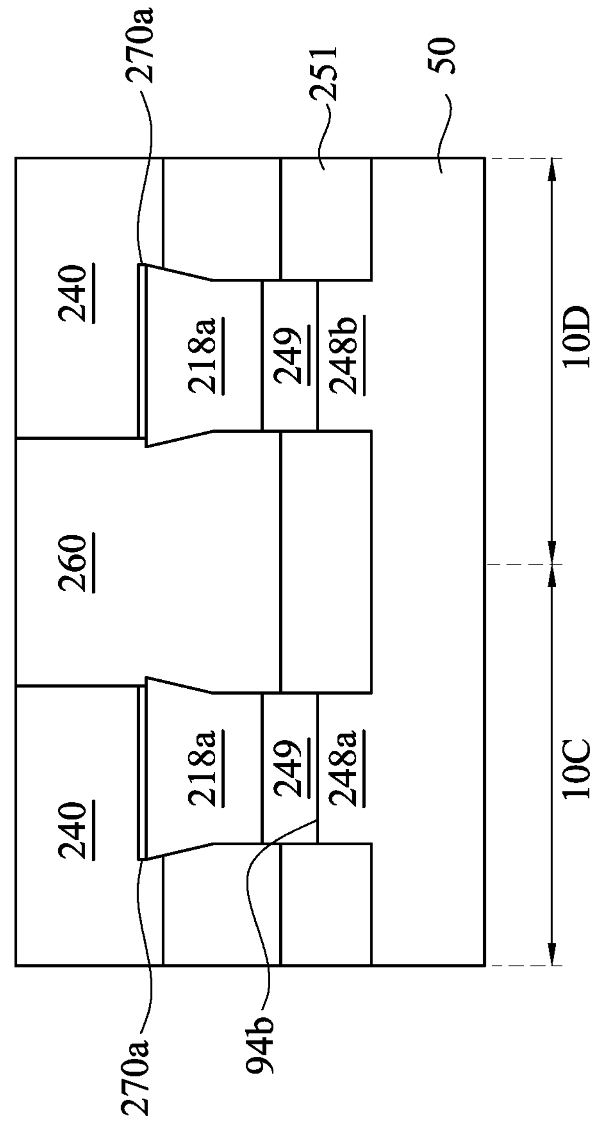
Figure 19B:
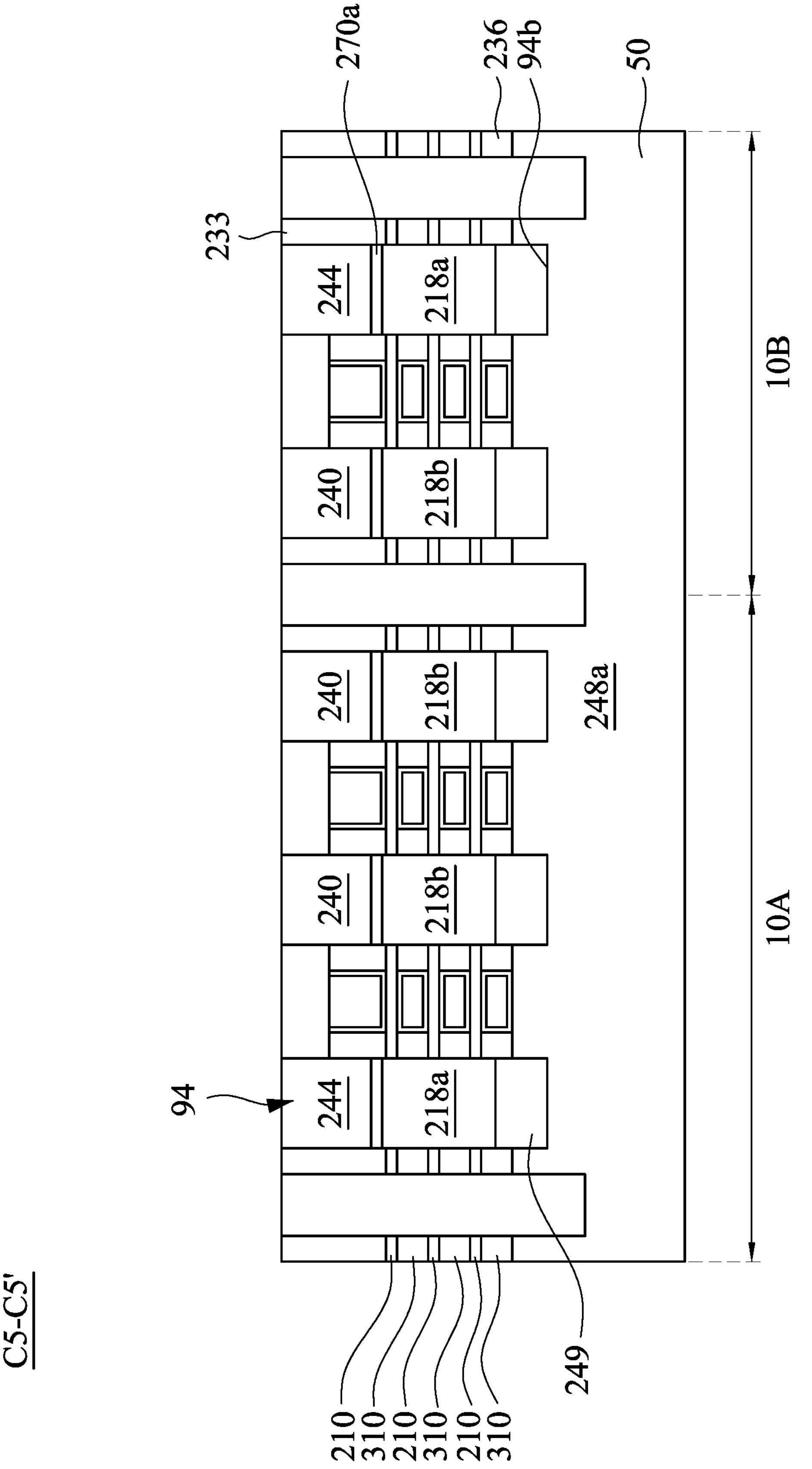
Figure 19C:
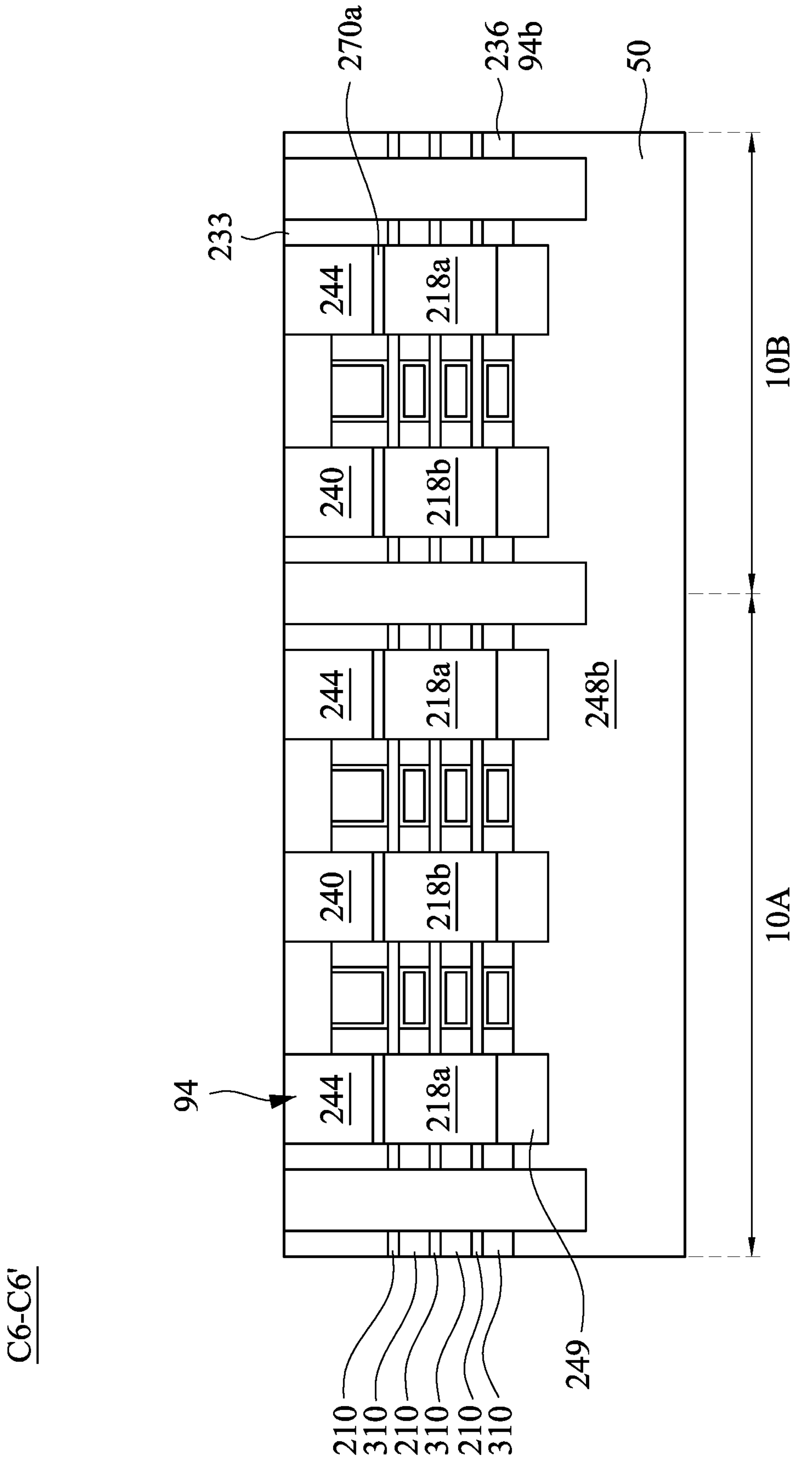

Reference is made to FIGS. 19A, 19B, and 19C. Source/drain contacts 240 and power supply voltage contacts 244 are formed in the ILD layer 260 and on the source/drain regions 218*a* and 218*b*. In some embodiments, the power supply voltage contacts 244 can be interchangeably referred to source/drain contacts. In some embodiments, the source/drain silicide regions 270 can be formed between the source/drain contacts 240 and the source/drain regions 218*b* and between the power supply voltage contacts 244 and the source/drain regions 218*a*. In some embodiments, materials of the source/drain contacts 240 and the power supply voltage contacts 244 may include Cu, Co, Ru, Pt, Al, W, Ti, TaN, TiN, Molybdenum (Mo), Ruthenium (Ru), Iridium (Ir), rhodium (Rh), or any combinations thereof.

In some embodiments, a front-side silicide layer 270*a* can be formed between the source/drain contacts 240 and the source/drain regions 218*b* and/or between the power supply voltage contacts 244 and the source/drain regions 218*a*. In some embodiments, a metal silicidation process can be performed on the source/drain region 218*a*/218*b* to form the front-side silicide layer 270*a*. The metal silicidation process is to make a reaction between metal and silicon (or polycrystalline silicon). In some embodiments, a metal layer is formed on the source/drain region 218*a*/218*b*. Subsequently, regarding the metal silicidation process, a first rapid thermal annealing (RTA) process may be performed in, for example, Ar, He, $N_2$ or other inert atmosphere at a first temperature, such as lower than 200~300° C., to convert the deposited metal layer into metal silicide. This is followed by an etching process to remove the unreacted metal layer from. The etching process may include a wet etch, a dry etch, and/or a combination thereof. As an example, the etchant of the wet etching may include a mixed solution of $H_2SO_4$, $H_2O_2$, $H_2O$, and/or other suitable wet etching solutions, and/or combinations thereof. Then, a second annealing or RTA step at a second temperature higher than the first temperature, such as 400~500° C., thereby forming the front-side silicide layer 270*a* with low resistance. In some embodiments, the front-side silicide layer 270*a* may include titanium silicide (TiSi), nickel silicide (NiSi), cobalt silicide (CoSi), Ni—Pt, or combinations thereof.

Figure 20A:
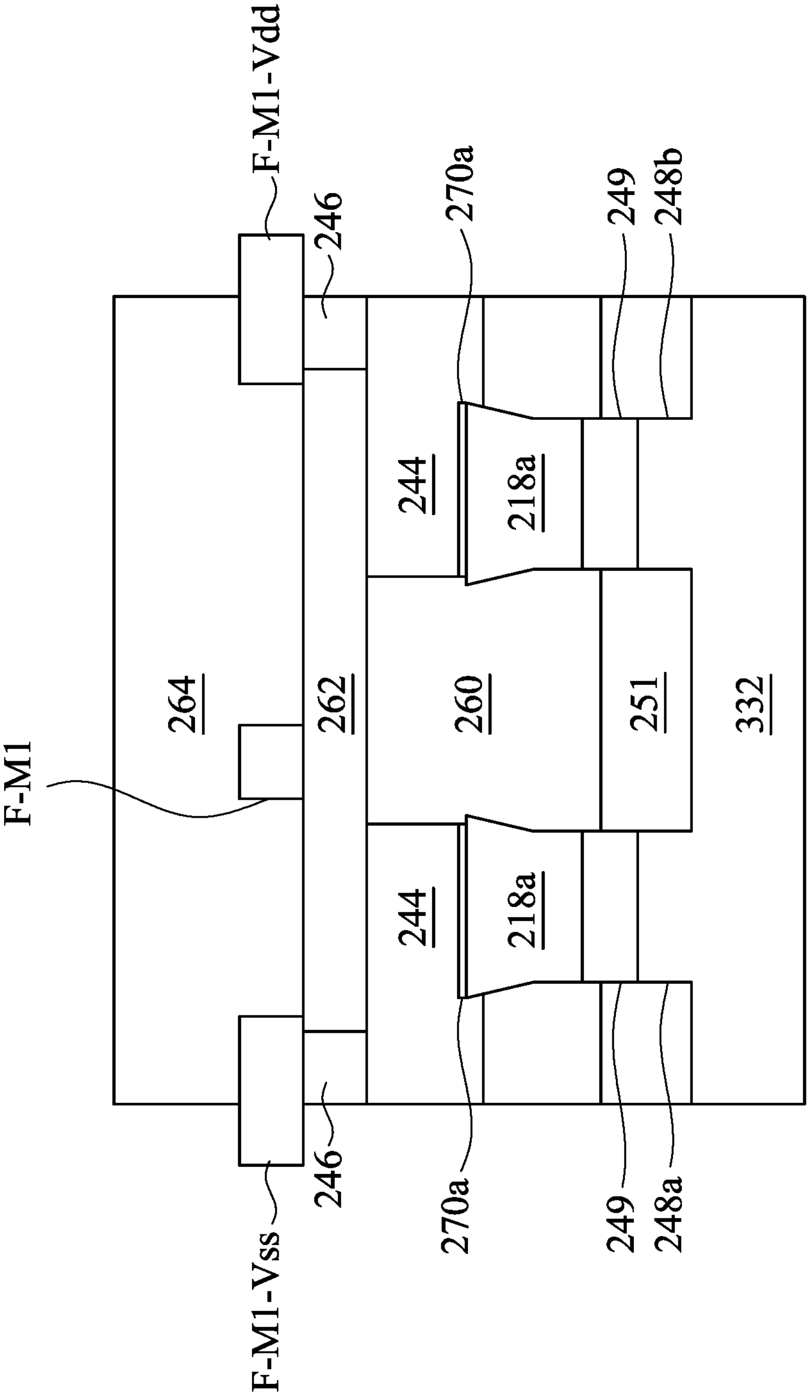
Figure 20B:
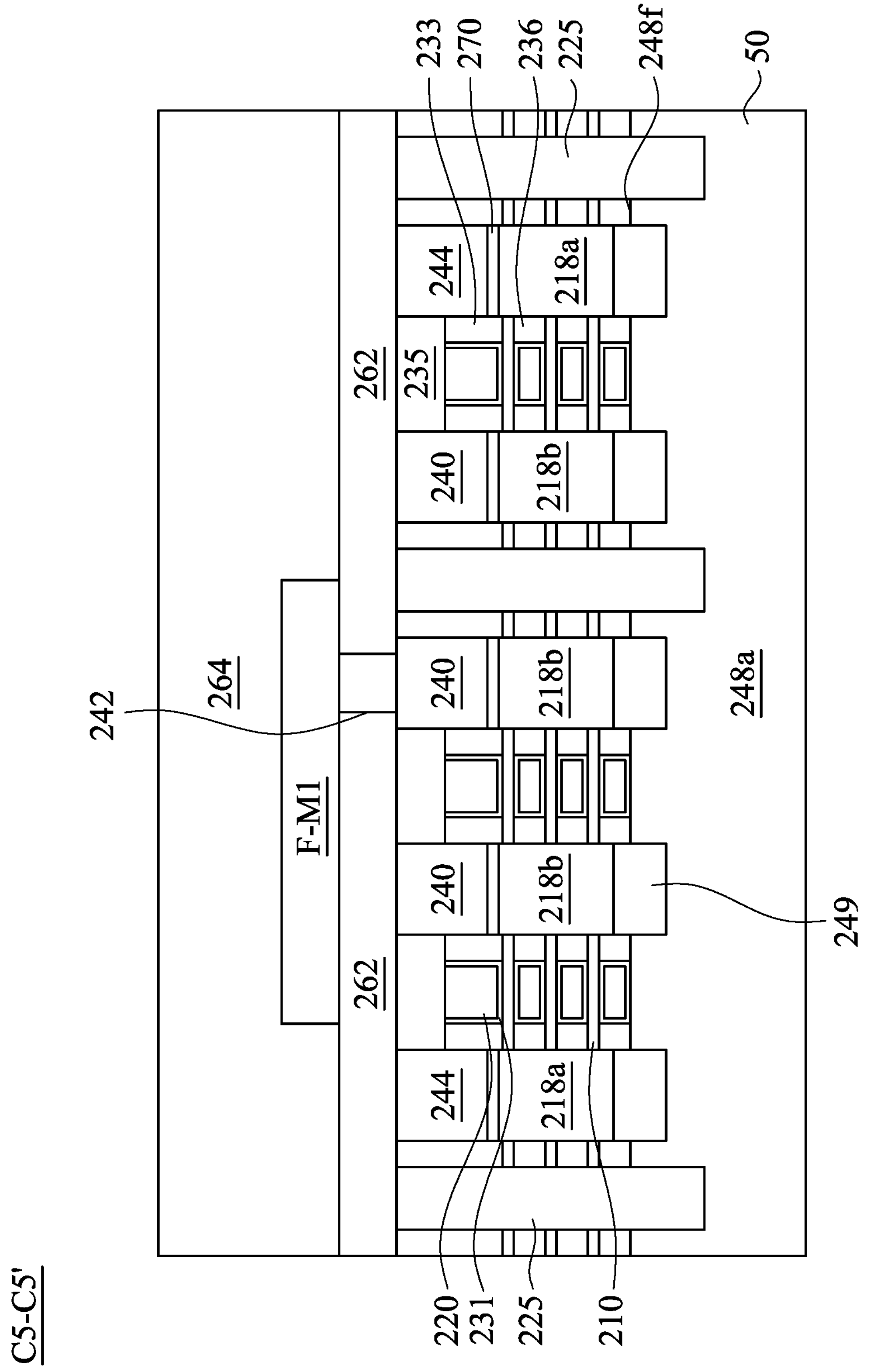
Figure 20C:
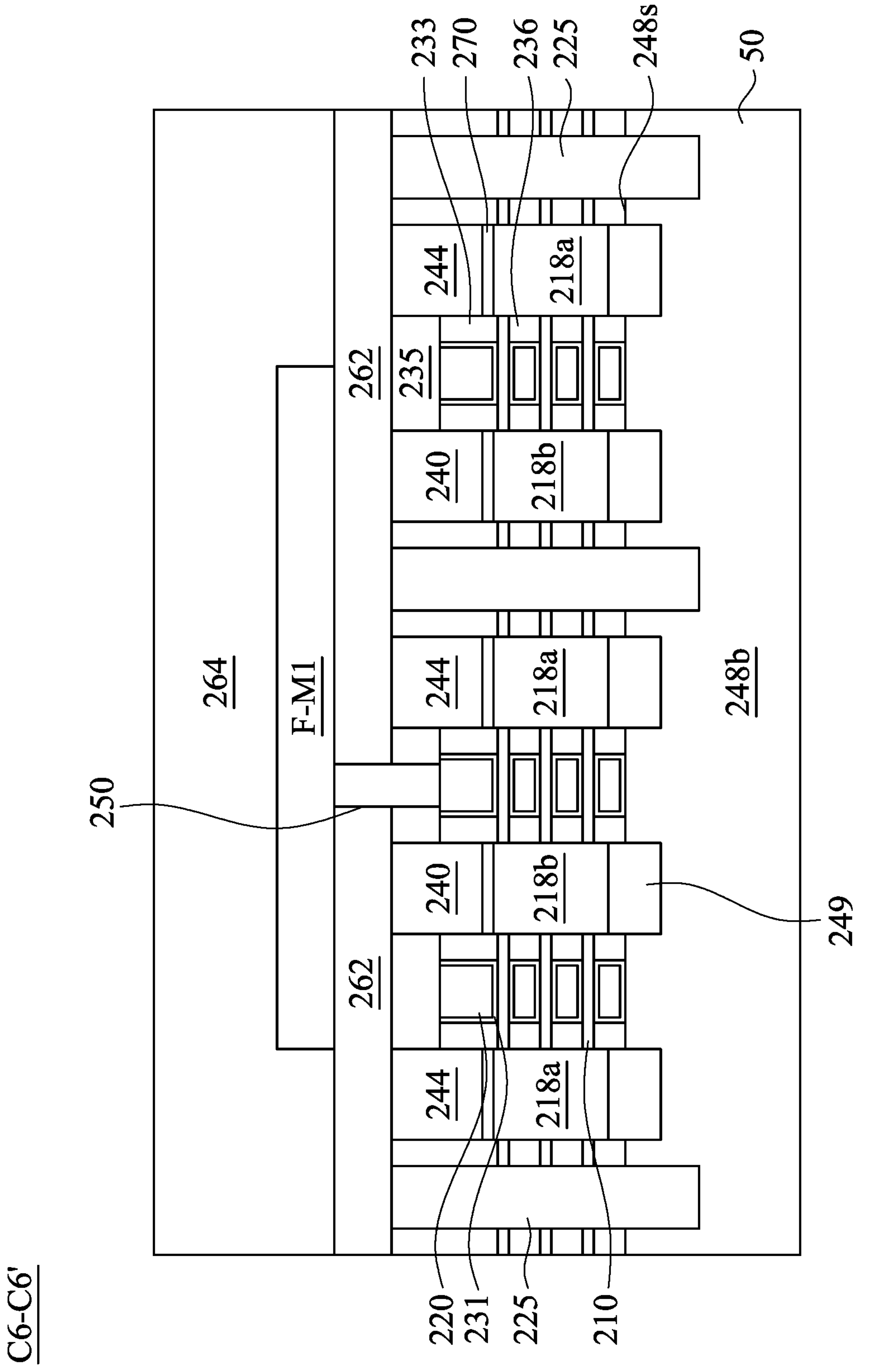

Reference is made to FIGS. 20A, 20B, and 20C. An ILD layer 262 is deposited over the ILD layer 260. Subsequently, source/drain vias 242 are formed in the ILD layer 262 and land on the source/drain contacts 240, and the conductive vias 246 are formed in the ILD layer 262 and land on the power supply voltage contact 244. In some embodiments, the conductive vias 246 can be interchangeably referred to source/drain vias. Gate vias 250 are formed to pass through the IL) layer 262 and the hard mask layer 235 and land on the gate electrode layers 220. The source/drain vias 242, conductive vias 246, and the gate vias 250 may include a metal-containing material such as titanium nitride, titanium oxide, tungsten, cobalt, ruthenium, aluminum, copper, combinations thereof, multi-layers thereof, or the like. The ILD layer 262 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof.

Subsequently, a front-side interconnect structure is formed over the front-side gate vias 250, the front-side source/drain vias 242, and the front-side conductive vias 246. The interconnect structure includes a plurality of metallization layers with a plurality of metallization vias or interconnects. Other embodiments may contain more or fewer metallization layers and corresponding more or fewer number of vias. The metal line illustrated here just for an example, and the metal line may be otherwise oriented (rotated 90 degrees or at other orientations). The front-side interconnect structure may include metal lines F-M1 and power supply voltage lines F-M1-Vdd, F-M1-Vss formed in a first front-side metallization layer. The metal lines F-M1 and the power supply voltage lines F-M1-Vdd, F-M1-Vss are in an IMD (inter-metal dielectric) layer 264. The front-side metal layers F-M1 are electrically connected to the gate electrode layers 220 through the gate vias 250 and electrically connected to the source/drain regions 218*a* and 218*b* through the source/drain vias 242 and the source/drain contacts 240. The power supply voltage lines F-M1-Vdd, F-M1-Vss are electrically connected to the source/drain regions 218*a* and 218*b* through the conductive vias 246 and the power supply voltage contact 244. In some embodiments, materials of the metal lines F-M1, the power supply voltage lines F-M1-Vdd, F-M1-Vss, and/or the gate via 250 may include Cu, Co, Ru, Pt, Al, W, Ti, TaN, TiN, Molybdenum (Mo), Ruthenium (Ru), Iridium (Ir), rhodium (Rh), or any combinations thereof. In some embodiments, the IMD layer 264 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. Subsequently, a protection layer (not shown) can be formed over the front-side interconnect structure. The protection layer can be a single layer, some embodiments may utilize multiple dielectric layers. In some embodiments, the protection layer can be a poly layer, or a silicon substrate.

Figure 21A:
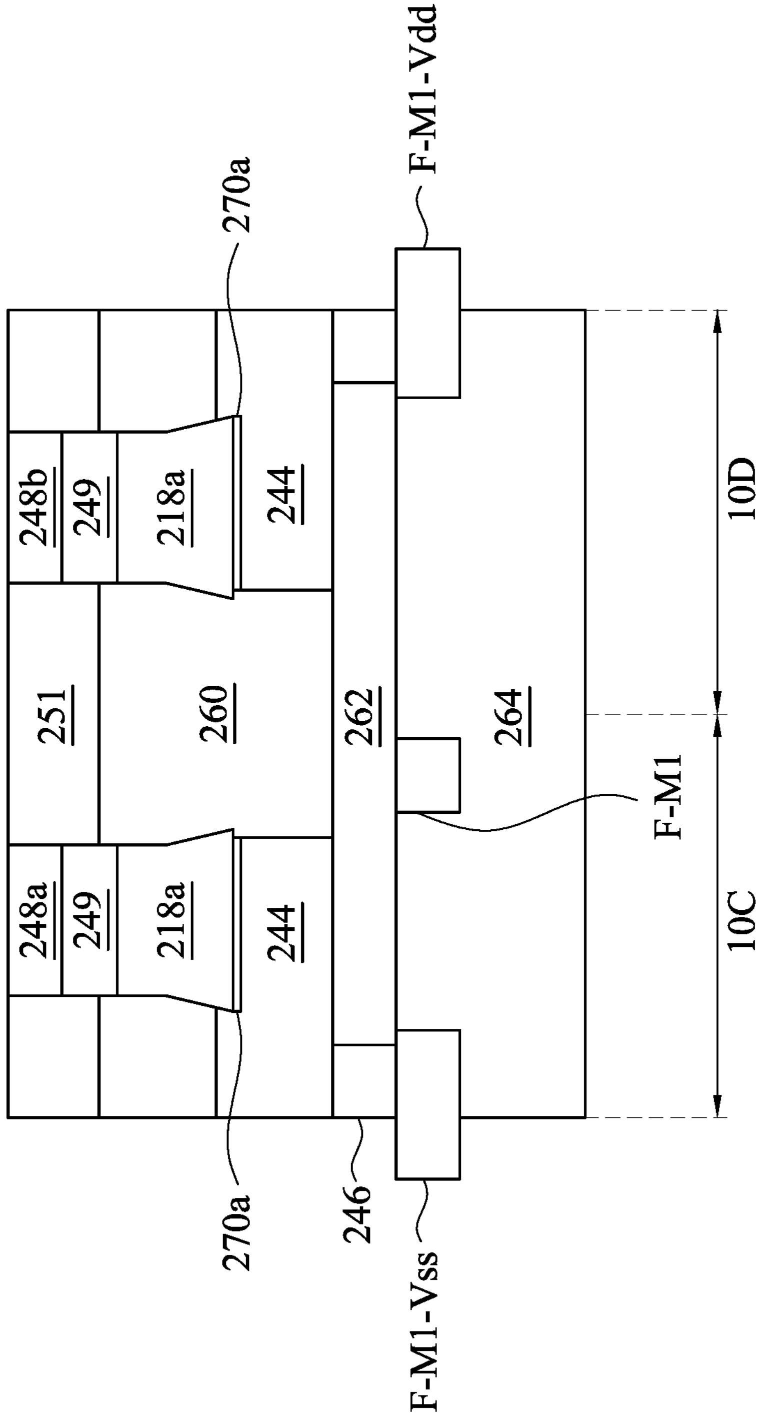
Figure 21B:
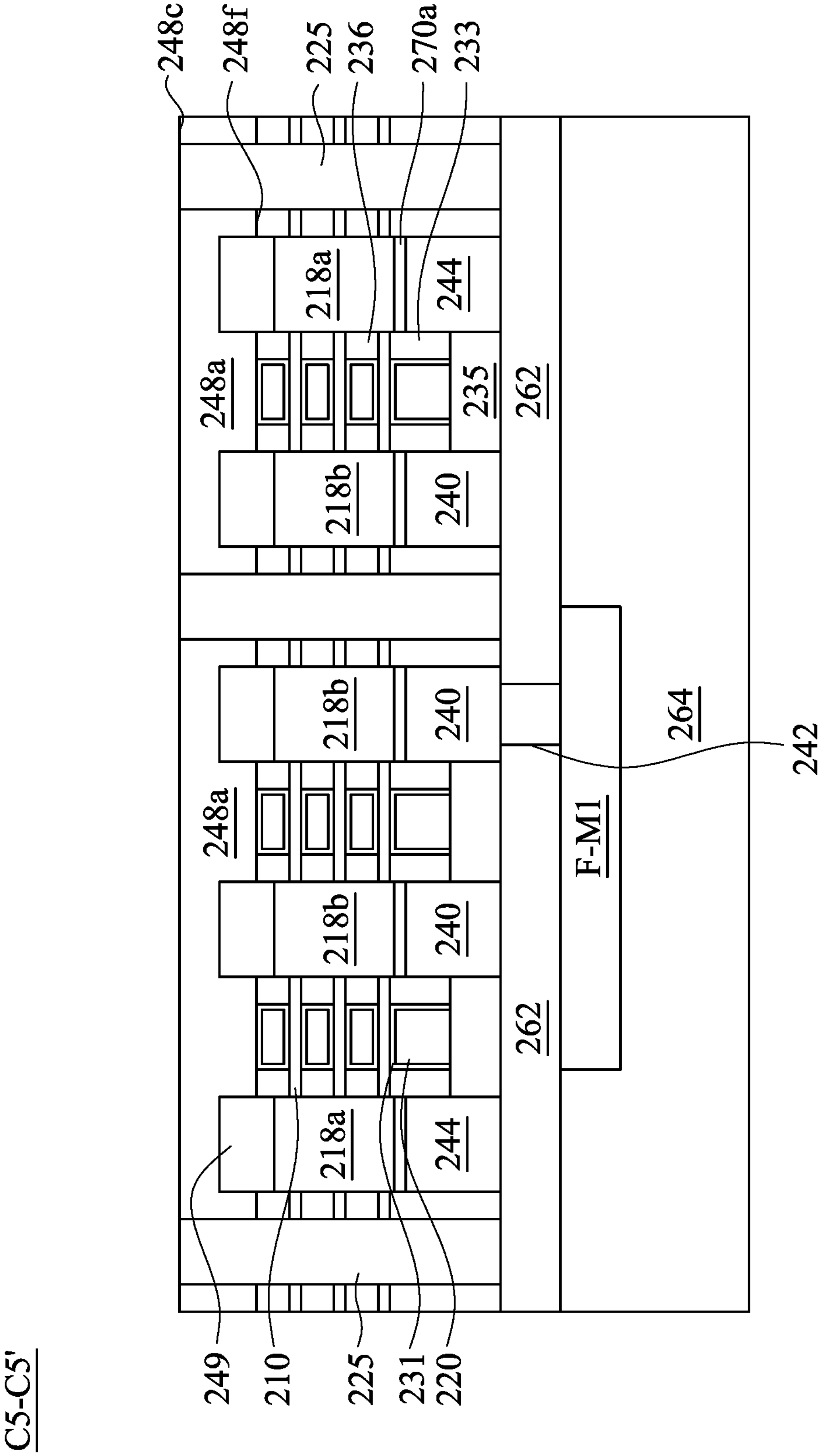
Figure 21C:
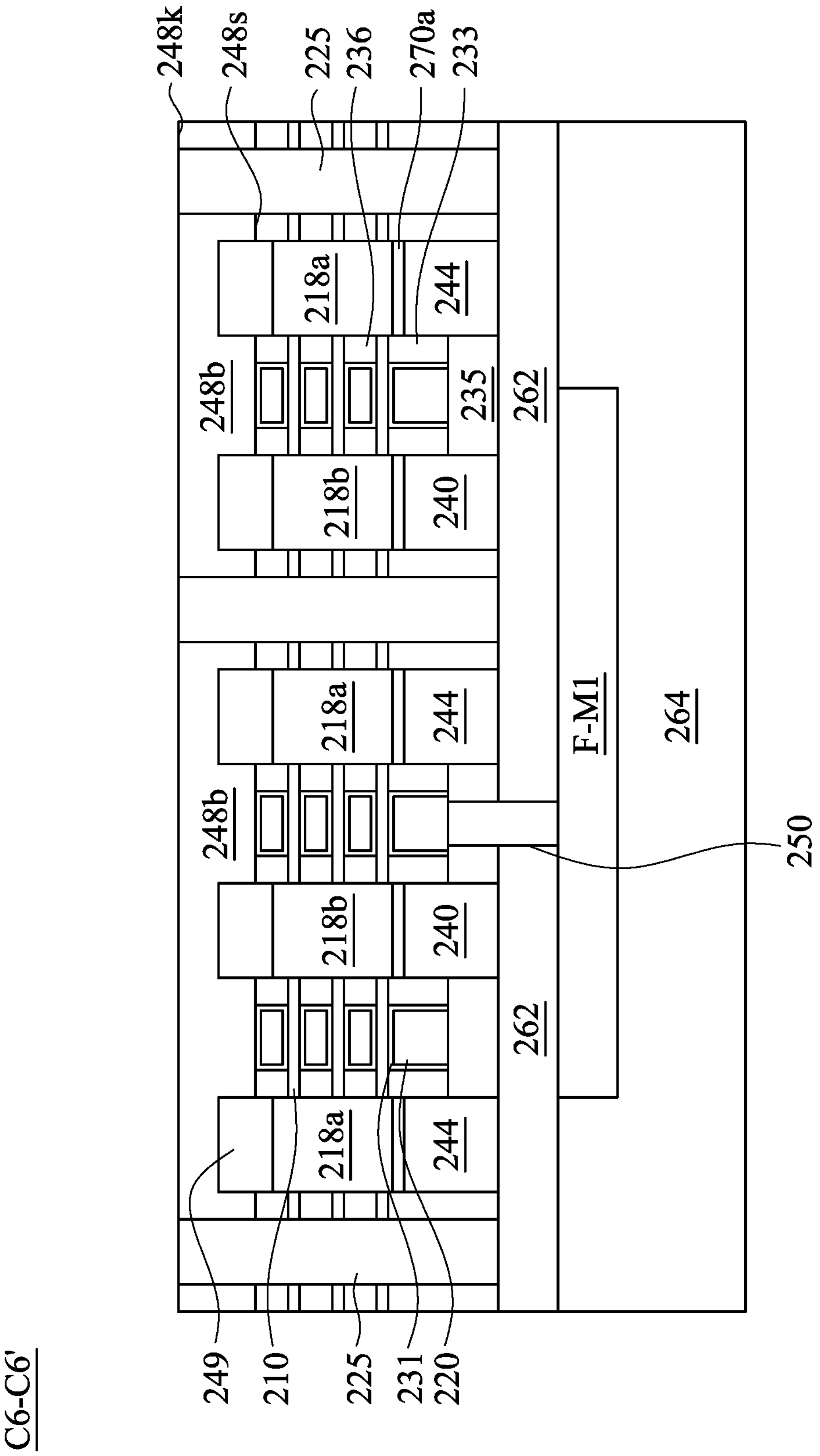

Reference is made to FIGS. 21A, 21B, and 21C. The structures of FIGS. 22A-22C are "flipped" upside down, and the substrate 50 is removed. The substrate 50 may be removed in a plurality of process operations, for example, CMP, HNA, and/or TMAH etching from the back-side 50*k* (see FIGS. 23B-23D) of the substrate 50, which stops at the STI structure 251 or the semiconductive layer 248*a*/248*b*. After the removal process, the STI structure 251 and the semiconductive layers 248*a* and 248*b* are exposed as shown in FIGS. 21A-21C.

Reference is made to FIGS. 22A-23D. The dielectric layers 249 included in Vdd node and Vss node are removed from the back-side of the semiconductor structure to expose the source/drain regions 218*a*. With reference to FIGS. 22A-22D, a mask layer 254 (see FIGS. 22B-22D) may be formed over the back-side 248*c*/248*k* of the semiconductive layer 248*a*/248*b*. The mask layer 254 is patterned to have openings O2 (see FIGS. 22B-22D) overlapping the source/ drain regions 218*a*. In some embodiment, the opening O2 (see FIG. 22A) on the mask layer 254 may have a dimension D5 in parallel with a lengthwise direction of the semiconductor sheet 210, and a dimension D6 in parallel with a lengthwise direction of the gate electrode 220 from the top view. The dimension D5 of the opening O2 may be greater than a width of the source/drain regions 218*a* in the lengthwise direction of the semiconductor sheet 210, such that the opening O2 can overlap the gate spacer 233 and/or the gate electrode 220 from the top view. The dimension D6 of the opening O2 may be the same as a width of the semiconductor sheet 210. Subsequently, a first etching process P4 (see FIGS. 22B-22D) can be performed through the openings O2 to remove portions of the semiconductive layer 248*a*/248*b* to form a back-side subsidiary contact opening 252*a* in the semiconductive layer 248*a*/248*b*, in which the dielectric layer 249 can act as an etch stop layer. In some embodiments, the etching process P4 may be an anisotropic dry etch process, such as a dry etch process (e.g., RIE, a NBE, or the like). In some embodiments, the back-side subsidiary contact opening 252*a* can have a top view profile inheriting the opening O2.

With reference to FIGS. 23A-23D, a second etching process P5 (see FIGS. 23B-23D) can be performed through the openings O2 to remove the dielectric layers 249 on the source/drain region 218*a* that is of Vdd node or Vss node, in which the source/drain regions 218*a* can act as an etch stop layer, such that a front-side subsidiary contact opening 252*b* can be formed to inherit the shape of the dielectric layers 249 and self-align with the source/drain regions 218*a*. In some embodiments, the back-side subsidiary contact opening 252*a* and the front-side subsidiary contact opening 252*b* can be collectively referred to as a back-side contact opening 252*c*. After the removing of the dielectric layers 249 underlying the source/drain regions 218*a*, the patterned mask layer 254 can be removed with a wet clean process, an ashing process, or the like. On the other hand, the dielectric layers 249 on the source/drain region 218*b* are remained. Therefore, the source/drain regions 218*b* which are not of Vdd node and Vss node can be isolated from the semiconductive layers 248*a* and 248*b* by the dielectric layers 249 formed from the remained dielectric layers 249.

In some embodiments, the front-side subsidiary contact opening 252*b* (see FIG. 23A) may have a dimension D7 in parallel with the lengthwise direction of the semiconductor sheet 210, and a dimension D8 in parallel with the lengthwise direction of the gate electrode 220 from the top view. The dimension D7 of the front-side subsidiary contact opening 252*b* may be the same as the width of the source/drain regions 218*a* in the lengthwise direction of the semiconductor sheet 210, such that the front-side subsidiary contact opening 252*b* non-overlaps with the gate spacer 233 and/or the gate electrode 220 from the top view. The dimension D8 of the front-side subsidiary contact opening 252*b* may be the same as a width of the semiconductor sheet 210. The dimension D5 of the back-side subsidiary contact opening 252*a* is greater than the dimension D7 of the front-side subsidiary contact opening 252*b*. By way of example and not limitation, a ratio of dimension D5 of the back-side subsidiary contact opening 252*a* to the dimension D7 of the front-side subsidiary contact opening 252*b* can be greater than about 1.3. In some embodiments, the dimension D6 of the back-side subsidiary contact opening 252*a* is substantially the same as the dimension D8 of the front-side subsidiary contact opening 252*b*.

In some embodiments, the etching process P5 may be an anisotropic dry etch process, such as a dry etch process (e.g., RIE, a NBE, or the like) and may employ a different etchant than that used in the etching process P4. In some embodiments, the dielectric layers 249 may be made of a material that has a high etching selectivity relative to the source/drain regions 218*a*, STI structure 251, and the gate spacer 233. For example, the etching selectivity, which is the ratio of the etching rate of the dielectric layer 249 to the source/drain region 218*a*, STI structure 251, and/or the gate spacer 233, is greater than about 10 when the dielectric layers 249 are etched.

Figure 24A:
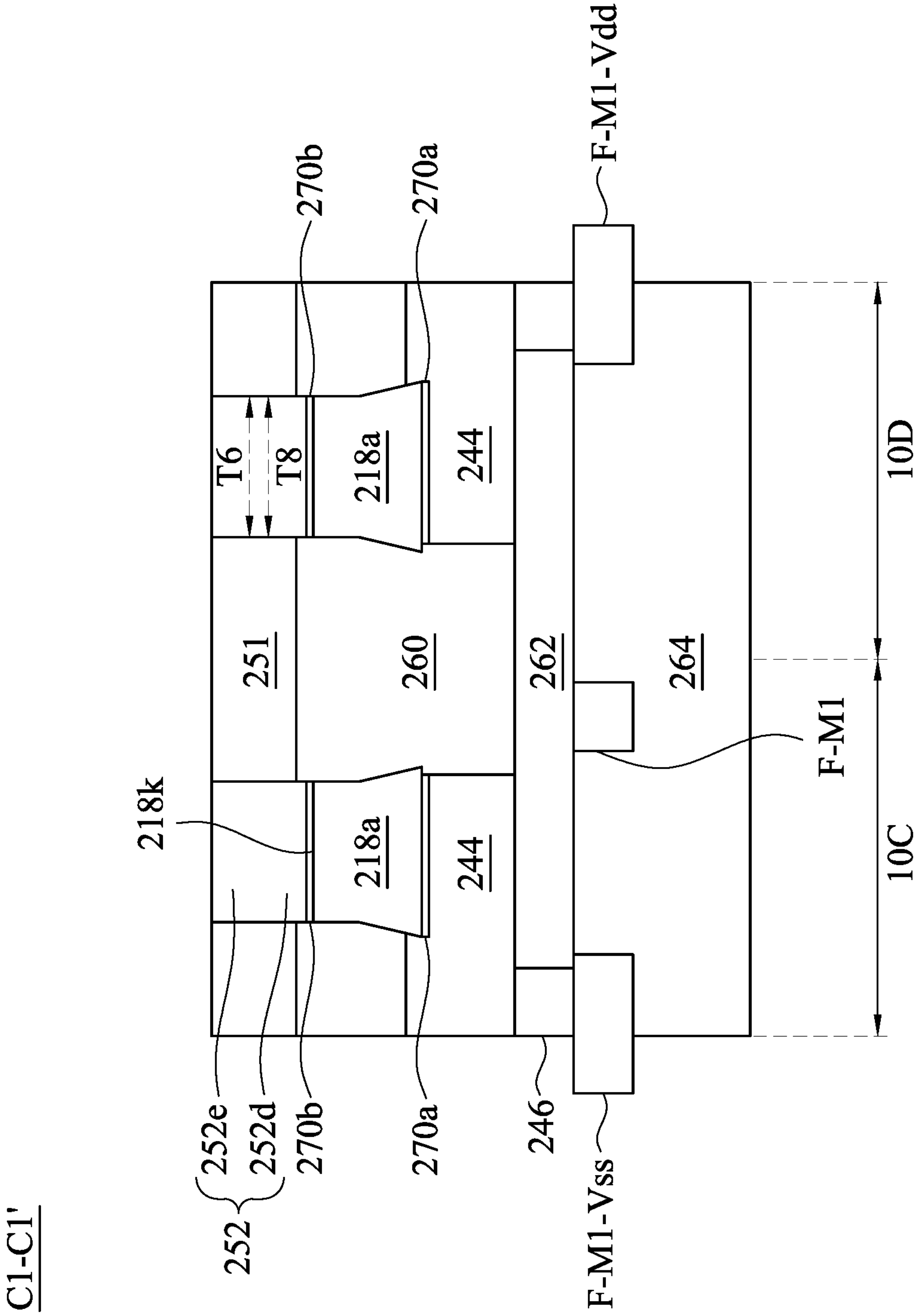
Figure 24B:
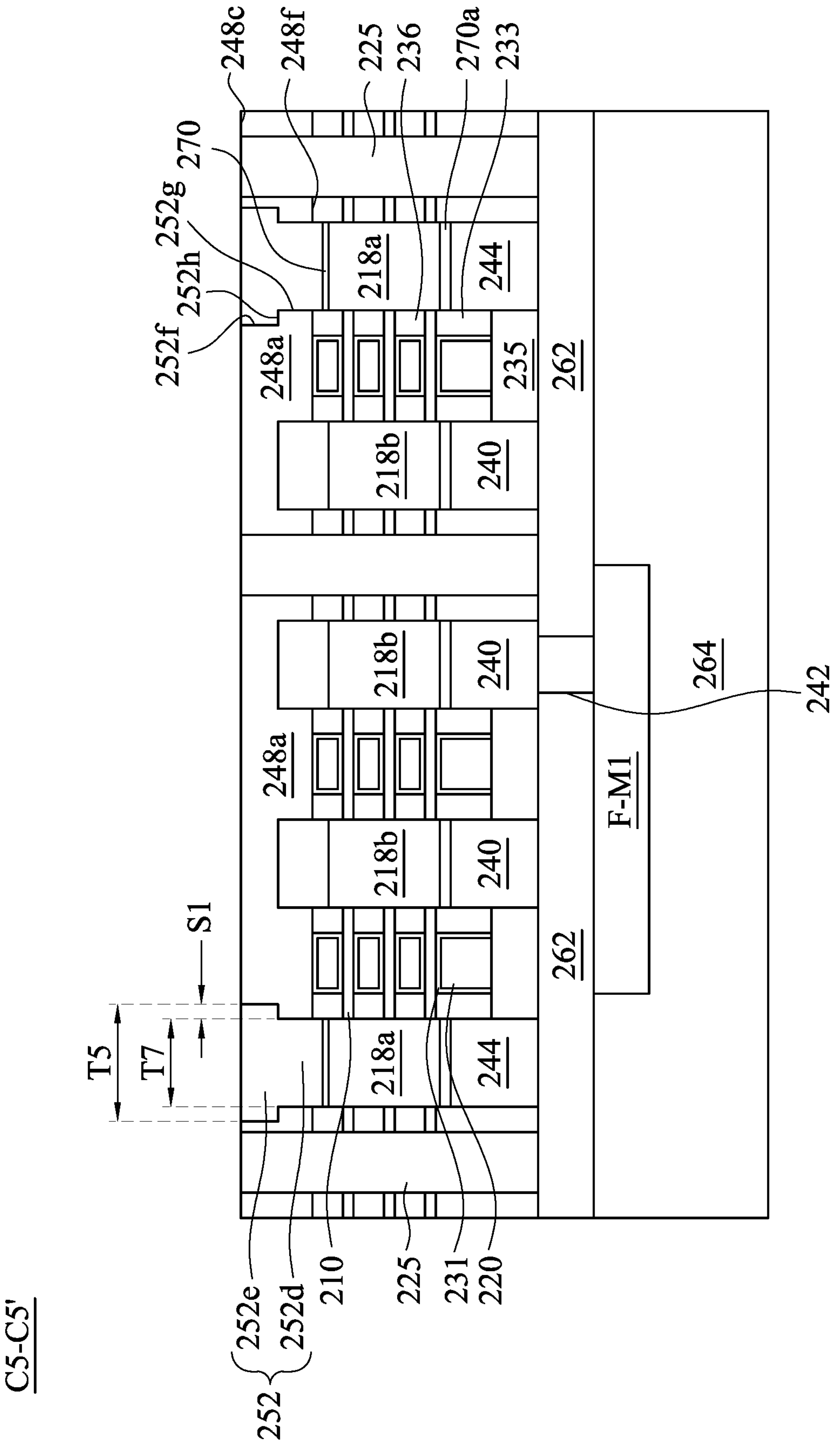
Figure 24C:
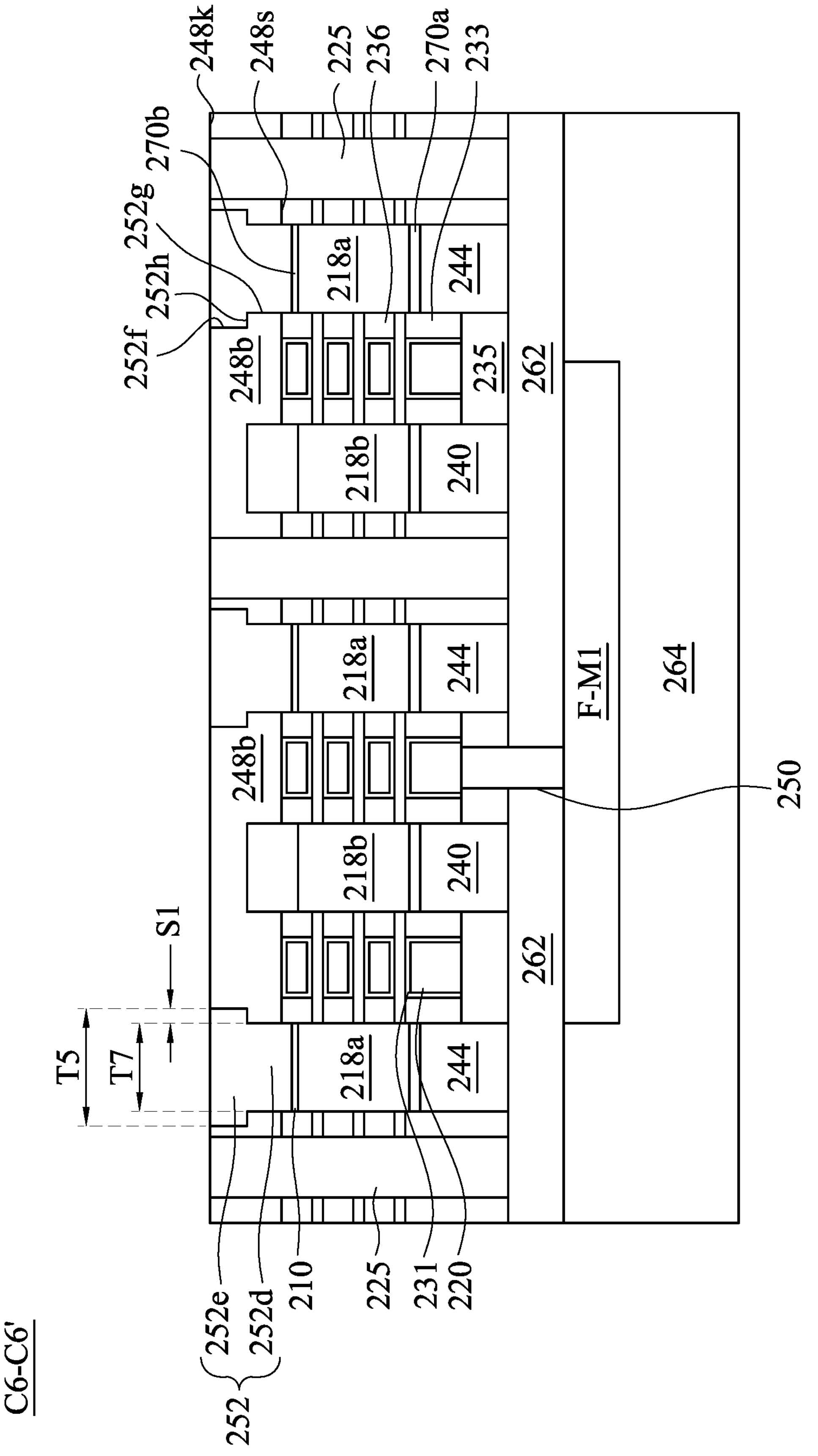

Reference is made to FIGS. 24A, 24B, and 24C. A conductive material is deposited over the back-side of the semiconductor structure and in the back-side contact opening 252*c*. Subsequently, a removal process is performed to level the back-side surface of the conductive material with the back-sides 248*c*, 248*k* of the semiconductive layers 248*a*, 248*b* to form contacts 252 in the back-side contact opening 252*c*. In some embodiments, a planarization process such as a chemical mechanical polish (CMP), an etch-back process, combinations thereof, or the like may be utilized. Therefore, the source/drain region 218*a* can be electrically connected to the back-side metal line (e.g., power supply voltage lines B-M1-Vss, B-M1-Vdd) through the contact 252 acting a power conductor path. Because the front-side subsidiary contact opening 252*b* of the contact opening 252*c* can be formed to inherit the shape of the dielectric layer 249 directly underlying the source/drain regions 218*a*, the contact 252 formed in the contact opening 252*c* can self-align with the source/drain regions 218*a* and on the back-side 218*k* of the source/drain region 218*a*. Therefore, the contact 252 can be interchangeably referred to as a self-aligned connection structure, and the intermediate stages in the formation of the semiconductor structure shown in FIGS. 12A-13C and 22A-24C can be referred to as a self-aligned contact process. Specifically, the contact 252 has a front-side portion 252*d* formed in the front-side subsidiary contact opening 252*b* and a back-side portion 252*e* formed in the back-side contact opening 252*a*.

As shown in FIGS. 24A, 24B, and 24C, the contact 252 can penetrate through the STI structure 251 when viewed in the cross section as shown in FIG. 24A and penetrate through the semiconductive layer 248*a*/248*b* when viewed in the cross section as shown in FIG. 24B or FIG. 24C. In addition, the contact 252 can be a stepped sidewall structure having a back-side sidewall 252*f*, a front-side sidewall 252*g* laterally set back from the back-side sidewall 252*f*, and an horizontal surface 252*h* connecting the back-side sidewall 252*f* to the front-side sidewall 252*g*. The back-side portion 252*e* of the contact 252 may have a dimension T5 (see FIGS. 24B and 24C) in parallel with a lengthwise direction of the semiconductor sheet 210, and a dimension T6 (see FIG. 24A) in parallel with a lengthwise direction of the gate electrode 220 from the top view. The dimension T5 of the back-side portion 252*e* of the contact 252 may be greater than a width of the source/drain regions 218*a* in the lengthwise direction of the semiconductor sheet 210, such that the back-side portion 252*e* of the contact 252 can overlap the gate spacer 233 and/or the gate electrode 220 from the top view. The dimension T6 of the back-side portion 252*e* of the contact 252 may be the same as a width of the semiconductor sheet 210 in the lengthwise direction of the gate electrode 220.

The front-side portion 252*d* of the contact 252 (see FIGS. 24B and 24C) may have a dimension T7 in parallel with the lengthwise direction of the semiconductor sheet 210, and a dimension T8 in parallel with the lengthwise direction of the gate electrode 220. The dimension T7 of the front-side subsidiary contact opening 252*b* may be the same as the width of the source/drain regions 218*a* in the lengthwise direction of the semiconductor sheet 210, such that the front-side portion 252*d* of the contact 252 non-overlaps with the gate spacer 233 and/or the gate electrode 220. The dimension T8 of the front-side subsidiary contact opening 252*b* may be the same as a width of the semiconductor sheet 210 in the lengthwise direction of the gate electrode 220. In some embodiments, the lateral dimension T11 (see FIGS. 12B and 12C) of the dielectric layer 249 may be the same as the dimension T7 of the front-side subsidiary contact opening 252*b*. In some embodiments, the lateral dimension T12 (see FIG. 12A) of the dielectric layer 249 may be the same as the dimension T8 of the front-side subsidiary contact opening 252*b*.

The dimension T5 of the back-side portion 252*e* of the contact 252 is greater than the dimension T7 of the front-side portion 252*d* of the contact 252. By way of example and not limitation, a ratio of dimension T5 of the back-side portion 252*e* of the contact 252 to the dimension T7 of the front-side portion 252*d* of the contact 252 can be greater than about 1.3. In some embodiments, the dimension T5 of the back-side portion 252*e* of the contact 252 is greater than the dimension T11 of the dielectric layer 249. In some embodiments, the dimension T6 of the back-side portion 252*e* of the contact 252 is substantially the same as the dimension T8 of the front-side portion 252*d* of the contact 252. In some embodiments, the front-side portion 252*d* of the contact 252 can have a front-side surface 252*i* in a position higher than the front-side surface 251*f* of the STI structure 251 (see FIG. 24A) and the front-side surface 248*f*/248*s* of the semiconductive layer 248*a*/248*b* (see FIGS. 24B and 24C). In some embodiments, the horizontal surface 252*h* of the contact 252 may have a length S1 (see FIGS. 24B and 24C) greater than about 2 nm. By way of example and not limitation, the length S1 (e.g., length) of the horizontal surface 252*h* of the contact 252 can be in a range from about 2 nm to about 10 nm, such as about 2, 3, 4, 5, 6, 7, 8, 9, or 10 nm.

In some embodiments, a back-side silicide layer 270*b* can be formed between the back-side contact 252 and the source/drain regions 218*a*. In some embodiments, a metal silicidation process can be performed on the source/drain region 218*a* to form the back-side silicide layer 270*b*. The metal silicidation process is to make a reaction between metal and silicon (or polycrystalline silicon). In some embodiments, a metal layer is formed on the source/drain region 218*a*. Subsequently, regarding the metal silicidation process, a first rapid thermal annealing (RTA) process may be performed in, for example, Ar, He, $N_2$ or other inert atmosphere at a first temperature, such as lower than 200~300° C., to convert the deposited metal layer into metal silicide. This is followed by an etching process to remove the unreacted metal layer from. The etching process may include a wet etch, a dry etch, and/or a combination thereof. As an example, the etchant of the wet etching may include a mixed solution of $H_2SO_4$, $H_2O_2$, $H_2O$, and/or other suitable wet etching solutions, and/or combinations thereof. Then, a second annealing or RTA step at a second temperature higher than the first temperature, such as 400~500° C., thereby forming the back-side silicide layer 270*b* with low resistance. In some embodiments, the back-side silicide layer 270*b* may include titanium silicide (TiSi), nickel silicide (NiSi), cobalt silicide (CoSi), Ni—Pt, or combinations thereof.

Figure 25A:
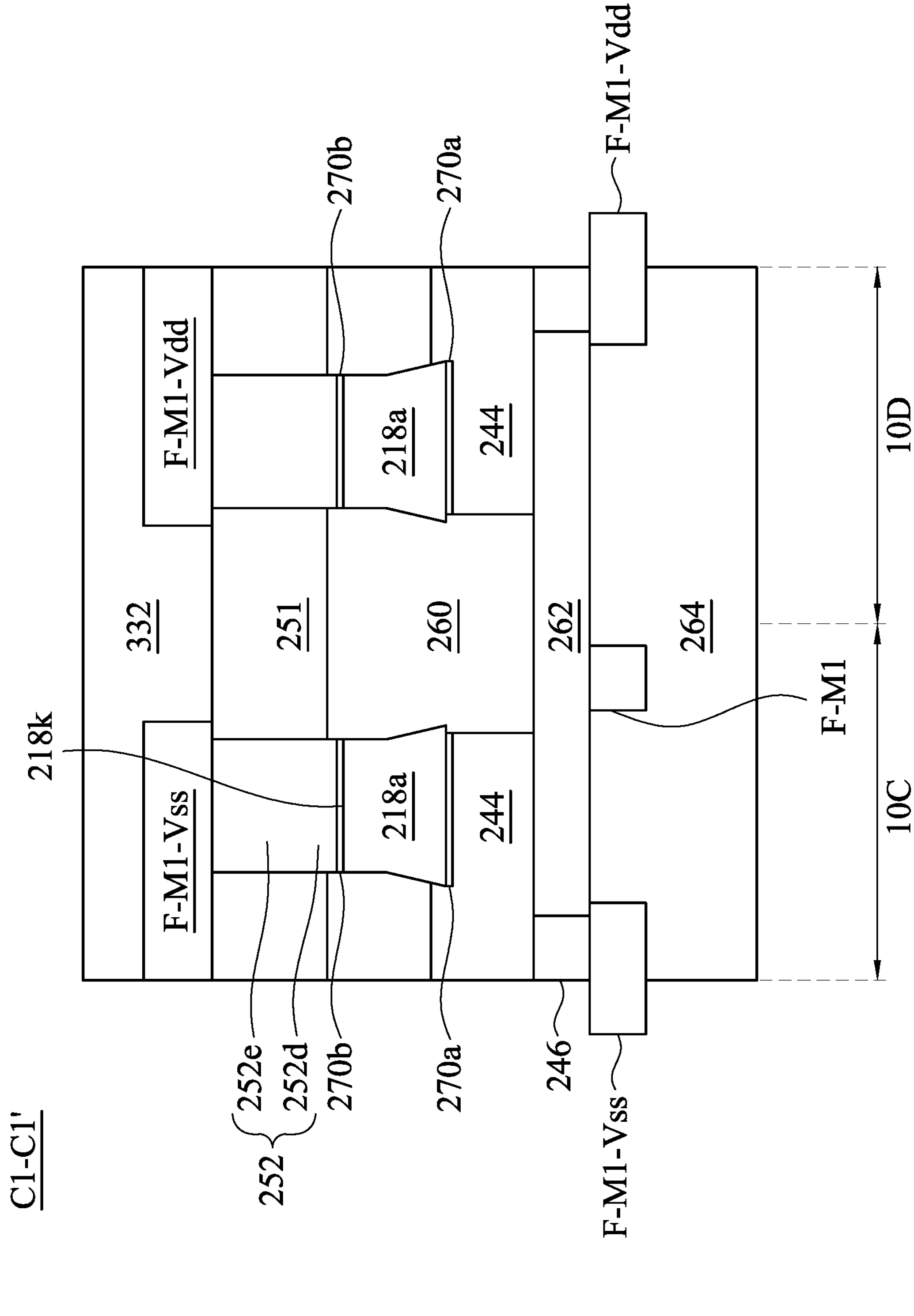
Figure 25B:
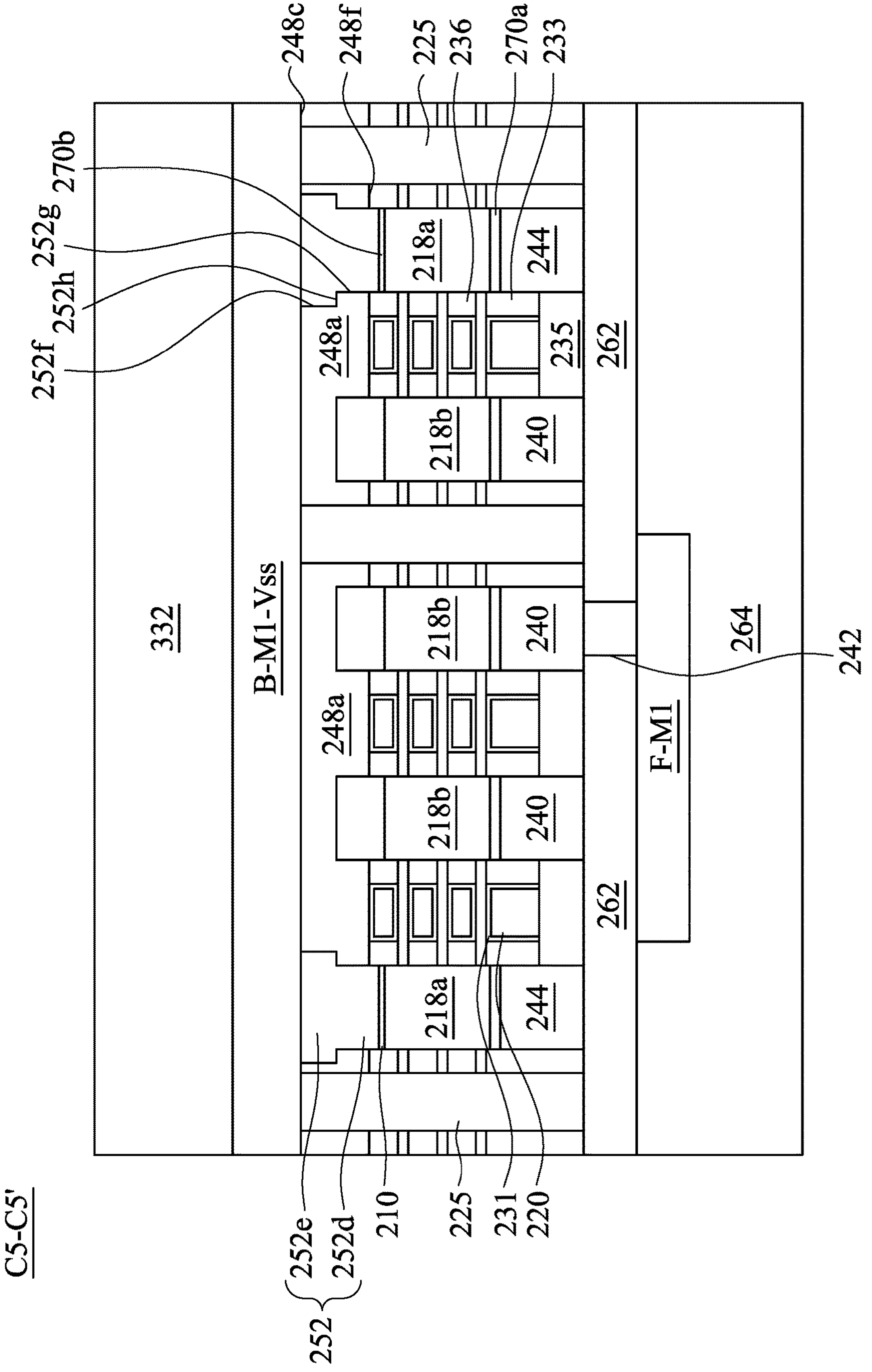
Figure 25C:
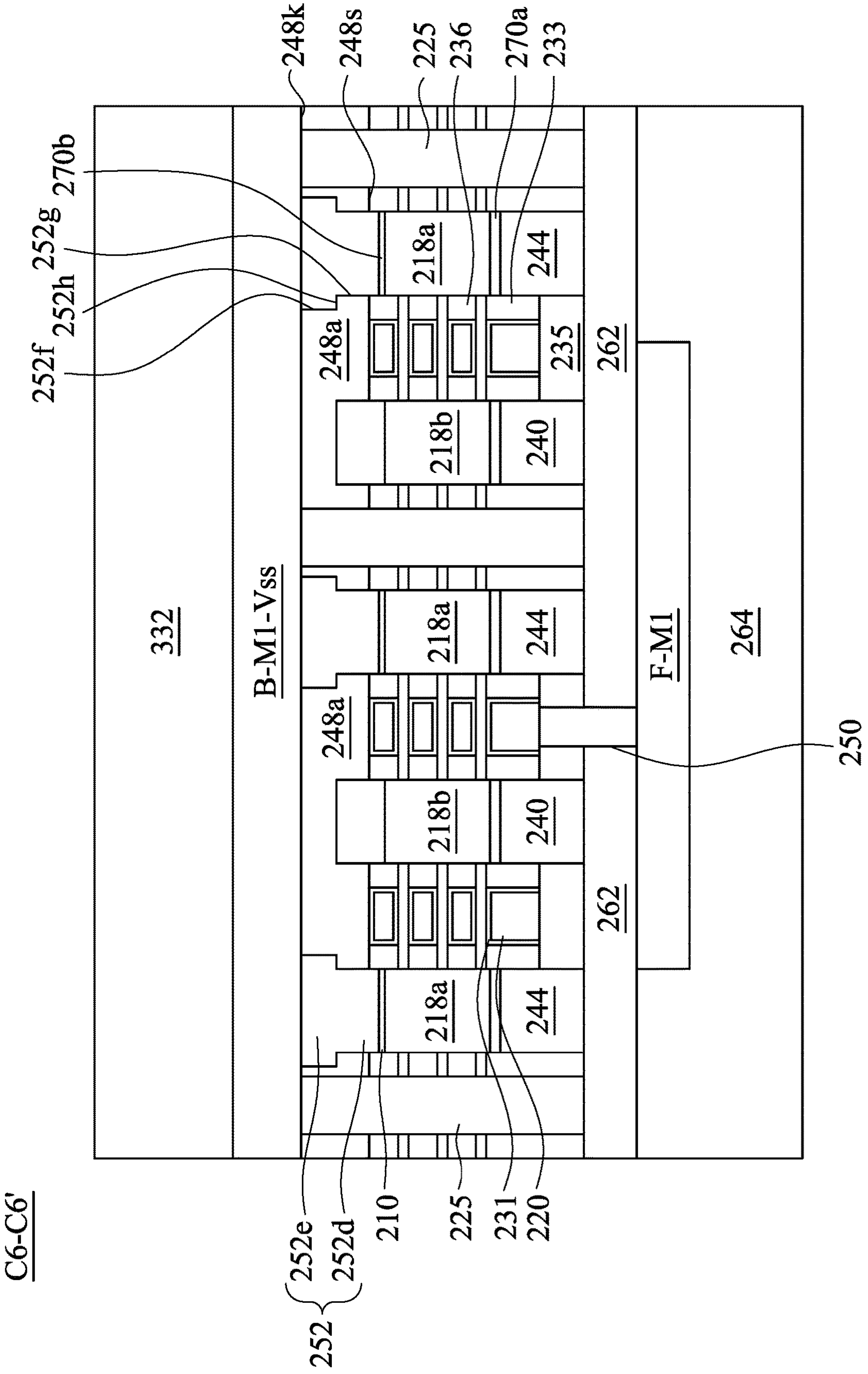

Reference is made to FIGS. 25A, 25B, and 25C. A back-side interconnect structure is formed over the back-side contact 252. The back-side interconnect structure includes a plurality of metallization layers with a plurality of metallization vias or interconnects. Other embodiments may contain more or fewer metallization layers and corresponding more or fewer number of vias. The metal line illustrated here just for an example, and the metal line may be otherwise oriented (rotated 90 degrees or at other orientations). The back-side interconnect structure may include the power supply voltage lines B-M1-Vss, B-M1-Vdd in a first back-side metallization layer formed in an IMD layer 332. The power supply voltage lines B-M1-Vss, B-M1-Vdd are electrically connected to the source/drain regions 218*a* and 218*b* through the back-side contact 252. In some embodiments, materials of the power supply voltage lines B-M1-Vss, B-M2-Vdd may include Cu, Co, Ru, Pt, Al, W, Ti, TaN, TiN, Molybdenum (Mo), Ruthenium (Ru), Iridium (Ir), rhodium (Rh), or any combinations thereof. In some embodiments, the IMD layer 332 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. In some embodiments, after the forming of the back-side interconnect structure, a backside to front side connection module formation (not shown) can be formed on the IC structure, such as a tap structure formation. Subsequently, backside bump pads formation (not shown) and passivation layer formation (not shown) can be formed on the back-side interconnect structure.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a metal line routing method to improve the functional density and operation performance on the IC structure. Because the power conductive contact can be formed to inherit the location of the dielectric layer directly underlying the source/drain region, the back-side contact can self-align with the source/drain region to connect the source/drain region 218*a* to the back-side power metal layers. Therefore, an isolation margin issue of the back-side power conductive contact to gate electrode can be solved, which in turn allows for scaling the contacted poly pitch (CPP). In addition, because the back-side power conductive contact can have a back-side portion having wider width than the front-side portion thereof (e.g., stepped sidewall structure) to connect the back-side power metal layers, an improved contact resistance between the source/drain region and the back-side power metal layers can be achieved.

In some embodiments, a method includes forming a plurality of semiconductor sheets on a front-side of a semiconductive layer that is on a front-side of a substrate; forming a gate strip surrounding each of the semiconductor sheets; forming a plurality of dielectric layers on the semiconductive layer and at opposite sides of the gate strip; forming a plurality of source/drain structures on the dielectric layers and on either side of each of the semiconductor sheets; performing a planarization process on a back-side of the substrate to expose the semiconductive layer; etching the semiconductive layer from a back-side of the semiconductive layer to form a first opening exposing a first one of the dielectric layers, while remains covering a second one of the dielectric layers; selectively removing the first one of the dielectric layers through the first opening to from a second opening exposing one of the source/drain structures; forming a contact having a back-side portion in the first opening and a front-side portion in the second opening; forming a power supply voltage line on a back-side of the contact. In some embodiments, when viewed in a cross section taken along a lengthwise direction of one of the semiconductor sheet, the contact is a stepped sidewall structure having a first sidewall connecting the power supply voltage line, a second sidewall connecting the first one of the source/drain structures and laterally set back from the first sidewall, and a horizontal surface connecting the first sidewall to the second sidewall. In some embodiments, the horizontal surface has a length greater than about 2 nm when viewed in the cross section. In some embodiments, when viewed in a cross section taken along a direction in parallel with a lengthwise direction the gate strip, the back-side portion of the contact has a same dimension as the front-side portion of the contact. In some embodiments, when viewed in a cross section taken along a lengthwise direction of one of the semiconductor sheet, the back-side portion of the contact has a greater lateral dimension than the remained second one of the dielectric layers. In some embodiments, the method further includes before forming the contact, forming a silicide layer on a back-side of the one of the source/drain structures. In some embodiments, the silicide layer is further conformally formed on sidewalls of the first and second openings. In some embodiments, the method further includes forming before forming the contact, conformally forming a dielectric layer on sidewalls of the first and second openings. In some embodiments, the method further includes forming a back-side dielectric layer between the semiconductive layer and the power supply voltage line, wherein the contact penetrates through the back-side dielectric layer. In some embodiments, the method further includes performing an implantation process on the semiconductive layer with a dopant, in which the dopant has a same conductivity type as the source/drain structures.

In some embodiments, a method includes forming a plurality of nanostructures arranged in a vertical direction on a semiconductor strip upwardly extending from a front-side of a substrate; forming a plurality of leakage barriers on the semiconductor strip; growing a plurality of epitaxial patterns on the leakage barriers and on opposite sides of the nanostructures; forming a gate pattern across the nanostructures and between the epitaxial patterns; performing a planarization process on a back-side of the substrate to expose the semiconductor strip; etching the semiconductor strip to expose one of the leakage barriers; removing the one of the leakage barriers to expose one of the epitaxial patterns; after removing the one of the leakage barriers, forming a power conductive contact extending through the semiconductor strip and on the one of the epitaxial patterns, the power conductive contact being a stepped sidewall structure, and a back-side of the power conductive contact having a greater lateral dimension than a front-side of the power conductive contact; forming a power supply voltage line on the back-side of the power conductive contact. In some embodiments, the method further includes forming a spacer on a sidewall of the gate pattern, wherein the power conductive contact overlaps the spacer from a top view. In some embodiments, the back-side of the power conductive contact has opposite two sidewalls from the cross-sectional view, the sidewalls having a distance therebetween in a range from about 13 nm to about 50 nm. In some embodiments, the front-side of the power conductive contact has opposite two sidewalls from the cross-sectional view, the sidewalls having a distance therebetween in a range from about 9 nm to about 20 nm. In some embodiments, the method further includes forming a shallow trench isolation (STI) structure laterally surrounding the semiconductor strip, the STI structure being used as an etch stop layer during the planarization process. In some embodiments, the method further includes forming a dummy gate pattern on the front-side of the substrate and extending in parallel with a lengthwise direction of the gate pattern from the top view, the dummy gate pattern having a back-side interrupting the semiconductor strip from the cross-sectional view.

In some embodiments, the semiconductor structure includes a transistor, a contact, a front-side power supply voltage line, and a back-side power supply voltage line. The transistor is on a front side of a silicon layer. The transistor includes a channel region, a gate structure surrounding the channel region, and source/drain regions on opposite sides of the gate structure. The contact extends through the silicon layer and is on a back-side of one of the source/drain regions. From a cross-sectional view, the contact has a back-side sidewall, a front-side sidewall connecting the back-side of the one of the source/drain regions and laterally set back from the back-side sidewall, and an horizontal surface connecting the back-side sidewall to the front-side sidewall. The front-side power supply voltage line is electrically connected to a front-side of the one of the source/drain regions. The back-side power supply voltage line is electrically connected to the contact. In some embodiments, the semiconductor structure further includes a silicide layer lining the back-side sidewall and the front-side sidewall of the contact. In some embodiments, the semiconductor structure further includes a back-side dielectric layer between the silicon layer and the back-side power supply voltage line, wherein the contact penetrates through the back-side dielectric layer. In some embodiments, the semiconductor structure further includes a dummy gate structure extends in parallel with a lengthwise direction of the gate structure, the dummy gate structure having a back-side inlaid in the silicon layer from a cross-sectional view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a plurality of semiconductor sheets on a front-side of a semiconductive layer that is on a front-side of a substrate, the plurality of semiconductor sheets being stacked along a first direction;

forming a gate strip surrounding each of the semiconductor sheets;

forming a dielectric gate offset from the gate strip, the dielectric gate extending from above the gate strip to below the gate strip;

forming a plurality of dielectric layers on the semiconductive layer and at opposite sides of the gate strip, at least one dielectric layer of the plurality of dielectric layers being positioned between the dielectric gate and the plurality of semiconductor sheets, a bottommost surface of the at least one dielectric layer being above a bottommost surface of the dielectric gate in the first direction;

forming a plurality of source/drain structures on the dielectric layers and on either side of each of the semiconductor sheets;

performing a planarization process on a back-side of the substrate to expose the semiconductive layer;

etching the semiconductive layer from a back-side of the semiconductive layer to form a first opening exposing a first one of the dielectric layers, while a second one of the dielectric layers remains covered by the semiconductive layer;

selectively removing the first one of the dielectric layers through the first opening to form a second opening exposing one of the source/drain structures;

forming a contact having a back-side portion in the first opening and a front-side portion in the second opening; and forming a power supply voltage line on a back-side of the contact, the power supply voltage line having an uppermost surface contiguous with a bottommost surface of the dielectric gate.

2. The method of claim 1, wherein when viewed in a cross section taken along a lengthwise direction of one of the semiconductor sheets, the contact is a stepped sidewall structure having a first sidewall connecting the power supply voltage line, a second sidewall connecting the first one of the source/drain structures and laterally set back from the first sidewall, and a horizontal surface connecting the first sidewall to the second sidewall.

3. The method of claim 2, wherein the horizontal surface has a length greater than about 2 nm when viewed in the cross section.

4. The method of claim 1, wherein when viewed in a cross section taken along a direction in parallel with a lengthwise direction the gate strip, the back-side portion of the contact has a same dimension as the front-side portion of the contact.

5. The method of claim 1, wherein when viewed in a cross section taken along a lengthwise direction of one of the semiconductor sheets, the back-side portion of the contact has a greater lateral dimension than the remained second one of the dielectric layers.

6. The method of claim 1, further comprising:

before forming the contact, forming a silicide layer on a back-side of the one of the source/drain structures.

7. The method of claim 6, wherein the silicide layer is further conformally formed on sidewalls of the first and second openings.

8. The method of claim 1, further comprising:

before forming the contact, conformally forming a dielectric layer on sidewalls of the first and second openings.

9. The method of claim 1, further comprising:

forming a back-side dielectric layer between the semiconductive layer and the power supply voltage line, wherein the contact penetrates through the back-side dielectric layer.

10. The method of claim 1, further comprising:

performing an implantation process on the semiconductive layer with a dopant, wherein the dopant has a same conductivity type as the source/drain structures.

11. A method, comprising:

forming a plurality of nanostructures arranged in a first direction on a semiconductor strip upwardly extending from a front-side of a substrate;

forming a dielectric gate offset from the plurality of nanostructures, the dielectric gate extending from above the plurality of nanostructures in the first direction to below an uppermost surface of the semiconductor strip in the first direction;

forming a plurality of leakage barriers on the semiconductor strip;

growing a plurality of epitaxial patterns on opposite sides of the nanostructures and on the leakage barriers;

forming a gate pattern across the nanostructures and between the epitaxial patterns;

performing a planarization process on a back-side of the substrate to expose the semiconductor strip;

etching the semiconductor strip to expose one of the leakage barriers;

removing the one of the leakage barriers to expose one of the epitaxial patterns;

after removing the one of the leakage barriers, forming a power conductive contact extending through the semiconductor strip and on the one of the epitaxial patterns, the power conductive contact being a stepped sidewall structure, and a back-side of the power conductive contact having a greater lateral dimension than a front-side of the power conductive contact; and forming a power supply voltage line on the back-side of the power conductive contact, the power supply voltage line having an uppermost surface contiguous with a bottommost surface of the dielectric gate.

12. The method of claim 11, further comprising:

forming a spacer on a sidewall of the gate pattern, wherein the power conductive contact overlaps the spacer from a top view.

13. The method of claim 11, wherein the back-side of the power conductive contact has opposite two sidewalls, the sidewalls having a distance therebetween in a range from about 13 nm to about 50 nm.

14. The method of claim 11, wherein the front-side of the power conductive contact has opposite two sidewalls, the sidewalls having a distance therebetween in a range from about 9 nm to about 20 nm.

15. The method of claim 11, further comprising:

forming a shallow trench isolation (STI) structure laterally surrounding the semiconductor strip, the STI structure being used as an etch stop layer during the planarization process.

16. The method of claim 11, wherein forming the dielectric gate comprises:

forming a dummy gate pattern on the front-side of the substrate and extending in parallel with a lengthwise direction of the gate pattern from a top view, the dummy gate pattern having a back-side interrupting the semiconductor strip.

17. A semiconductor structure, comprising:

a transistor on a front side of a silicon layer, the transistor comprising a channel region, a gate structure surrounding the channel region, and a plurality of source/drain regions on opposite sides of the gate structure;

a dielectric gate between the transistor and a second transistor adjacent the transistor, the dielectric gate extending from above the gate structure to below the gate structure;

a contact extending through the silicon layer and on a back-side of one of the source/drain regions, wherein from a cross-sectional view, the contact has a back-side sidewall, a front-side sidewall connecting the back-side of the one of the source/drain regions and laterally set back from the back-side sidewall, and a horizontal surface connecting the back-side sidewall to the front-side sidewall;

a front-side power supply voltage line electrically connected to a front-side of the one of the source/drain regions; and a back-side power supply voltage line electrically connected to the contact, the back-side power supply voltage line having an upper surface contiguous with a bottommost surface of the contact and contiguous with a bottommost surface of the dielectric gate.

18. The semiconductor structure of claim 17, further comprising:

a silicide layer lining the back-side sidewall and the front-side sidewall of the contact.

19. The semiconductor structure of claim 17, further comprising:

a back-side dielectric layer between the silicon layer and the back-side power supply voltage line, wherein the contact penetrates through the back-side dielectric layer.

20. The semiconductor structure of claim 17, wherein:

the dielectric gate extends in parallel with a lengthwise direction of the gate structure, and has a back-side inlaid in the silicon layer from a cross sectional view.

* * * * *